United States Patent
Ooishi

(10) Patent No.: US 6,424,585 B1
(45) Date of Patent: *Jul. 23, 2002

(54) SEMICONDUCTOR MEMORY DEVICE WITH A VOLTAGE DOWN CONVERTER STABLY GENERATING AN INTERNAL DOWN-CONVERTED VOLTAGE

(75) Inventor: Tsukasa Ooishi, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/561,816

(22) Filed: May 1, 2000

Related U.S. Application Data

(62) Division of application No. 09/210,811, filed on Dec. 15, 1998, now Pat. No. 6,072,742, which is a continuation of application No. 08/914,280, filed on Aug. 19, 1997, now Pat. No. 5,881,014, which is a division of application No. 08/511,497, filed on Aug. 4, 1995, now Pat. No. 5,689,460.

(30) Foreign Application Priority Data

| Aug. 4, 1994 | (JP) | 6-183300 |
| Nov. 7, 1994 | (JP) | 6-272537 |
| May 30, 1995 | (JP) | 7-130902 |

(51) Int. Cl.$^7$ ................................. G11C 7/00
(52) U.S. Cl. ..................... 365/226; 365/189.09
(58) Field of Search ................ 365/226, 189.09

(56) References Cited

U.S. PATENT DOCUMENTS

| 4,994,668 A | 2/1991 | Horiguchi et al. |
| 5,130,579 A | 7/1992 | Thomas |
| 5,179,539 A | 1/1993 | Horiguchi et al. |
| 5,249,155 A * | 9/1993 | Arimoto et al. ........ 365/226 X |
| 5,352,935 A | 10/1994 | Yamamura et al. |
| 5,373,477 A | 12/1994 | Sugibayashi |
| 5,377,156 A | 12/1994 | Watanabe et al. |
| 5,382,839 A | 1/1995 | Shinohara |
| 5,436,586 A | 7/1995 | Miyamoto |
| 5,442,277 A | 8/1995 | Mori et al. |
| 5,604,707 A | 2/1997 | Kuge et al. |
| 6,097,180 A * | 8/2000 | Tsukude et al. ............ 323/313 |

FOREIGN PATENT DOCUMENTS

| JP | 5-114291 | 5/1993 |
| JP | 6-162772 | 6/1994 |
| JP | 62-15571 | 8/1994 |

OTHER PUBLICATIONS

"A New On-Chip Voltage Converter for Submicrometer High-Density DRAM's", by Furuyama et al., IEEE Journal of Solid-State Circuits, vol. SC-22, No. 3, Jun. 1997, pp. 437-441.

* cited by examiner

Primary Examiner—Huan Hoang
(74) Attorney, Agent, or Firm—McDermott, Will & Emery

(57) ABSTRACT

A comparison circuit compares a reference voltage Vref from a reference voltage generation circuit with an internal power supply voltage VCI on an internal power supply line to provide a signal according to the comparison result. A drive transistor supplies current to the internal power supply line from an external power supply node according to the output signal of the comparison circuit. A resistance element connected between the external power supply node and the output node of the comparison circuit and a resistance element connected between the output node of the comparison circuit and a ground node VSS suppresses the amplitude of an output signal of the comparison circuit. Thus, overdrive of the drive transistor can be suppressed, and a current corresponding to an abrupt change of the internal power supply voltage can be supplied from the external power supply node to the internal power supply line by the amplitude limitation function. Thus, an internal power supply voltage generation circuit is provided superior in high frequency response that can generate an internal power supply voltage stably.

57 Claims, 95 Drawing Sheets

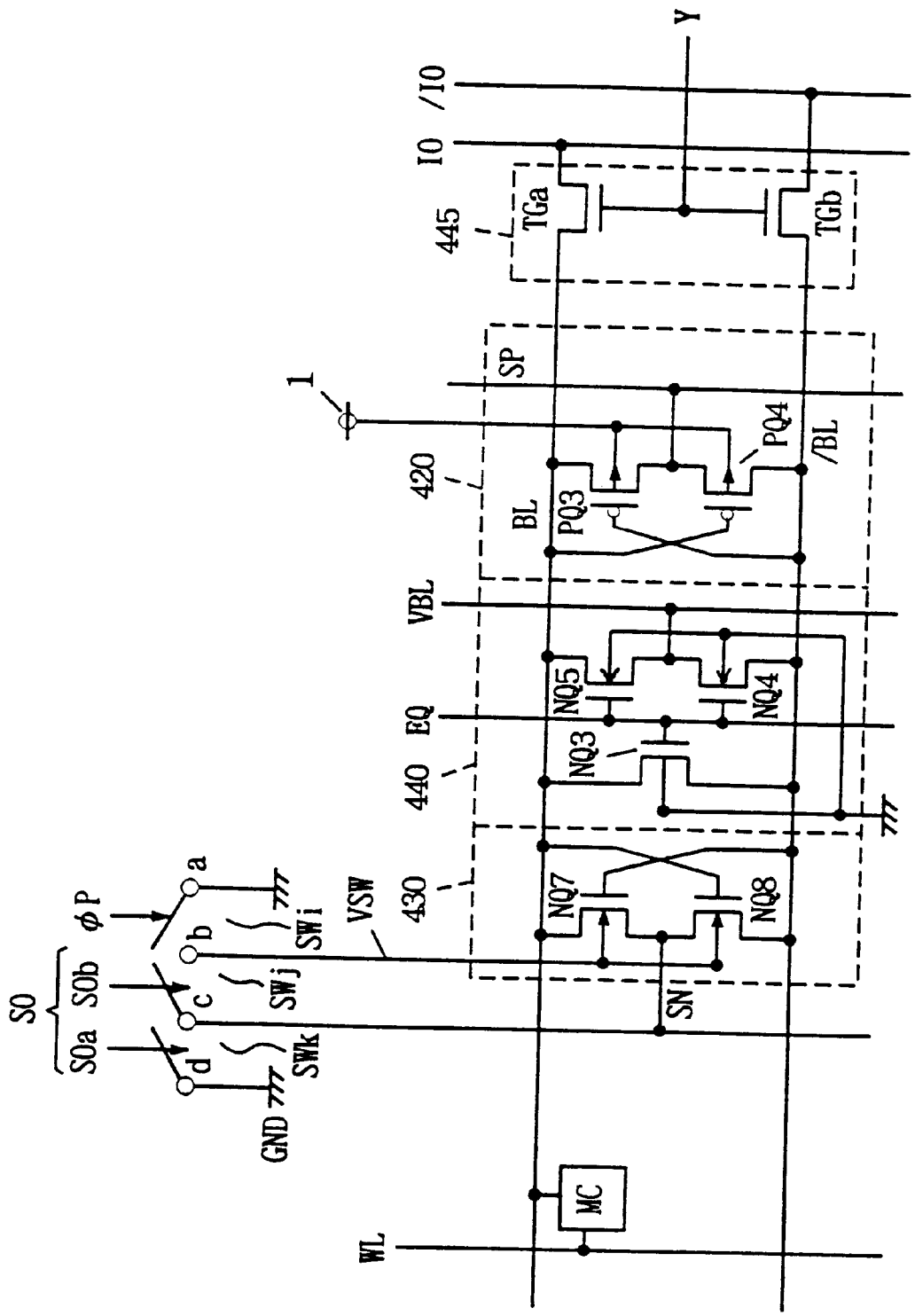
F I G. 44

SELECT SIGNAL

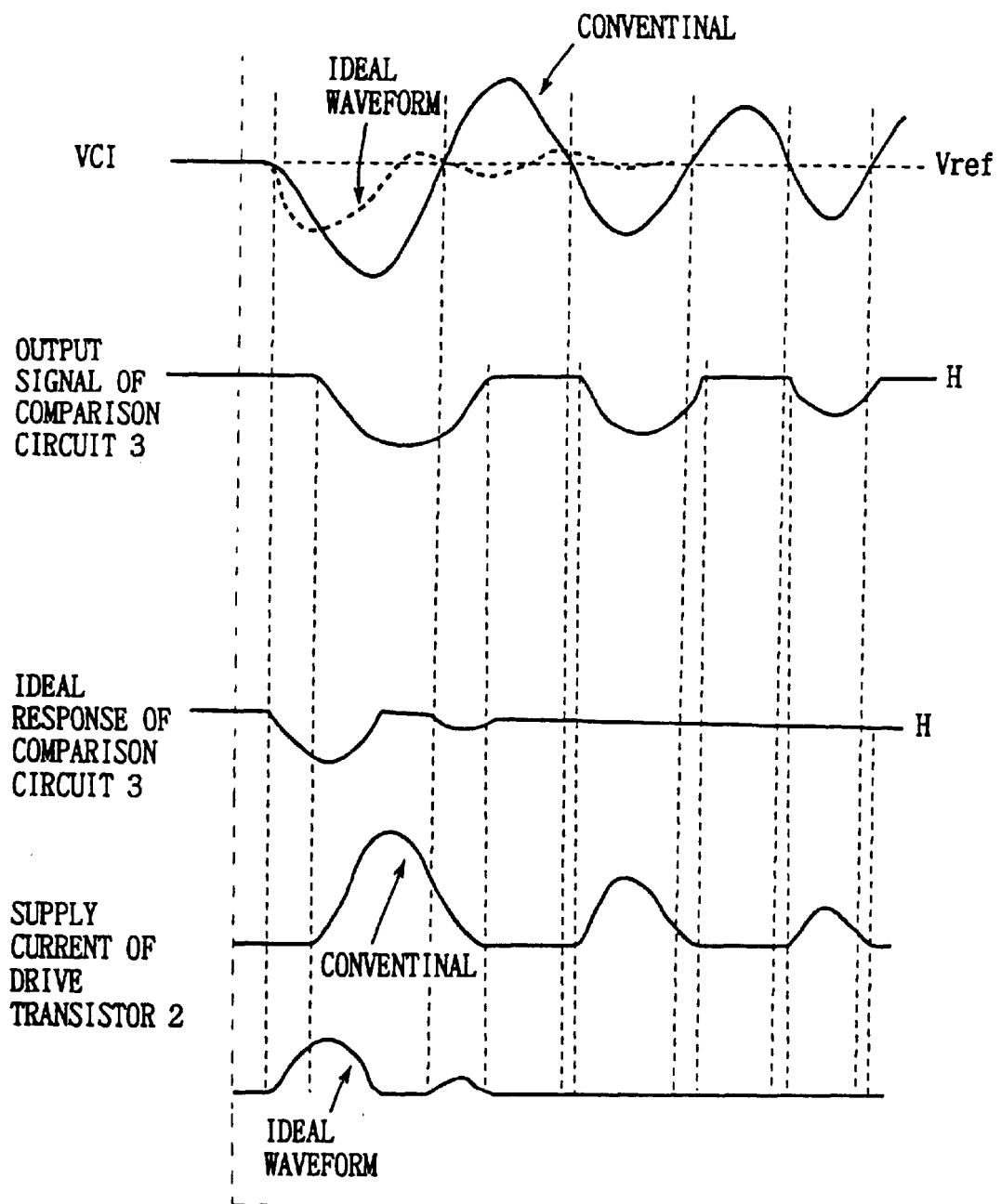

SEMICONDUCTOR MEMORY DEVICE WITH A VOLTAGE DOWN CONVERTER STABLY GENERATING AN INTERNAL DOWN-CONVERTED VOLTAGE

This application is a Divisional of application Ser. No. 09/210,811 filed Dec. 15, 1998, is now U.S. Pat. No. 6,072,742 which is a Continuation of application Ser. No. 08/914,280 filed Aug. 19, 1997 and now U.S. Pat. No. 5,881,014, which is a Divisional of application Ser. No. 08/511,497 filed Aug. 4, 1995 and now U.S. Pat. No. 5,689,460.

BACKGROUND OF THE INVENTION

1. Field of the Invention

The present invention relates to semiconductor memory devices, and more particularly, to a structure for maintaining an internal node, to which voltage of a constant level is transmitted, at a constant voltage level stably. More particularly, the present invention relates to a structure of an internal voltage down converter for down-converting an external power supply voltage to generate an internal power supply voltage.

2. Description of the Background Art

The size of elements in a semiconductor memory device which are the components thereof is reduced in accordance with increase in the density and degree of integration. The internal operating power supply voltage is decreased to improve reliability of such miniaturized elements, to increase the operation speed due to reduction in the signal amplitude on a signal line, and to reduce power consumption. In contrast, miniaturization is not so advanced in processors and logic LSIs (Large Scale Integrated circuit) which are external devices. When a process system is built using a semiconductor memory device, the system power supply voltage is determined depending upon the power supply voltage of such processors. In order to construct a system of a single power source, an external power supply voltage (system power supply voltage) is down-converted in a semiconductor memory device to a desired level to generate an internal power supply voltage. An internal voltage down converter is used to generate this internal power supply voltage.

FIG. 133 schematically shows a structure of a conventional internal voltage down converter. Referring to FIG. 133, an internal voltage down converter 10 includes a reference voltage generation circuit 4 for generating a reference voltage Vref at a constant level from an external power supply voltage VCE and ground voltage VSS, a comparison circuit 3 for comparing an internal power supply voltage VCI on an internal power supply line 5 with reference voltage Vref from reference voltage generation circuit 4, and a p channel MOS transistor 2 responsive to an output signal of comparison circuit 3 to supply current from an external power supply node (pad) to internal power supply line 5. Comparison circuit 3 receives an internal power supply voltage VCI on internal power supply line 5 at its positive input, and reference voltage Vref from reference voltage generation circuit 4 at its negative input. When internal power supply voltage VCI is higher than reference voltage Vref, the potential level of the output signal of comparison circuit 3 rises.

A load circuit 7 using this internal power supply voltage VCI is connected to internal power supply line 5. Load circuit 7 may operate with internal power supply voltage VCI as one operating power supply voltage. Also, load circuit 7 may generate a constant intermediate voltage (for example (VCI+VSS)/2) from internal power supply voltage VCI and ground voltage VSS. Load circuit 7 may also charge a predetermined signal line to the level of internal power supply voltage VCI (functioning as a sense amplifier, for example). Any of the above-described structures is allowed as long as load circuit 7 operates using internal powers supply voltage VCI. An operation of the internal power voltage down converter shown in FIG. 133 will be described hereinafter with reference to the waveform diagram of FIG. 134.

When internal power supply voltage VCI attains a constant voltage level (level of reference voltage Vref), the output signal of comparison circuit 3 attains a predetermined voltage level. When load circuit 7 operates and uses internal power supply voltage VCI, a current flowing from internal power supply line 5 to load circuit 7 causes lowering in the level of internal power supply voltage VCI. In response, the voltage level of the output signal of comparison circuit 3 is lowered, which increases the conductance of a p channel MOS transistor (referred to as "drive transistor" hereinafter) 2. As a result, the current flow from external power supply node 1 to internal power supply line 5 increases. When the current flow via drive transistor 2 becomes greater than that consumed by load circuit 7, the level of internal power supply voltage VCI rises. When the level of internal power supply voltage VCI rises to become higher than reference voltage Vref, the voltage level of the output signal of comparison circuit 3 rises, and the conductance of drive transistor 2 is reduced. As a result, the current flow from drive transistor 2 to internal power supply line 5 is reduced or cut off. More specifically, when internal power supply voltage VCI is greater than reference voltage Vref, drive transistor 2 cuts off or reduces the supplying of current. When internal power supply voltage VCI becomes lower than reference voltage Vref, drive transistor 2 supplies a great amount of current from external power supply node 1 to internal power supply line 5. Thus, internal power supply voltage VCI is maintained at the level of reference voltage Vref.

According to a structure of an internal voltage down converter, a feedback loop is formed of drive transistor 2, internal power supply line 5, and comparison circuit 3. The adjustment of the level of internal power supply voltage VCI on the basis of this feedback includes the following steps:

(a) The output signal of comparison circuit 3 has a constant level at a normal state. It is assumed that this constant level is an H level (for example, the level of external power supply voltage VCE) where drive transistor 2 is completely turned off.

(b) Load circuit 7 operates to consume current from internal power supply line 5, whereby internal power supply voltage VCI is lowered.

(c) Comparison circuit 3 compares internal power supply voltage VCI with reference voltage Vref to reduce the level of an output signal thereof.

(d) Drive transistor 2 is turned on, whereby current is supplied from external power supply node 1 to internal power supply line 5.

(e) The level of internal power supply voltage VCI is restored.

(f) Comparison circuit 3 compares internal power supply voltage VCI with reference voltage Vref, whereby the voltage level of the output signal is increased.

(g) Drive transistor 2 is turned off.

According to the control using such a feedback loop, a change in internal power supply voltage VCI is detected by comparison circuit 3 to adjust the gate potential of drive transistor 2 according to the output signal of comparison circuit 3, whereby the supplying amount of current of drive transistor 2 is adjusted. There is a time delay between a change in internal power supply voltage VCI and adjustment of the supplying amount of current of drive transistor 2. This time delay will be described with reference to FIG. 135 schematically showing the relationship between internal power supply voltage VCI and an output signal of comparison circuit 3.

For the sake of simplification, FIG. 135 shows the state where the output signal of comparison circuit 3 is set at a constant voltage of an H level when internal power supply voltage VCI and reference voltage Vref become equal to each other.

The output signal of comparison circuit 3 is lowered shortly after the reduction in the level of internal power supply voltage VCI. This means that internal power supply voltage VCI is already varied greatly when the supplying amount of current of drive transistor 2 is increased according to the output signal of comparison circuit 3. A great amount of current is supplied from external power supply node 1 to internal power supply line 5 for the purpose of restoring the greatly varied internal power supply voltage VCI to its former voltage level (comparison circuit 3 has a differential amplifier structure, as will be described in detail afterwards). Although internal power supply voltage VCI is restored to the level of reference voltage Vref, the turn off of drive transistor 2 is delayed, so that internal power supply voltage VCI becomes higher than reference voltage Vref. As a result, overshooting occurs in internal power supply voltage VCI. This overshooting causes ringing due to the inductance component in internal power supply line 5, or causes reduction in the level of internal power supply voltage VCI due to the operation of load circuit 7. This state is repeated, and current is supplied from external power supply node 1 to internal power supply line 5 when drive transistor 2 attains an ON state.

In an ideal response waveform, current should be supplied to internal power supply line 5 via drive transistor 2 in immediate response to a change in internal power supply voltage VCI. In this case, the amount of change in internal power supply voltage VCI is small (due to a quick current supply timing), and internal power supply voltage VCI is restored to the former level of reference voltage Vref speedily. The amount of current through drive transistor 2 is small, and overshooting of a significant level will not occur. Internal power supply voltage VCI is restored to the level of reference voltage Vref stably.

By comparing the ideal response waveform and the operation waveform of a conventional internal voltage down converter, it is appreciated that an abrupt change in internal power supply voltage VCI in the structure of a conventional internal voltage down converter causes overshooting/undershooting in internal power supply voltage VCI. Therefore, a stable operation of load circuit 7 cannot be ensured.

Repetition of overshooting/undershooting causes a longer time period of the current supply through drive transistor 2, inducing a problem that the consumed current of the semiconductor device is increased. The time period of the flow of a great current is lengthened due to delay in the response of adjustment in the feedback loop, resulting in the problem that power consumption of the semiconductor device is increased. If the gate width (channel width) of a drive transistor 2 having a great current driving capability is set to a great value in order to compensate for the current consumed by load circuit 7 during operation, the gate capacitance is increased. Therefore, the gate potential of drive transistor 2 will not change immediately in response to the output signal of comparison circuit 3. Thus, the above-described problem of delay in response becomes significant.

Furthermore, when load circuit 7 operates and internal power supply voltage VCI changes abruptly, drive transistor 2 will be turned on in a delayed manner due to the delay in the response. Therefore, the voltage level of internal power supply voltage VCI is lowered significantly.

The above-described problem occurs, not only in an internal voltage down converter, but also in a feedback control system that feeds back an output signal that is to be maintained at a predetermined voltage level to a comparison circuit for controlling the level of the output signal according to the output signal fed back to the comparison circuit.

In operation of a load circuit, current is supplied from a power supply node thereof to an output node, whereby the signal of the output node is driven to the potential level on the power supply node. The voltage of the power supply node is varied due to this consumed current, resulting in generation of a power supply noise. Here, the level of the input and output signals of other circuits to which the current from that power supply node is provided are varied according to a change in the voltage of this power supply node, resulting in a problem that an erroneous operation is generated in the other circuits.

In a sense amplifier that consumes a great amount of current in charging/discharging a bit line during the operation of a semiconductor memory device, a change in the voltage of the power supply node causes reduction in the driving capability of the transistor of the sense amplifier (because the potential difference between the source and gate of a transistor is reduced). As a result, sense operation cannot be carried out at high speed. Furthermore, when this voltage change of the power supply node is great, the logic on the bit line is erroneously detected to cause an erroneous sensing operation.

SUMMARY OF THE INVENTION

In view of the foregoing, an object of the present invention is to provide a semiconductor device that can maintain the voltage level on an internal node at a constant level stably.

A particular object of the present invention is to provide a semiconductor device that can supply internal power supply voltage stably.

Another object of the present invention is to provide a semiconductor device including an internal voltage down converter of low current consumption.

A further object of the present invention is to provide a semiconductor memory device including a sense amplifier that operates stably and speedily.

A semiconductor device according to a first aspect of the present invention includes a comparison circuit for comparing a voltage on a first node and a reference voltage of a predetermined level, a drive element connected between a second node receiving voltage of a predetermined level and the first node for supplying current from the second node to the first node according to an output signal of the comparison circuit, and an amplitude suppression circuit for suppressing change in the amplitude of an output signal of the comparison circuit.

According to a semiconductor device of the above aspect, the amplitude of an output signal of the comparison circuit is limited, and overdrive of the drive element can be suppressed. Therefore, generation of ringing of the voltage on the first node can be prevented. Furthermore, the limitation of the amplitude allows an output signal of the comparison circuit to speedily change according to a change of the voltage of the first node. The voltage level of the first node can be restored to the predetermined level following a change in the voltage of the first node.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 44 shows a structure of the components of a semiconductor device according to a seventh embodiment of the present invention.

FIG. 135 is a signal waveform diagram for explaining the problems of the conventional internal voltage down converter shown in FIG. 133.

DESCRIPTION OF THE PREFERRED EMBODIMENTS

Embodiments of the present invention will be described hereinafter. Although an internal voltage down converter down-converting an external power supply voltage for generating an internal power supply voltage will be described as an embodiment of the present invention, the present invention is also applicable to a circuit that adjusts the voltage level of an internal node that is to be maintained at a predetermined voltage level. First, the characteristic structure of an internal voltage down converter of the present invention will be schematically described in block level, and then a structure of an internal voltage down circuit in a semiconductor memory device as an enablement of the-present invention will be described.

Embodiment 1

Figure 1:
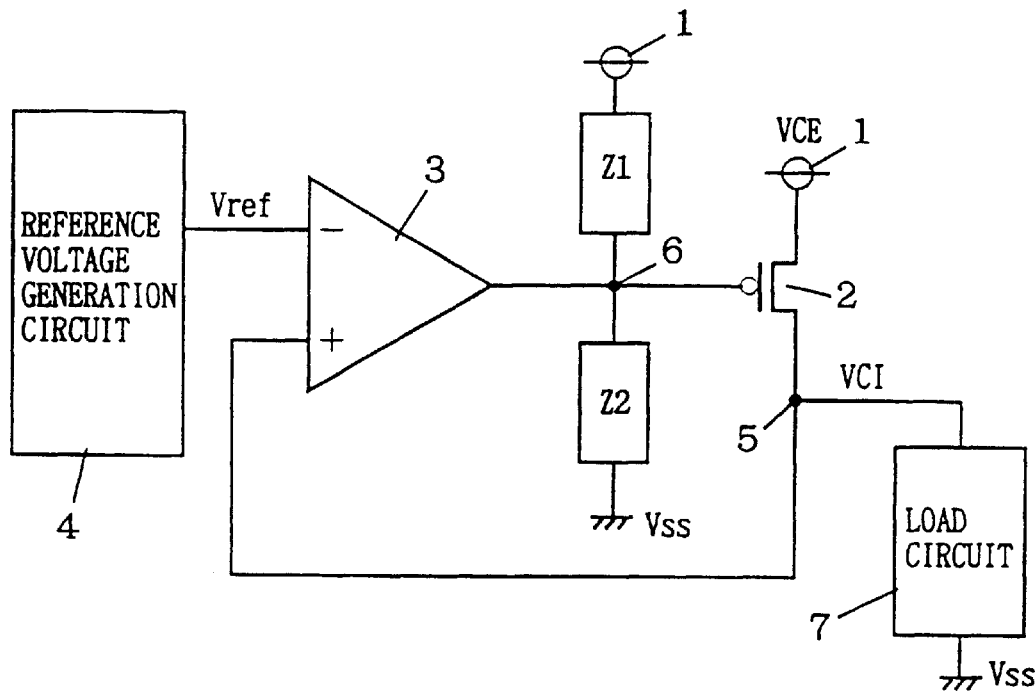
FIG. 1 schematically shows a structure of an internal power supply voltage generation circuit according to a first embodiment of the present invention.

FIG. 1 schematically shows a structure of an internal power supply voltage generation circuit according to a first embodiment of the present invention. Referring to FIG. 1, an internal power supply voltage generation circuit includes a comparison circuit 3 for comparing an internal power supply voltage VCI on an internal power supply line 5 with a reference voltage Vref from a reference voltage generation circuit 4, a resistor element Z1 connected between an external power supply node 1 and an output portion (node 6) of comparison circuit 3, a resistor element Z2 connected between node 6 and a ground voltage supply node (simply referred to as "ground node" hereinafter), and a drive transistor 2 for supplying current from external power supply node 1 to internal power supply line 5 according to the voltage on node 6. External power supply node 1 may be an external power supply line that transmits an external power supply voltage VCE, or a pad receiving an externally applied power supply voltage. The amplitude of an output signal of comparison circuit 3 is limited by resistor elements Z1 and Z2 connected in series between external power supply node 1 and a ground node VSS. An operation of the structure shown in FIG. 1 will be briefly described.

When an output signal of comparison circuit 3 is pulled down towards a low level, current from external power supply node 1 is provided to node 6 via resistor element Z1 to suppress lowering of the voltage of node 6. When the output signal of comparison circuit 3 is pulled up towards an H level, resistor element Z2 conducts current from node 6 to ground node VSS, whereby the voltage rise at node 6 is suppressed. The amplitude limitation of an output signal of comparison circuit 3 by means of resistor elements Z1 and Z2 becomes significant as the offset of the voltage level of the output signal of comparison circuit 3 from the bias voltage applied to node 6 due to the resistor-division by resistor elements Z1 and Z2 becomes greater. More specifically, the gain of comparison circuit 3 (the ratio of the output signal amplitude to the difference between reference voltage Vref and internal power supply voltage VCI) becomes smaller as the amplitude of the output signal of comparison circuit 3 becomes greater. Thus, the oscillation phenomenon of the output signal of comparison circuit 3 in response to an abrupt change in internal power supply voltage VCI can be suppressed. The effect of this amplitude limitation by resistor elements Z1 and Z2 will be described specifically hereinafter.

Figure 2:
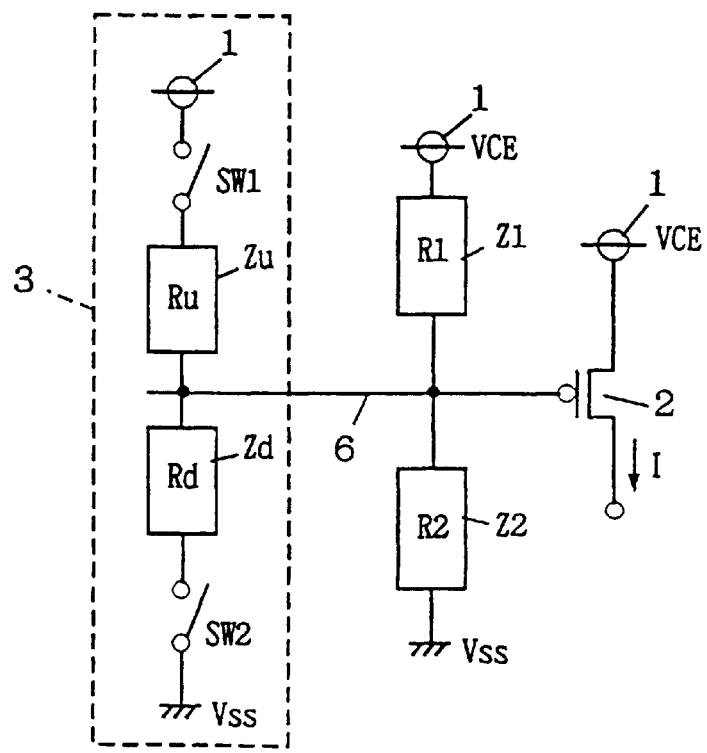
FIG. 2 is a diagram for explaining an operation of the internal power supply voltage generation circuit according to the first embodiment of the present invention.

As shown in FIG. 2, a structure is assumed in which a switching element SW1 and a resistor element Zu are connected between external power supply node 1 and node 6, and a resistor Zd and a switching element SW2 are connected between node 6 and ground node VSS at the output stage of comparison circuit 3. Switching elements SW1 and SW2 are turned on/off in a complementary manner. The structure of the output stage of comparison circuit 3 will be described in detail afterwards. Here, it is assumed that the potential at node 6 is biased to a predetermined voltage by resistor elements Z and Z2 at an initial state. Let the resistance value of resistor elements Z1 and Z2 be R1 and R2, respectively,: then the voltage of node 6 at the initial state is:

$$V(\text{initial}) = R2 \cdot VCE/(R1+R2)$$

When internal power supply voltage VCI becomes lower than a predetermined voltage level (reference voltage Vref), the voltage level of the output signal of comparison circuit 3 is lowered, and the conductance of drive transistor 2 becomes greater than that of the initial state. Therefore, the current flow I through drive transistor 2 is increased. Under this state, in comparison circuit 3, switching element SW2 is turned on, and node 6 is discharged towards ground node VSS. Here, the finally achieved potential of node 6 is:

$$V = (R2//Rd) \cdot VCE/(R1+(R2//Rd))$$

It is to be noted that R2//Rd indicates the combined resistance value of resistor elements Z2 and Zd connected in parallel. The resistance of resistor element Zd is Rd. More specifically, the following relation is obtained:

$$(R2//Rd) = R2 \cdot Rd/(R2+Rd)$$

Therefore, the minimum attainable potential of node 6 is ground voltage VSS in a case where resistor elements Z1 and Z2 are not provided.

When the voltage level of node 6 rises, switching element SW1 is turned on in comparison circuit 3, and node 6 is supplied with current via resistor element Zu to have the potential thereof increased. Here, the maximum attainable potential of node 6 is:

$$V = R2 \cdot VCE/((R1//Ru)+R2)$$

where R1//Ru is the combined resistance of resistor elements Z1 and Zu. When resistor elements Z1 and Z2 are not provided, the finally attaining potential of node 6 is external power supply voltage VCE. Therefore, the voltage level of node 6 varies within a range between the upper limit determined by resistor elements Z1, Z2, and Zu, and the lower limit determined by resistor elements Z1, Z2 and Zd. Ringing in the voltage of node 6 is proportional to L·di/dt, where L is the parasitic inductance accompanying node 6, and di/dt is the changing rate of current (with respect to time) in node 6. The value of di/dt can be reduced by decreasing the voltage amplitude of node 6, which allows suppression of ringing, i.e. oscillation phenomenon, of the output signal of comparison circuit 3. The amplitude limitation by means of the resistor elements also provides an effect set forth in the following.

Figure 3:
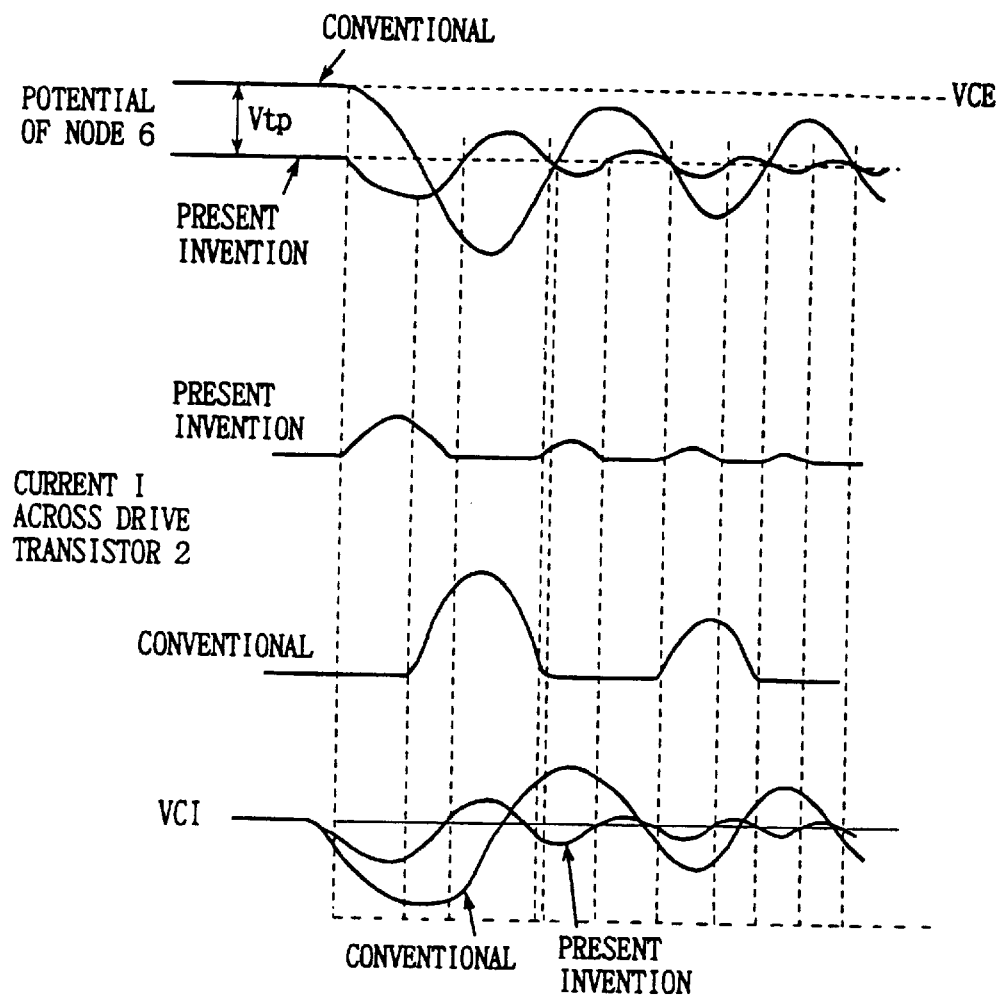
FIG. 3 is a signal waveform diagram showing an operation of the structure shown in FIG. 2.

Here it is assumed that comparison circuit 3 provides an output signal of the level of external power supply voltage VCE in a standby mode when resistor elements Z1 and Z2 are not provided as shown in FIG. 3 (as will be described afterwards, this condition is realized by having comparison circuit 3 of a current mirror type amplifier cut off the constant current source in a standby mode). The voltage of node 6 is set to the level of VCE−Vtp by means of resistor elements Z1 and Z2. Vtp shows the absolute value of the threshold voltage of drive transistor 2. Under this state, drive transistor 2 is turned off, so that current will not be supplied to internal power supply line 5 from external power supply node 1.

A state is considered where a standby cycle is completed and an active cycle is entered, wherein load circuit 7 operates to use internal power supply voltage VCI. An operation of load circuit 7 causes a current flow from internal power supply line 5 to load circuit 7, whereby the level of internal power supply voltage VCI is lowered. In response, the voltage level of an output signal of comparison circuit becomes lower. When the voltage level of node 6 reaches a level below VCI−Vtp, drive transistor 2 is turned on, whereby current is provided from external power supply node 1 to internal power supply line 5. Here, drive transistor 2 supplies current when the output signal of comparison circuit 3 becomes lower than the level of VCE−Vtp in a conventional structure. In contrast, in the present invention, the voltage level of node 6 is set to the voltage level of VCE−Vtp by resistor elements Z1 and Z2. Therefore, drive transistor 2 is turned on immediately in response to a fall in the voltage level of the output signal of comparison circuit 3, whereby current is supplied from external power supply node 1 to internal power supply line 5. When the change in internal power supply voltage VCI is small, current can be supplied onto internal power supply line 5 via drive transistor 2, so that internal power supply voltage VCI can be rapidly restored to a predetermined voltage level (reference voltage level Vref).

In the case of a conventional structure, internal power supply voltage VCI is already changed greatly when drive transistor 2 supplies current. A great amount of current must be supplied from external power supply node 1 to internal power supply line 5 via drive transistor 2 in order to restore the greatly changed internal power supply voltage VCI to the former voltage level. Furthermore, this restore operation is time consuming. This provision of a great current via drive transistor 2 to internal power supply line 5 causes increase in the current changing rate therein to cause the generation of ringing. In response, ringing of a great level is also generated in the output signal of comparison circuit 3 to cause an oscillation phenomenon in the output signal of comparison circuit 3. In contrast, in the present invention, current is provided to internal power supply line 5 via drive transistor 2 when the change in internal power supply voltage VCI is small. This means that the changing rate of internal power supply voltage VCI is small, i.e. the current changing rate on the internal power supply line is low. Therefore, only ringing of a small level is generated.

Thus, the amount of current supplied from external power supply node 1 to internal power supply line 5 during the on period of drive transistor 2 is significantly reduced as compared to that of a conventional structure. Furthermore, since ringing in the internal power supply voltage is small, the time period and number of times of providing current to internal power supply line 5 via drive transistor 2 can be reduced, so that the amount of current supplied from external power supply node 1 to internal power supply line 5 for the purpose of stabilizing internal power supply voltage VCI can be significantly reduced in comparison with that of a conventional structure. More specifically, power consumption of the semiconductor device can be reduced drastically, and an internal power supply voltage VCI can be generated stably at low current consumption.

In contrast to the signal waveform diagram of FIG. 3 in which there is a great delay in response since a change of internal power supply voltage VCI to a change in the potential of node 6, this delay in response can be significantly reduced in the present case.

Figure 4:
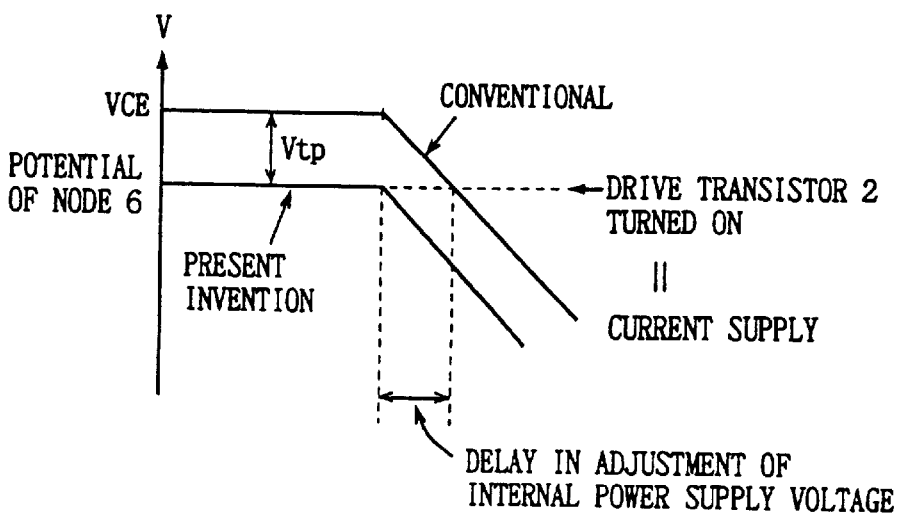
FIG. 4 is a waveform diagram for explaining an operation during a load circuit operation mode of the structure shown in FIGS. 1 and 2.

Referring to FIG. 4, in the conventional case, drive transistor 2 is turned on after the potential of node 6 becomes lower than the predetermined voltage level of VCE−Vtp. Then, current is supplied from external power supply node 1 to internal power supply line 5. In the present invention, reduction in the voltage level of the output signal of comparison circuit 3 immediately causes reduction of the voltage level of node 6. In response, current is supplied from external power supply node 1 to internal power supply line 5 via drive transistor 2 instantaneously. Thus, in response to a change in internal power supply voltage VCI, drive transistor 2 is turned on speedily, so that current can be supplied from external power supply node 1 to internal power supply line 5. The response characteristic is improved significantly.

Relation of Resistance Values of Resistor Elements Z1, Z2, Zu and Zd

Figure 5:
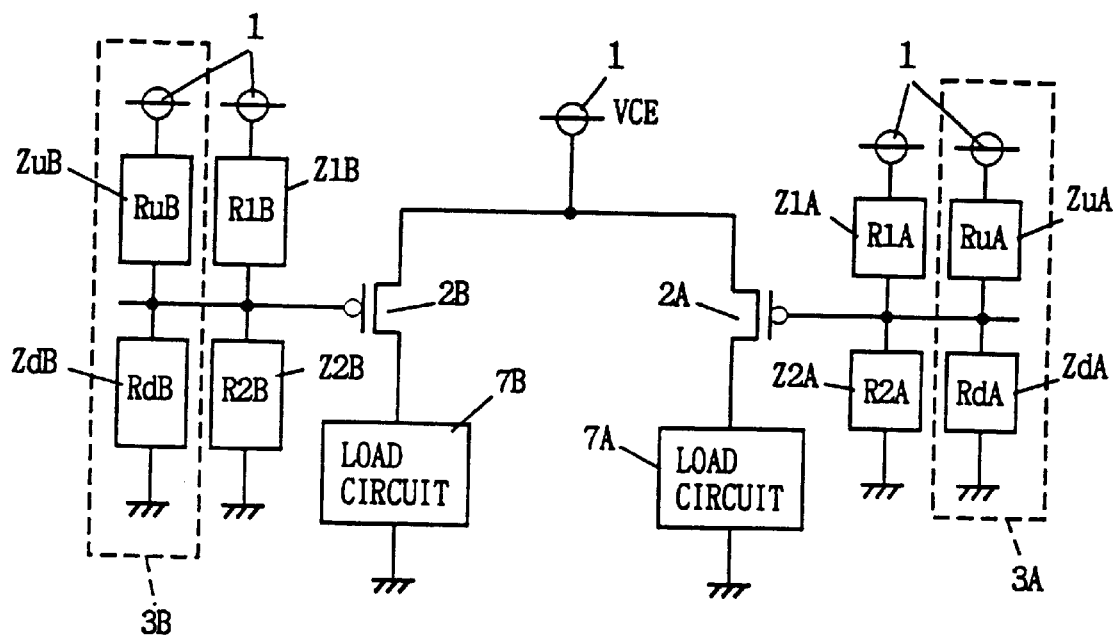
FIG. 5 is a diagram for explaining the correspondence between a resistor element and resistance of an output stage of a comparison circuit according to the structure of FIG. 1.

FIG. 5 schematically shows the relationship of the resistance of resistor elements Z1, Z2, Zu, and Zd. Referring to FIG. 5, two load circuits 7A and 7B are provided. Current is supplied from external power supply node 1 to load circuit 7A via a drive transistor 2A. Current is supplied from external power supply node 1 to load circuit 7B via a drive transistor 2B. Resistor elements Z1A, Z2A, ZuA, and ZdA are provided at the gate (control electrode) of drive transistor 2A. Resistor elements Z1B, Z2B, ZuB, and ZdB are provided at the gate of drive transistor 2B.

Load circuits 7A and 7B differ in their operation and in the operating characteristics. As an example, load circuit 7A is assumed to carry out logical operations of peripheral circuitry in a dynamic semiconductor memory device. Load circuit 7B is assumed to be a memory cell array drive circuit (a circuit for discharging/charging a bit line (sense amplifier)). Internal power supply voltage VCI to be supplied to such load circuits 7A and 7B require the conditions shown in FIG. 6.

Figure 6:
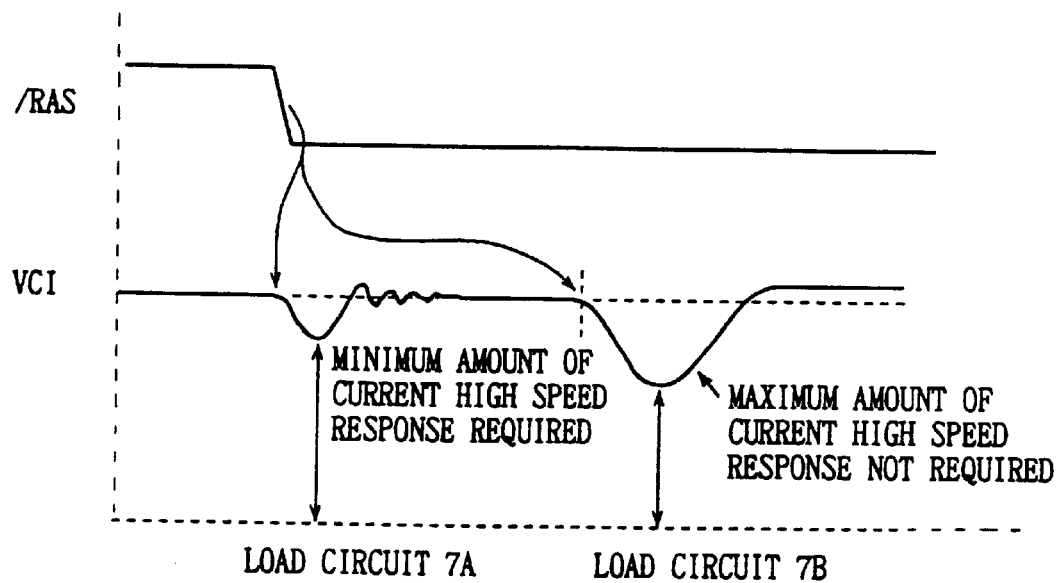
FIG. 6 is a diagram for explaining the advantage of the structure of FIG. 5.

FIG. 6 shows exemplary conditions required for an internal power supply voltage in a dynamic type semiconductor memory device. Referring to FIG. 6, when a row address strobe signal /RAS which is well known in a dynamic semiconductor memory device (DRAM) is pulled down to an L level of an active state, the active operation of this DRAM is initiated. When signal /RAS is rendered active, peripheral circuitry (decoder, buffer circuit, and internal control signal generation circuit) operates (the circuit portion related to a row select operation). These circuits, i.e. load circuit 7A operates at high speed, and the output signal thereof must be set to a stable state speedily. Although the amount of current consumed by load circuit 7A during its operation is small with respect to internal power supply voltage VCI, the voltage level thereof must be restored speedily to its former voltage level (this is because the voltage level of the output signal of load circuit 7A is determined by the voltage level of internal power supply voltage VCI). Internal power supply voltage VCI, when low, must be stored to a predetermined voltage level speedily. It is necessary to set the affect of the amplitude limitation function of resistor elements ZuA and ZdA greater than that of resistor elements Z1A and Z2A. This is because drive transistor 2A must be turned on/off according to the voltage level of output signal of comparison circuit 3 at high speed.

In the case of load circuit 7B such as a sense amplifier that charges/discharges a bit line, current consumption is great since there are a great many number of bit lines to be charged. However, it is to be noted that the charge potential of a bit line only has to attain a constant voltage level within a predetermined time period (prior to initiation of a column select operation) during a sensing operation. Therefore, although the great amount of consumed current must be compensated for, it is not necessary to restore the level of internal power supply voltage VCI to a predetermined voltage at high speed. Therefore, the effect of resistor elements Z1B and Z2B are set greater than those of resistor elements ZuB and ZdB for load circuit 7B. The amplitude of the voltage level of an output signal of comparison circuit 3 is suppressed from increasing.

The amplitude limitation function of resistor elements Z1A, Z2A and resistor elements Z1B, Z2B are effective for both load circuits 7A and 7B. Therefore, high speed response, reduction in current consumption, and suppression of the oscillation phenomenon of an output signal of comparison circuit 3 can be realized reliably. The current driving capability of drive transistors 2A and 2B are adjusted together according to the magnitude of the consumed current of load circuits 7A and 7B. The resistance values of resistor elements Z1, Z2, Zu, and Zd are determined according to the operating characteristics of a load circuit using internal power supply voltage VCI generated by a corresponding drive transistor 2.

By providing a resistor element limiting the amplitude of an output signal of comparison circuit 3 that controls the supplying amount of current of drive transistor 2, the oscillation phenomenon of an output signal of comparison circuit 3 can be suppressed, and an internal power supply voltage VCI of a desired voltage level can be generated stably.

First Specific Structure of Resistor Element

Figure 7:
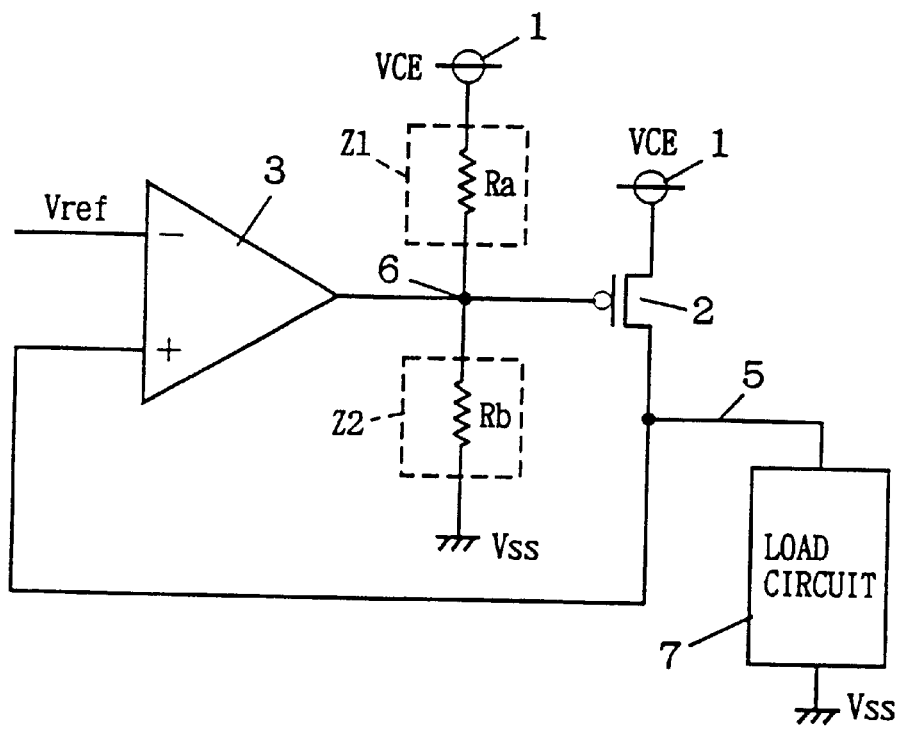
FIGS. 7–11 are first to fifth specific structures, respectively, of an internal power supply voltage generation circuit according to the first embodiment of the present invention.

FIG. 7 shows a specific structure of the resistor element of FIG. 1. In resistor element Z1 of FIG. 7, a resistor Ra formed of polysilicon or an active layer (impurity region formed on the surface of a semiconductor substrate) is used, and a resistor Rb formed similarly of polysilicon or an active layer is used. Although this is the most simple structure realizing resistor elements Z1 and Z2, current flows to ground node VSS during a rise of the voltage level of node 6 via resistor Rb to suppress increase of the voltage of node 6. When the voltage level of node 6 is decreased, the voltage drop of node 6 is suppressed by resistor Ra. Even this simple structure is sufficient to suppress the amplitude of an output signal of this comparison circuit 3.

Second Specific Structure of Resistor Elements Z1 and Z2

Figure 8:
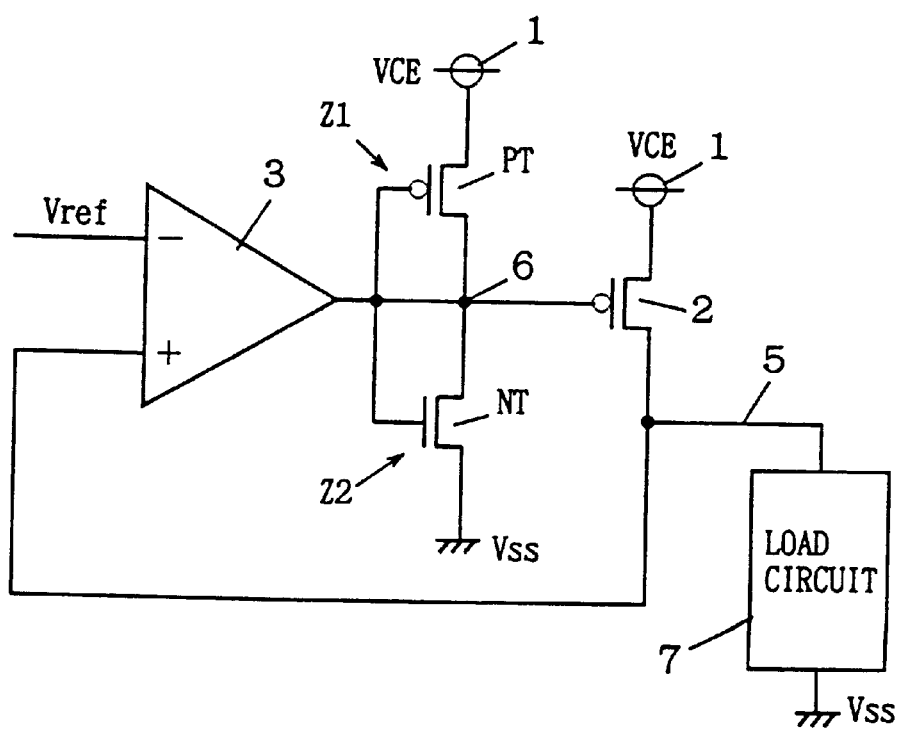

FIG. 8 shows a second specific structure of resistor elements Z1 and Z2 of FIG. 1. Resistor element Z1 of FIG. 8 is formed of a p channel MOS transistor PT having its source connected to an external power supply node 1 and its gate and drain connected to node 6. Resistor element Z2 is formed of an n channel MOS transistor NT having its gate and drain connected to node 6 and its source connected to ground node VSS. MOS transistors PT and NT of substantially equal size function as resistor elements. An MOS transistor generally supplies a drain current of $\beta$ (Vgs−Vth)$^2$ where Vgs is the gate-source voltage and Vth is the absolute value of the threshold voltage. It is to be noted that $\beta$ is a constant that is proportional to W/L which is the ratio of a gate width (channel width) W to a gate length (channel length) L of an MOS transistor. When the change in the voltage level of node 6 becomes great, the current flow via MOS transistors PT and NT vary according to the above-described square characteristics, so that amplitude limitation of an output signal of comparison circuit 3 can be carried out more speedily. More specifically, when the voltage level of node 6 increases according to an output signal of comparison circuit 3, the gate-source voltage of p channel MOS transistor PT is reduced, so that the amount of current flow from external power supply node 1 to node 6 is reduced according to the above equation showing the square characteristics via the p channel MOS transistor PT, whereas the gate-source voltage of n channel MOS transistor NT is increased, so that the current flow from node 6 to ground node VSS increases according to the square characteristics via n channel MOS transistor NT. Thus, the voltage increase of node 6 can be suppressed more speedily. When the voltage level of node 6 decreases, an opposite operation is carried out to limit the voltage drop.

Third Specific Structure of Resistor Elements Z1 and Z2

Figure 9:
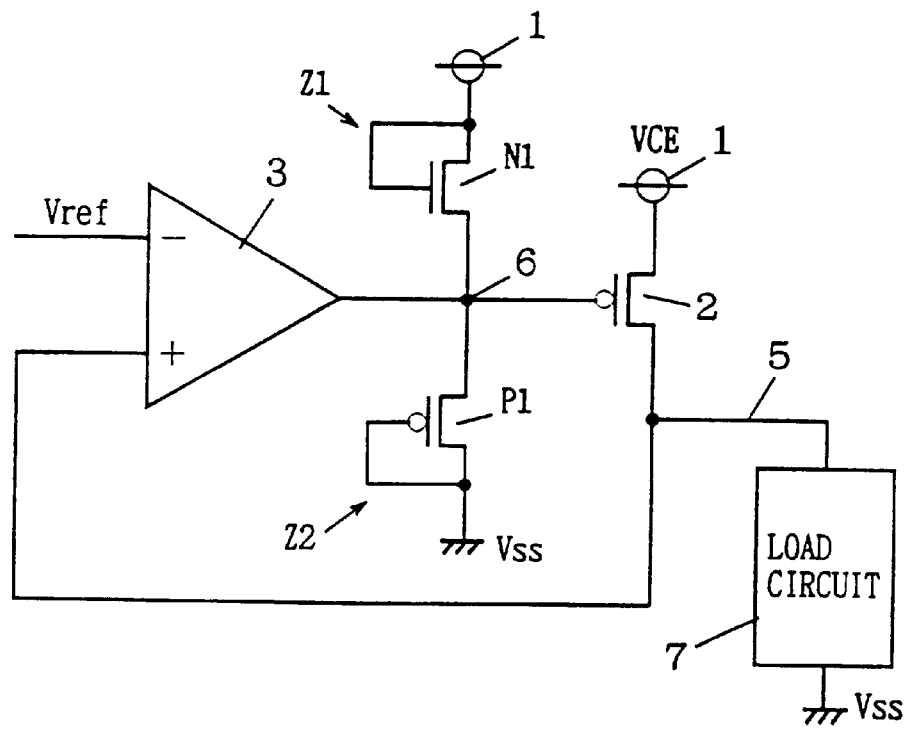

FIG. 9 shows a third specific structure of resistor elements Z1 and Z2 of FIG. 1. Referring to FIG. 9, resistor element Z1 is formed of an n channel MOS transistor N1 having its gate and drain connected to external power supply node 1 and its source connected to node 6. Resistor element Z2 is formed of a p channel MOS transistor P1 having its source connected to node 6, and its gate and drain connected to ground node VSS. When the voltage of node 6 rises, the gate-source voltage of MOS transistor P1 is reduced, so that MOS transistor P1 is turned on more deeply to conduct a greater amount of current. When the voltage of node 6 decreases, MOS transistor N1 is turned on more deeply to supply current to node 6. Similar to the structure shown in FIG. 8, the current flow through MOS transistors N1 and P1 vary according to the square characteristics in response to a change in the voltage level of node 6, i.e., functions as the so-called "variable resistor element". The amplitude of an output signal of comparison circuit 3 can be suppressed speedily.

Fourth specific Structure of Resistor Elements Z1 and Z2

Figure 10:
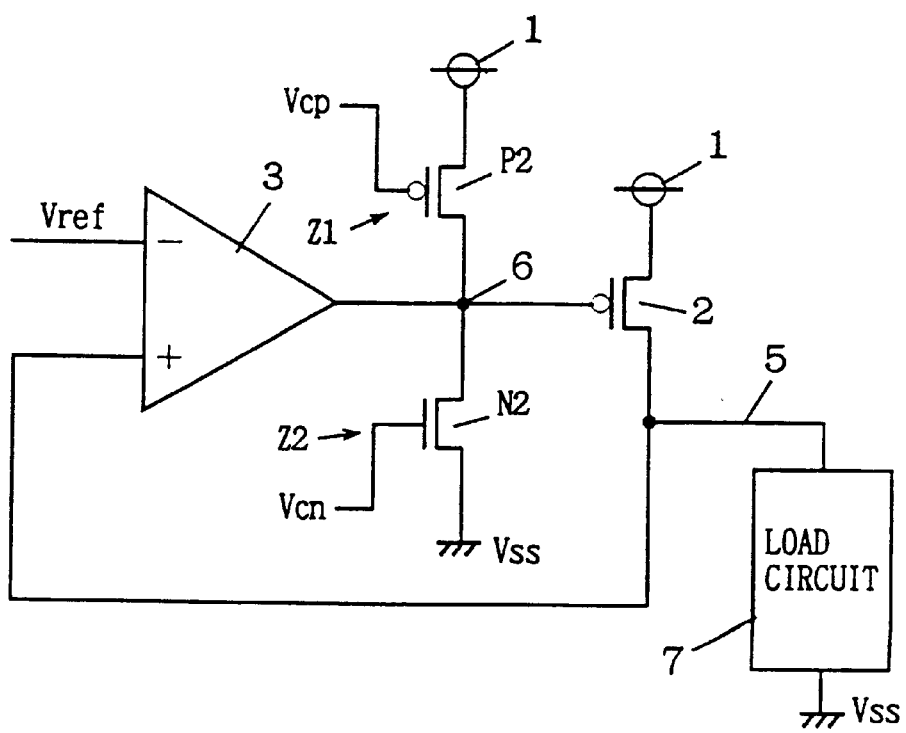

FIG. 10 shows a fourth specific structure of resistor elements Z1 and Z2 of FIG. 1. Referring to FIG. 10, resistor element Z1 is formed of a p channel MOS transistor P2 having its source connected to external power supply node 1, its drain connected to node 6, and its gate receiving a constant voltage Vcp. Resistor element Z2 is formed of an n channel MOS transistor N2 having its drain connected to node 6, its source connected to ground node VSS, and its gate connected to receive a constant voltage Vcn. The gate-source voltage of p channel MOS transistor T2 is constant at the level of Vcp–VCE. Therefore, p channel MOS transistor P2 functions as a resistor element having an ON resistance (channel conductance) determined by the gate voltage Vcp. Similarly, the gate-source voltage of n channel MOS transistor N2 is constant at the level of Vcn–VSS, so that it functions as a resistor element having an ON resistor (channel conductance) determined by that gate voltage Vcn. When MOS transistors P2 and N2 are used, the occupying area can be reduced in comparison with the case where polysilicon or an active layer is used. Furthermore, the resistance value of MOS transistors P2 and N2 can be set to optimum values by gate voltages Vcp and Vcn.

Fifth Specific example of Resistor Elements Z1 and Z2

Figure 11:
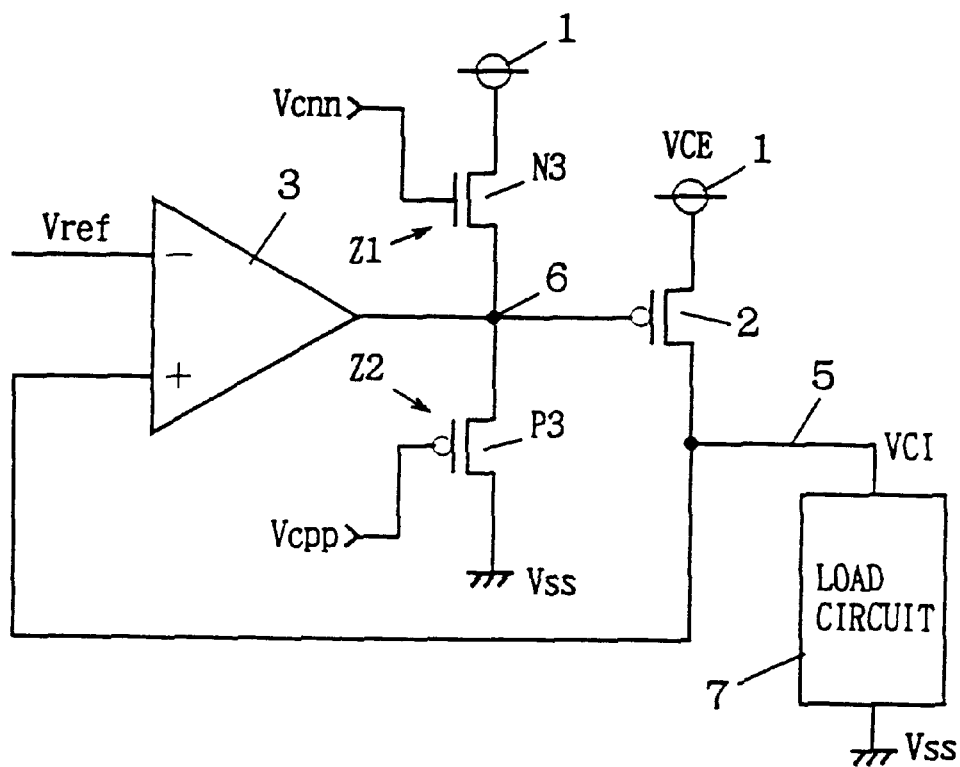

FIG. 11 shows a fifth specific structure of resistor elements Z1 and Z2 of FIG. 1. Referring to FIG. 11, resistor element Z1 is formed of an n channel MOS transistor N3 having its drain connected to external power supply node 1, its gate connected to receive constant voltage Vcnn, and its source connected to node 6. Resistor element Z2 is formed of a p channel MOS transistor 3 having its source connected to node 6, its drain connected to ground node VSS, and its gate connected to receive constant voltage Vcpp. The drain current Ids of the MOS transistor is provided by Ids=$\beta$(Vgs–Vth)$^2$ in a saturation region. More specifically, drain current Ids flows when gate-source voltage Vgs becomes higher than threshold voltage Vth. Therefore, according to the structure shown in FIG. 11, MOS transistor N3 supplies current when the voltage of node 6 becomes lower than Vcnn–Vth. Similarly, p channel MOS transistor P3 conducts a current flow from node 6 to ground node VSS when the voltage level of node 6 becomes higher than Vcpp+Vtp.

Figure 12:
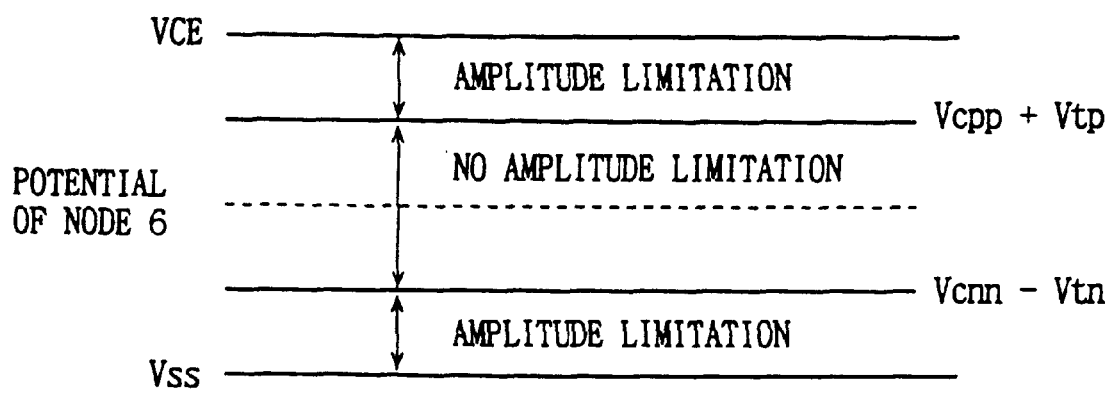
FIG. 12 is a diagram for explaining an operation of the structure shown in FIG. 11.

As shown in FIG. 12, by setting voltages Vcnn and Vcpp to satisfy the relationship of VCE>Vcpp+Vtp>Vcnn–Vtn>VSS, a region in which amplitude limitation is not carried out and a region in which amplitude limitation is carried out can be provided. More specifically, when the voltage of node 6 is between the levels of Vcpp+Vtp and Vcnn–Vtn, MOS transistors N3 and P3 are both turned off, so that the potential of node 6 changes according to an output signal of comparison circuit 3. Therefore, in this region, amplitude limitation of an output signal of comparison circuit is not carried out. When the voltage of node 6 becomes higher than Vcpp+vtp, p channel MOS transistor P3 is turned on, so that current is drawn from node 6 towards ground node VSS. Therefore, the rise of the voltage level of an output signal of comparison circuit 3 is suppressed to carry out amplitude limitation. When the voltage level of node 6 becomes lower than Vcnn–Vtn, MOS transistor N3 is turned on, whereby current is supplied from node 6 to external power supply node 1 to increase the voltage level of node 6. Thus, amplitude limitation is carried out with respect to an output signal of comparison circuit 3.

According to the structure shown in FIG. 11, no amplitude limitation is carried out when the output signal of comparison circuit 3 has a small amplitude. Amplitude limitation is carried out only when the output signal has a great amplitude. Oscillation of an output signal of comparison circuit 3 occurs when internal power supply voltage VCI on internal power supply line 5 changes abruptly to cause a great change in the output signal from comparison circuit 3. By carrying out an amplitude limitation only when there is possibility of generation of an oscillation phenomenon in an output signal of comparison circuit 3, internal power supply voltage can be restored stably at high speed even when there is an abrupt change in internal power supply voltage VCI. When the change in internal power supply voltage VCI is small or the changing rate is gentle, the change of the voltage level of node 6 is small or moderate. In this case, an amplitude limitation of an output signal of comparison circuit 3 is not carried out, so that conductance of drive transistor 2 can be adjusted following a change in internal power supply voltage VCI. Therefore, the varied internal power supply voltage VCI can be restored at high speed stably. According to the present structure, an internal voltage down converter (internal power supply voltage generation circuit) superior in high frequency response (response characteristics when internal power supply voltage VCI suddenly changes) and direct current characteristics (response characteristics when internal power supply voltage VCI changes gently) can be realized.

When MOS transistors are used as resistor elements Z1 and Z2, the relationship between the current driving capability of these MOS transistors and the current driving capability of the MOS transistors which are the component of the output stage carrying out the charging/discharging operation of node 6 of comparison circuit 3 is determined according to the operation speed (operating characteristics) of comparison circuit 7. This is similar to the relationship of resistance values R1, R2, and Ru described with reference to FIG. 5.

Modification 1

Figure 13:
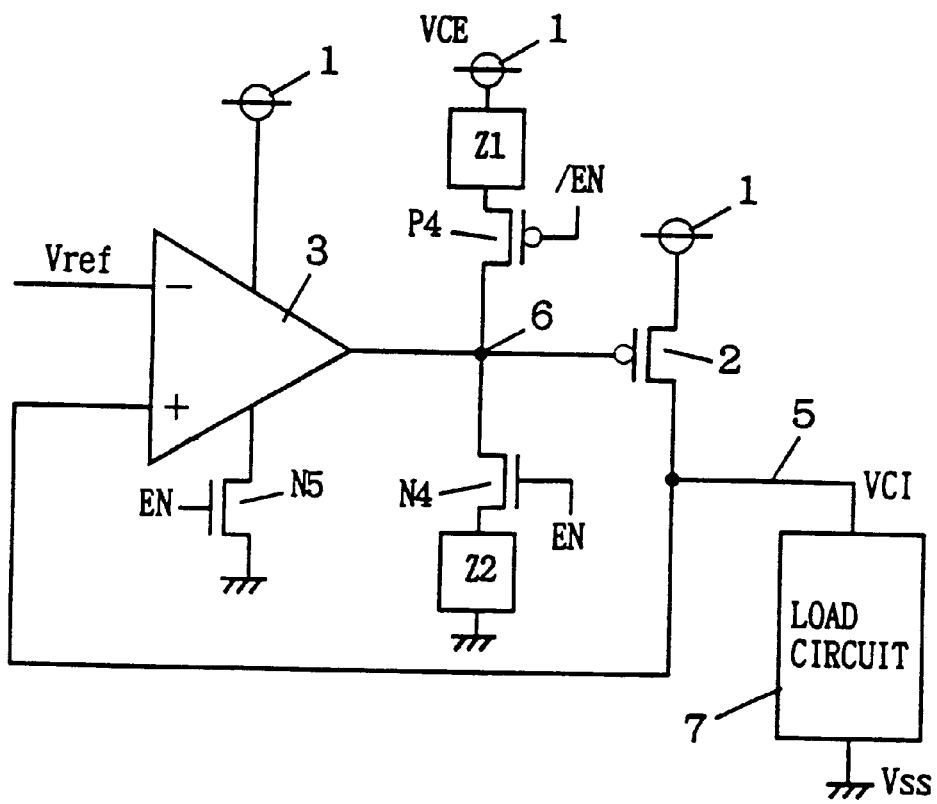
FIG. 13 shows a first modification of the internal power supply voltage generation circuit according to the first embodiment of the present invention.

FIG. 13 shows a structure of a first modification of an internal voltage down converter of the first embodiment. Referring to FIG. 13, a p channel MOS transistor P4 is provided between resistor element Z1 and node 6 to be turned on in response to a period control signal /EN. Also, an n channel MOS transistor N4 is provided between node 6 and resistor element Z2 which is turned on in response to a period control signal EN. Period control signals /EN and EN are complementary to each other. Period control signals /EN and EN are signals determining the operating period of load circuit 7. For example, when the internal voltage down converter is applied to a semiconductor memory device, a row address strobe signal /RAS or a chip select signal /CS can be used as period control signal /EN.

Figure 14:
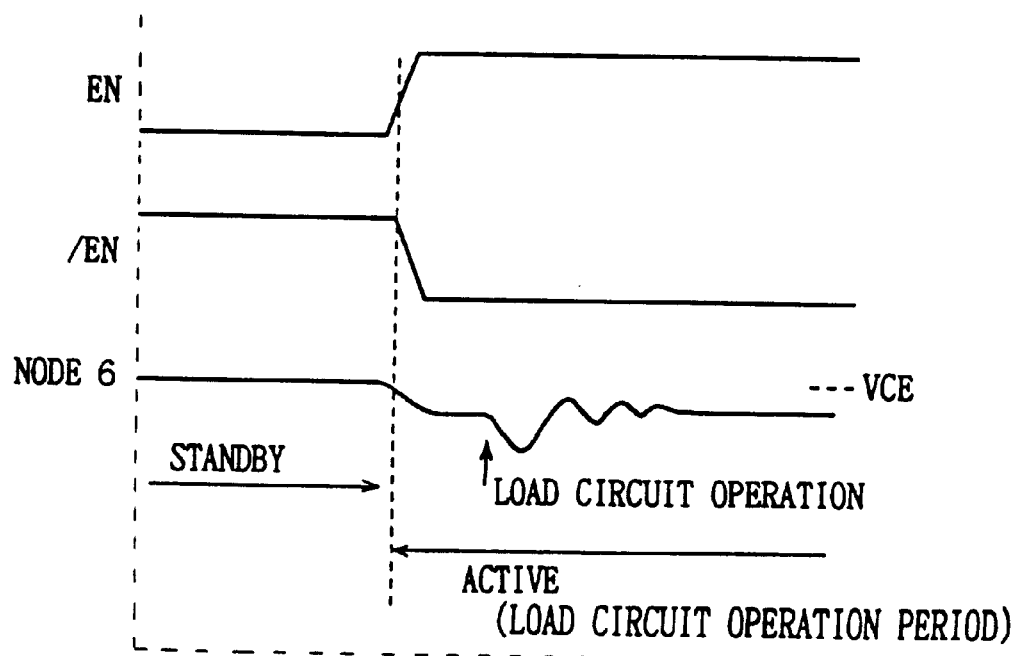
FIG. 14 is a waveform diagram for explaining the operation of the structure shown in FIG. 13.

In FIG. 13, comparison circuit 3 is shown including an n channel MOS transistor N5 as a current source that is activated in response to period control signal EN. Comparison circuit 3 operates with external power supply voltage VCE applied to external power supply node 1 as one operating power supply voltage, to compare reference voltage Vref with internal power supply voltage VCI. Although the structure will be described in detail afterwards, comparison circuit 3 has a structure of a current mirror type differential amplifier. MOS transistor N5 serves as the current source of this current mirror type differential amplifier. When period control signal EN attains an L level of an inactive state, an output signal of comparison circuit 3 attains the level of external power supply voltage VCE. The operation of the structure shown in FIG. 13 will be described with reference to a waveform diagram of FIG. 14.

When period control signal EN and /EN attain an L level and an H level, respectively, of an inactive state, MOS transistors P4 and N4 are both turned off, so that node 6 is isolated from resistor elements Z1 and Z2. In this state, the current path from external power supply node 1 towards ground node VSS is cut off, so that the current consumption is prevented. In comparison circuit 3, MOS transistor N5 is turned off so that comparison circuit 3 is in an inactive state. The output signal of comparison circuit 3 attains the level of external power supply voltage VCE. Therefore, the voltage of node 6 attains the level of external power supply voltage VCE, so that drive transistor 2 is also turned off. This is a standby period in which load circuit 7 does not operate. Therefore, internal power supply voltage VCI is hardly used (only the current consumption by the standby current), so that internal power supply voltage VCI is maintained at approximately a constant level.

When an active cycle is initiated, period control signals EN and /EN are set to an H level and an L level, respectively, of an active state. As a result, MOS transistors P4, N4 and N5 are turned on, so that the voltage of node 6 is lowered due to the resistance division of resistor elements Z and Z2. In this state, drive transistor 2 maintains substantially a turned off state. When load circuit 7 operates in an active cycle, the voltage level of internal power supply voltage VCI is lowered. In response, the voltage of node 6 decreases, so that current flows from external power supply node 1 to internal power supply line 5 via drive transistor 2. The functions of resistor elements Z1 and Z2 during the adjustment of the voltage level of internal power supply voltage VCI is similar to that described before. By connecting resistor elements Z and Z2 to node 6 only during the time period when internal power supply voltage VCI changes by means of period control signals EN and /EN, the consumed current will be reduced in this path. Period control signals EN and /EN may be a signal determining the operation period of load circuit 7. Load circuit 7 does not have to operate directly in response to period control signals EN and /EN. Resistor elements Z1 and Z2 can use any of the specific structures shown in FIGS. 7–11.

Modification 2

Figure 15:
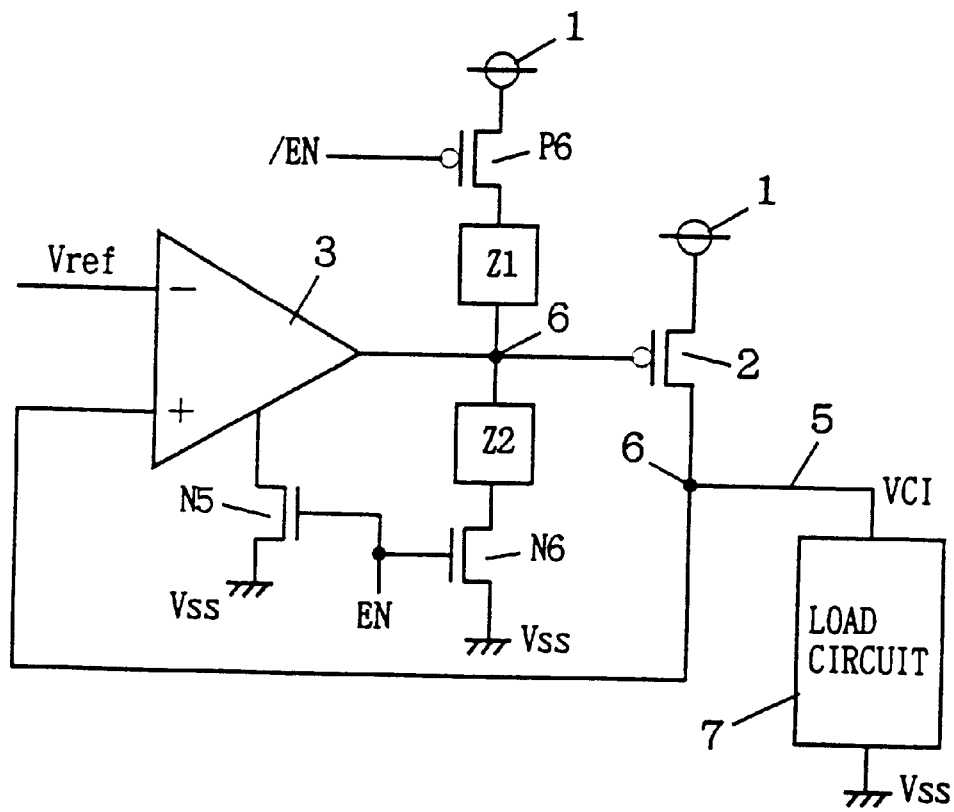
FIG. 15 shows a second modification of the internal power supply voltage generating circuit according to the first embodiment of the present invention.

FIG. 15 shows a second modification of the first embodiment of the present invention. Referring to FIG. 15, a p channel MOS transistor P6 which is turned on in response to period control signal /EN is provided between one terminal of resistor element Z1 and external power supply node 1, and an n channel MOS transistor N6 which is turned on in response to period control signal EN is provided between one end of resistor element Z2 and ground node VSS. Resistor elements Z1 and Z2 have their other ends connected to node 6. The remaining structures are similar to those shown in FIG. 13. As shown in the structure of FIG. 15, when a structure is used where resistor elements Z1 and Z2 are isolated from external power supply node 1 and ground node VSS according to period control signals /EN and EN, current consumption of resistor elements Z1 and Z2 can be prevented during a standby period (inactive period of period control signals EN and /EN) so that reduction in the current consumption of the internal voltage down converter can be realized.

According to the first embodiment of the present invention, the amplitude of an output signal of a control circuit adjusting the supplying amount of current of a drive transistor is suppressed. Therefore, overshooting and undershooting in an internal power supply voltage VCI caused by a great current being transmitted to internal power supply line 5 via drive transistor 2 due to a great change in the gate potential of drive transistor 2 is prevented. Furthermore, internal power supply voltage VCI can be restored to a predetermined level in response to a change of internal power supply voltage VCI.

According to period control signals EN and /EN, current consumption for limiting the amplitude can be reduced by means of a structure in which current is conducted to a resistor element for output amplitude limitation only during a required period.

Embodiment 2

Figure 16:
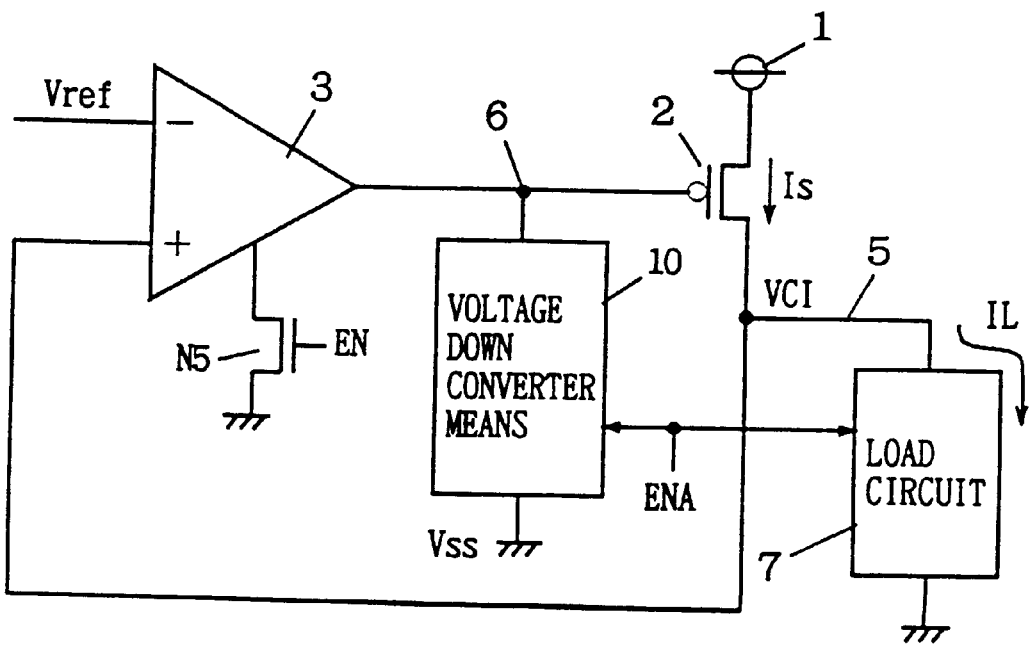
FIG. 16 shows a structure of an internal power supply voltage generation circuit according to a second embodiment of the present invention.
Figure 17:
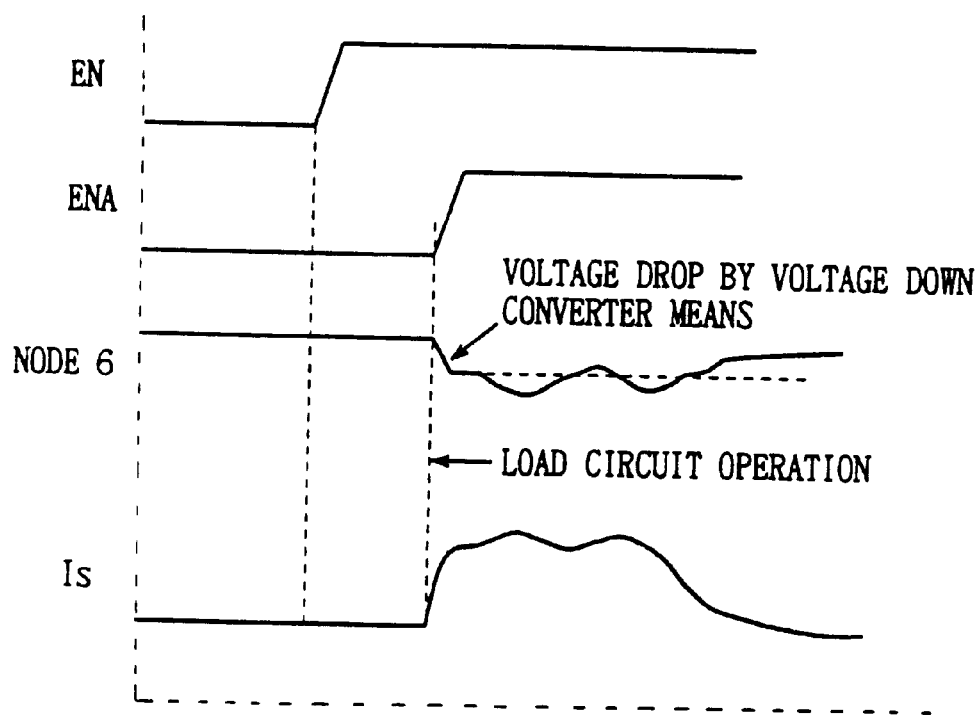
FIG. 17 is a signal waveform diagram for explaining the operation of the circuit shown in FIG. 16.

FIG. 16 shows a structure of a second embodiment of an internal voltage down converter according to the present invention. Referring to FIG. 16, voltage drop means 10 is provided for lowering the voltage level of node 6 in response to an activation control signal ENA. Activation control signal ENA determines the active timing of load circuit 7. The operation of the internal voltage down converter of FIG. 16 will be described with reference to the waveform diagram of FIG. 17. When period control signal (active signal) EN attains an H level of an active state, comparison circuit 3 is activated. In this state, activation control signal ENA is still at an L level of an inactive state, and voltage drop means 10 is in an inactive state. Load circuit 7 does not operate and maintains a standby state. Drive transistor 2 provides a current Is to internal power supply line 5 according to an output signal of comparison circuit 3. Here, a standby current is consumed in load circuit 7.

When activation control signal ENA attains an H level of an active state, voltage drop means 10 is activated, whereby the voltage level of node 6 is lowered. As a result, the conductance of drive transistor 2 becomes greater to increase current Is. Load circuit 7 also activated in response to this activation control signal ENA, whereby current IL is consumed through internal power supply line 5. Current IL consumed by load circuit 7 is provided from drive transistor 2. When current Is supplied by drive transistor 2 is equal to operating current IL consumed by load circuit 7, internal power supply voltage VCI on internal power supply line 5 does not change and maintains a constant value. When current Is supplied by drive transistor 2 become smaller than current IL consumed by load circuit 7, internal power supply voltage VCI on internal power supply line 5 is lowered. In this case, the output signal of comparison circuit 3 is pulled down to an L level, whereby the conductance of drive transistor 2 becomes greater to increase current Is. By lowering the voltage level of node 6 by means of activation of voltage drop means 10 in synchronization with the start of the operation of load circuit 7, an abrupt drop in internal power supply voltage VCI can be prevented, so that internal power supply voltage VCI can be maintained at a constant voltage level.

First Specific Structure of Second Embodiment

Figure 18:
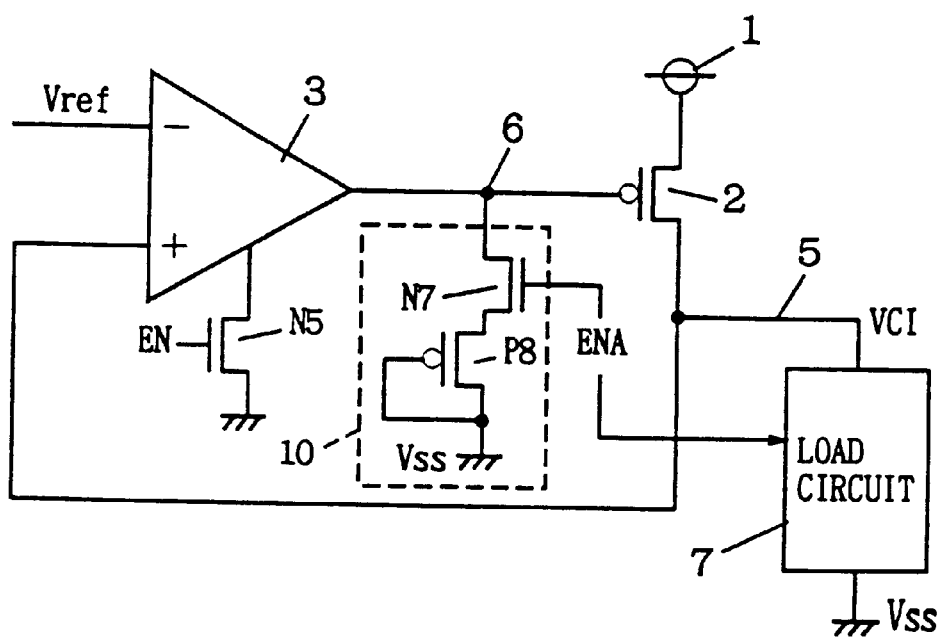
FIGS. 18–20 show first to third specific structures, respectively, of the internal power supply voltage generation circuit according to the second embodiment of the present invention.

FIG. 18 shows a first specific structure of the second embodiment. Referring to FIG. 18, voltage drop means 10 includes an n channel MOS transistor N7 and a p channel MOS transistor P8 connected in series between node 6 and ground node VSS. N channel MOS transistor N7 has one conduction terminal connected to node 6, and its gate supplied with activation control signal ENA. P channel MOS transistor P8 has its source connected to the other conduction terminal of n channel MOS transistor N7, and its gate and drain connected to ground node VSS. The operation will be described hereinafter.

When activation control signal ENA attains an L level of an inactive state, MOS transistor N7 is off, and the voltage level of node 6 is that of an output signal of comparison circuit 3. More specifically, when signal ENA attains an L level, the voltage level of node 6 attains the level of external power supply voltage VCE. When signal ENA attains an H level, the voltage level of node 6 is set to a level determined according to the relationship between internal power supply voltage VCI and reference voltage REF.

When activation control signal ENA attains an H level of an active state, MOS transistor N7 is turned on, and node 6 is discharged via MOS transistors N7 and P8 to be a lower voltage level. In response, the conductance of drive transistor 2 becomes greater, whereby current supplied from external power supply source 1 to internal power supply line 5 is increased. Load circuit 7 is activated in response to activation control signal ENA to consume current from internal power supply line 5. An abrupt increase of the consumed current of load circuit 7 is compensated for by current supplied via drive transistor 2. Therefore, an abrupt change in internal power supply voltage VCI on internal power supply line 5 is suppressed. Here, the current supplied via drive transistor 2 is set smaller than the maximum value of the consumed current of load circuit 7. This is to prevent the voltage level of internal power supply voltage VCI on internal power supply line 5 to be increased unnecessarily due to the current supplied by drive transistor 2 being greater than that consumed by load circuit 7. According to the operation of load circuit 7, a decrease in the voltage level of internal power supply voltage VCI causes reduction in the voltage level of the output signal of comparison circuit 3. In response, the supplied amount of current by drive transistor 2 is also increased.

Since a relatively great current is supplied via drive transistor 2 at the initial state of an operation of load circuit 7, a sudden change in internal power supply voltage VCI is suppressed, and the output signal of comparison circuit 3 follows a change in internal power supply voltage VCI to adjust the conductance of drive transistor 2. When the voltage level of node 6 is lowered, the gate-source voltage of MOS transistor P8 is reduced, so that the current flow via MOS transistor P8 is reduced. As a result, the degree of influence of voltage drop means 10 is reduced, and the conductance of drive transistor 2 is adjusted according to an output signal of comparison circuit 3. According to this structure, an abrupt lowering of an internal power supply voltage VCI is prevented at the initiation of an operation of load circuit 7. Furthermore, overshooting of internal power supply voltage VCI due to an unnecessary great current being supplied can be prevented.

Although a p channel MOS transistor P8 is used in the structure of FIG. 8, an n channel MOS transistor may be used instead.

Second Specific Structure of Voltage Drop Means

Figure 19:
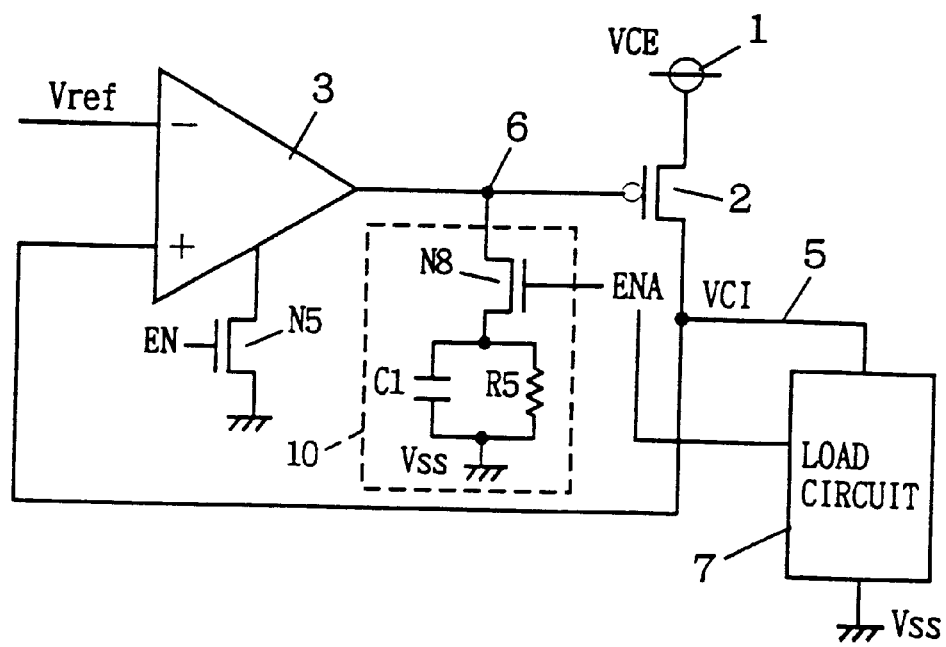

FIG. 19 shows a second specific structure of the voltage drop means of FIG. 16. Referring to FIG. 19, voltage drop means 10 includes a capacitor C1 and a resistor R5 connected in parallel with each other, and an n channel MOS transistor N8 connecting capacitor C1 and resistor R5 to node 6 in response to activation control signal ENA. Resistor R5 has a relatively great resistance to serve as a pull down resistor. More specifically, during an off state of MOS transistor N8, resistor R5 mainly serves to discharge the charged potential of capacitor C1 to the level of ground potential VSS.

When activation control signal ENA attains an L level of an inactive state, MOS transistor N8 is turned off. In this state, one electrode of capacitor C1 is discharged to the level of ground potential VSS via resistor R5. When activation control signal ENA is pulled up to an H level of an active state, MOS transistor N8 is turned on, and node 6 is connected to one electrode of capacitor C1 which has been discharged to the level of ground potential. As a result, current flows from node 6 to capacitor C1, whereby the potential of node 6 is decreased. In response, the conductance of drive transistor 2 becomes greater, so that the amount of supplied current from external power supply node 1 to internal power supply line 5 is increased.

The lowered potential of node 6 is charged by an output signal of comparison circuit 3. One electrode of capacitor C1 is charged to a level substantially equal to that of the output signal of comparison circuit 3. Here, the voltage drop function of resistor R5 is neglected. As a result, drive transistor 2 can supply a great amount of current to internal power supply line 5 in response to current that is suddenly increased at the initiation of an operation of load circuit 7. Therefore, an abrupt lowering of internal power supply voltage VCI can be prevented. During an operation of load circuit 7, internal power supply voltage VCI can be restored at high speed to a constant voltage level according to an output signal of comparison circuit 3 following a change in internal power supply voltage VCI.

When activation control signal ENA attains an inactive state, MOS transistor N8 is turned off, whereby the voltage charged at one electrode of capacitor C1 is discharged again to the level of ground voltage VSS via resistor R5.

According to the structure shown in FIG. 19, the potential of node 6 can be lowered instantaneously at the start of an operation of load circuit 7. The conductance of drive transistor 2 can be adjusted so as to compensate for the consumed current of load circuit 7 which suddenly increases. Therefore, an abrupt change in internal power supply voltage VCI can be suppressed, and internal power supply voltage VCI can be generated stably.

Specific Structure 3 of the Second Embodiment

Figure 20:
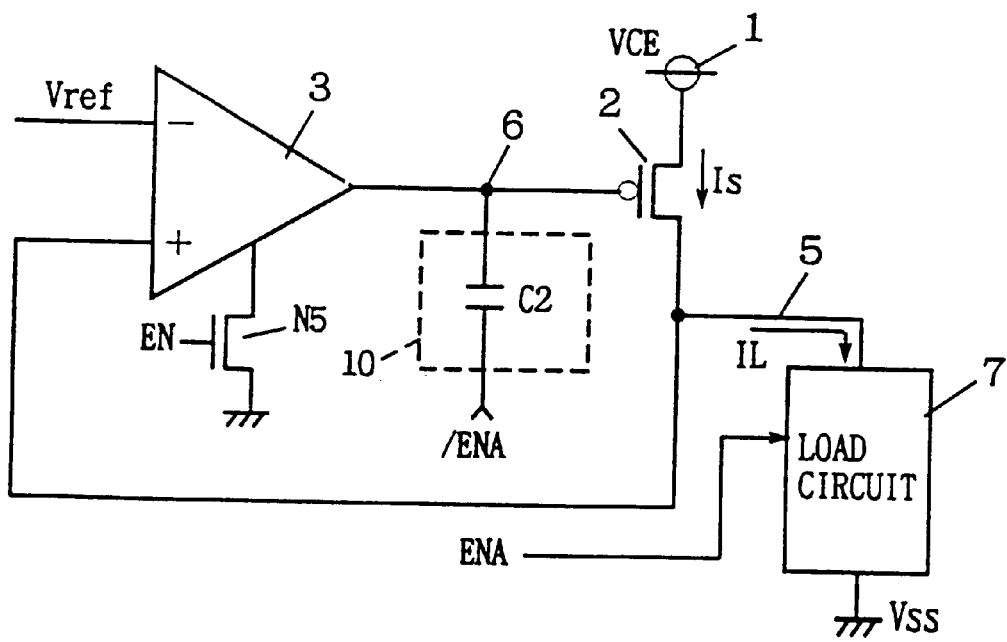
Figure 21:
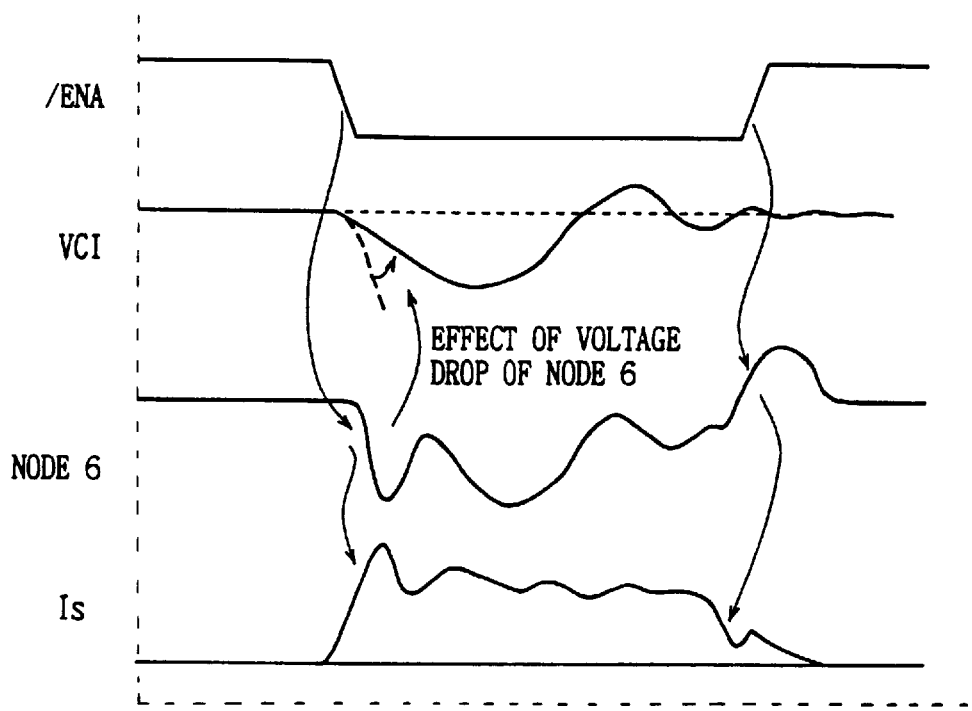
FIG. 21 is a signal waveform diagram showing an operation of the structure shown in FIG. 20.

FIG. 20 shows a third specific structure of the voltage drop means shown in FIG. 16. Referring to FIG. 20, voltage drop means 10 includes a capacitor C2 having one electrode receiving activation control signal /ENA and another electrode connected to node 6. Activation control signal /ENA is complementary to signal ENA, and attains an L level when active. Capacitor C2 transmits activation control signal /ENA to node 6 by capacitive coupling. The operation of the structure of FIG. 20 will be described hereinafter with reference to the waveform diagram of FIG. 21.

When activation control signal /ENA attains an H level, node 6 attains a voltage level according to the level of the output signal of comparison circuit 3. When load circuit 7 operates in response to activation control signal ENA, activation control signal /ENA attains an L level of an active state to lower the voltage level of node 6. The degree of lowering of the voltage of node 6 is determined according to the parasitic capacitance at node 6 and the capacitance of capacitor C2. The conductance of drive transistor 2 is increased according to the voltage drop of node 6, whereby the current flow Is via drive transistor 2 suddenly increases. Then, load circuit 7 operates, so that current IL also increases. Therefore, an abrupt lowering of internal power supply voltage VCI is suppressed (the change in internal power supply voltage VCI is shown in a broken line in FIG. 21), whereby internal power supply voltage VCI changes gently. Subsequent to the voltage level of node 6 lowered due to the capacitive coupling of capacitor C2, node 6 is restored to a voltage level corresponding to that of the output signal of comparison circuit 3. Drive transistor 2 has its conductance adjusted according to the output signal of comparison circuit 3. Thus, an abrupt change in internal power supply voltage VCI due to consumed current IL at the start of an operation of load circuit 7 can be suppressed, so that internal power supply voltage VCI can be maintained at a predetermined level stably.

The structure shown in FIG. 20 includes the following advantages. More specifically, when the operation of load circuit 7 is completed and activation control signal /ENA is driven to an H level of an inactive state, the voltage level of node 6 increases due to the capacitive coupling of capacitor C2. This causes an abrupt reduction in the conductance of drive transistor 2. As a result, the supplied current Is is reduced. When the operation of load circuit 7 is ceased and the consumed current IL suddenly decreases, current Is provided by drive transistor 2 can be reduced. Thus, supply of excessive current from external power supply node 1 to internal power supply line 5 can be suppressed, which suppresses overshooting of internal power supply voltage VCI on internal power supply line 5. As a result, the voltage level of internal power supply voltage VCI can be prevented from changing after the operation of load circuit 7 is completed.

In the structure shown in FIGS. 18–20, signals EN and ENA may be the same signal. For example, in a DRAM, a row address strobe signal RAS or a column address strobe signal CAS can be used as signals EN and ENA. Internal power supply voltage VCI for a column select circuit or a row select circuit in a high frequency operation can be maintained at a constant voltage level.

Fourth Specific Structure of Voltage Drop Means

Figure 22:
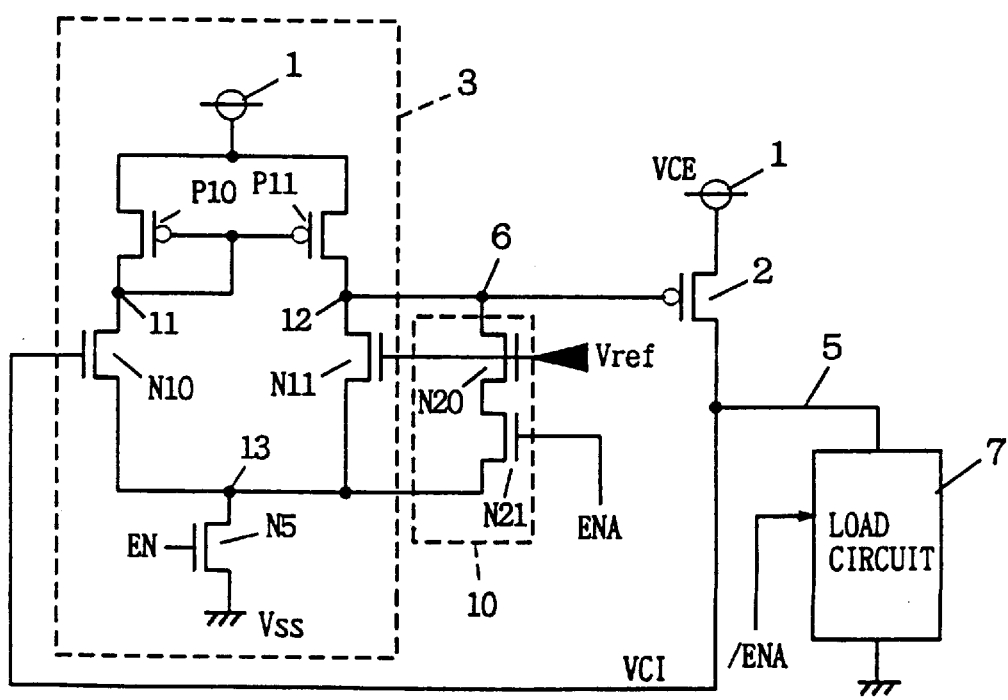
FIG. 22 shows a fourth specific structure of the internal power supply voltage generation circuit according to the second embodiment of the present invention.

FIG. 22 shows a fourth specific structure of the voltage drop means of FIG. 16. FIG. 22 also illustrates a specific structure of comparison circuit 3. Comparison circuit includes a p channel MOS transistor P10 having one conduction terminal connected to external power supply node 1, and another conduction terminal connected to node 11, a p channel MOS transistor P11 having one conduction terminal connected to external power supply node 1 and the other conduction terminal connected to node 12, an n channel MOS transistor N10 having one conduction terminal connected to node 11, another conduction terminal connected to node 13, and its gate connected to internal power supply line 5, an n channel MOS transistor N11 having one conduction terminal connected to node 12, the other conduction terminal connected to node 13, and its gate supplied with reference voltage Vref, and an n channel MOS transistor N5 connected between node 13 and ground node VSS for receiving period control signal EN at its gate. MOS transistor P10 has its gate connected to the gate of p channel MOS transistor P11 and to node 11. MOS transistors P10 and P11 form a current mirror circuit.

Figure 23:
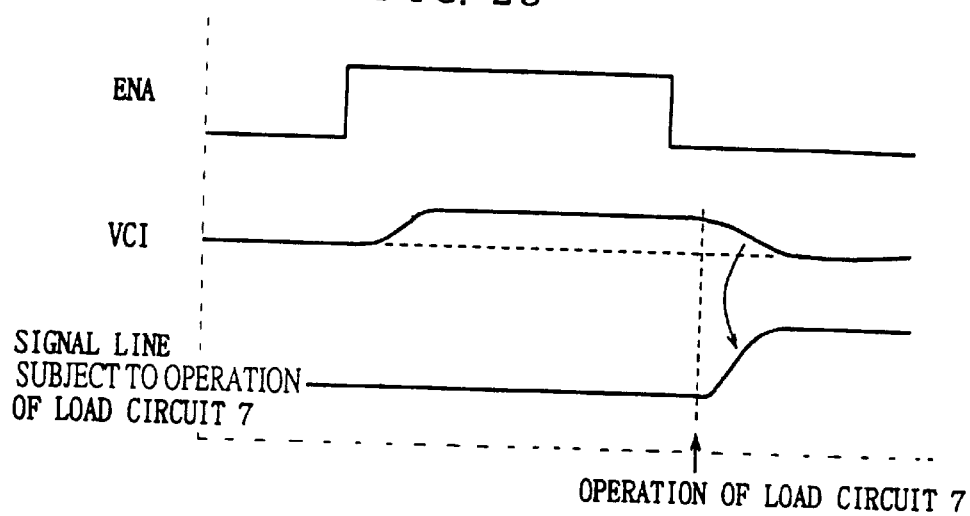
FIG. 23 is a signal waveform diagram for explaining the operation shown in FIG. 22.

Voltage drop means 10 includes n channel MOS transistors N20 and N21 connected in series between nodes 6 and 13. Reference voltage Vref is applied to the gate of n channel MOS transistor N20. Activation control signal ENA is applied to the gate of MOS transistor N21. Load circuit 7 is activated in response to signal /ENA complementary to activation control signal ENA to carry out a predetermined operation. The operation thereof will be described with reference to the waveform diagram of FIG. 23. It is to be noted that control signal EN is not shown in FIG. 23.

When control signal EN attains an L level of an inactive state, MOS transistor N5 is turned off, and the current path from node 6 to ground node VSS and the current path from external power supply node 1 to ground node VSS are cut off. Therefore, node 6 is charged to the level of external power supply voltage VCE via MOS transistor P11 (since there is no current flow between external power supply node 1 and node 12, the voltage level of node 12 becomes equal to that of external power supply node 1).

When signal EN attains an H level of an active state, MOS transistor N5 is turned on to activate comparison circuit 3. The voltage level of node 6 is set to a level corresponding to the relationship between reference voltage Vref and internal power supply voltage VCI. Here, an activation control signal ENA at an L level is considered. When internal power supply voltage VCI is higher than reference voltage Vref, the conductance of MOS transistor N10 becomes higher than that of MOS transistor N11. Therefore, the current flow via MOS transistor N10 becomes greater than the current flow via MOS transistor N11. Current is supplied to MOS transistor N10 via MOS transistor P10. The voltage level of node 11 is lowered according to an increase of the current supplied by MOS transistor P10 (according to the square characteristics of the drain current of the MOS transistor). In response, the gate potential of MOS transistor P11 is lowered, so that a mirror current of the current flow via MOS transistor P10 is conducted to MOS transistor P11. When MOS transistors P10 and P11 are equal in size, current of the same level is conducted to MOS transistors P10 and P11. As a result, the potential of node 12 is increased, so that the conductance of drive transistor 2 is reduced.

In contrast, when internal power supply voltage VCI is smaller than reference voltage Vref, the conductance of MOS transistor N10 becomes smaller than that of MOS transistor N11. As a result, the current supplied by MOS transistor P10 is reduced. In response, the current supplied by MOS transistor P11 is reduced, and node 12 is discharged via MOS transistors N11 and N5. As a result, the voltage level thereof is reduced. This causes increase in the conductance of drive transistor 2. More specifically, comparison circuit 3 has a structure of a current mirror type differential amplifier that differentially amplifies reference voltage Vref and internal power supply voltage VCI.

The case where activation control signal ENA attains an H level of an active state will be considered. Here, MOS transistor N21 is turned on, and MOS transistors N11 and N20 are connected in parallel with each other. This is equivalent to the case where the supplied amount of current of MOS transistor N11 is doubled equivalently, and the case where comparison circuit 3 has an offset with respect to reference voltage Vref, when MOS transistors N11 and N20 have the same size. More specifically, the current flow I via MOS transistor N10 is supplied via MOS transistor P10. Current I of the same amount is supplied to MOS transistors N11 and N20 via MOS transistor P11. Therefore, MOS transistors N11 and N20 only conduct a current of I/2 respectively. When the conductance of MOS transistor N10 becomes higher than that of MOS transistors N11 and N20, drive transistor 2 is turned off if the current flow via MOS transistor N10 is set to a value two times that when signal ENA attains an inactive state. Therefore, the voltage level of internal power supply voltage VCI at which level drive transistor 2 is turned off rises. This is equal to an increase in reference voltage Vref. Similarly, when the conductance of MOS transistor N10 is set smaller than the conductance of MOS transistors N11 and N20, node 12 (node 6) is discharged via MOS transistors N11 and N20, so that the potential of node 6 is reduced at two times the speed in the case when signal ENA is inactive. Then, current is supplied to internal power supply line 5. Therefore, internal power supply voltage VCI is maintained at a voltage level higher than reference voltage Vref.

Even when internal power supply voltage VCI and reference voltage Vref are equal, ½ of the current flow via MOS transistor N10 is conducted respectively via MOS transistors N11 and N20, and a current below the current driving capability of MOS transistors N11 and N20 is supplied. The voltage level of node 12 is lowered, and conductance of drive transistor 2 is reduced. Therefore, current is supplied to internal power supply line 5 so that the voltage level of internal power supply voltage VCI increases. Thus, it can be appreciated that internal power supply voltage VCI is maintained at a level higher than reference voltage Vref. More specifically, internal power supply voltage VCI is maintained at a level provided where a current of a magnitude of two times the current that can be conducted by MOS transistors N11 and N20 respectively is conducted via MOS transistor N10.

When activation control signal ENA attains an inactive state and activation control signal /ENA attains an active state, load circuit 7 operates, so that the voltage level of a predetermined signal line is increased to the level of internal power supply voltage VCI. Here, load circuit 7 uses the current from internal power supply line 5 precharged to a voltage level higher than that of a normal level and charges an internal signal line to a predetermined voltage level. Therefore, the level of internal power supply voltage VCI is prevented from being reduced below a predetermined voltage level. As a result, an abrupt reduction in the voltage level of internal power supply voltage VCI is prevented, so that internal power supply voltage VCI can be maintained stably at a predetermined voltage level. A specific structure of the load circuit shown in FIG. 22 will be described hereinafter.

Figure 24A:
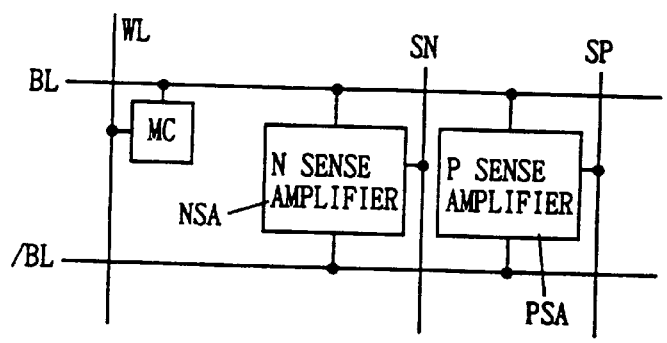
FIGS. 24A and 24B are diagrams for explaining the application of the circuit shown in FIG. 22.

FIG. 24A schematically shows a structure of a sense amplifier unit of a DRAM. In this DRAM, an N sense amplifier NSA formed of n channel MOS transistors and a P sense amplifier PSA formed of p channel MOS transistors are provided for a pair of bit lines BL and /BL connected to a column of memory cells. N sense amplifier NSA is activated in response to a sense amplifier activation signal SN to discharge the potential of one of bit lines BL and /BL at a lower potential to ground voltage VSS. P sense amplifier PSA responds to a sense amplifier activation signal SP to charge one of bit lines BL and /BL at a higher potential to the level of internal power supply voltage VCI.

Figure 24B:
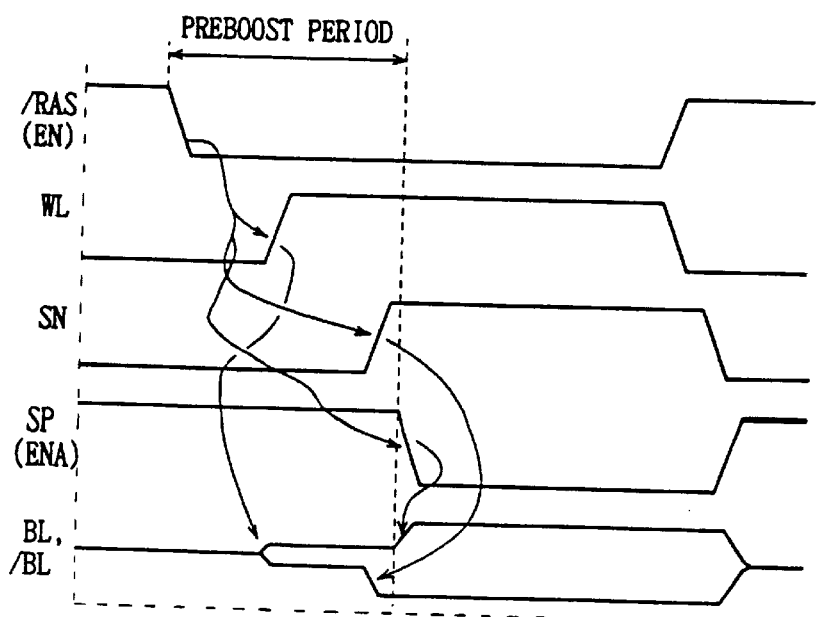

FIG. 24A shows a state where a memory cell MC is arranged corresponding to the crossing of a word line WL and a bit line BL. As well known, memory cell MC of a DRAM includes a memory capacitor storing charge, and an access transistor responsive to a signal potential on word line WL to connect this memory capacitor to a corresponding bit line BL. P sense amplifier PSA corresponds to load circuit 7 shown in FIG. 22. Sense amplifier activation signal SP corresponds to activation control signal ENA. The operation of the circuit shown in FIG. 24 will be described with reference to the waveform diagram of FIG. 24B.

In a DRAM, when row address strobe signal /RAS (corresponding to signal EN shown in FIG. 20) is pulled down to an L level, a memory cycle is initiated. In response to a fall of signal /RAS, a row select operation is carried out within DRAM, whereby the potential of a selected word line WL rises. Here, sense amplifier activation signals SN and SP are still at an L level and an H level, respectively, of an inactive state. When the potential of the selected word line WL increases, data in memory cell MC connected to the selected word line WL is transmitted to a corresponding bit line BL (or /BL).

Then, sense amplifier activation signal SN is pulled up to an H level of an active state, whereby N sense amplifier NSA is activated. The potential of one of bit lines BL and /BL of a low potential is discharged to the level of ground voltage VSS. Then, sense amplifier activation signal SP is activated, whereby the potential of the bit line of a high potential is increased to the level of internal power supply voltage VCI. During the time period starting at a fall of signal /RAS till an activation of sense amplifier activation signal SP, power supply voltage VCI on internal power supply line 5 is higher than the level of the predetermined voltage. As a result, charging of a bit line BL or /BL is carried out at high speed (internal power supply voltage VCI is boosted). Also, an abrupt reduction in internal power supply voltage VCI during an operation of P sense amplifier PSA can be prevented. Thus, a stable sensing operation can be ensured.

In the above description, the preboosting period where internal power supply voltage VCI is boosted higher than a predetermined voltage level is from an activation of signal /RAS up to an activation of sense amplifier activation signal SP. This period may be set appropriately according to the structure of an applied semiconductor memory device. A preboost period may be set starting from completion of an equalizing operation of bit lines BL and /BL (when bit lines BL and /BL are equalized in response to a fall of signal RAS, or when the potential of bit lines BL and /BL are equalized according to an equalize signal generated by a fall of signal RAS at completion of a memory cycle) to continue until the activation (restore operation) of sense amplifier PSA. It may be set to be a period during an inactive state of sense amplifier PSA.

According to the second embodiment of the present invention, the gate potential of a drive transistor is forcively lowered to increase the conductance of the drive transistor only during the period when the voltage level of internal power supply voltage VCI is expected to be lowered at the operation of the load circuit. Therefore, the internal power supply voltage can be stably maintained at a predetermined voltage level even when the load circuit operates and the consumed current amount increases suddenly.

Embodiment 3

Figure 25:
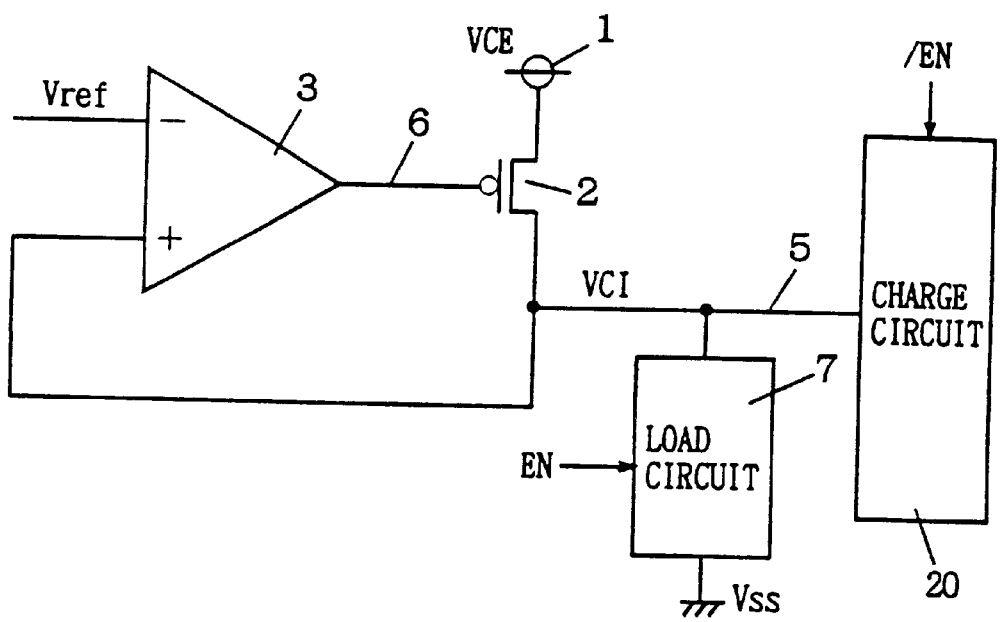
FIG. 25 schematically shows a structure of an internal power supply voltage generation circuit according to a third embodiment of the present invention.

FIG. 25 shows a structure of a third embodiment of an internal power supply voltage generation circuit according to the present invention. Referring to FIG. 25, in addition to drive transistor 2, a charge circuit 20 for charging internal power supply line 5 to a predetermined voltage level in response to activation control signal /EN is connected to internal power supply line 5. Activation control signal/EN is complementary to activation control signal EN provided to load circuit 7. More specifically, charge circuit 20 charges the voltage of internal power supply line 5 to the level of a predetermined voltage (a voltage level higher than internal power supply voltage VCI) when load circuit 7 is inactive.

As in embodiments 1 and 2, internal power supply line 5 is maintained at a constant voltage level by drive transistor 2 and comparison circuit 3. The operation of the structure shown in FIG. 25 will be described with reference to the waveform diagram of FIG. 26.

When activation control signal EN attains an L level of an inactive state, activation control signal/EN attains an H level of an active state. Charge circuit 20 charges internal power supply line 5 to the level of a predetermined voltage (a voltage level higher than internal power supply voltage VCI). Here, comparison circuit 3 may be maintained at an inactive state by activation control signal EN. Even when the circuit 3 is rendered active, internal power supply voltage VCI on internal power supply line 5 is higher than reference voltage Vref, so that comparison circuit 3 maintains drive transistor 2 at a turned off state.

Figure 26:
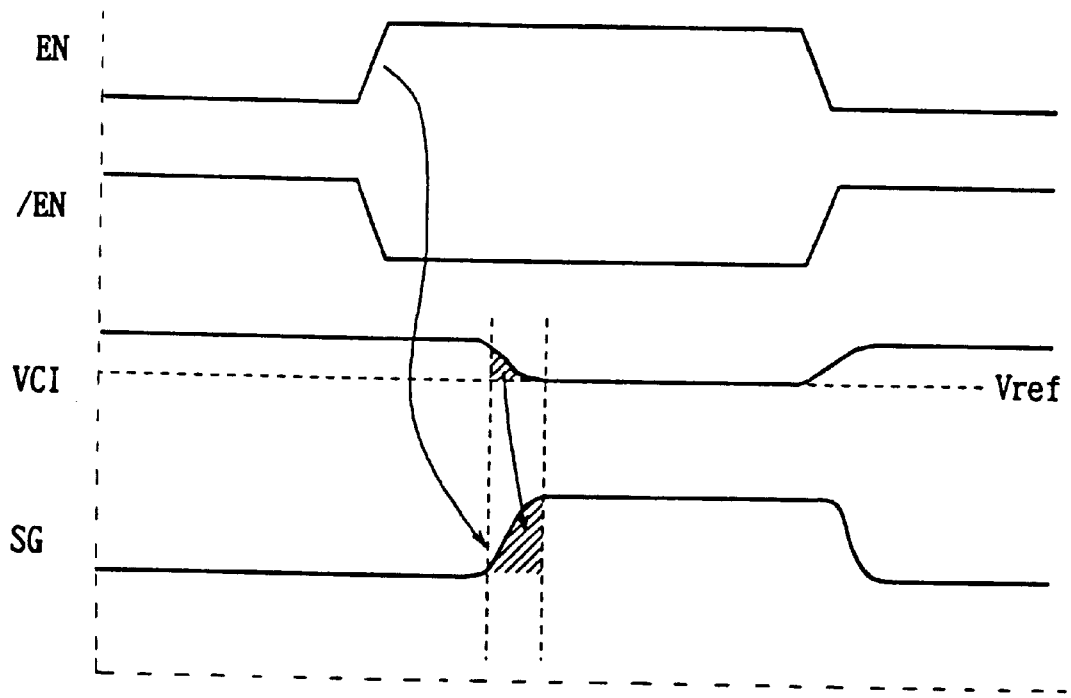
FIG. 26 is a signal waveform diagram showing an operation of the circuit shown in FIG. 25.

In response to activation control signal EN attaining an H level of an active state, load circuit 7 operates at a predetermined timing. Charge circuit 20 does not charges internal power supply line 5 since signal /EN attains an inactive state. In response to this activation control signal EN, load circuit 7 operates at a predetermined timing, whereby the voltage level of a signal line SG to be driven is increased to the level of internal power supply voltage VCI. This voltage increase of signal line SG is realized by supplying current from internal power supply line 5 to signal line SG. Here, the voltage level of internal power supply line 5 is set higher than a predetermined voltage level (Vref) by charge circuit 20. Even when current is suddenly flown from internal power supply line 5 to signal line SG during an operation of load circuit 7 (during a charging operation of signal line SG), an abrupt reduction in the level of power supply voltage VCI during the operation of load circuit 7 can be prevented since power supply voltage VCI on internal power supply line 5 is lowered from the boosted level charged by charge circuit 20. Particularly, if the amounts of current used in the hatched regions of FIG. 26 are identical to each other, internal power supply voltage VCI is reduced only down to the level of the predetermined reference voltage Vref during the operation of load circuit 7. Therefore, internal power supply voltage VCI can be prevented from being lower than reference voltage Vref. During an active period of load circuit 7, power supply voltage VCI on internal power supply line 5 is maintained at a constant voltage level (Vref) by comparison circuit 3 and drive transistor 2.

When activation control signal EN attains an inactive state again and the operation of load circuit 7 is completed, charge circuit 20 is activated again in response to control signal /EN, whereby internal power supply line 5 is charged to a level higher than the constant voltage level (Vref).

According to the above series of operations, internal power supply line 5 is charged to a predetermined voltage level higher than reference voltage Vref by charge circuit 20. Therefore, an abrupt reduction in the level of internal power supply voltage VCI caused by the operating current consumed right after initiation of the operation of load circuit 7 can be prevented.

Figure 27:
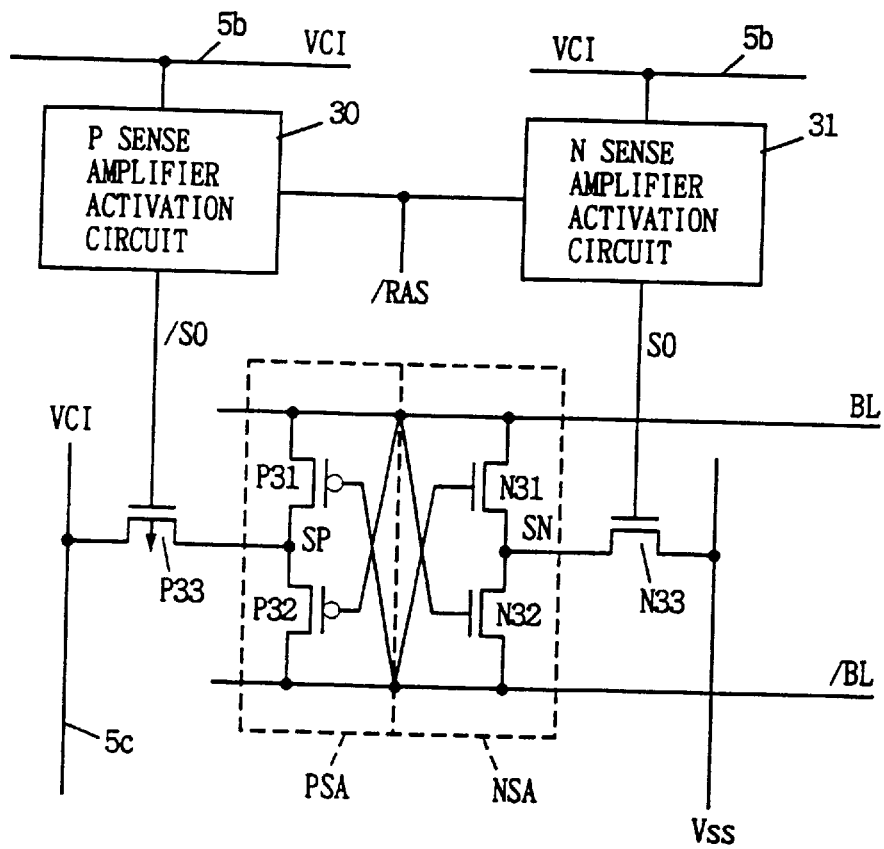
FIG. 27 shows a specific example of the load circuit of the structure shown in FIG. 25.

FIG. 27 shows a specific structure of the load circuit of FIG. 25. In FIG. 27, a sense amplifier and an sense amplifier activation circuit in a DRAM are shown as the load circuit. Similar to the structure of FIG. 24, the DRAM includes a P sense amplifier PSA formed of p channel MOS transistors P31 and P32, and an N sense amplifier NSA formed of n channel MOS transistors N31 and N32 with respect to bit lines BL and /BL. MOS transistors P31 and P32 have their gates and drains cross-coupled, and MOS transistors N31 and N32 have their gates and drains cross-coupled.

In order to activate P sense amplifier PSA, there are provided a P sense amplifier activation circuit 30 responsive to signal /RAS to render active sense amplifier activation signal /SO at a predetermined timing (L level), and a p channel MOS transistor P33 responsive to sense amplifier activation signal /SO to transmit internal power supply voltage VCI on internal power supply line 5c to P sense amplifier PSA. Similarly for N sense amplifier NSA, there are provided an N sense amplifier activation circuit 31 responsive to signal /RAS to render sense amplifier activation signal SO active (H level) at a predetermined timing, and an n channel MOS transistor N33 responsive to sense amplifier activation signal SO to transmit ground potential VSS to N sense amplifier NSA. Internal power supply voltage VCI is supplied to P sense amplifier activation circuit 30 and N sense amplifier activation circuit 31 via internal power supply line 5a and internal power supply line 5b, respectively. Internal power supply lines 5a and 5b may be of the same interconnection, or alternatively, of different interconnections. The operation of the structure shown in FIG. 27 will now be described with reference to the waveform diagram of FIG. 28.

When signal /RAS attains an H level, internal power supply lines 5a, 5b and 5c are charged to a voltage level higher than reference voltage Vref by a charge circuit not shown. Bit lines BL and /BL are precharged to a level of a predetermined intermediate voltage (VCI/2).

When signal /RAS attains an L level, a row select operation is initiated. More specifically, a word line not shown is selected, whereby data of a memory cell connected to the selected word line is transmitted onto bit line BL or /BL. The voltage of one bit line changes according to the data stored in the selected memory cell, and the other bit line maintains precharge voltage ½ VC.

N sense amplifier activation circuit 31 renders sense amplifier activation signal SO to an active state of an H level at a predetermined timing. As a result, MOS transistor N33 is turned on, and one of bit lines BL and /BL of a lower potential is discharged to the level of ground voltage VSS. N sense amplifier activation circuit 31 uses internal power supply voltage VCI on internal power supply line 5b (uses the current from internal power supply line 5b to supply the same onto the signal line transmitting sense amplifier activation signal SO) when sense amplifier activation signal SO is rendered active. Since power supply voltage VCI on internal power supply line 5b is charged to a level higher than a predetermined voltage level (Vref level), sense amplifier activation signal SO can be pulled up at high speed, and the voltage level of power supply voltage VCI on internal power supply line 5b is prevented from decreasing suddenly.

Then, P sense amplifier activation signal 30 renders sense amplifier activation signal /SO to an active state of an L level. MOS transistor P33 is turned on, whereby internal power supply voltage VCI on internal power supply line 5C is transmitted to one of bit lines BL and /BL of a higher potential (i.e. current is supplied from internal power supply line 5c to the bit line of the higher potential). Since power supply voltage VCI on internal power supply line 5c is boosted to a voltage level higher than a constant voltage level (Vref level), generation of internal power supply voltage VCI lower than reference voltage Vref can be prevented. Therefore, a sudden reduction in internal power supply voltage VCI is prevented, and the bit line of the higher potential is charged to the level of internal power supply voltage VCI at high speed by the high voltage.

Then, a column select circuit not shown is operated according to signal ICAS (Column Address Strobe Signal), and data writing/reading is carried out with respect to a memory cell on the selected column.

At the completion of a memory cycle, signal /RAS is rendered inactive at an H level, and sense amplifier activation signals /SO and SO attain an inactive state of an L level and an H level, respectively. Here, the charging of internal power supply lines 5a, 5b and 5c are initiated again. The start and end of a charging operation of internal power supply lines 5a and 5c may be determined by signal /RAS, or alternatively by sense amplifier activation signals /SO, SO.

Figure 28:
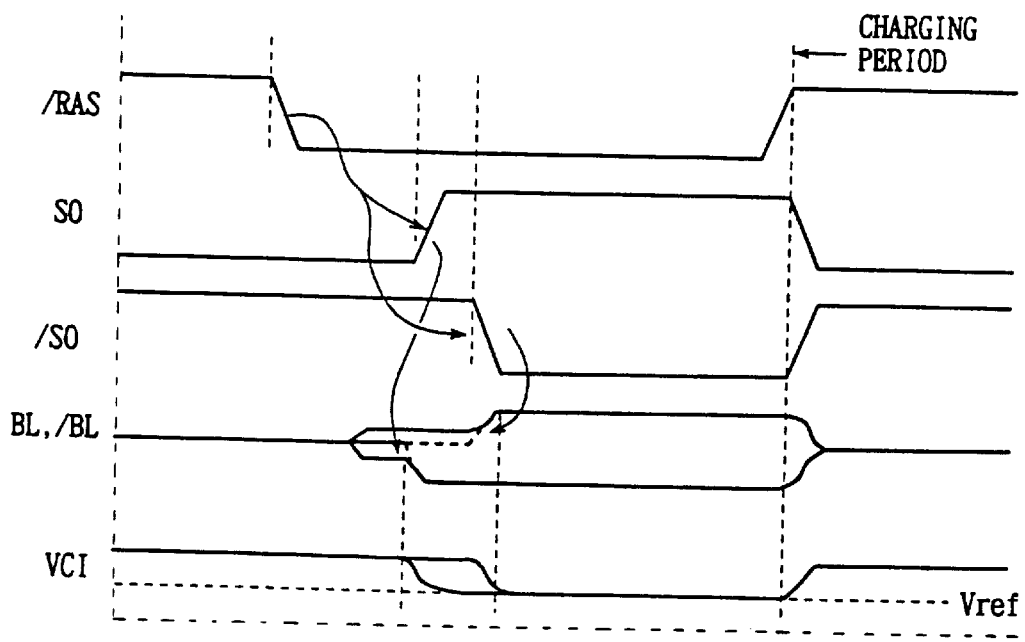
FIG. 28 is a signal waveform diagram showing an operation of the circuit structure of FIG. 27.

In the operation waveform diagram of FIG. 28, sense amplifier activation signals SN and SP maintain the level of ground voltage VSS and internal power supply voltage VCI, respectively. Alternatively, sense amplifier activation signals SP and SN may be maintained at a voltage level of intermediate voltage VCI/2 during an inactive mode. Internal power supply voltage VCI with respect to P sense amplifier activation circuit 30 is boosted in order to set the level of sense amplifier activation signal SP identical to that of internal power supply voltage VCI on internal power supply line 5C and ensure the turn off of MOS transistor P33.

Figure 29:
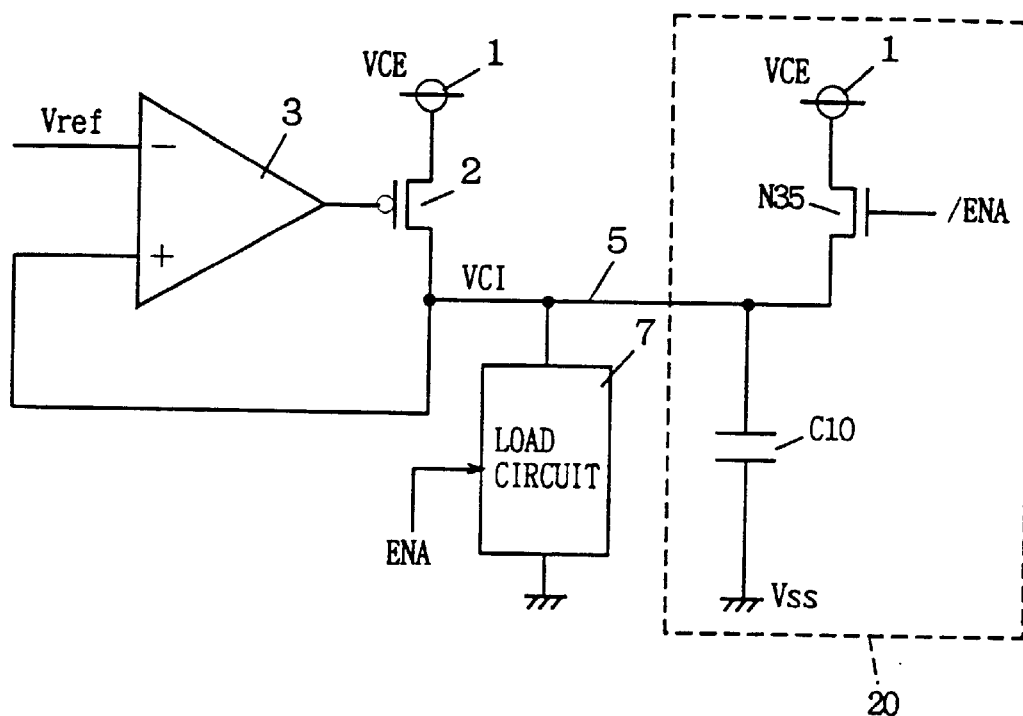
FIGS. 29–31 show first to third specific structures, respectively, of an internal power supply voltage generation circuit according to the third embodiment of the present invention.

First specific structure of charge circuit FIG. 29 shows a first schematic structure of charge circuit 20 of FIG. 25. Referring to FIG. 29, charge circuit 20 includes an n channel MOS transistor N35 rendered conductive in response to activation control signal /ENA to transmit external power supply voltage VCE from external power supply node 1 to internal power supply line 5, and a tank capacitor C10 connected between internal power supply line 5 and ground node VSS. Load circuit 7 using internal power supply voltage VCI on internal power supply line 5 is activated in response to activation control signal ENA. At an inactive state of load circuit 7, MOS transistor N35 is turned on, whereby current is supplied to internal power supply line 5 by the on-resistance inherent thereto. Tank capacitor C10 is charged to the level of external power supply voltage VCE. When load circuit 7 is activated in response to activation control signal ENA, MOS transistor N35 is turned off, and the charging operation of tank capacitor C10 is ceased.

Load circuit 7 uses the charge in tank capacitor C10 to drive its internal circuit (signal line) to the level of a predetermined voltage. When the capacitance of tank capacitor C10 is equal to the parasitic capacitance of the signal line driven by load circuit 7, internal power supply voltage VCI maintains the level of reference voltage Vref set by comparison circuit 3 and drive transistor 2. Activation control signal /ENA has an H level of external power supply voltage VCE. The capacitance of tank capacitor C10 can be obtained in a manner as set forth in the following. Here, an operation is considered of charging capacitance Ca of the level of ground voltage VSS of load circuit 7 to the level of reference voltage Vref. In this case, the amount of charge used in load circuit 7 is provided by Ca·Vref. The charge consumed by tank capacitor C10 is provided by C10·(VCE−Vref). The equivalence thereof provides:

$$C10=Ca\cdot Vref/(VCE-Vref)$$

By setting a capacitance of tank capacitor C10 to satisfy the above equation, internal power supply voltage VCI can be prevented from becoming lower than reference voltage Vref.

Second Specific Structure of Charge Circuit

Figure 30:
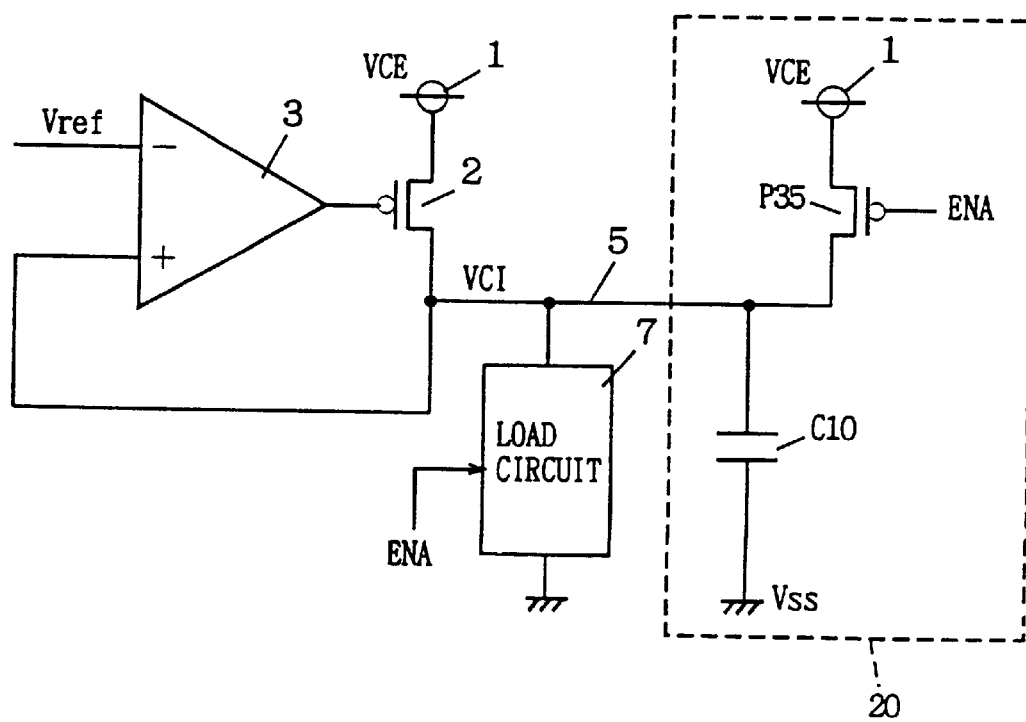

FIG. 30 shows a second specific structure of charge circuit 20 of FIG. 25. Referring to FIG. 30, charge circuit 20 includes a p channel MOS transistor P35 responsive to activation control signal ENA to transmit external power supply voltage VCE from external power supply node 1 to internal power supply line 5, and a tank capacitor C10 connected between internal power supply line and ground node VSS. Tank capacitor C10 is charged to the voltage level on internal power supply line 5. The structure shown in FIG. 30 is similar to that shown in FIG. 29 except that a p channel MOS transistor P35 is used instead of n channel MOS transistor N35. According to the structure shown in FIG. 30, internal power supply line 5 can be charged to a level higher than reference voltage Vref (external power supply voltage VCE) only during a predetermined time period without a voltage loss due to the threshold voltage of the MOS transistor.

Third Specific Structure of Charge Circuit

Figure 31:
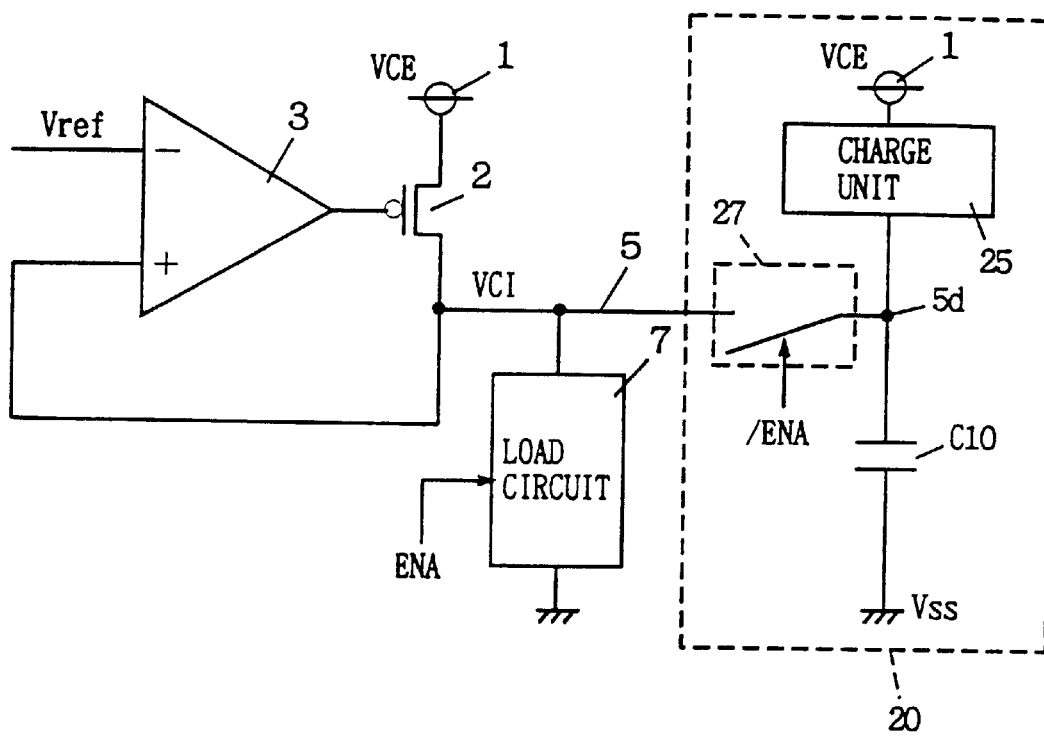

FIG. 31 shows a third specific structure of charge circuit 20 of FIG. 25. Referring to FIG. 31, charge circuit 20 includes a charge unit 25 receiving power supply voltage VCE from external power supply node 1 to charge tank capacitor C10 to a predetermined voltage level higher than reference voltage Vref, and a switching element 27 responsive to activation control signal /ENA to connect one electrode (node 5d) of tank capacitor C10 to internal power supply line 5. Load circuit 7 is activated in response to activation control signal ENA to carry out a predetermined operation. Although the structure of charge unit 25 will be described afterwards, one electrode node 5d of tank capacitor C10 is always charged to the level of a constant voltage. Switching element 27 is rendered conductive at an inactive state of load circuit 7 to connect one electrode node 5d of tank capacitor C10 to internal power supply line 5. During an operation of load circuit 7, switching element 27 is turned off, whereby internal power supply line 5 is isolated from one electrode node 5d of tank capacitor C10. Since the structure of FIG. 31 has internal power supply line 5 charged to a voltage level higher than reference voltage Vref, the current consumed at the initiation of an operation of load circuit 7 can be compensated for by this boosted voltage level. Therefore, internal power supply voltage VCI can be prevented from becoming lower than the level of reference voltage Vref.

Switching element 27 may be adapted not to turn off during an operation of load circuit 7, and is turned on only during a predetermined time period including the initiating operation period of load circuit 7, whereby the current consumed by load circuit 7 at the start of an operation is supplied from tank capacitor C10.

Figure 32A:
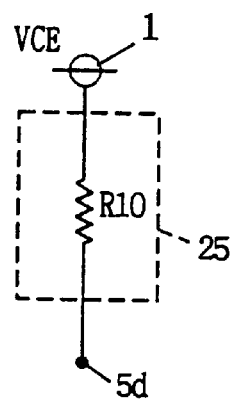
FIGS. 32A and 32B show specific structures of a charging unit shown in FIG. 31.
Figure 32B:
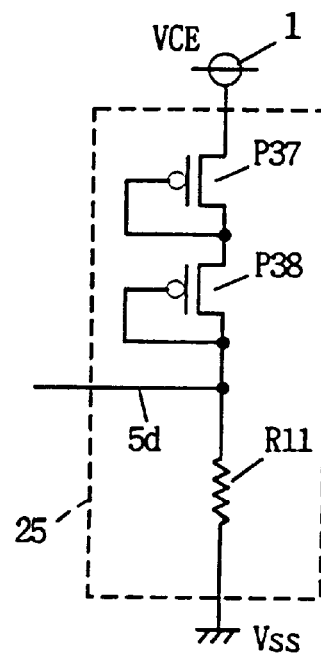

FIGS. 32A and 32B specifically show a structure of charge unit 25 of FIG. 31. Referring to FIG. 32A, charge unit 25 includes a resistor R10 connected between external power supply node 1 and one electrode node 5d of tank capacitor C10. According to this structure, one electrode node 5d of tank capacitor C10 is charged to the level of external power supply voltage VCE. Polysilicon, an active layer, or an MOS transistor can be used as resistor element R10.

Referring to FIG. 32B, charge unit 25 includes diode-connected p channel MOS transistors P37 and P38 connected in series between external power supply node 1 and one electrode node 5d of tank capacitor C10, and a resistor R11 connected between one electrode node 5d of tank capacitor C10 and ground node VSS. Resistor R11 has a relatively high resistance, so that MOS transistors P37 and P38 receive a slight current flow. MOS transistors 37 and 38 each generate a voltage drop of the absolute value Vtp of the threshold voltage thereof. Therefore, according to the structure shown in FIG. 32B, a voltage of the level of VCE–2·Vtp is applied to node 5d, whereby one electrode node 5d of tank capacitor C10 is charged to this voltage level. In FIG. 32B, resistor R11 may be formed of an MOS transistor, and MOS transistors P37 and P38 each may be replaced with an n channel MOS transistor. The number of MOS transistors connected between external power supply node 1 and node 5d is selected appropriately according to the charging potential of one electrode node 5d of tank capacitor C10.

Fourth Specific Structure of Charge Circuit

Figure 33:
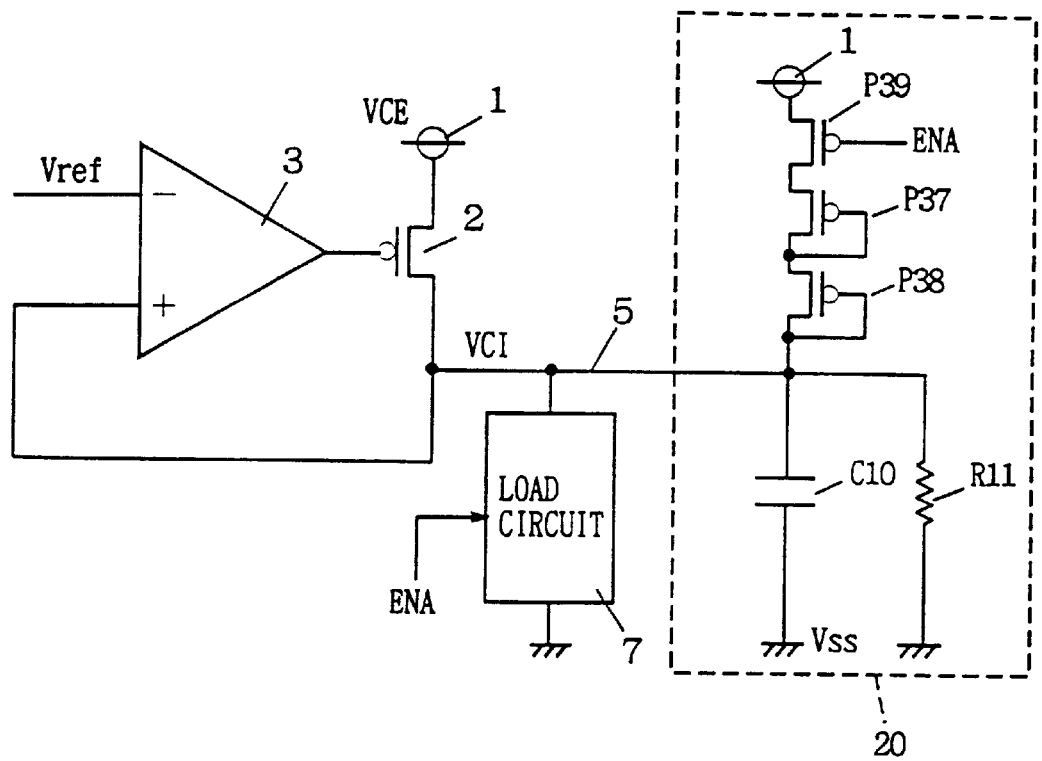
FIGS. 33 and 34 are fourth and fifth specific structures, respectively, of the internal power supply voltage generation circuit according to the third embodiment of the present invention.

FIG. 33 shows a fourth specific structure of the charge circuit of FIG. 25. Referring to FIG. 33, charge circuit 20 includes a p channel MOS transistor P39 having one conduction terminal connected to external power supply node 1 and turned on in response to activation control signal ENA, p channel diode-connected MOS transistors P37 and P38 connected in series between MOS transistor P39 and internal power supply line 5, a tank capacitor C10 connected between internal power supply line 5 and ground node VSS, and a resistor R11 connected in parallel to tank capacitor C10 between internal power supply line 5 and ground node VSS. Resistor R11 has a great resistance. MOS transistors P37 and P38 each function as diodes to cause a voltage drop of voltage Vtp when MOS transistor P39 conducts. Load circuit 7 operates in response to activation control signal ENA. More specifically, MOS transistor P39 conducts when load circuit 7 is inactive, whereby tank capacitor C10 is charged to the level of a predetermined voltage (VCE–2·Vtp in the figure). When load circuit 7 is activated in response to activation control signal ENA, MOS transistor P39 is turned off, whereby load circuit 7 uses the charge in tank capacitor C10 to charge the internal signal line to a predetermined voltage level. A structure may be adopted in which a resistor element is connected between transistor P39 and tank capacitor C10.

Fifth Specific Structure of Charge Circuit

Figure 34:
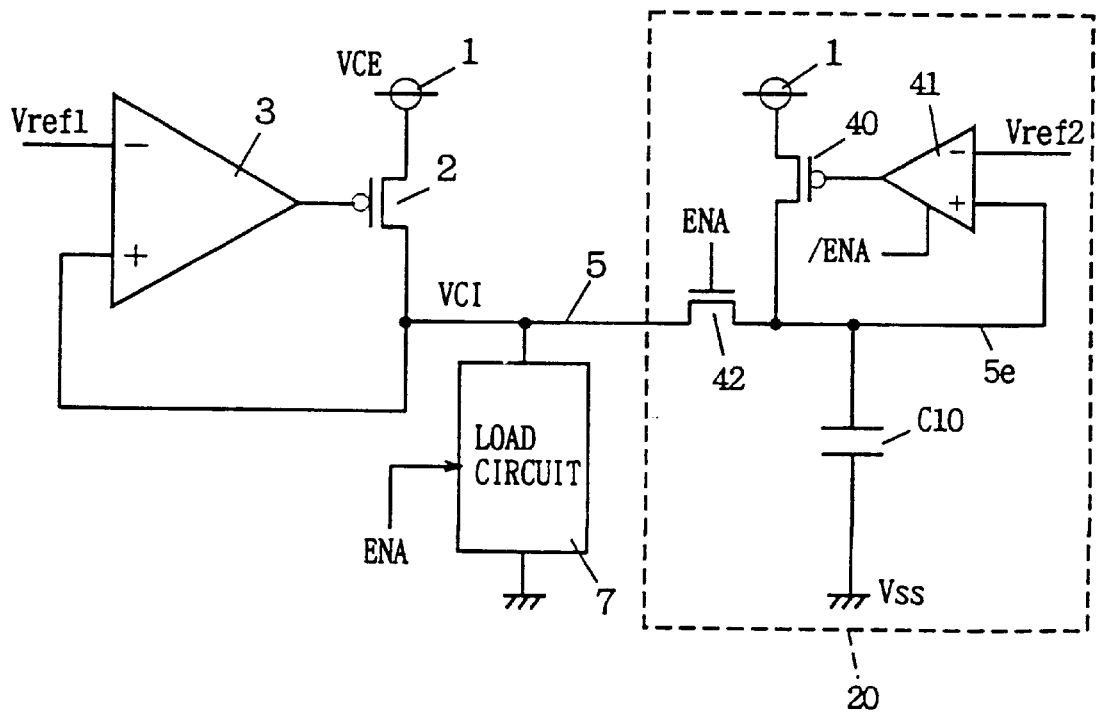

FIG. 34 shows a fifth specific structure of the charge circuit of FIG. 25. Referring to FIG. 34, charge circuit 20 includes a comparison circuit 41 for comparing a voltage on signal line 5e and a reference voltage Vref2 which is higher than reference voltage Vref1, a p channel MOS transistor 40 responsive to an output signal of comparison circuit 41 to provide current from external power supply node 1 to signal line 5e, a tank capacitor C10 connected between a signal line 5e and ground node VSS, and an n channel MOS transistor 42 responsive to activation control signal ENA to connect signal line 5e to internal power supply line 5. Comparison circuit 41 is activated in response to activation control signal /ENA to carry out a comparison operation between the voltage on signal line 5e and reference voltage Vref2. When activation control signal /ENA attain an inactive state, comparison circuit 41 is rendered inactive, whereby MOS transistor 40 is turned off. More specifically, when comparison circuit 41 is inactive, a voltage adjustment operation of signal line 5e is not carried out. Also, the operation of supplying current from external power supply node 1 to signal line 5e is not carried out. MOS transistor 42 connects signal line 5e to internal power supply line 5 during an operation of load circuit 7. The operation will be described.

When activation control signal ENA is inactive, MOS F: transistor 42 is turned off, so that internal power supply line 5 is disconnected from signal line 5e. In this state, signal /ENA attains an active state, whereby comparison circuit 41 compares the voltage on signal line 5e and reference voltage Vref2. When the voltage on signal line 5e is lower than reference voltage Vref2, MOS transistor 40 is turned on in response to an output signal of comparison circuit 41. As a result, current is supplied from external power supply node 1 to signal line 5e to charge tank capacitor C10. When the voltage on signal line 5e is higher than reference voltage Vref, the output signal of comparison circuit 41 attains an H level, and MOS transistor 40 is also turned off. Thus, one electrode of tank capacitor C10, i.e. signal line 5e is charged to the level of reference voltage Vref2.

When load circuit 7 is activated in response to activation control signal ENA, MOS transistor 42 is turned on, whereby internal power supply line 5 is connected to signal line 5e. At the start of an operation of load circuit 7, the charge in tank capacitor C10 is used, so that an abrupt voltage drop of internal power supply voltage VCI on internal power supply line 5 is prevented. Here, the voltage of one electrode of tank capacitor C10 is equal to voltage VCI on internal power supply line 5 since comparison circuit 41 is not carrying out a comparison operation and MOS transistor is still turned off. When the operation of load circuit 7 is completed, MOS transistor 42 is turned off, whereby comparison circuit 41 is rendered active again. As a result, the voltage on signal line 5e is boosted to the level of reference voltage Vref2.

During the operation of load circuit 7, comparison circuit 3 compares power supply voltage VCI on internal power supply line 5 with reference voltage Vref1, whereby current is supplied from external power supply node 1 to internal power supply line 5 via drive transistor 2 according to the comparison result. As a result, power supply voltage VCI is maintained at the level of the constant reference voltage Vref1.

According to the structure shown in FIG. 34, the charge voltage of tank capacitor C10 can be set to an accurate level by setting reference voltage Vref2 to a predetermined voltage level.

The structure shown in FIG. 34 may be modified such that tank capacitor C10 is connected to internal power supply line 5, and MOS transistor 42 conducts in response to activation control signal /ENA. Tank capacitor C10 is charged via MOS transistor 42 attaining an on state during an inactive state of load circuit 7. When load circuit 7 is active, tank capacitor C10 is disconnected from signal line 5e. A similar effect can be obtained by such a structure.

According to the third embodiment of the present invention, internal power supply line 5 is boosted to a level higher than a predetermined voltage level by means of another path using a tank capacitor. Therefore, current consumed at the start of the operation of load circuit 7 can be supplied using the extra charge (the stored charge in the parasitic capacitance at the internal power supply line or tank capacitance) stored by the boosted voltage. Therefore, an abrupt voltage drop of internal power supply voltage VCI can be prevented to provide internal power supply voltage VCI stably.

Embodiment 4

Figure 35:
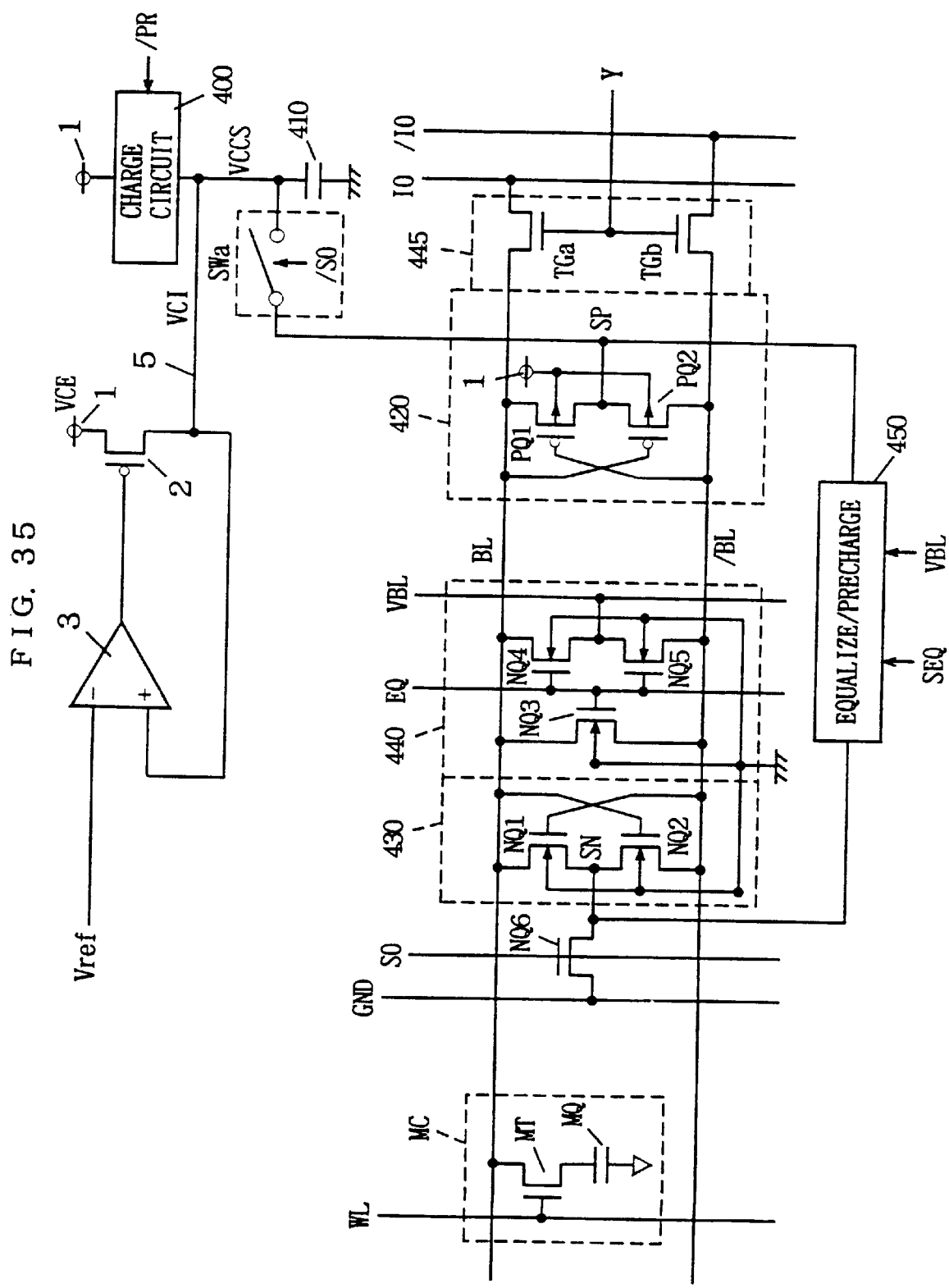
FIG. 35 shows a structure of the main portion of a semiconductor device according to a fourth embodiment of the present invention.

FIG. 35 shows a structure of the components of a semiconductor device according to a fourth embodiment of the present invention. In the structure of FIG. 35, the load circuit does not particularly receive an activation control signal, and is simply rendered active when a certain voltage is applied on an internal node. Similar to a conventional device, there are provided a comparison circuit 3 for comparing the voltage on internal power supply line 5 with a predetermined reference voltage Vref (reference voltage generation circuit not shown), and a drive element 2 formed of a p channel MOS transistor for supplying current from external power supply node 1 to internal power supply line 5 in response to an output signal of comparison circuit 3. Furthermore, a capacitor 410 and a charge circuit 400 for charging one electrode of capacitor 410 to a predetermined voltage level for a predetermined time period are provided with respect to internal power supply line 5. One electrode of capacitor 410 is connected to internal power supply line 5. Charge circuit 400 has a structure similar to those shown in FIGS. 32–34 to charge one electrode of capacitor 410 to the level of a predetermined voltage for a predetermined time period in response to a precharge signal /PR.

An active restore circuit (P sense amplifier) 420 which is a load circuit amplifies differentially the potentials of bit lines BL and /BL connected to memory cells MC of one column. In FIG. 35, one memory cell MC is typically shown for the bit line pair of BL and /BL. Memory cell MC includes a memory capacitor MQ for storing information, and an access transistor MT responsive to a potential on a word line WL to connect memory capacitor MQ to a bit line BL. Active restore circuit 420 includes a pair of cross-coupled p channel MOS transistors PQ1 and PQ2. MOS transistor PQ1 has its source connected to signal line 441, its drain connected to bit line BL, and its gate connected to bit line /BL. MOS transistor PQ2 has its source connected to signal line 441, its drain connected to bit line /BL, and its gate connected to bit line BL. The substrate region (well or semiconductor layer) of MOS transistors PQ1 and PQ2 are connected to receive an external power supply voltage VCE from an external power supply node 1.

Furthermore, a sense amplifier 430 for amplifying differentially the potentials of bit lines BL and /BL, and a bit line equalize circuit 440 for precharging and equalizing bit lines BL and /BL at the level of a predetermined potential VBL during a standby state are provided with respect to bit lines BL and /BL. Sense amplifier 430 includes cross-coupled n channel MOS transistors NQ1 and NQ2. MOS transistor NQ1 has its source connected to a node SN, its drain connected to bit line BL, and its gate connected to bit line /BL. MOS transistor NQ2 has its source connected to node SN, its drain connected to bit line /BL, and its gate connected to bit line BL.

Bit line equalize circuit 440 includes an n channel MOS transistor NQ3 rendered conductive in response to an equalize signal EQ to electrically short-circuit bit lines BL and /BL, an n channel MOS transistor NQ4 responsive to equalize signal EQ to supply a predetermined precharge potential VBL (½ of internal power supply voltage) to bit line BL, and an n channel MOS transistor NQ5 rendered conductive in response to equalize signal EQ to transmit precharge voltage VBL to bit line /BL. MOS transistors NQ1–NQ5 receive ground voltage at the substrate regions.

A sense activation transistor NQ6 is provided to activate sense amplifier 430. Sense activation transistor NQ6 conducts in response to a sense activation signal SO to transmit ground voltage GND to node SN.

A sense equalize/precharge circuit 450 is provided to equalize and precharge nodes SN and SP at an intermediate voltage VBL and precharge during a standby mode. Sense equalize/precharge circuit 450 responds to an equalize. signal SEQ to precharge and equalize nodes SN and SP at the level of precharge voltage VBL. Sense equalize/ precharge circuit 450 has a structure identical to that of equalize circuit 440.

In FIG. 35, transfer gates TGa and TGb of column select gate 445 respond to a column select signal Y to connect bit lines BL and /BL to internal data lines IO and /IO. Although column select signal Y is shown to select only one pair of bit lines BL and /BL in FIG. 35, a plurality of columns may be selected simultaneously by this column select signal Y. Furthermore, sense amplifier 430 and active restore circuit 420 may be formed in the so-called "shared sense amplifier arrangement" shared between the bit line pairs of two memory blocks. The operation of the semiconductor device of FIG. 35 will be described with reference to the waveform diagram of FIG. 36.

Figure 36:
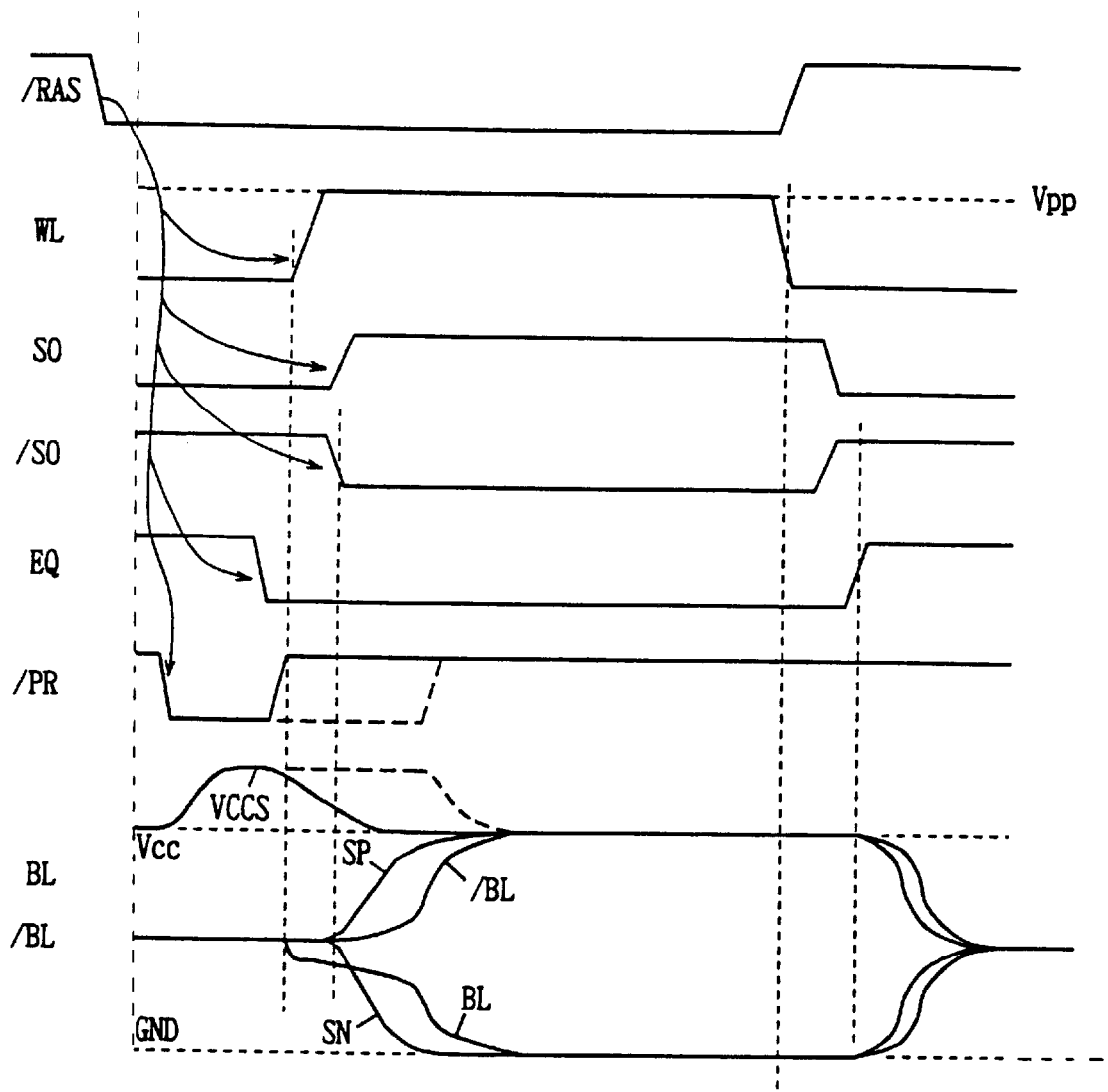
FIG. 36 is a signal waveform diagram showing an operation of the semiconductor device of FIG. 35.

The semiconductor memory device is maintained at a standby state when row address strobe signal /RAS attains a high level. Here, equalize signal EQ attains a high level, whereby bit line equalize circuit 440 precharges and equalizes bit lines BL and /BL at a precharge voltage VBL. Similarly, sense equalize/precharge circuit 450 precharges and equalizes nodes SN and SP at the level of intermediate voltage VBL. Charge circuit 400 is inactive, and one electrode of capacitor 410 is charged to the level of the voltage on internal power supply line 5. In FIG. 36, charge voltage VCCS during the standby state of capacitor 410 is shown to be equal to the level of internal operating power supply voltage VCC (VCI=VCC). Switching element SWa and sense activation transistor NQ6 are both turned off.

When row address strobe signal /RAS falls to a low level of an active state, a memory cycle is initiated. In response to the activation of signal /RAS, precharge signal /PR is pulled down to a low level of an active state for a predetermined time period, whereby charge circuit 400 supplies current from external power supply node 1 to capacitor 410. As a result, voltage VCCS of one electrode of capacitor 410 becomes higher than internal power supply voltage VCC. Equalize signals EQ and SEQ are both rendered inactive, and bit line equalize circuit 440 and sense equalize/ precharge circuit 450 are rendered inactive. As a result, bit lines BL and /BL attain a floating state at the level of precharge voltage VBL. Also, nodes SN and SP attain a floating state at the level of precharge voltage VBL.

In response to signal /RAS being active, decoding of an address signal is carried out by a circuit not shown. A word line select operation is carried out. The potential of the selected word line WL rises to a high level by a word line drive circuit not shown. FIG. 36 shows the case where the voltage level of selected word line WL is boosted to the level of a high voltage Vpp which is higher than internal power supply voltage VCC.

When word line WL is selected to have its potential increased to a high level, access transistor MT of memory cell MC is turned on, whereby the charge stored in memory capacitor MQ is transmitted to bit line BL (or /BL) to cause a potential difference between bit lines BL and /BL. FIG. 36 shows the case where data of a low level is stored in memory capacitor MC, so that the potential of bit line BL is lowered from the level of precharge voltage VBL.

When a charge operation of capacitor 410 is completed by charge circuit 400, charge voltage VCCS of capacitor 410 gradually decreases due to discharge of internal power supply line 5. When the potential difference between bit lines BL and /BL becomes sufficient (at an elapse of a predetermined time period from the activation of signal /RAS), sense activation signals /SO and SO are rendered active. Sense activation signals /SO and SO are rendered active in response to signal /RAS. As a result, switching element SWa and sense activation transistor NQ6 are both turned on, so that charging of node SP and discharging of node SN are carried out.

Voltage VCCS of one electrode of capacitor 410 attains a high level higher than internal operating power supply voltage VCC. When switching transistor SWa is turned on, variation in the voltage VCI (VCC) on internal power supply line 5 is suppressed, whereby the potential of node SP rises at high speed. More specifically, reduction in the potential on internal power supply line 5 is compensated for by the charge from capacitor 410 to suppress reduction in voltage VCI on internal power supply line 5.

When the voltage level of node SP rises, the conductance of MOS transistor PQ2 receiving the potential of bit line BL at its gate becomes greater than that of MOS transistor PQ1 in active restore circuit 420. Current is supplied from node SP to bit line /BL via transistor PQ2, whereby the potential thereof rises to the level of the power supply voltage. When the potential of capacitor 410 falls to the level of internal power supply voltage VCC, current is supplied from drive element 2 to internal power supply line 5, so that the level of node SP is maintained at the level of internal power supply voltage VCC.

When node SN is discharged to the level of ground voltage GND in sense amplifier 430, the conductance of MOS transistor NQ1 receiving the high potential of bit line /BL at its gate becomes greater than that of MOS transistor NQ2. Therefore, bit line BL is discharged to the level of ground voltage by transistor NQ1.

When bit lines BL and /BL are driven to the levels of internal power supply voltage VCC and ground voltage GND, column select signal Y is rendered active at a high level. Bit lines BL and /BL are connected to internal data lines IO and /IO via respective column select gates 445. Then, data writing/reading of a memory cell is carried out by a circuit not shown.

When a memory cycle is completed, signal /RAS attains a high level, whereby word line WL and sense activation signals SO and /SO are rendered inactive. Then, bit line equalize signal EQ is pulled up to a high level of an active state, and sense equalize/precharge circuit 450 is also activated by equalize signal SEQ. Nodes SP and SN and bit lines BL and /BL are precharged and equalized at the level of precharge voltage VBL. Thus, one memory cycle is completed.

As described above, when the voltage level of node SP becomes higher than the level of internal power supply voltage VCC at the initiation of an operation of active restore circuit 420, the rising speed of the voltage level of node SP can be speeded in comparison with the case where internal power supply voltage VCC is used. In active restore circuit 420, the gate-source voltage of the MOS transistor (PQ2) receiving the potential of the bit line having a lower potential (bit line BL in FIG. 36) is increased to result in a greater conductance thereof. In contrast, the voltage difference between the gate and source in MOS transistor PQ1 is reduced to result in a smaller conductance thereof. Therefore, the difference in the conductance between transistors PQ1 and PQ2 is increased, which allows increase in the current to be supplied to the bit line to be charged during an operation of active restore circuit 420 in comparison with the case using internal power supply voltage VCC. Therefore, a restore operation can be carried out at high speed.

The static capacitance of capacitor 410 is determined depending upon the load capacitance (bit line capacitance), a parasitic capacitance of the signal line (sense amplifier drive signal line) to be driven by capacitor 410 and the charge potential of capacitor 410.

Modification 1

Figure 37:
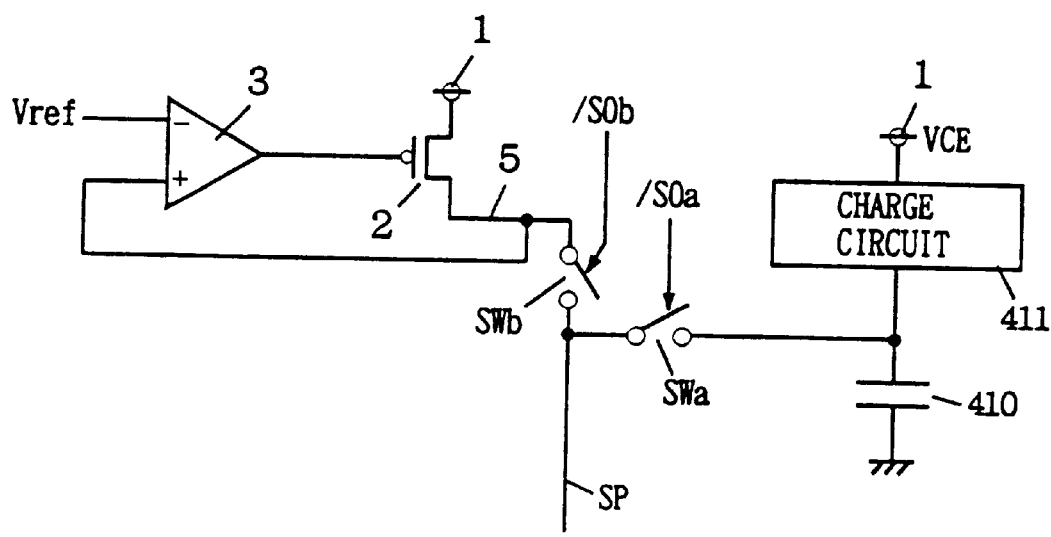
FIG. 37 shows a first modification of the fourth embodiment of the present invention.
Figure 38:
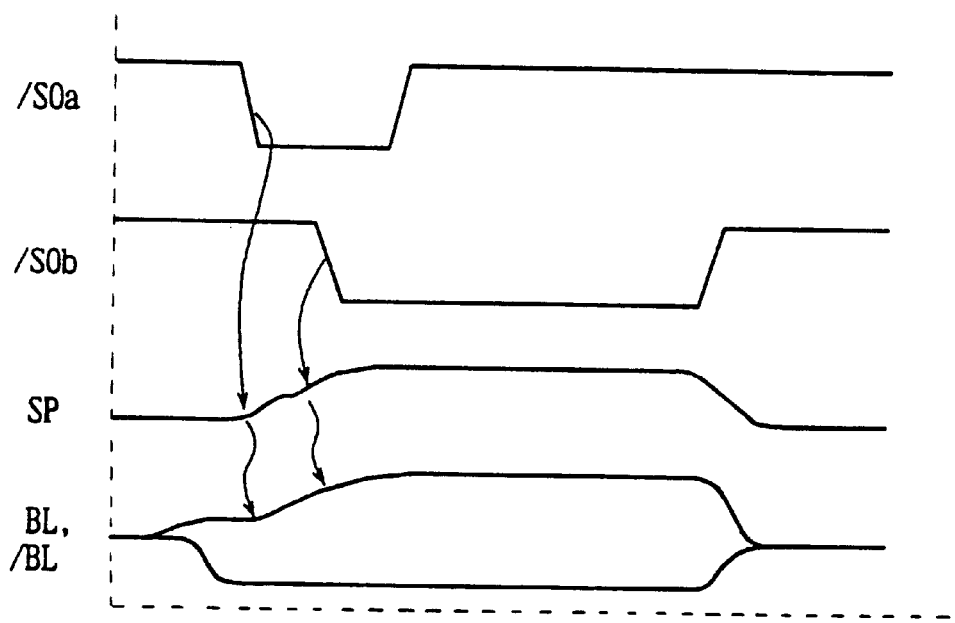
FIG. 38 is a signal waveform diagram showing an operation of the semiconductor device shown in FIG. 37.

FIG. 37 shows a first modification of the fourth embodiment of the present invention. Referring to FIG. 37, a switching element Swb is provided between internal power supply line 5 and node SP. Similar to the structure of FIG. 35, node SP is connected to one electrode node of capacitor 410 via switching element SWa. Charge circuit 410 may constantly charge one electrode of capacitor 410. Alternatively, it may be charged for only a predetermined time period as shown in FIG. 35. The level of the charge potential of charge circuit 411 may be the level of external power supply voltage VCE, or a level lower than internal power supply voltage VCC. It should be charged to the voltage level that compensates for charging of node SP. The operation will be described briefly with reference to the waveform diagram of FIG. 38. In FIG. 38, only the waveform diagram in a-sensing operation is shown.

One electrode of capacitor 410 is charged to the level of a predetermined voltage (positive voltage level) by charge circuit 411.

When sense activation signal /SOa attains a low level of an active state for a predetermined time period, switch element SWa is turned on, whereby one electrode of capacitor 410 is connected to node SP. As a result, node SP has its potential slightly increased from the level of precharge potential VBL according to the charge potential of capacitor 410. In response to this increase in potential of node SP, the potential of one of the higher potential of bit lines BL and /BL is slightly increased. Then, sense activation signal /SOb is pulled to a low level of an active state, whereby switching element SWb is turned on to connect internal power supply line 5 to node SP. As a result, node SP is charged to the level of power supply voltage VCC by a current control path of drive element 2 and comparison circuit 3. According to the charging from drive element 2, node SP is eventually increased to the level of internal power supply voltage VCC.

As shown in FIG. 38, during the operation of the restore circuit, node SP is charged by the charge potential of capacitor 410. Then, internal power supply line 5 is connected to node SP, so that the voltage variation of internal power supply line 5 upon the transition to the on state of switching element SWb can be reduced sufficiently. Thus, a restore operation can be carried out stably. Sense activation signals /SOa and /SOb may be rendered active at the same timing. By supplying the current from internal power supply line 5 together with the charge from capacitor 410 during the increase of the potential of node SP in a restore operation, reduction in the voltage level of internal power supply line 5 can be suppressed. Node SP can be driven to a level of a predetermined voltage at high speed to carry out a restore operation speedily.

As shown in the broken line in FIG. 36, the charging operation period of the charge circuit 400 may overlap the operation period of the restore circuit. More specifically, since node SP is charged by charge circuit 400 during a restore operation, the potential of node SP can be increased to the level of the predetermined voltage more speedily. In response, the potential difference between the gate and source of an MOS transistor provided corresponding to a bit line to be charged can be made great enough, and the bit line can be charged at high speed.

According to the fourth embodiment of the present invention, the power supply node coupled to nodes of a restore circuit can be increased in potential by the charge of a capacitor during the operation of the restore circuit. Therefore, reduction in the voltage on internal power supply line 5 can be suppressed sufficiently even when there is a delay in the response of drive element 2 and comparison circuit 3. Thus, the control node of the restore circuit can be increased in potential to a level of a predetermined voltage stably and speedily. A restore circuit is realized that operates speedily and stably.

Fifth Embodiment

Figure 39:
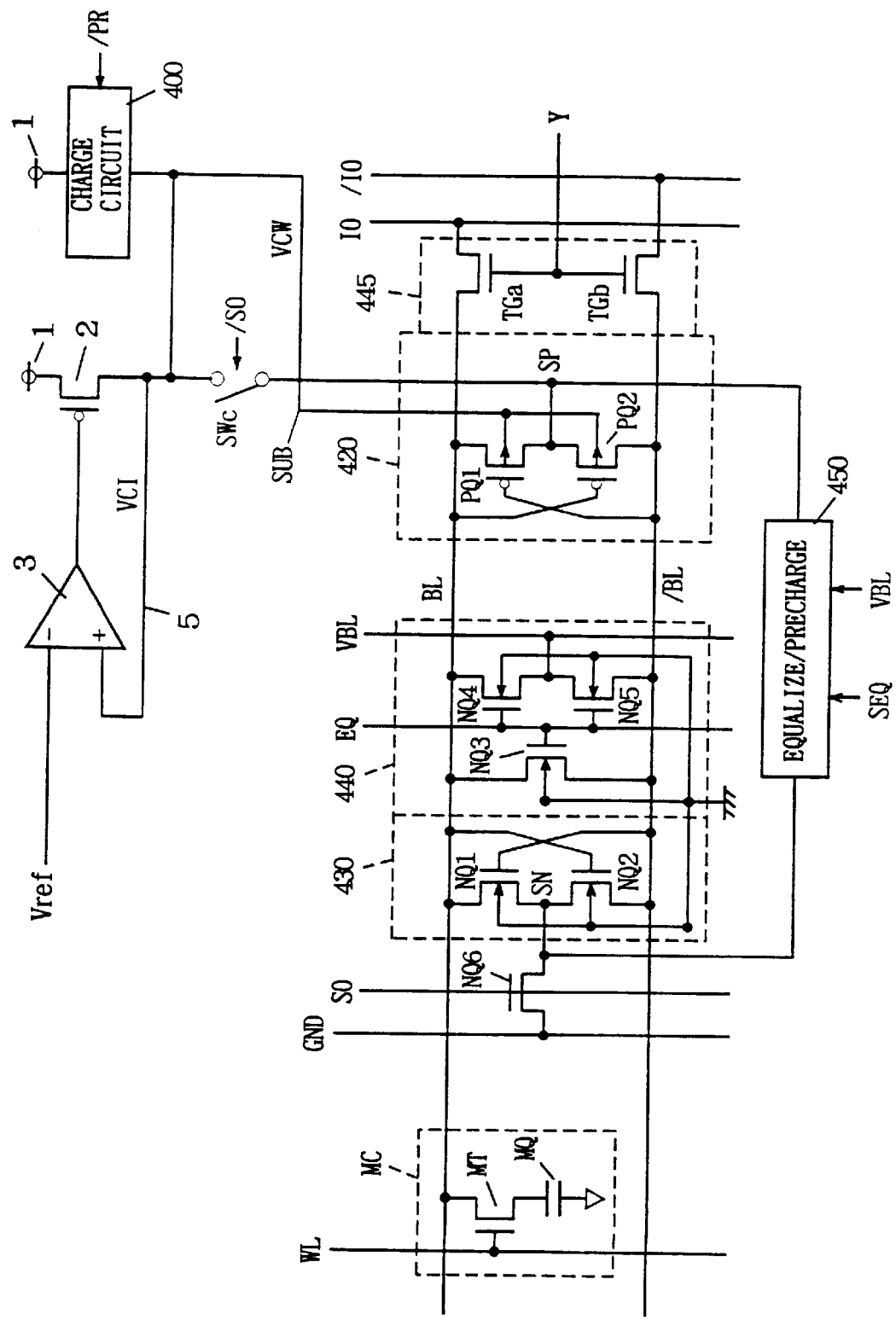
FIG. 39 shows a structure of a fifth embodiment of the present invention.

FIG. 39 shows a structure of the components of a semiconductor device according to a fifth embodiment of the present invention. Referring to FIG. 39, the substrate regions (well or semiconductor layer) of p channel MOS transistors PQ1 and PQ2 in restore circuit 420 are connected to receive the output voltage of charge circuit 400. Node SP is connected to internal power supply line 5 via switching element SWc. The structure of the remaining components are identical to those shown in FIG. 35, and corresponding components have the same reference characters allotted. The operation of the device shown in FIG. 39 will be described with reference to the waveform diagram of FIG. 40.

In a standby cycle, signal /RAS is rendered inactive at a high level. Various signals are set in the sets similar to the states described with reference to the fourth embodiment. Here, the substrate regions of MOS transistors PQ1 and PQ2 of active restore circuit 420 are charged to the level of voltage VCI (internal power supply voltage VCC) on internal power supply line 5.

When signal /RAS attains an active state of a low level and an active cycle is initiated, charge circuit 400 is activated in response to precharge signal /PR, whereby a voltage higher than internal power supply voltage VCC is output for a predetermined time period. As a result, the substrate regions of MOS transistors PQ1 and PQ2 of active restore circuit 420 are charged to a level higher than that of power supply voltage VCC. Thus, the substrate bias of MOS transistors PQ1 and PQ2 are set to a deeper state.

Figure 40:
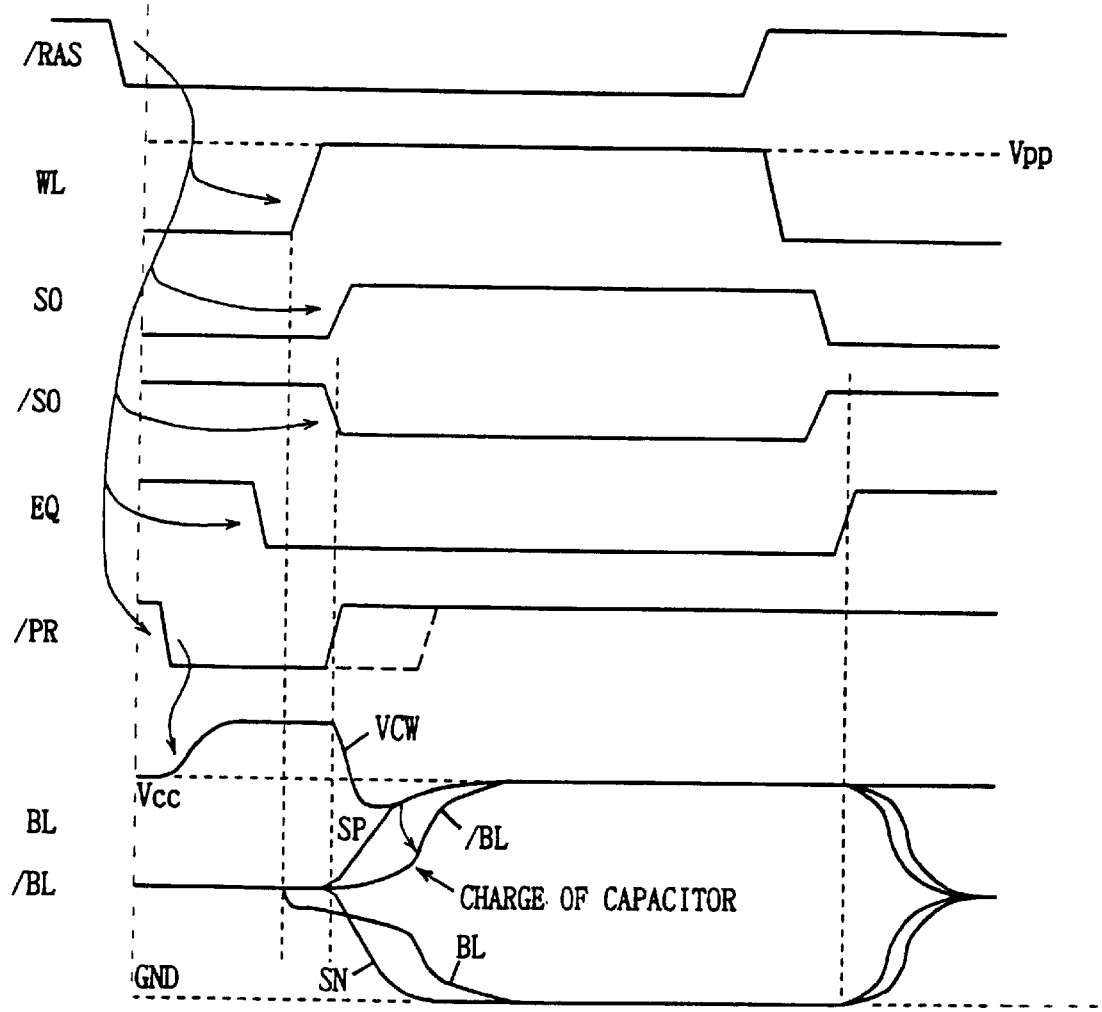
FIG. 40 is a signal waveform diagram showing an operation of the semiconductor device of FIG. 39.

Then, a memory cell select operation is carried out. When the potential on a selected word line WL increases to the level of high voltage Vpp, a potential difference is generated between bit lines BL and /BL according to data stored in memory cell MC. FIG. 40 shows an example where voltage of a low level is transmitted to bit line BL. Sense activation signal /SO is then pulled down to a low level of an active state, and switching element SWc is turned on. This causes nodes SUB and SP to be connected to each other. The charge stored in the substrate regions of MOS transistors PQ1 and PQ2 is transmitted to node SP via to node SUB and switching element SWc. As a result, the charge stored in the substrate region is transmitted to node SP. Node SP has its voltage level increased according to the current supplied from internal power supply line 5 and the charge supplied from the substrate region. Thus, reduction in the voltage level of internal power supply line 5 can be suppressed. Delay in the response of drive element 2 and comparison circuit 3 can be compensated for. At the initiation of an operation of restore circuit 420, high voltage is supplied from node SUB to node SP, whereby the voltage increase rate of node SP is improved. This is equivalent to that the source potentials of MOS transistors PQ1 and PQ2 are increased. Similar to the case of embodiment 4, the conductance of an MOS transistor to charge a bit line is set sufficiently greater than that of the other MOS transistor to allow charging of a bit line at high speed.

In FIG. 40, following the completion of charging by charge circuit 400, substrate node SUB is connected to node SP, whereby the potential thereof is decreased. The substrate regions of MOS transistors PQ1 and PQ2 of active restore circuit 420 is utilized as the capacitance. By using the charge of this capacitance for the increase of the potential of node SP of active restore circuit 420, reduction in the potential of internal power supply line 5 is suppressed, whereby node SP is driven to the level of a predetermined voltage at high speed.

The charge period by charge circuit 400 is limited to the activation period of precharge signal /PR. Therefore, even if charge circuit 400 is supplied with current from external power supply node 1 to carry out a charging operation, node SP will not be boosted higher than the level of internal power supply voltage VCC since the charging operation is carried out only for a predetermined time period.

When switching element SWc is turned on, the sources and substrate regions of MOS transistors PQ1 and PQ2 in active restore circuit 420 are set at the same potential. Therefore, MOS transistors PQ1 and PQ2 can carry out on amplifying operation with the absolute value of the highest threshold voltage. Thus, a charging operation can be carried out at high speed. A deep substrate bias allows increase in the absolute value of the threshold voltage, so that the conductance of MOS transistors PQ1 and PQ2 of active restore circuit 420 becomes greater than that in the case where internal power supply voltage VCC is supplied to the substrate region. Therefore, the amplifying operation speed at the start of the operation can be delayed to increase sensitivity of the sense amplifier (small voltage difference is amplified gently). Therefore, an active restore circuit that operates accurately can be realized.

As shown in the broken line in FIG. 40, the precharge signal /PR with respect to charge circuit 400 may be set such that charging (precharge operation) is carried out even after sense activation signals SO and /SO are rendered active. In this case, node SP can be driven to a predetermined voltage level at higher speed.

Modification 1

Figure 41A:
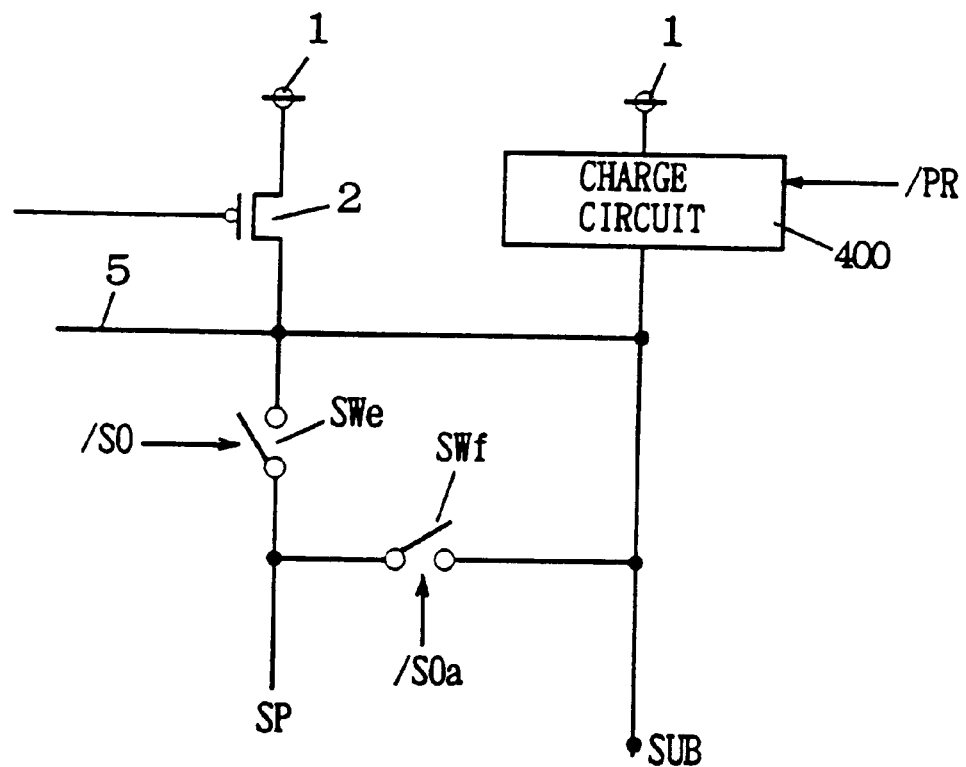
FIG. 41A shows a first modification of the fifth embodiment of the present invention.
Figure 41B:
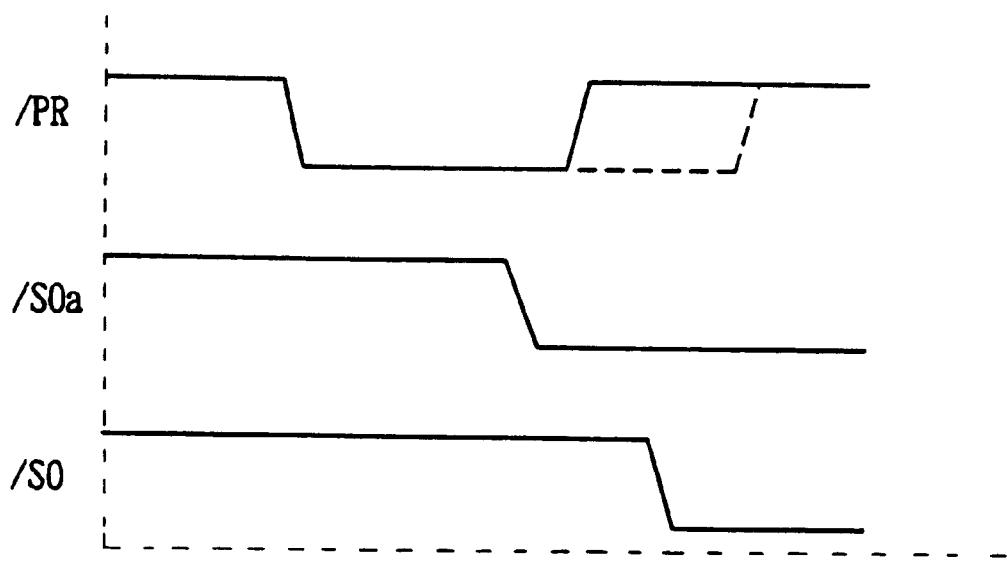
FIG. 41B is a signal waveform diagram showing the operation of the device of FIG. 41A.

FIGS. 41A and 41B show a structure and operation of a first modification of the fifth embodiment of the present invention. Referring to FIG. 41A, charge circuit 400 carries out a precharge operation in response to precharge signal /PR only during a predetermined time period. The substrate region SUB of MOS transistors PQ1 and PQ2 (not shown in FIG. 41A) in active restore circuit 420 is connected to internal power supply node 5. More specifically, substrate region SUB is precharged to a level higher than normal voltage VCI on internal power supply line 5 during a charging operation of charge circuit 400. A switching element SWe is provided between internal power supply line 5 and node SP of active restore circuit 420. A switching element SWf is provided between node SP and substrate region SUB. Switching element SWe conducts in response to sense activation signal /SO. Switching element SWf is rendered conductive by a signal /SOa which is rendered active at a timing earlier than that of sense activation signal /SO. The operation will be described hereinafter with reference to the waveform diagram of FIG. 41B.

During a standby state, switching elements SWe and SWf are both turned off, and substrate region SUB is charged to the power supply voltage level on internal power supply line 5. When an active cycle is initiated, first precharge signal /PR is rendered active, whereby charge circuit 400 operates to charge substrate region SUB to a predetermined voltage level. Then, signal /SOa is rendered active to turn on switching element SWf, whereby substrate region SUB is connected to node SP. The charge of substrate region SUB is transmitted to node SP, whereby the potential of node SP rises. Here, the source and the substrate region of the MOS transistor in active restore circuit 420 is equal since substrate region SUB is interconnected with node SP. The substrate effect is suppressed. The MOS transistor of active restore circuit 420 operates at the smallest absolute value of the threshold voltage. Then, sense activation signal /SO is rendered active, whereby internal power supply line 5 is connected to node SP. Node SP rises to the level of the voltage on internal power supply line 5.

Even when the static capacitance of the substrate region is smaller than the capacitance (bit line capacitance) at node SP, and the potential of node SP is not sufficiently higher due to the charge from substrate region SUB, the voltage node SP rises to a predetermined voltage level by current supplied on internal power supply line via drive element 2.

Since this active restore circuit is formed entirely over the substrate region (an active restore circuit is provided corresponding to each of the plurality of the bit line pairs), the area of this substrate region is relatively great, so that the capacitance of the substrate region can have a sufficient great value. Node SP can be increased in the voltage level by supplying sufficient charge during the operation of this active restore circuit. The voltage level, increased by the charge from substrate region SUB, of node SP is determined by the capacitance of node SP and the capacitance of substrate region SUB.

According to the structure of FIG. 41, reduction in the voltage of internal power supply line 5 can be suppressed to ensure the drive of internal node SP to the level of the predetermined voltage.

Modification 2

Figure 42A:
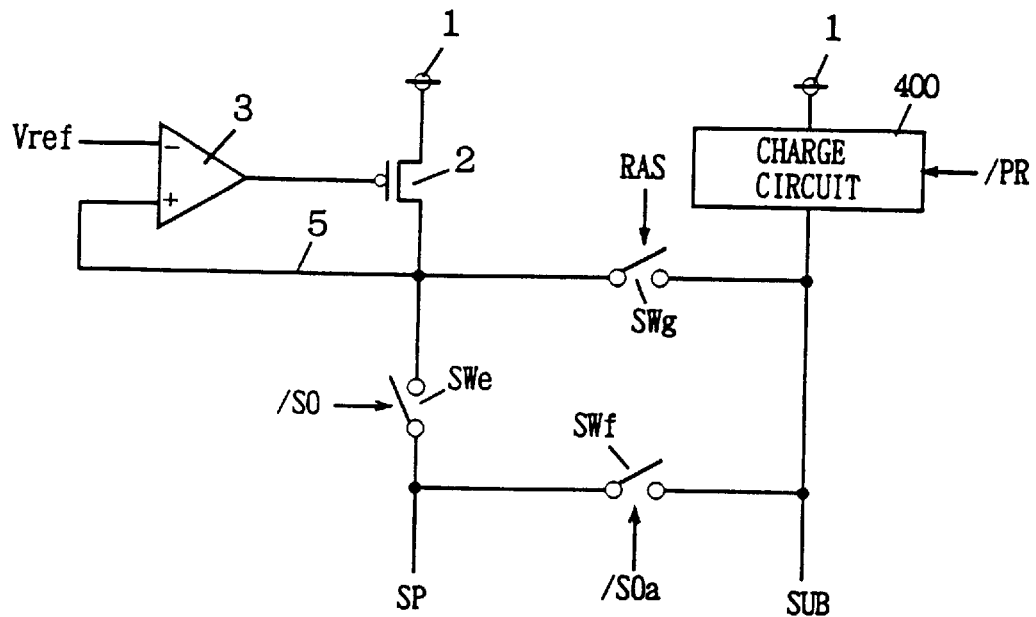
FIGS. 42A and 42B show a structure and operation, respectively, of a second modification of the fifth embodiment.
Figure 42B:
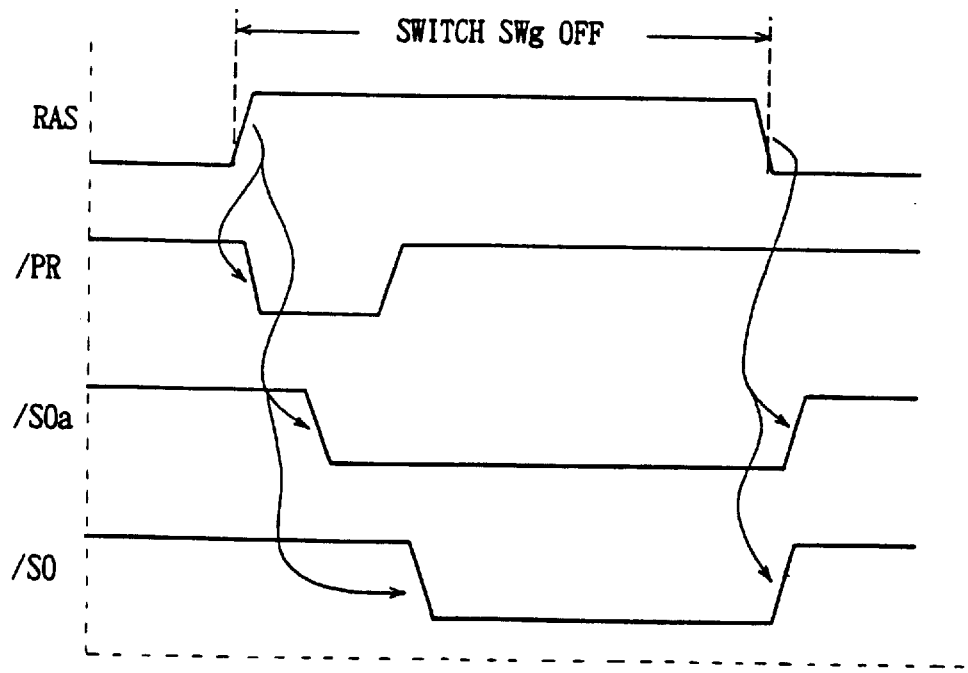

FIGS. 42A and 42B show a structure and operation of a second modification of the fifth embodiment. Referring to FIG. 42A, a switching element SWg is further provided between an output node (substrate region SUB) of charge circuit 400 and internal power supply line 5, and is rendered conductive during an inactive state of row address strobe signal RAS. The remaining structure is similar to that shown in FIG. 41A. Switching element SWg is turned on only during a standby cycle. Charge circuit 400 carries out a precharge operation in response to a precharge signal /PR for only a predetermined time period. The operation will be described hereinafter with reference to the waveform diagram of FIG. 42B.

In a standby cycle, signal RAS attains a low level, and switching element SWg is turned on. In contrast, sense activation signals /SO and /SOa attain a high level of an inactive state, and switching elements SWe and SWf are turned off. Under this state, substrate region SUB is charged to the level of power supply voltage VCC on internal power supply line 5.

When an active cycle is entered, signal RAS is pulled to a high level of an active state, whereby switching element SWg is turned off. In response to activation of signal RAS, precharge signal /PR is pulled down to a low level of an active state, whereby charge circuit 400 operates to charge substrate region SUB to the level of a predetermined voltage. Then, signal /SOa is pulled down to a low level of an active state, whereby substrate region SUB is interconnected with node SP. As a result, charge flows from substrate region SUB to node SP, whereby the potential of node SP rises. Then, signal /SO is pulled down to a low level of an active state, whereby switching element SWe is turned on. As a result, node SP is supplied with a current from drive element 2, whereby the potential is pulled up to a high level at high speed. A similar effect to that of FIG. 41A arrangement can be obtained in this case. Since internal power supply line 5 is not charged during charging of substrate region SUB, substrate region SUB can be charged to a predetermined voltage level efficiently.

It is to be noted that the charge circuit shown in any of FIGS. 28 to 32 may be used as charge circuit 400. Charge circuit 400 may be formed such that substrate region SUB is charged to the level of the power supply voltage applied to external power supply node 1. Alternatively, charge circuit 400 may be a resistor element connected to an external power supply node.

In the fifth embodiment, the substrate region in the MOS transistor in an active restore circuit is used as the capacitance whose charge is used to increase the node potential during an operation of the active restore circuit. Therefore, variation in the voltage of internal power supply line 5 can be suppressed, and the control node of the active restored circuit can be driven to a predetermined voltage level at high speed and stably. Thus, an active restore circuit can be realized that operates speedily and stably.

Embodiment 6

Figure 43A:
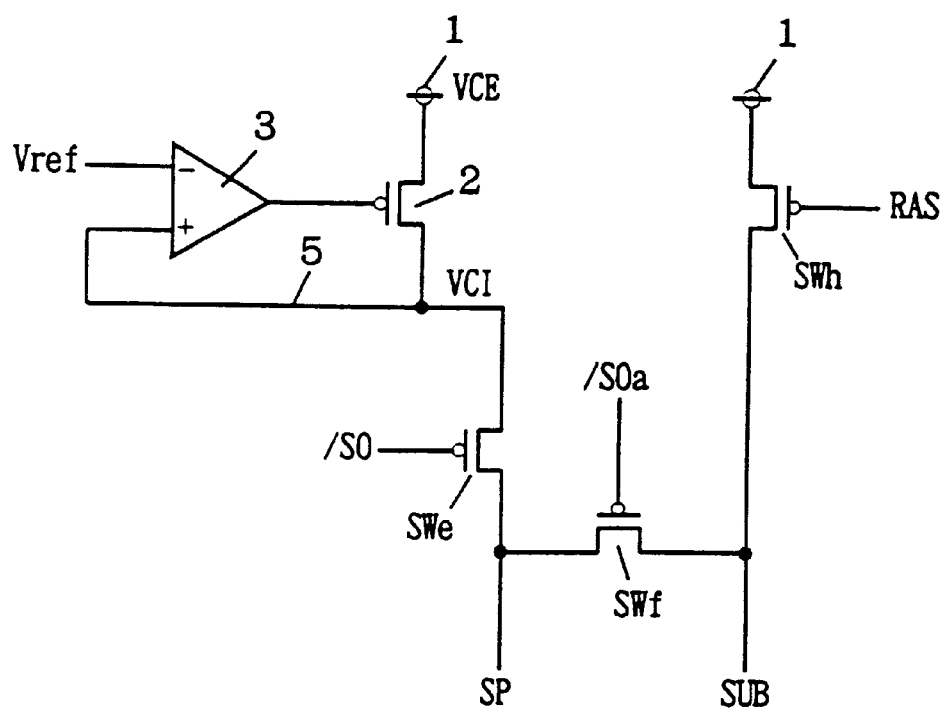
FIGS. 43A and 43B show a structure and operation, respectively, of a semiconductor device according to a sixth embodiment of the present invention.
Figure 43B:
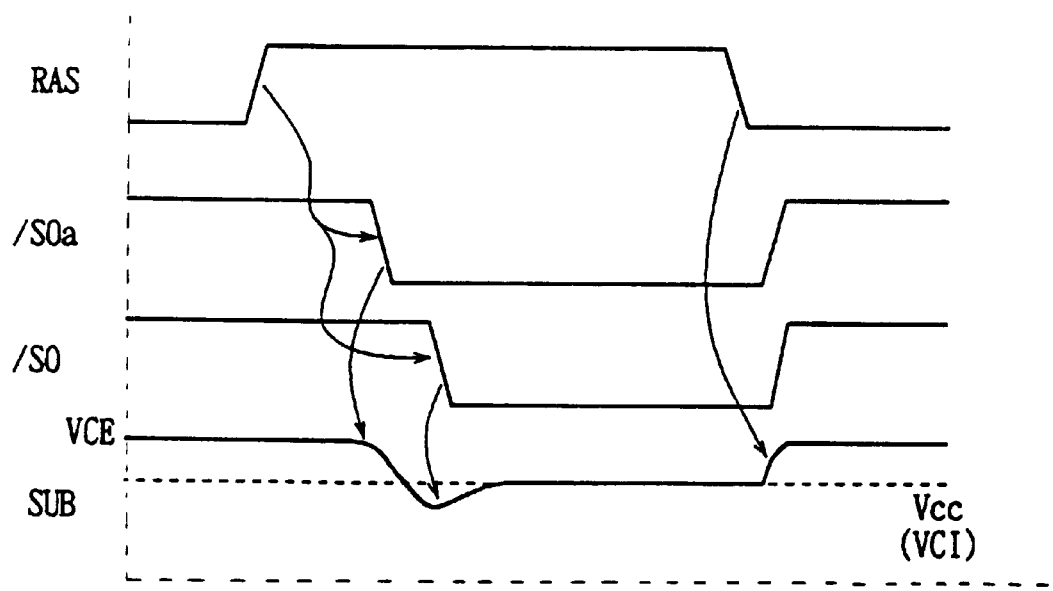

FIGS. 43A and 43B show a structure and an operation of the semiconductor device according to a sixth embodiment of the present invention. In FIG. 43A, a switching transistor SWh is provided between external power supply node 1 and substrate region (the substrate region of the MOS transistor in active restore circuit 420) SUB that conducts in response to row address strobe signal RAS. Internal power supply line 5 is not connected to substrate region SUB. A switching element SWf is provided between substrate region SUB and node SP of active restore circuit 420 which conducts in response to signal /SOa. A switching element SWe that conducts in response to sense activation signal /SO is provided between internal power supply line 5 and node SP. Switching element SWh is turned off and on when signal RAS attains a high level and a low level, respectively. More specifically, switching element SWh is turned on during a standby cycle. The operation thereof will now be described with reference to the waveform diagram of FIG. 43B.

In a standby cycle, signal RAS attains a low level, and switching element SWh is turned on. Substrate region SUB is charged to the level of external power supply voltage VCE applied to external power supply node 1. Switching elements SWe and SWf are both turned off.

When an active cycle is initiated, signal RAS attains a high level, and switching element SWh is turned off. Upon an elapse of a predetermined time period, signal /SOa attains an active state of a low level, whereby switching element SWf is turned on. Substrate region SUB is connected to node SP, and the potential of node SP rises from the level of the precharge potential (intermediate potential). Thus, an active restore operation is gently initiated. The potential of substrate region SUB decreases in response to rise of the potential of node SP. Node SP and substrate region SUB are interconnected, so that the fall of the potential of substrate region SUB and the rise of the potential of node SP are generated substantially at the same speed. At the start of a restore operation, the substrate bias of the MOS transistor of active restore circuit 420 is deeply set, so that the channel resistance thereof is increased due to substrate effect. Thus, a gentle amplifying operation is carried out.

Then, sense activation signal /SO is rendered active at a low level, and switching element /SO is turned on. Current is supplied from internal power supply line 5 to node SP, whereby the potential is restored to the level of power supply voltage VCI (internal operating power supply voltage VCC) on internal power supply line 5. Since the current supply via switching element SWe is carried out with respect to substrate region SUB via switching element SWf, the potential of substrate region SUB attains the level of internal power supply voltage VCC. An active restore operation is carried out under this state. Similar to the previous second embodiment, the difference between the conductance of an MOS transistor that will charge the bit line of a higher potential and the conductance of the other MOS transistor is made sufficiently large in this case. Therefore, the potential of the bit line to be charged increases at a relatively high speed. Here, in active restore circuit 420, the potential of the source and substrate region of MOS transistors PQ1 and PQ2 (refer to FIG. 39) are made equal to each other, so that a substrate effect does not serve. These MOS transistors operate according to the small absolute values of the threshold voltages, and a restore operation can be carried out at high speed.

At the completion of one operation cycle, signal RAS is pulled down to a low level, and signals /SOa and /SO attain an active state of a high level. Switching element SWh is turned off, and substrate region SUB is charged to the level of external power supply voltage VCE again.

By setting the substrate region of an MOS transistor in an active restore circuit at the level of external power supply voltage as in the present sixth embodiment, the substrate region can easily be charged without having to provide an extra charge circuit. Thus, an active restore circuit that operates speedily and stably can be realized.

According to the structure of the sixth embodiment, the substrate region of an MOS transistor which is the component of an active restore circuit is precharged to the level of external power supply voltage during a standby cycle. The charge stored in the substrate region is transmitted to the activation node of the active restore circuit during an operation of the active restore circuit. Therefore, the activation (control) node potential can be increased at high speed and accurately to obtain an active restore circuit that operates stably and speedily.

Embodiment 7

FIG. 44 shows a structure of the components of a semiconductor device according to a seventh embodiment of the present invention. FIG. 44 shows only the portion corresponding to one column of memory cells, i.e. the portion concerning one sense amplifier.

Referring to FIG. 44, an active restore circuit 420 includes cross-coupled p channel MOS transistors PQ3 and PQ4. External power supply voltage VCE is supplied to the substrate regions of MOS transistors PQ3 and PQ4 from external power supply node 1.

Similar to the structure shown in FIG. 39, bit line equalize circuit 440 includes n channel MOS transistors NQ3, NQ4 and NQ5. The substrate regions of MOS transistors NQ3–NQ5 are connected to receive ground voltage GND.

Sense amplifier 430 includes cross-coupled n channel MOS transistors NQ7 and NQ8 between bit lines BL and /BL. The substrate regions of MOS transistors NQ7 and NQ8 are connected to a node VSW. A switching element SWi which is rendered conductive during an active period of precharge signal φP is provide between node VSW and a ground voltage supply node. A switching element SWj rendered conductive during an activation of signal SOb is arranged between node VSW and node SN. A switching element SWk rendered conductive during an activation of signal SOi is provided between node SN and the connected voltage supply node.

A column select gate 445 responsive to a column select signal Y for connecting bit lines BL and /BL to internal data lines IO and /IO is provided to bit lines BL and /BL. Column select gate 445 includes transfer gates TGa and TGb conducting in response to column select signal Y. The structures of bit line equalize circuit 440 and column select gate 445 are similar to those shown in FIG. 39. The operation of the structure of FIG. 44 will now be described with reference to the waveform diagram of FIG. 45.

In a standby cycle, row address strobe signal /RAS attains an inactive state of a high level. Bit line equalize signal EQ attains an H level (high voltage Vpp level), and MOS transistors NQ3–NQ5 of bit line equalize circuit 440 are all turned on. Bit lines BL and /BL are precharged and equalized at the level of intermediate voltage VBL. Similarly, node SP of active restore circuit 420 and node SN of sense amplifier 430 are precharged and equalized at the level of intermediate voltage VBL by an equalize/precharge circuit not shown. Substrate region VCW of MOS transistors NQ7 and NQ8 of sense amplifier 430 is precharged to the level of ground voltage GND at the previous cycle.

When an active cycle is entered, signal /RAS is rendered active at a low level. In response, signal φP is entered active at a high level, and switching element SWi is turned on. As a result, substrate region VSW is reliably precharged to the level of ground voltage GND. Here, bit line equalize signal EQ attains an inactive state of a low level, and MOS transistors NQ3–NQ5 of bit line equalize circuit 440 are all turned off.

Figure 45:
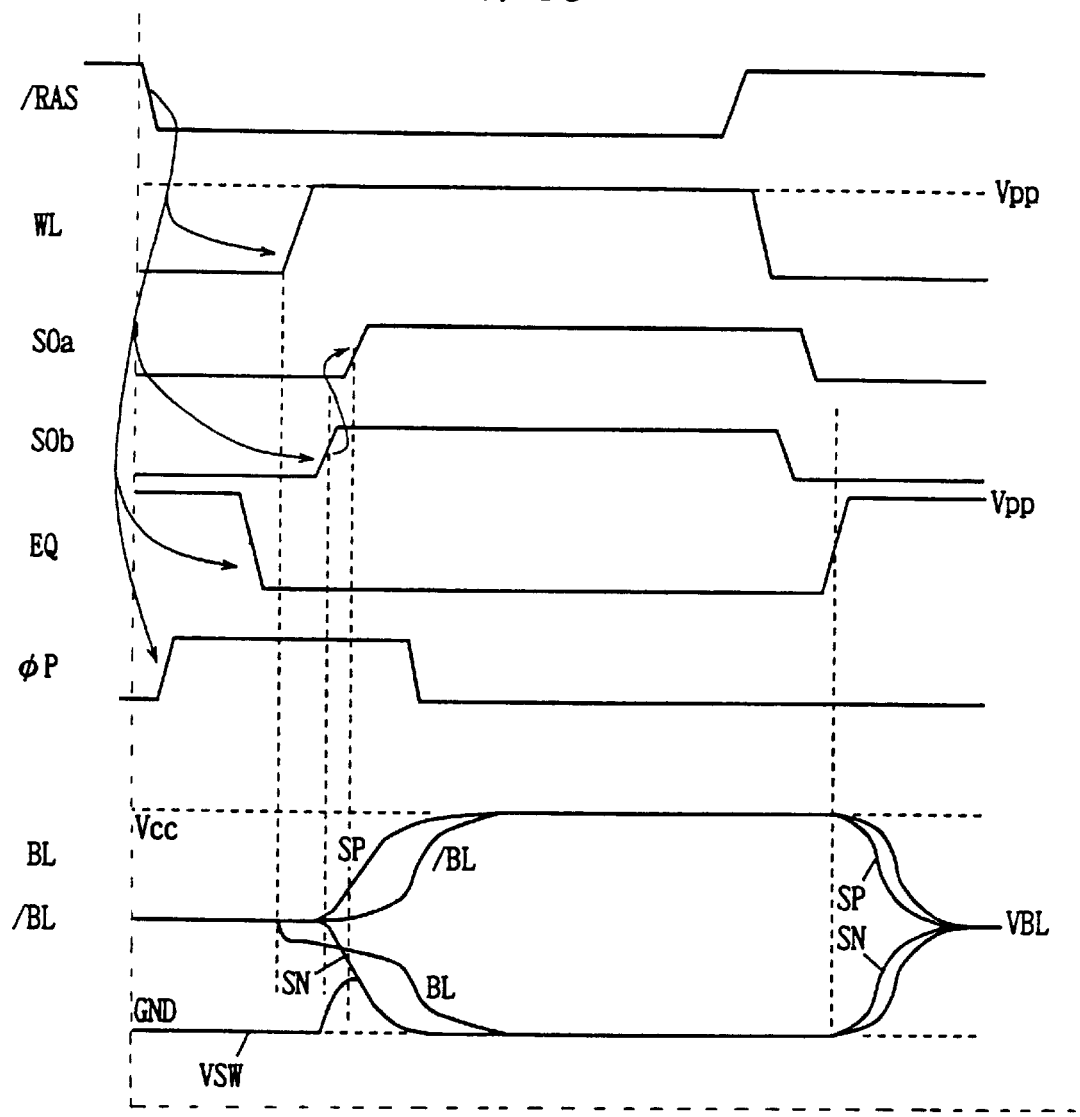
FIG. 45 is a signal waveform diagram showing an operation of the semiconductor device of FIG. 44.

A word line select operation is carried out according to a path not shown, whereby a selected word line WL is boosted to the level of high voltage Vpp. This causes a potential difference between bit lines BL and /BL according to information stored in a memory cell MC connected to the selected word line WL. FIG. 45 shows the case where information of a low level is read out to bit line BL.

Then, sense activation signal SOb is rendered active to a high level, and switching element SWj is turned on. As a result, substrate region VSW is connected to node SN of sense amplifier 430. The potential of node SN is gradually lowered from the precharged level of VBL. Reduction in the potential of node SN is carried out by the provision of charge (electrons) from substrate region VSW. n response, the potential of substrate region VSW rises.

Then, second sense activation signal SOa attains an active state of a high level, and switching element SWk is turned on. Ground voltage GND is supplied to node SN. As a result, the voltage of node SN of sense amplifier 430 rapidly decreases. In comparison to the structure where ground voltage GND is supplied only via switching element SWk, the substrate region of MOS transistors NQ7 and NQ8 is used as the capacitor whose charge stored therein is used to drive node SN to the level of ground voltage. Node SN of sense amplifier 430 can be driven to the level of the predetermined ground voltage at high speed. Here, since the substrate region VSW and the source (node SN) are interconnected via switching element SWj in sense amplifier 430 and have the same potential, the threshold voltage of MOS transistors NQ7 and NQ8 are not subjected to the effect of a substrate effect, and has the smallest value. Therefore, the relevant bit line can be discharged to the level of ground voltage at high speed. Node SN can be reliably discharged to the level of ground voltage GND via switching element SWk even when the capacitance of substrate region VSW is smaller than the capacitance (bit line capacitance) of this node SN. Therefore, the floatings-up of the ground voltage at the start of sense operation can be prevented to reliably carry out a sense operation.

When a memory cycle is completed, signal /RAS is pulled up to a high level, whereby the potential of word line WL decreases to the level of ground voltage of an inactive state. Then, signal SOb is pulled down to a low level, and switching element SWj is turned off. Substrate region VSW is already charged to the level of ground voltage GND. Then, activation signal SOa is rendered inactive at a low level, and switching element SWk is turned off.

In the waveform diagram of FIG. 45, precharge signal φP is rendered active to a high level during a sense operation. Here, a structure may be utilized where sense activation signals SOb and SOa are rendered active after charge signal φP attains an inactive state of a low level.

The potential of node SP of active restore circuit 420 is similar to that described with reference to the previous embodiment 2. A sense activation signal is generated by a path not shown, and node SP is increased to the level of internal power supply voltage VCC.

Modification 1

Figure 46:
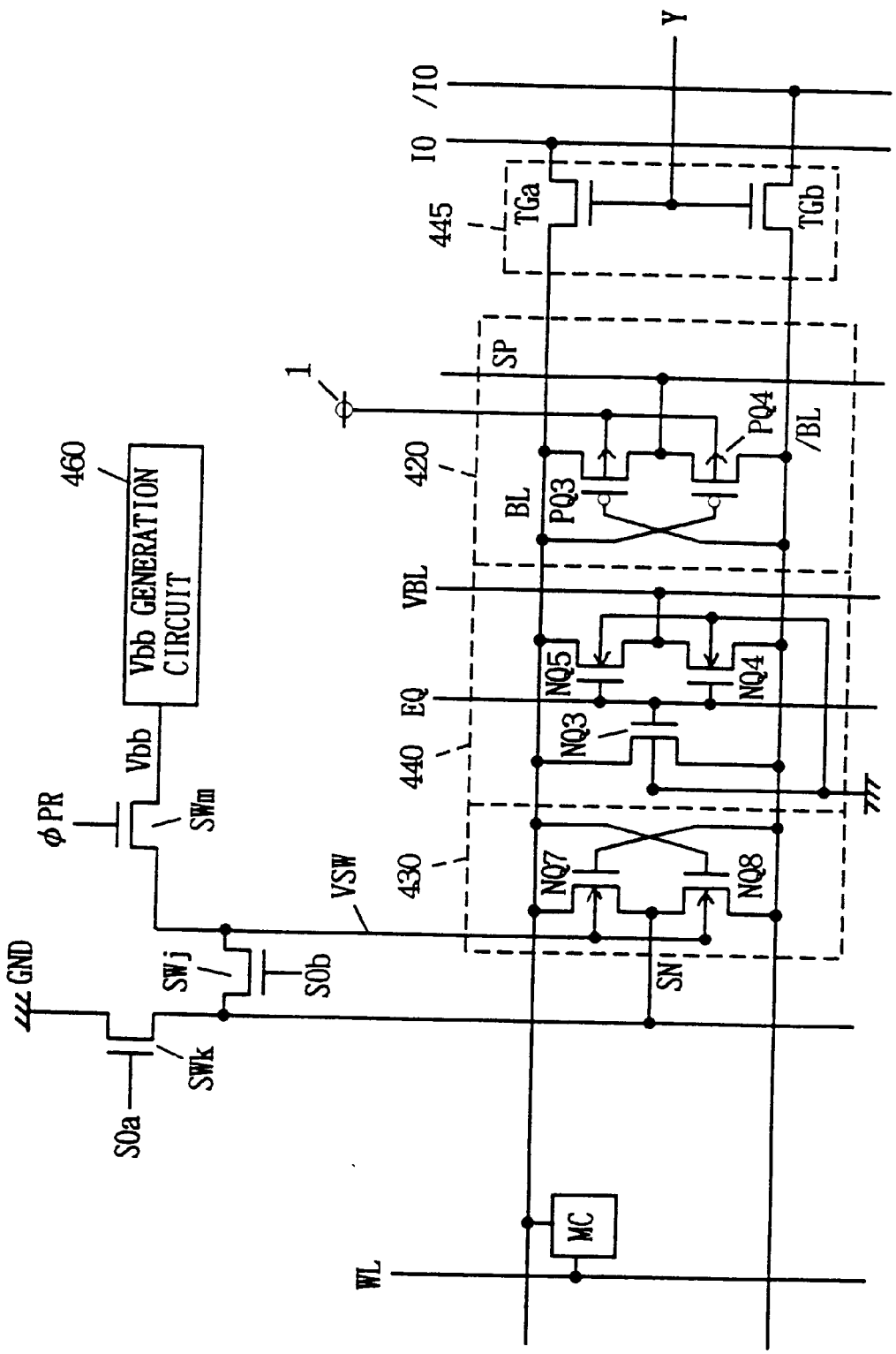
FIG. 46 shows a first modification of the seventh embodiment of the present invention.

FIG. 46 shows a structure of a first modification of the seventh embodiment of the present invention. Referring to FIG. 46, substrate region VSW of MOS transistors NQ7 and NQ8 of sense amplifier 430 is supplied with a negative voltage Vbb from a Vbb generation circuit 460 via switching element SWm. Switching element SWm receives a precharge signal φPR at its gate. Precharge signal φPR attains the level of internal power supply voltage VCC at a high level and the level of a negative voltage Vbb at a low level. The remaining structure is similar to that shown in FIG. 44, and corresponding components have the same reference characters denoted. The operation of the structure shown in FIG. 46 will be described with reference to the waveform diagram of FIG. 47.

In the standby cycle, signals SOa, SOb and φPR are all rendered inactive at a low level, and switching elements SWk, SWj and SWa are turned off. Substrate region VSW is precharged to the level of ground voltage GND at the previous cycle. Bit line equalize circuit 440 is activated in response to equalize signal EQ of a high level to precharge and equalize bit lines BL and /BL to the level of intermediate voltage VBL. In active restore circuit 420, node SP is precharged to the level of intermediate voltage VBL. Node SN of sense amplifier 430 is also precharged to the level of intermediate voltage VBL.

When signal /RAS attains an active state at a low level, an active cycle is initiated. In response to the fall of signal /RAS, precharge signal φPR is pulled up to a high level from a low level, whereby negative voltage Vbb from Vbb generation circuit 460 is supplied to substrate region VSW of sense amplifier 430. This causes substrate region VSW to be charged to the level of negative voltage Vbb from ground voltage GND. Here, equalize signal EQ is pulled down to a low level of an inactive state, and bit line equalize circuit 440 is rendered inactive. Bit lines BL and /BL attain a floating state at the level of precharge voltage VBL.

When the potential of a selected word line WL rises to the level of high voltage Vpp so that the voltage difference between bit lines BL and /BL is increased, sense activation signals SOb and SOa are sequentially rendered active at a high level (rendered active upon an elapse of a predetermined time period in response to signal /RAS). This turns on switching element SWj, whereby negative voltage Vbb of substrate region VSW is transferred to node SN. The voltage of node SN is decreased from intermediate voltage VBL towards ground potential. Since the negative voltage is supplied from substrate region VSW to sense node SN, the source voltage of MOS transistors NQ7 and SQ8 of sense amplifier 430 decreases more speedily than in the case where ground voltage GND is supplied. The potential difference between the higher potential bit line and node SN is increased, so that the gate-source voltage of the MOS transistor that will discharge the bit line of the lower potential is increased. Therefore discharge of the bit line is carried out at high speed.

Here, negative voltage Vbb is applied to substrate region VSW of MOS transistors NQ7 and NQ8. The bias thereof is deeper than in the case where the ground voltage is supplied. Therefore, by a substrate bias effect, the threshold voltage of MOS transistors NQ7 and NQ8 is increased, and the source potential are decreased equivalently. Under this state, a discharge operation is carried out moderately. Therefore, when switching element SWj is turned off at the initiation of the sense operation, the sense operation is carried out gently. Then, switching element SWj is turned on, and substrate region VSW and node SN are inter-connected to have the substrate effect removed. Discharging is carried out at high speed. Thus, a sense operation in two stages is realized including a gentle amplification at the start of the sense operation and then an amplification operation at high speed. Therefore, the small potential difference between bit lines BL and /BL can be amplified accurately.

At the completion of one memory cycle, signal /RAS is pulled up to a high level. In response, word line WL is pulled down to a low level, and sense activation signals SOb and SOa are pulled down to a low level. Equalize signal EQ is pulled to a high level of high voltage Vpp. As a result, each circuit returns to a standby state.

Figure 47:
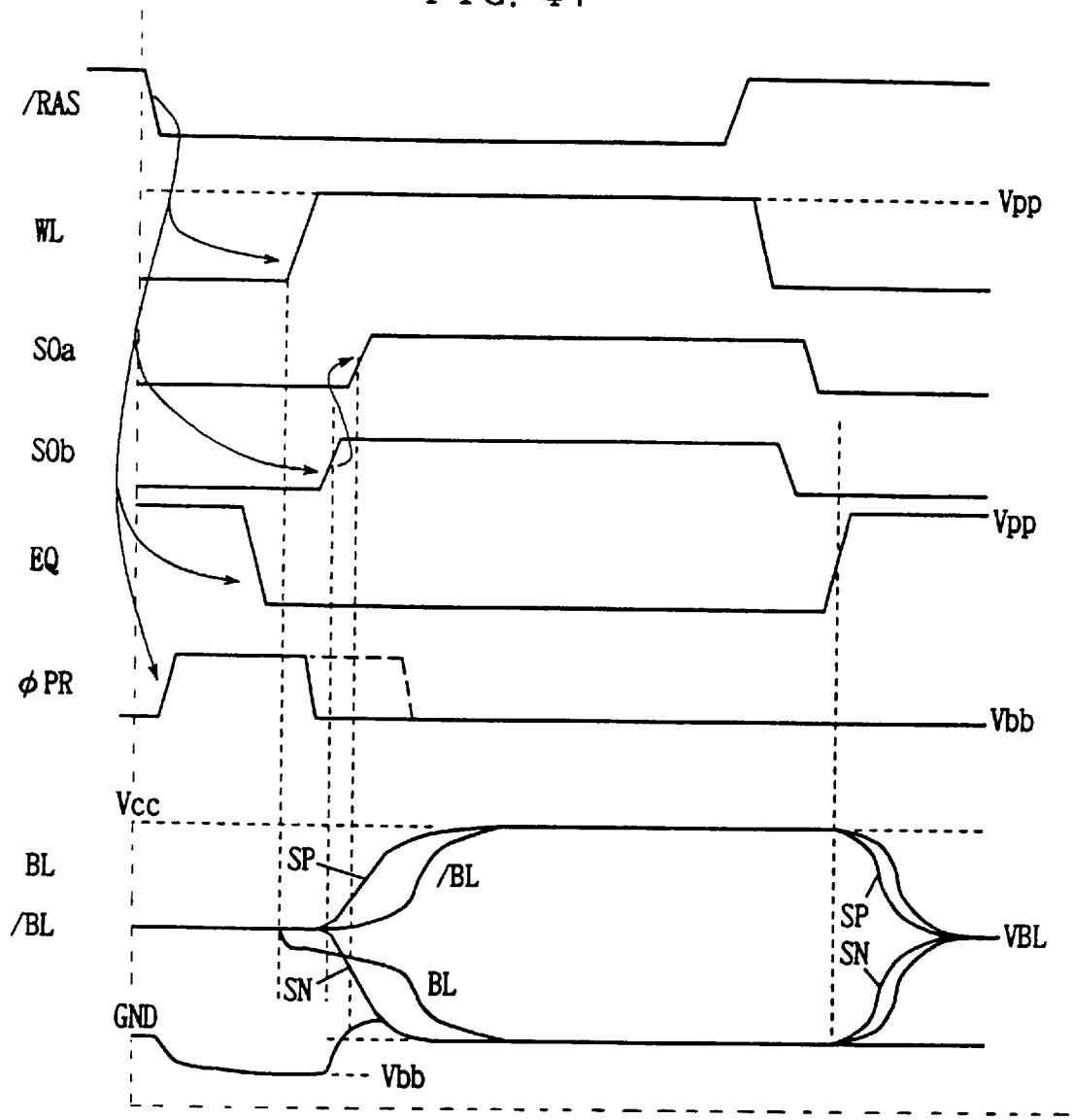
FIG. 47 is a signal waveform diagram showing an operation of the semiconductor device of FIG. 46.

The waveform diagrams of FIGS. 45 and 47 show the state where switching element SWk is turned off after switching element SWj is turned off. Switching elements SWk and SWj may be turned off at the same timing. Alternatively, switching element SWk may be first turned off, and switching element SWj may then be turned off.

Modification 2

Figure 48:
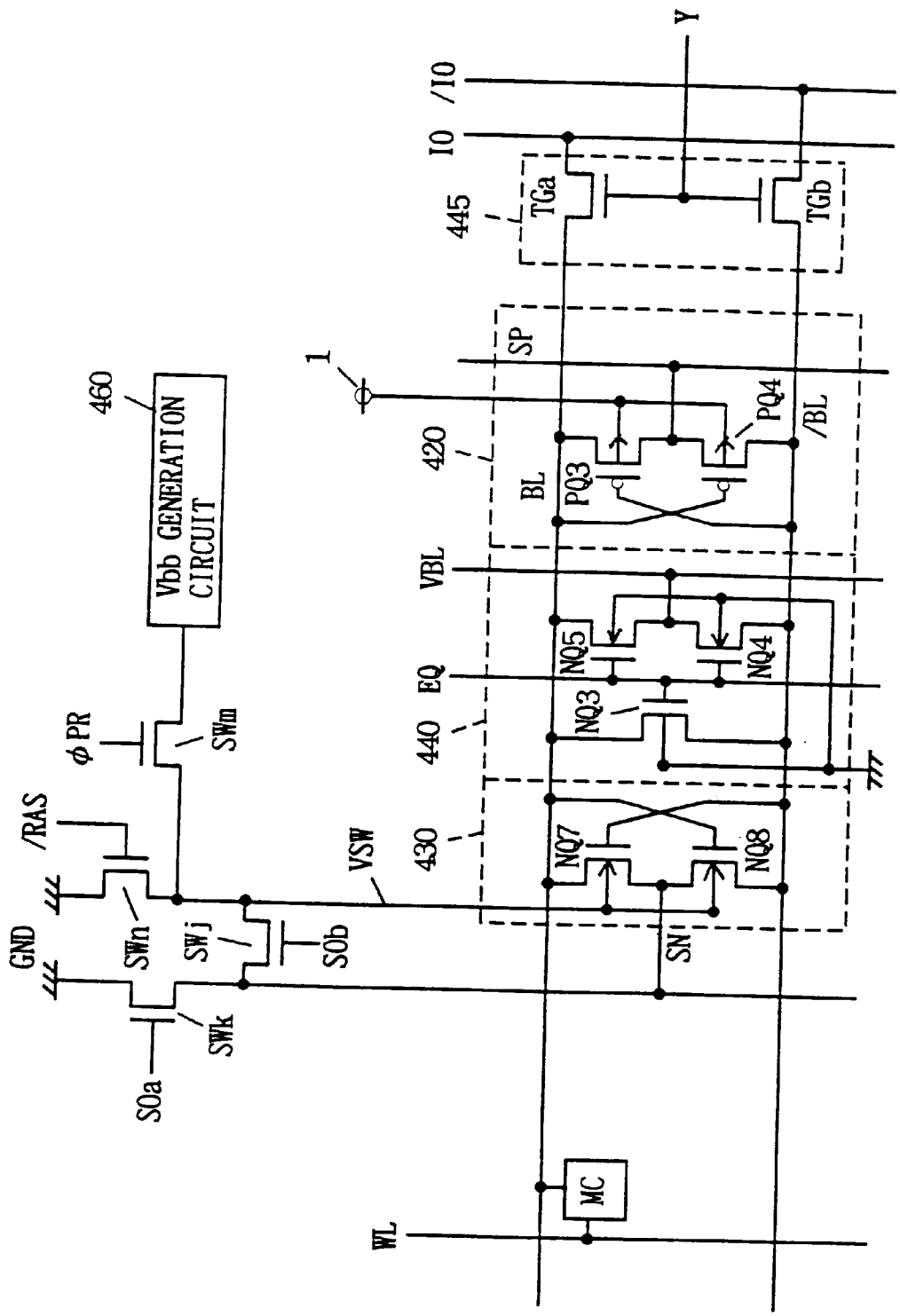
FIG. 48 shows a second modification of the seventh embodiment.

FIG. 48 shows a structure of the second modification of the seventh embodiment of the present invention. Referring to FIG. 48, a switching element SWn rendered conductive at an inactivation of signal /RAS for transmitting ground voltage GND is arranged for substrate region VSW. More specifically, in the structure of FIG. 48 where signal /RAS indicates a standby cycle at a high level, switching element SWn is turned on, and ground voltage GND is supplied to ground region VSW of MOS transistors NQ7 and NQ8 of sense amplifier 430. This prevents substrate region VSW from attaining a floating state during a standby cycle. Therefore, substrate region VSW can be reliably maintained at the level of ground voltage GND.

Since switching element SWm is turned on only during a predetermined time period according to the structure shown in FIGS. 46 and 48, the period where negative voltage Vbb is supplied to substrate region VSW is limited. Therefore, after charging of node SN, substrate region VSW is driven to the level of ground voltage GND by switching elements SWk and SWj, whereby node SN is prevented from altering to the level of negative voltage Vbb.

According to the structure of the seventh embodiment, the substrate region of MOS transistors NQ7 and NQ8 of sense amplifier is charged to a predetermined voltage. Since the electric charges of the substrate region are utilized for charging the activation node of the sense amplifier, a sensing operation can be carried out speedily and stably.

Embodiment 8

Figure 49:
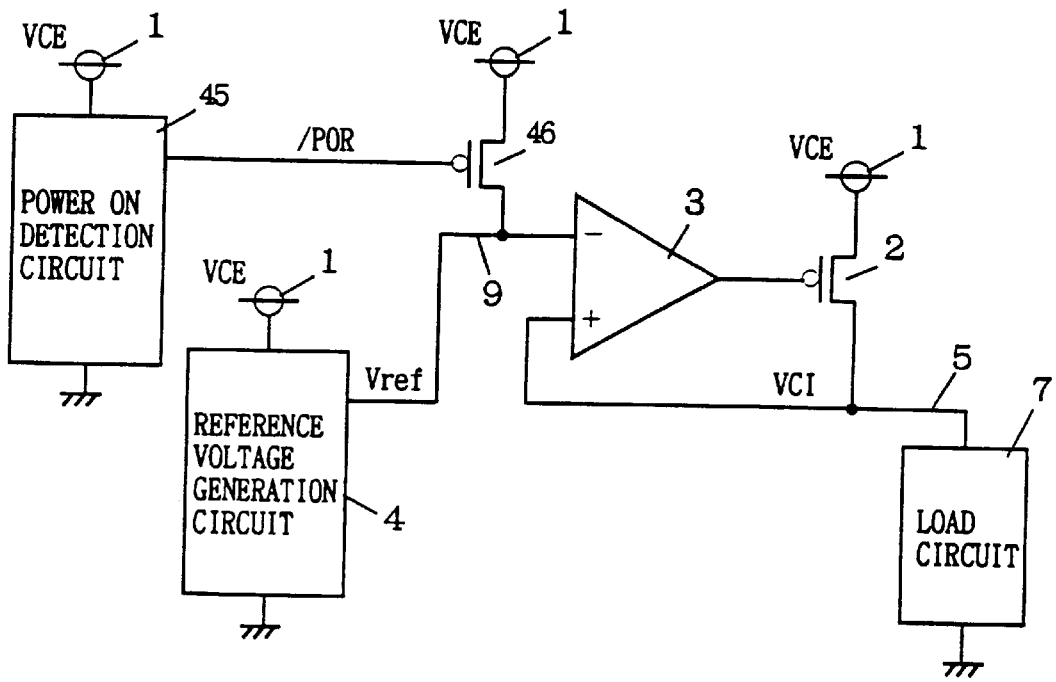
FIG. 49 shows a structure of an internal power supply voltage generation circuit according to an eighth embodiment of the present invention.

FIG. 49 shows a structure of an internal power supply voltage generation circuit according to an eighth embodiment of the present invention. Referring to FIG. 49, the internal power supply voltage generation circuit (internal voltage down converter) includes a power on detection circuit 45 for detecting the supply of an external power supply voltage VCE when externally applied power supply voltage VCE to external power supply node 1 rises to a predetermined voltage level to provide a power on detection signal POR (not shown in FIG. 49) and an inverted signal /POR, a reference voltage generation circuit 4 for generating a reference voltage Vref of a predetermined voltage level from external power supply voltage VCE on external power supply node 1 to provide the same on a signal line 9, and a p channel MOS transistor 46 rendered conductive in response to power on detection signal /POR from power on detection circuit 45 for electrically connecting external power supply node 1 with signal line 9. Drive transistor 2 and comparison circuit 3 are similar to those of the conventional internal voltage down converter. Comparison circuit 3 compares internal power supply voltage VCI on internal power supply line 5 with the voltage on signal line 9, and adjusts the current supply amount of drive transistor 2, i.e. the conductance of drive transistor 2. Load circuit 7 uses internal power supply voltage VCI on internal power supply line 5. The internal power supply voltage generation circuit of FIG. 49 will be described with reference to the waveform diagram of FIG. 50.

Figure 50:
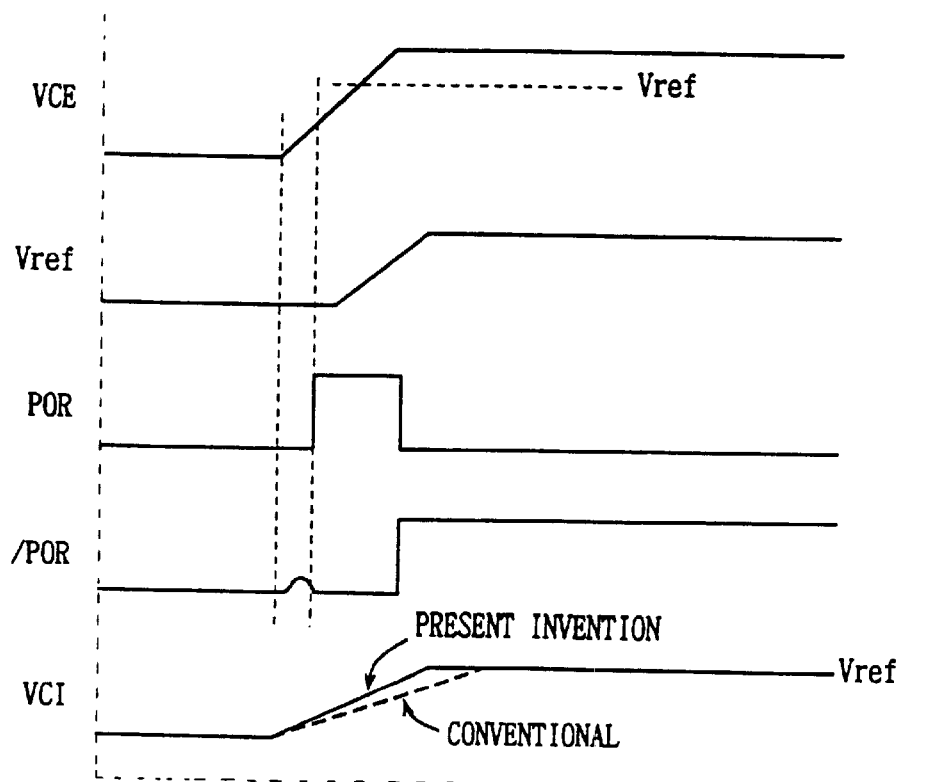
FIG. 50 is a signal waveform diagram showing an operation of the circuit of FIG. 49.

When external power supply voltage VCE is applied to external power supply node 1, and the potential level on external power supply node 1 exceeds a predetermined voltage level, power on detection circuit 45 detects that external power supply voltage VCE is supplied and pulls up power on detection signal POR to an H level. The pulse width of power on detection signal POR of an H level is set to an appropriate magnitude. In FIG. 50, power on detection signal POR is shown being pulled down to an L level after external power supply voltage VCE becomes constant at a predetermined voltage level. The term of this power on detection signal POR may be slightly increased.

In contrast, power supply detection signal /POR maintains an L level (when external power supply voltage VCE is supplied, the voltage level slightly increases according to external power supply voltage VCE. However it is immediately set to an L level by signal POR). In response to signal /POR of an L level, MOS transistor 46 is turned on, whereby external power supply voltage VCE is transmitted to signal line 9.

The structure of reference voltage generation circuit 4 will be shown afterwards. Reference voltage generation circuit 4 operates when external power supply voltage VCE exceeds a constant voltage level. The voltage level of reference voltage Vref is gradually raised to be eventually set to the level of a predetermined constant voltage. Comparison circuit 3 compares the voltage on signal line 9 with internal power supply voltage VCI on internal power supply line 5 to drive the transistor 2 according to the comparison result thereof. Internal power supply line 5 has a relatively large parasitic capacitance, so that the rise of internal power supply voltage VCI is more gentle than the rise of the voltage level of reference voltage Vref. Here, MOS transistor 46 is turned on, and the voltage of signal line 9 is set to the level of external power supply voltage VCE. Therefore, comparison circuit 3 adjusts the conductance of drive transistor 2 according to the difference between internal power supply voltage VCI and external power supply voltage VCE. Therefore, a current greater than in the case where reference voltage Vref from reference voltage generation circuit 4 is compared with internal power supply voltage VCI is supplied to internal power supply line 5 by drive transistor 2. As a result, the rise of internal power supply voltage VCI on internal power supply line 5 is speeded, so that internal power supply voltage VCI attains a stable state at high speed.

The rising time period of signal /POR to an H level from power on detection circuit 45 is set to be before the arrival of power supply voltage VCI on internal power supply line 5 at the level of a constant reference voltage. The rising period of signal /POR and the maintaining period of an H level of signal are set so that comparison circuit 3 carries out the comparison operation of reference voltage Vref from reference voltage generation circuit 4 with internal power supply voltage VCI before internal power supply voltage VCI becomes greater than the target constant voltage level (the final attaining level of reference voltage Vref).

By advancing the period where internal power supply voltage VCI is stabilized, internal power supply voltage VCI can reliably be set to a predetermined voltage level during a dummy cycle that is carried out for resetting the internal circuit after power is turned on (toggling signal /RAS a predetermined number of times to set any signal line and any internal node to the level of a predetermined voltage). Therefore, the internal circuitry and any internal node can be reliably set to the initial state of a predetermined voltage level.

Modification 1

Figure 51:
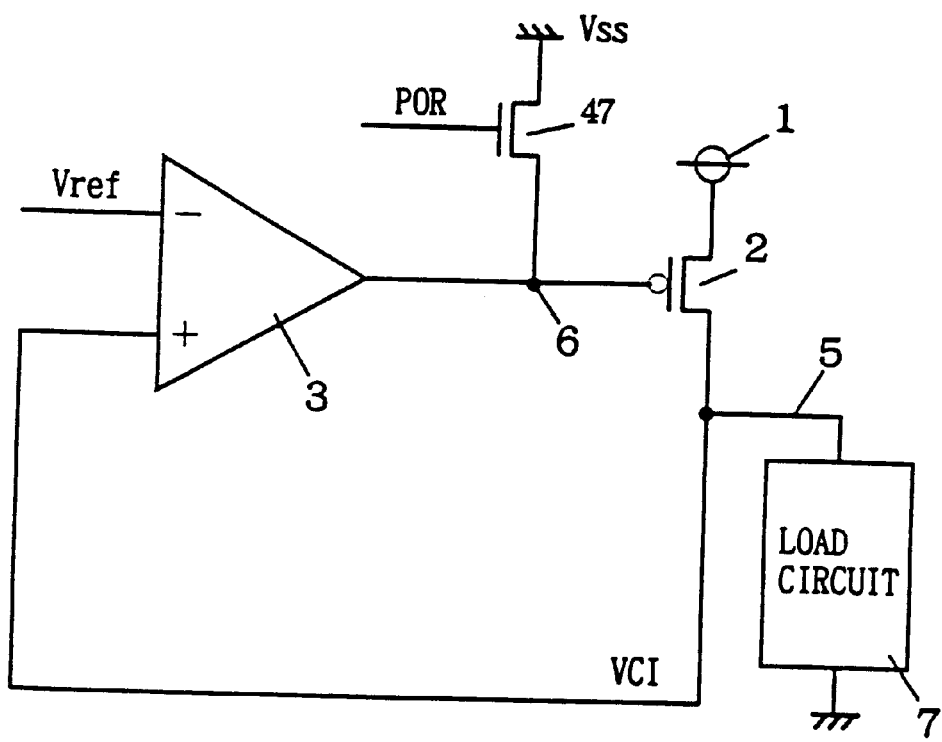
FIG. 51 shows a first modification of the internal power supply voltage generation circuit of the eighth embodiment.
Figure 52:
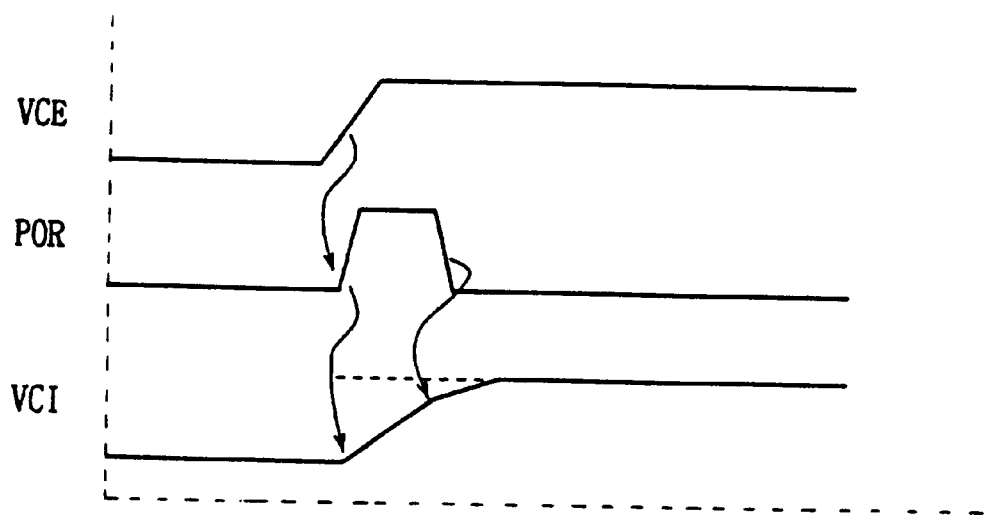
FIG. 52 is a signal waveform diagram showing an operation of the circuit of FIG. 51.

FIG. 51 shows a first modification of an internal power supply voltage generation circuit according to an eighth embodiment of the present invention. Referring to FIG. 37, an n channel MOS transistor 47 is provided at the output node 6 of comparison circuit 3, i.e. at the gate of drive transistor 2. N channel MOS transistor 47 is turned on in response to power on detection signal POR to electrically connect node 6 to ground node VSS. The remaining structure is similar to that of a conventional internal voltage down converter. The operation of the structure shown in FIG. 51 will be described hereinafter with reference to the waveform diagram of FIG. 52.

When external power supply voltage VCE is applied and external power supply node 1 attains a predetermined level, power on detection signal POR is pulled up to an H level for predetermined time period. As a result, MOS transistor 47 is turned on, and node 6 is set to the level of ground voltage VSS. Drive transistor 2 has a great conductance according to ground voltage VSS on node 6 to supply a great current flow from external power supply node 1 to internal power supply line 5, whereby the level of internal power supply voltage VCE is increased. Since reference voltage Vref has not yet attained a predetermined voltage level when power on detection signal POR attains an H level, internal power supply voltage VCI can be increased more speedily. When power on detection signal POR attains an L level, MOS transistor 47 is turned off, and the voltage level of node 6 is varied according to an output signal of comparison circuit 3. Here, the conductance (current driving capability) of drive transistor 2 is adjusted according to the voltage level of reference voltage Vref and internal power supply voltage VCI. Eventually, internal powers supply voltage VCI is increased to the level of the final voltage level.

According to the structure shown in FIG. 51, drive transistor 2 supplies current from external power supply node 1 to internal power supply line 5 with a great current driving capability when external power supply voltage VCE is applied. Therefore, internal power supply voltage VCI is increased at high speed. Accordingly, internal power supply voltage VCI can be stabilized at a predetermined voltage level at high speed.

Modification 2

Figure 53:
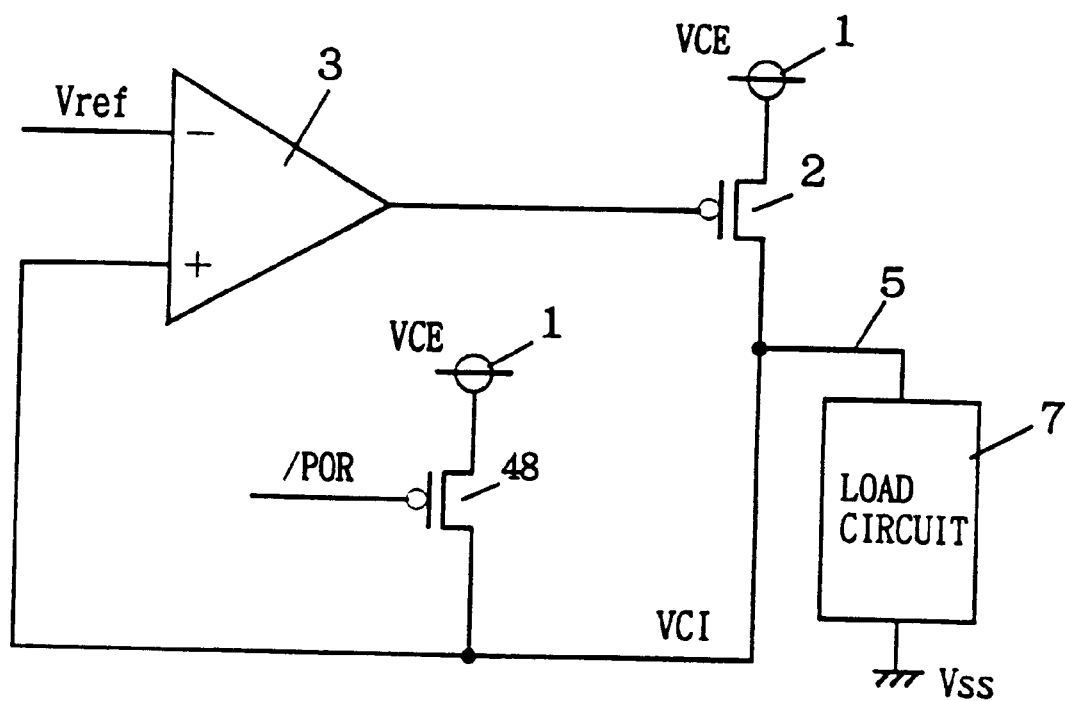
FIG. 53 shows a second modification of the internal power supply voltage generation circuit according to the eighth embodiment.
Figure 54:
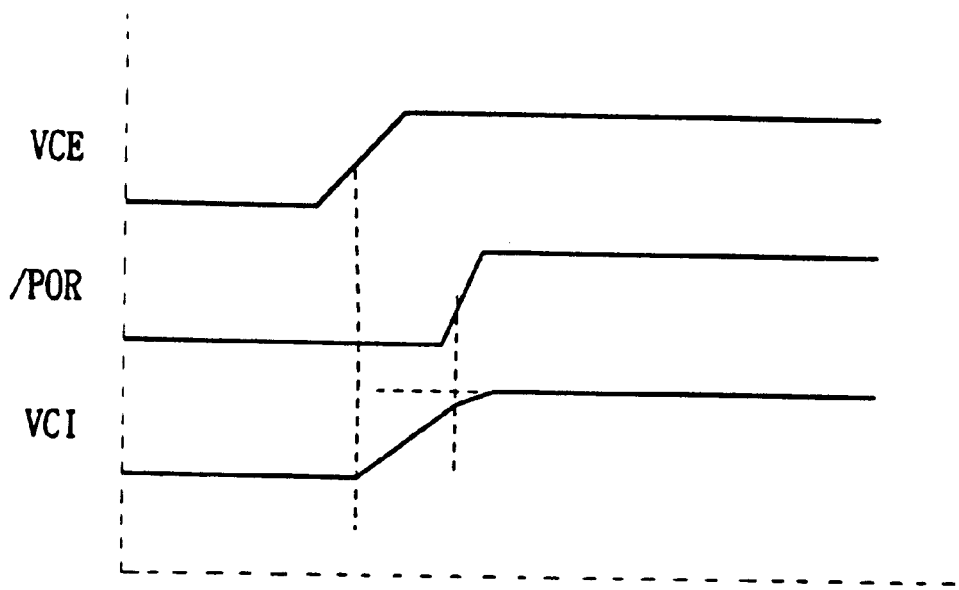
FIG. 54 is a signal diagram showing an operation of the circuit structure of FIG. 53.

FIG. 53 shows a second modification of the internal power supply voltage generation circuit according to the eighth embodiment of the present invention. According to the structure shown in FIG. 53, in addition to drive transistor 2, a p channel MOS transistor 48 rendered conductive in response to power on detection signal /POR is provided between internal power supply line 5 and external power supply node 1. The operation thereof will be described with reference to the waveform diagram of FIG. 54.

Similar to the structure shown in FIG. 51, when external power supply voltage VCE is applied to external power supply node 1 in the structure of FIG. 53, p channel MOS transistor 48 is turned on for a predetermined time period, whereby current is supplied from external power supply node 1 to internal power supply line 5. Even when the voltage of the output signal of comparison circuit 3 attains a transient state, and the conductance of drive transistor 2 is not yet stable, current is supplied from external power supply node 1 via MOS transistor 48 to internal power supply line 5. Therefore, the potential of internal power supply voltage VCI rises. When signal /POR is pulled up to an H level, MOS transistor 48 is turned off (the H level of signal /POR is the external power supply voltage level VCE). Internal power supply line 5 has current supplied from external power supply node 1 via drive transistor 2 according to an output signal of comparison circuit 3. The voltage level of internal power supply voltage VCI rises to the level of a predetermined voltage.

Since internal power supply line 5 is electrically connected to external power supply node 1 when internal power supply voltage VCE is applied to internal power supply node 1 in the structure shown in FIG. 53, the rising timing of the level of internal power supply voltage VCI can be advanced, so that internal power supply voltage VCI can be set to a stable state speedily.

Embodiment 9

Figure 55:
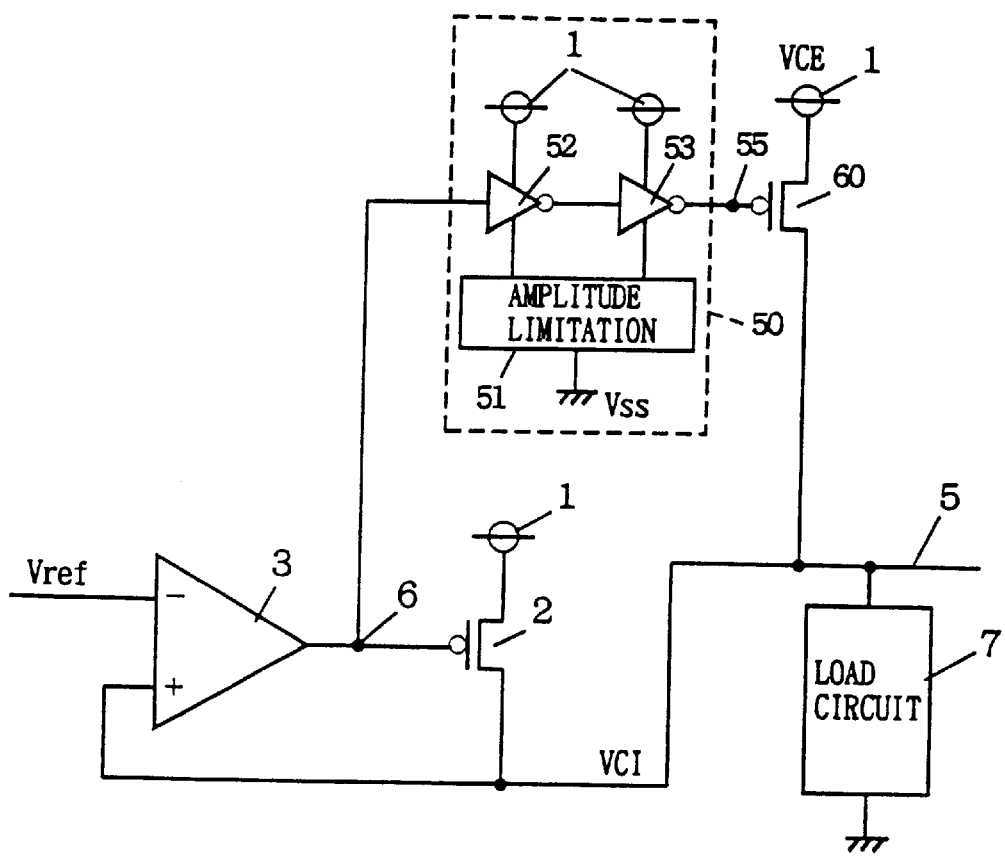
FIG. 55 schematically shows a structure of an internal power supply voltage generation circuit according to a ninth embodiment of the present invention.
Figure 56:
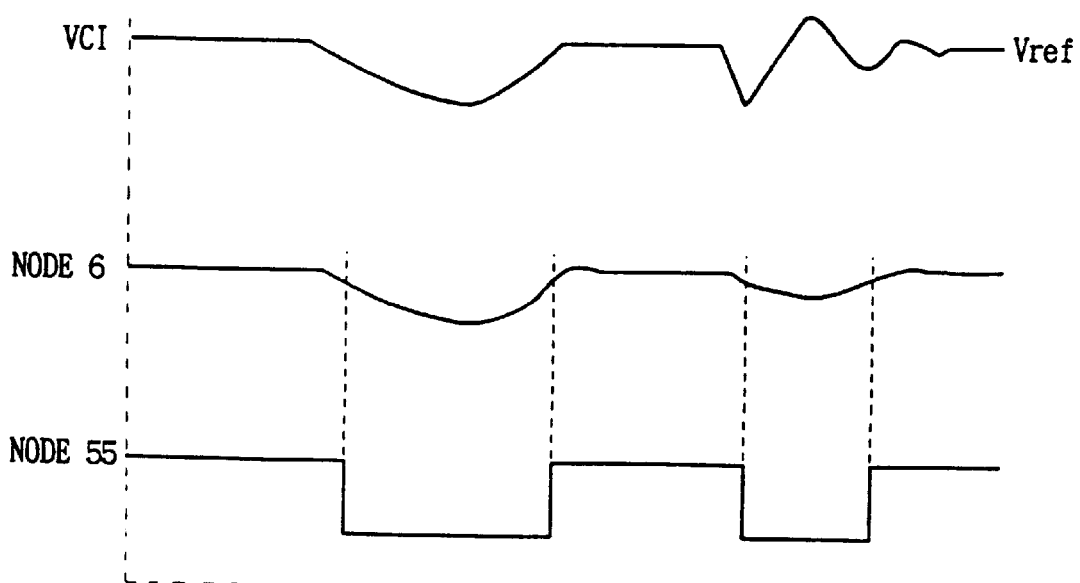
FIG. 56 is a signal waveform diagram showing an operation of the circuit structure shown in FIG. 55.

FIG. 55 shows a structure of an internal power supply voltage generation circuit according to a ninth embodiment of the present invention. Referring to FIG. 55, the internal power supply voltage generation circuit includes a comparison circuit 3 for comparing reference voltage Vref with internal power supply voltage VCI on internal power supply line 5, a drive transistor 2 for supplying current from external power supply node 1 to internal power supply line 5 in response to an output signal of comparison circuit 3, an amplifier circuit 50 for amplifying an output signal of comparison circuit 3, and a p channel MOS transistor 60 turned on/off in response to an output signal of amplifier circuit 50 for supplying current from external power supply node 1 to internal power supply line 5. Amplifier circuit 50 includes two stages of cascade-connected CMOS inverters 52 and 53 for amplifying an output signal of comparison circuit 3, and an amplitude limitation circuit 51 for limiting the amplitude of an L level of output signals of CMOS inverters 52 and 53. CMOS inverters 52 and 53 operate with external power supply voltage VCE applied to external power supply node 1 as one operating power supply voltage. The operation of the internal power supply voltage generation circuit of FIG. 55 will be described with reference to the waveform diagram of FIG. 56.

When internal power supply voltage VCI on internal power supply line 5 is reduced gently, the output signal of comparison circuit 3 is lowered in response to the change of internal power supply voltage VCI. When an output signal of comparison circuit 3, i.e. the voltage level of node 6, decreases, drive transistor 2 is increased in the conductance thereof, so that current is supplied from external power supply node 1 towards internal power supply line 5. The voltage level of this lowered internal power supply voltage VCI is restored to its former level. Here, in amplifier circuit 50, CMOS inverter 52 inverts and amplifies the signal on node 6. Then, CMOS inverter 53 inverts and amplifies the output signal of CMOS inverter 52. As a result, the output signal of amplifier circuit 50 is pulled down to an L level at high speed, and MOS transistor 60 is turned on. Therefore, current is supplied from external power supply node 1 to internal power supply line 5. Here, when the load current is great, the current driving capability of MOS transistor 60 assists the current driving capability of drive transistor 2. When the load current is small, the load current can be sufficiently supplied only with the current driving capability of drive transistor 2. Therefore, overshooting of internal power supply voltage VCI on internal power supply line 5 can be prevented.

When the signal voltage of node 6 is reduced, p channel MOS transistor is turned on in CMOS inverter 52. Therefore, the output signal thereof is pulled up to an H level. However, by amplitude limitation circuit 51, the source potential of the internal n channel MOS transistor is higher than ground voltage VSS, and the gate-source voltage of the n channel MOS transistor is sufficiently made smaller. Therefore, the through current of CMOS inverter 52 is suppressed. The structure of amplitude limitation circuit 51 will be described in detail afterwards. Here, the output signal of CMOS inverter 53 is decreased to an L level. The voltage of an L level is set to the voltage level determined by amplitude limitation circuit 51. Therefore, the gate potential of MOS transistor 60 is prevented from falling to the level of ground voltage VSS. As a result, overshooting of internal power supply line 5 is prevented which is caused by a great current supplied from MOS transistor 60 to internal power supply line 5.

When power supply voltage VCI on internal power supply line 5 is suddenly reduced according to an operation of load circuit 71, the output signal of comparison circuit 3 will not follow this sudden change of internal power supply voltage VCI. Output signal of comparison circuit 3 will vary gently. However, since the output signal of comparison circuit 3, i.e. the voltage of node 6, is amplified by amplifier circuit 50, MOS transistor 60 is turned on at high speed, so that current is supplied from external power supply node 1 to internal power supply line 5. Therefore, a sudden change in internal power supply voltage VCI is suppressed. By turning on MOS transistor 60, the sudden change in internal power supply voltage VCI can be alleviated or compensated for. Therefore, internal power supply voltage VCI can be maintained at a predetermined voltage level stably.

First Specific Structure

Figure 57:
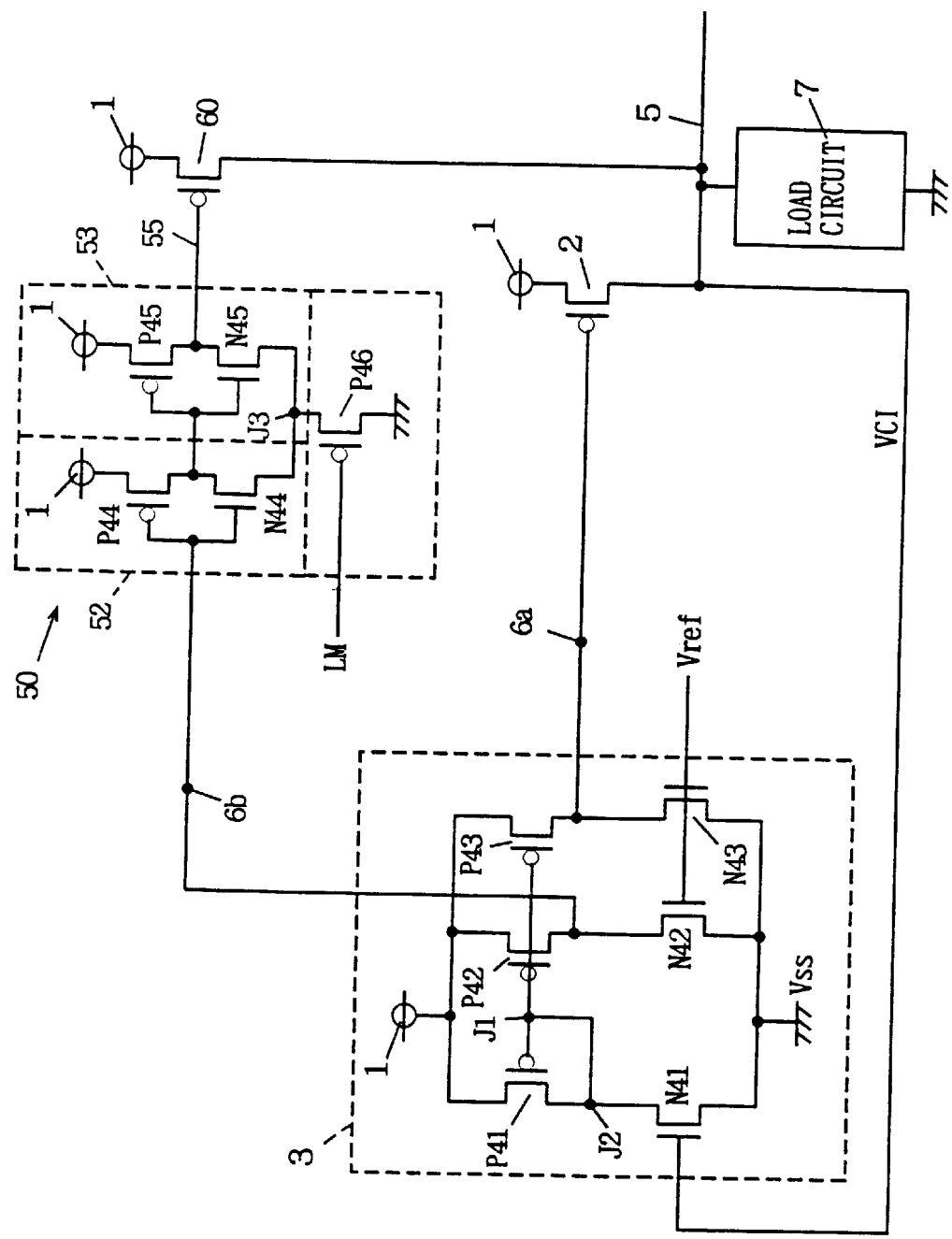
FIGS. 57–59 show first to third specific structures, respectively, of an internal power supply voltage generation circuit according to a ninth embodiment of the present invention.

FIG. 57 shows a specific structure of the internal power supply voltage generation circuit according to the ninth embodiment of the present invention. Referring to FIG. 57, comparison circuit 3 includes an n channel MOS transistor 41 connected between a node J2 and ground node VSS for receiving internal power supply voltage VCI at its gate, an n channel MOS transistor N42 connected between a node 6b and ground node VSS for receiving reference voltage Vref at its gate, a p channel MOS transistor P41 connected between external power supply node 1 and node J2 and having its gate connected to node J2 via node J1, a p channel MOS transistor P42 connected between external power supply node 1 and a node 6b and having its gate connected to node J1, a p channel MOS transistor P43 connected between external power supply node 1 and node 6a and having its gate connected to node J1, and an n channel MOS transistor N32 connected between node 6a and ground node VSS and receiving reference voltage Vref at its gate.

P channel MOS transistor P41 and p channel MOS transistors P42 and P43 form a current mirror circuit. More specifically, the current mirroring the current through p channel MOS transistor 41 is conducted to p channel MOS transistors P42 and P43. The ratio of the currents is determined according to the ratio of the size (the ratio of gate width to gate length W/L) of MOS transistor P41 to MOS transistors P42 and P43. Node 6a is connected to the gate of drive transistor 2. Node 6b is connected to an input portion of amplifier circuit 50.

Amplifier circuit 50 includes CMOS inverters 52 and 53. CMOS inverter 52 includes a p channel MOS transistor P44 and an n channel MOS transistor N44 connected between external power supply node 1 and node G3. CMOS inverter 53 includes a p channel MOS transistor P45 and an n channel MOS transistor N45 connected between external power supply node 1 and node J3. Node 6b is connected to the gates of MOS transistors P44 and N44. The output node of CMOS inverter 52 is connected to the gates of MOS transistors P45 and N45.

Amplitude limitation circuit 51 includes a p channel MOS transistor P46 connected between a node 53 and ground node for receiving an amplitude control signal LM at its gate. MOS transistor P46 sets the potential of node J3 to the voltage level of LM+Vtp. The operation thereof will be described below.

Similar to the comparison circuit of FIG. 22, comparison circuit 3 has a structure of a current mirror amplifier circuit. More specifically, when internal power supply voltage VCI is higher than reference voltage Vref, the conductance of MOS transistor N41 becomes higher than that of MOS transistors N42 and N43, so that the current flow of MOS transistor P41 increases. The mirror current of the current flow of MOS transistor P41 is conducted to MOS transistors P42 and P43 respectively. Since the conductance of MOS transistors N42 and N43 is smaller than that of MOS transistor N41, the voltage level of nodes 6a and 6b rises. As a result, the conductance of drive transistor 2 is reduced, so that the current flow from internal power supply node 1 to internal power supply line 5 via drive transistor 2 is suppressed (cut off).

The voltage on node 6b is inverted and amplified by CMOS inverter 52. Here, MOS transistor P44 is brought to a transition of an off state, and MOS transistor N44 is turned on. Therefore, an output signal of CMOS inverter 52 is pulled down to an L level, and MOS transistor P45 is turned on in CMOS inverter 53. Therefore, MOS transistor N45 is gradually turned off. Therefore, the voltage level of node 55 rises, and drive MOS transistor 60 is turned off. When the output signal of CMOS inverter 52 is reduced in potential to an L level, the voltage level of node J3 is LM+Vtp, so that MOS transistor N45 is turned off. Therefore, the through current in CMOS inverter 53 is suppressed. When drive transistor 2 is substantially turned off in CMOS inverter 52, MOS transistor P44 is also substantially turned off, whereby the through current of CMOS inverter 52 is similarly prevented.

When internal power supply voltage VCI is lower than reference voltage Vref, the conductance of MOS transistor N41 is set smaller than that of MOS transistors N42 and N43. Therefore, the current flow in MOS transistor P41 is reduced, so that the current flow via MOS transistors P42 and P43 is decreased. As a result, nodes 6a and 6b are discharged by MOS transistors N42 and N43, so that the voltage level thereof is reduced. Drive transistor 2 is first turned on, so that current is supplied from external power supply node 1 to internal power supply line 5. In amplifier circuit 50, MOS transistor P44 is turned on, and the gate-source voltage of MOS transistor N44 (the voltage between node 6b and J3) is small. Therefore, the current flow in MOS transistor N44 is reduced. As a result, the output signal of CMOS inverter 52 is pulled up to an H level, and MOS transistor P45 is turned on and MOS transistor N45 is turned off in CMOS inverter 53.

The voltage level of node 55 falls to the voltage level on node J3, so that MOS transistor 60 is turned on. Here, the voltage level of node 55 is the level of voltage LN+Vtp on node J3. MOS transistor 60 supplies the limited current amount to internal power supply line 5 from external power supply node 1. According to this structure, even when drive transistor 2 does not follow a sudden voltage drop of internal power supply line 5, drive transistor 60 is turned on at high speed by amplifier circuit 50. Current is supplied from external power supply node 1 to internal power supply line 5 following this sudden change of internal power supply voltage VCI to compensate for reduction in internal power supply voltage VCI.

Drive transistor 2 responds to a gentle voltage change of internal power supply voltage VCI, whereby current is supplied from external power supply node 1 to internal power supply line 5. MOS transistor 60 supplies current from external power supply node 1 to internal power supply line 5 so as to alleviate the sudden change of power supply voltage VCI. More specifically, by operating drive transistor 2 in an analog manner and operating MOS transistor 60 in a digital manner, internal power supply voltage VCI can be maintained substantially at a constant voltage level stably.

Comparison circuit 3 provides signal voltages from nodes 6a and 6b commonly using the master stage (MOS transistor P41) of the current mirror circuit. In this case, in comparison to the case where a comparison circuit is provided for each of amplifier circuit 50 and drive transistor 2, the occupying area of a comparison circuit can be reduced. Furthermore, the voltage change rate of nodes 6a and 6b can be set to an appropriate value by appropriately adjusting the size of MOS transistors P42 and P43. More specifically, the amplification rate of comparison circuit 3 can be set to an appropriate value with respect to amplifier circuit 50 and drive transistor 2. The response characteristics of drive transistor 2 and MOS transistor 60 can be set at an appropriate value.

In comparison circuit 3, the mirror current of the current flow in MOS transistor P41 is conducted to MOS transistors P42 and P43. When two comparison circuits are provided, current will be consumed by each transistor since two of MOS transistors P41 are required. However, the number of the current paths is reduced by means of commonly sharing the master stage of this current mirror circuit. Therefore, the consumed current of the comparison circuit can be reduced.

The current driving capability of MOS transistors P42 and P43 are set to appropriate values according to the gate capacitance of drive transistor 2 and the input gate capacitance of CMOS inverter 52. Therefore, lowering of internal power supply voltage VCI can be suppressed with respect to both of a sudden change (high-frequency change) and a gentle change (current change) of power supply voltage VCI on internal power supply line 5. The change of internal power supply voltage VCI can be reliably followed.

Second Specific Structure

Figure 58:
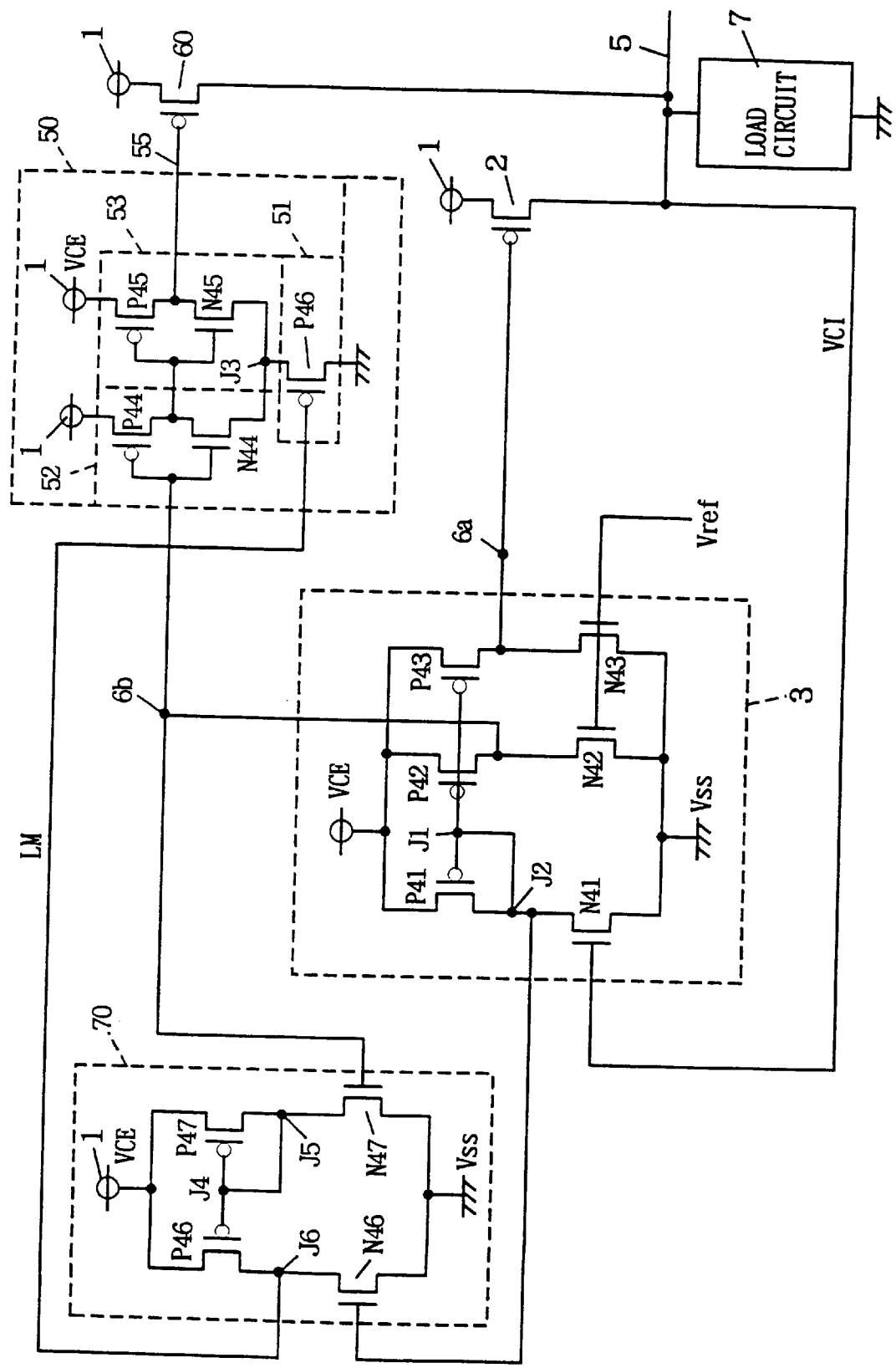

FIG. 58 shows a second specific structure of the internal power supply voltage generation circuit according to the ninth embodiment of the present invention. Referring to FIG. 58, a differential amplifier circuit 70 for further differentially amplifying a differential output signal of comparison circuit 3 is provided for the purpose of generating a signal LM supplied to the gate of MOS transistor P46, i.e. to amplitude limitation circuit 51. The structure of comparison circuit 3 and amplifier circuit 50 are similar to those shown in FIG. 57, and corresponding components are denoted with the same reference number. Differential amplifier circuit 70 includes an n channel MOS transistor N46 connected between node J6 and ground node VSS for receiving an output signal of node J2 of comparison circuit 3 at its gate, an n channel MOS transistor N47 connected between node J5 and ground node VSS for receiving a signal on output node 6b of comparison circuit 3 at its gate, a p channel MOS transistor P46 connected between external power supply node 1 and node J6, and having its gate connected to nodes J4 and J5, and a p channel MOS transistor P47 connected between external power supply node 1 and node J5, and having its gate connected to nodes J4 and J5. P channel MOS transistors P46 and P47 form a current mirror circuit. MOS transistor P47 operates as a master stage, so that the mirror current of the current flow via MOS transistor P47 flows via MOS transistor P46. The operation will be briefly described hereinafter.

(i) When VCI>Vref

The voltage level of node J2 decreases due to the increase of the current flow via MOS transistor P41 according to $(Vgs-Vtp)^2$. The gate and drain of MOS transistor P41 is equal in voltage level to node J2, and the source voltage attains the level of external power supply voltage VCE. Therefore, the voltage drop of MOS transistor P41 is increased. Although the current flow of MOS transistor P42 increases, MOS transistor N42 cannot pass through all the supplied current, so that the voltage level of node 6b increases. As a result, in differential amplifier circuit 70, the conductance of MOS transistor N47 becomes higher than that of MOS transistor N46, so that the current flow of MOS transistor P47 increases. As a result, the current flow via MOS transistor P46 increases, so that the voltage level of the output signal of node J6, i.e. amplitude limitation signal LM increases (maximum VCE level). In response, the gate potential of MOS transistor P46 of amplitude limitation circuit 51 of amplifier circuit 50 increases, so that the voltage level of node J3 increases. Here, the current supply capability of MOS transistor P46 is set to a sufficiently great level, so that the voltage of the gate-source (between nodes 6b and J3) is maintained at the level of threshold voltage Vtp. Thus, the conductance of MOS transistor N44 is reduced, and the through current of CMOS inverter 57 is reduced. The voltage level of node 55 is charged by MOS transistor P45 to approach external power supply voltage VCE. MOS transistor 60 is turned off. In contrast, drive transistor 2 has its conductance reduced according to the voltage level of node 6a.

(ii) When VCI<Vref

The voltage level of node J2 slightly increases, and the voltage level of node 6b is discharged to be lowered by MOS transistor N42. Therefore, the conductance of MOS transistor N46 becomes greater than that of MOS transistor N47, so that the output signal of node J6, i.e. the voltage level of amplitude limitation signal LM, is lowered. This reduction in the voltage level of node 6b is amplified by voltage circuit 50, and MOS transistor 60 is turned on. Here, the clamp level of node J3 in amplifier circuit 50 (clamping by MOS transistor P46) is lowered, so that the voltage level of node 55 is set equal to that of node J3. Therefore, the conductance of MOS transistor 60 is increased, so that the relatively great current is transmitted from external power supply node 1 towards internal power supply line 5. When the difference between internal power supply voltage VCI and reference voltage Vref is small, the voltage level of amplitude limitation signal LM is relatively high. When internal power supply voltage VCI becomes sufficiently lower than reference voltage Vref, and the voltage level of amplitude limitation signal LM approaches the level of ground voltage VSS.

More specifically, the voltage level of node 55 (output node of amplifier-circuit 50) is lowered when MOS transistor 60 should supply a greater amount of current. The voltage level of amplitude limitation signal LM is slightly increased when a great amount of current does not have to be supplied. As a result, overdrive of MOS transistor 60 is prevented. Excessive current will not be supplied to internal power supply line 5. Therefore, the voltage level of internal power supply voltage VCI can be restored to the former level without generation of overshooting. Here, although high speed response is slightly degraded, drive transistor 2 is also turned on, so that current is supplied from external power supply node 1 to internal power supply line 5.

According to the structure shown in FIG. 58, comparison circuit 3 inverts and amplifies the difference between reference voltage Vref and internal power supply voltage VCI, whereby the output of comparison circuit 3 is further amplified to generate an amplitude limitation signal LM. Therefore, the voltage level of amplitude limitation signal LM can be set according to the difference between internal power supply voltage VCI and reference voltage Vref.

Third Specific Example

Figure 59:
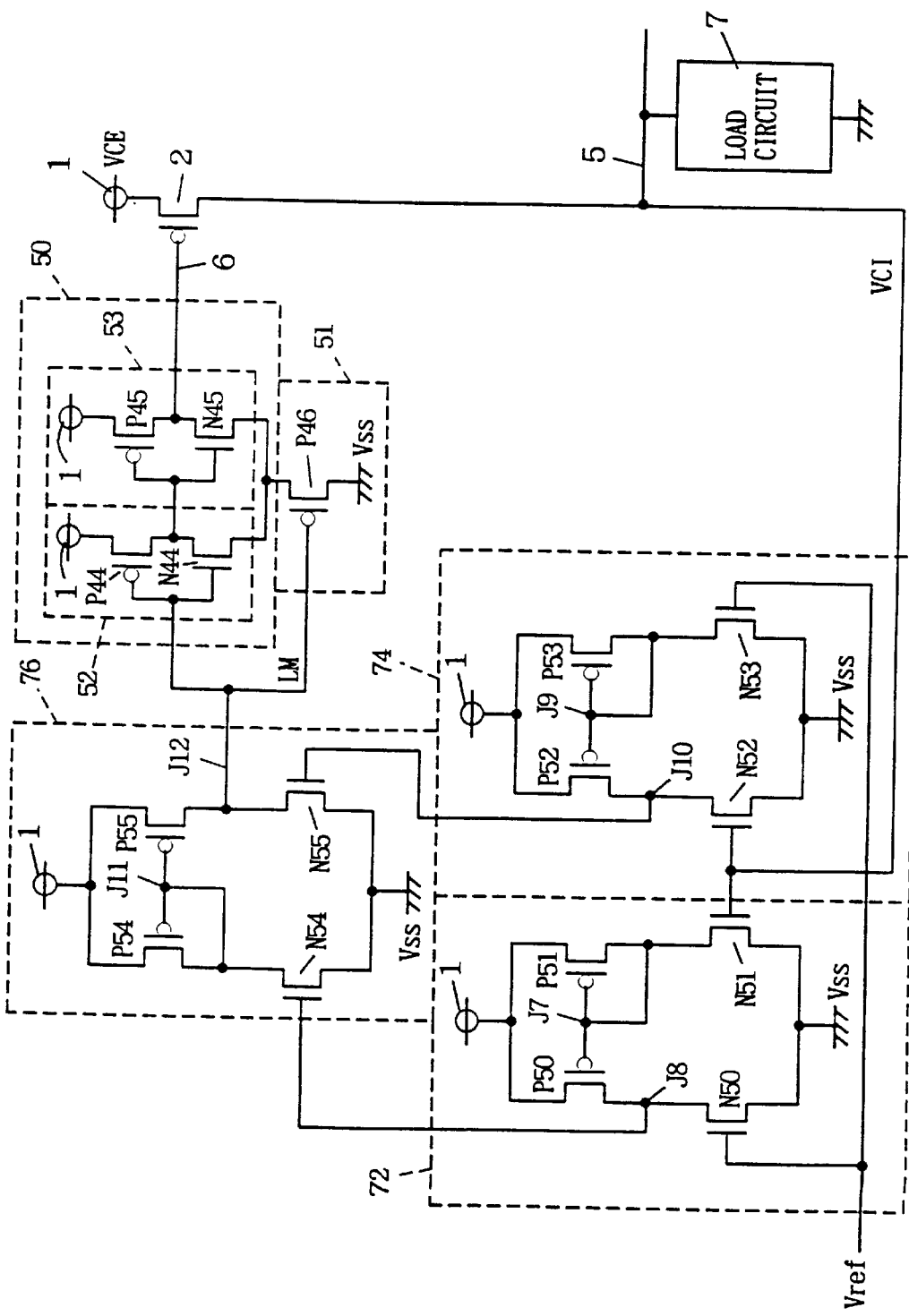

FIG. 59 shows a third specific structure of an internal power supply voltage generation circuit according to the ninth embodiment of the present invention. Referring to FIG. 59, an internal power supply voltage generation circuit includes a differential amplify circuit 72 for amplifying the difference between internal power supply voltage VCI and reference voltage Vref, a differential amplify circuit 74 for amplifying the difference between reference voltage Vref and internal power supply voltage VCI, a differential amplifier circuit 76 for amplifying the difference between the output signals of differential amplifier circuit 72 and 74, an amplifier circuit 50 for further amplifying the output signal of differential amplifier circuit 76 to adjust the conductance of drive transistor 2, and an amplitude limitation circuit 51 receiving an output signal of differential amplifier circuit 76 as amplitude limitation signal LM to limit the amplitude of an L level of the signal output of amplifier circuit 50.

Differential amplifier circuit 72 includes an n channel MOS transistor N50 connected between a node J8 and ground node VSS for receiving reference voltage Vref at its gate, an n channel MOS transistor N51 connected between node J7 and ground node VSS for receiving internal power supply voltage VCI at its gate, a p channel MOS transistor P50 connected between internal power supply node 1 and node J8 and having its gate connected to node J7 and a p channel MOS transistor P51 connected between external power supply node 1 and node J7, and having its gate connected to node J7.

MOS transistors P50 and P51 form a current mirror circuit, so that a mirror current of the current flow via MOS transistor P51 flows via MOS transistor P50. When internal power supply voltage VCI is higher than reference voltage Vref in differential amplifier circuit 72, a signal of an H level is provided from node J8.

Differential amplifier circuit 74 includes an n channel MOS transistor N52 connected between a node J10 and ground node VSS for receiving internal power supply voltage VCI at its gate, a n channel MOS transistor N53 connected between node J9 and ground node VSS for receiving reference voltage Vref at its gate, a p channel MOS transistor P52 connected between internal power supply node 1 and node J10 and having its gate connected to node J9, and a p channel MOS transistor P53 connected between external power supply node 1 and node J9 and having its gate connected to node J9. P channel MOS transistors P52 and P53 form a current mirror circuit, whereby the mirror current of the current flow via MOS transistor M53 flows via MOS transistor P52. When internal power supply voltage VCI is lower than reference voltage Vref in differential amplifier circuit 74, a signal of an H level is output from node J10.

Differential amplifier circuit 76 includes an n channel MOS transistor N54 connected between a node J11 and ground VSS and having its gate connected to output node J8 of differential amplifier circuit 72, an n channel MOS transistor N55 connected between a node J12 and ground node VSS and having its gate connected to output node J10 of differential amplifier circuit 74, a p channel MOS transistor P54 connected between external power supply node 1 and node J11 and having its connected to node J11, and a p channel MOS transistor P55 connected between external power supply node 1 and node J12 and having its gate connected to node J11. P channel MOS transistors P54 and P55 form a current mirror circuit, whereby the mirror current of the current flow via MOS transistor P54 flows via MOS transistor P55. When the signal voltage of output node J8 in differential amplifier circuit 72 is higher than the signal voltage of output node J10 in differential amplifier circuit 74, an output signal of an H level is output from output node J12 of differential amplifier circuit 76.

Amplitude circuit 50 includes two stages of CMOS inverters 52 and 53 connected to receive a signal voltage of output node J12 of differential amplifier circuit 76. CMOS inverter 52 includes a p channel MOS transistors P44 and an n channel MOS transistor N44. CMOS inverter 53 includes a p channel MOS transistor 45 and an n channel MOS transistor N45. A signal for adjusting the conductance of drive transistor 2 is output from CMOS inverter 53.

Amplitude limitation circuit 51 for limiting the amplitude of an L level of an output signal of amplifier circuit 50 includes a p channel MOS transistor P46 for receiving at its gate an output signal of differential amplifier circuit 76 as an amplitude limitation signal LM. MOS transistor P46 functions not as a clamp, but as a resistor element that has its resistance determined according to amplitude limitation signal LM applied to its gate. In the internal power supply voltage generation circuit shown in FIG. 59, only one drive transistor is provided for supplying current from external power supply node 1 to internal power supply line 5. The operation thereof will be described briefly.

Differential amplifier circuit 72 provides a signal of the voltage level of k·(VCI−Vref) from its output node J8. Here, k represents the amplification rate of differential amplifier circuit 72. Similarly, differential amplifier circuit 74 provides a signal of the voltage level of j·(Vref−VCI) from its output node J10. Here, j indicates the amplification rate of differential amplifier circuit 74. Differential amplifier circuit 76 differentially amplifies the output signals of differential amplifier circuits 72 and 74. Therefore, from differential amplifier circuit 76, a signal of the following voltage level is generated:

$$i\{k·(VCI-Vref)-j·(Vref-VCI)\}=i·(k+j)(VCI-Vref)$$

where i is the amplification rate thereof. When internal power supply voltage VCI is higher than reference voltage Vref, the voltage level near internal power supply voltage VCI is supplied from amplifier circuit 50 to the gate of drive transistor 2. In this case, substantially no current is supplied from external power supply node 1 to internal power supply line 5.

When internal power supply voltage VCI is smaller than reference voltage Vref, a voltage signal of:

$$-m·i·(k+J)(VCI-Vref)$$

is output where m is the amplification rate of CMOS inverter 52 of the first stage. The output signal of CMOS inverter 52 is further inverted and amplified by CMOS inverter 53 to be provided to the gate of drive transistor 2. A signal having relatively great voltage amplitude is applied to the gate of drive transistor 2 even when the difference between internal power supply voltage VCI and reference voltage Vref is small. Only one drive transistor 2 is provided, which has a relatively great current driving capability. Here, amplitude control signal LM has a voltage level identical to that of the input signal of CMOS inverter 52, whereby the resistance of MOS transistor P46 is increased to raise the source potential thereof to set the L level of the output signal of CMOS inverter 53 to a relatively high voltage level. Therefore, a signal having a voltage level defined by $+m^2 \cdot i \cdot (k+j)(VCI-Vref)$ is provided to drive transistor 2 at the gate, whereby drive transistor 2 provides current from external power supply node 1 to internal power supply line 5 at a relatively low current driving capability.

When internal power supply voltage VCI is greatly lower than reference voltage Vref, the voltage level supplied from amplifier circuit 50 thereof to the gate of drive transistor 2 is also greatly reduced. Here, the voltage level of amplitude limitation signal LM is lowered to reduce the resistance of MOS transistor P64 sufficiently. The source potential thereof is sufficiently lowered, whereby the gate potential of drive transistor 2 is significantly lowered. Therefore, current is supplied from external power supply node 1 to internal power supply line 5 at a high current driving capability. The source potential of MOS transistor P46 is supplied by the through current of CMOS inverter 52. CMOS inverter 53 hardly generates any through current.

According to the structure shown in FIG. 59, the difference between reference voltage Vref and internal power supply voltage VCI is amplified by three differential amplifier circuits 72, 74, and 76, and the output signal of differential amplifier circuit 76 is further amplified by amplifier circuit 50. Therefore, drive transistor 2 is turned on/off rapidly according to the voltage level of internal power supply voltage VCI. Even when internal power supply voltage VCI on internal power supply line 5 is suddenly decreased, drive transistor 2 supplies current from external power supply node 1 to internal power supply line 5 at high speed to compensate for this sudden drop in internal power supply voltage VCI.

In the structure shown in FIG. 59, p channel MOS transistor P46 for amplitude limitation may be provided only for MOS transistor N45, and the source of n channel MOS transistor N44 of CMOS inverter 52 may be connected to ground node VSS. In this arrangement, setting the size of MOS transistors P44 and N44 forming CMOS inverter 52 smaller than that of MOS transistors P45 and N45 forming CMOS inverter 53 would reduce the through current in CMOS inverter 52 to a sufficiently low value.

By limiting the amplitude of the output signal only in CMOS inverter 53 of the output stage, through current in CMOS inverter 53 and over driving of drive transistor 2 can be reliably suppressed, so that the required amount of current can be supplied from external power supply node 1 to internal power supply line 5 via drive transistor 2. MOS transistor P46 may be formed to include a source potential clamping characteristic (clamping at LM+Vtp).

According to the ninth embodiment of the present invention, the gate potential of the drive transistor is set by amplifying the output signal of comparison circuit comparing the internal power supply voltage and the reference voltage, the required amount of current accommodating both a sudden drop and a gentle drop of internal power supply voltage VCI can be supplied to internal power supply line 5 from external power supply node via a drive transistor.

Therefore, internal power supply voltage VCI can be maintained at a predetermined voltage level stably. Here, by limiting the amplitude of the output signal of the amplifier circuit, overshooting of the drive transistor is suppressed, so that only the required amount of current can be supplied from external power supply node 1 to internal power supply line 5. Particularly, by generating the voltage level of this amplitude limitation using an output signal of the comparison circuit, that voltage level can be adjusted to have the amplitude thereof limited according to the amount of current to be supplied to internal power supply line 5 via drive transistor 2. The required amount of current can be supplied from external power supply node 1 to internal power supply line 5 in response to change in internal power supply voltage VCI. Internal power supply voltage VCI can be restored to a predetermined voltage level in response to both of a sudden reduction and a gentle reduction in internal power supply voltage VCI.

Embodiment 10

Figure 60:
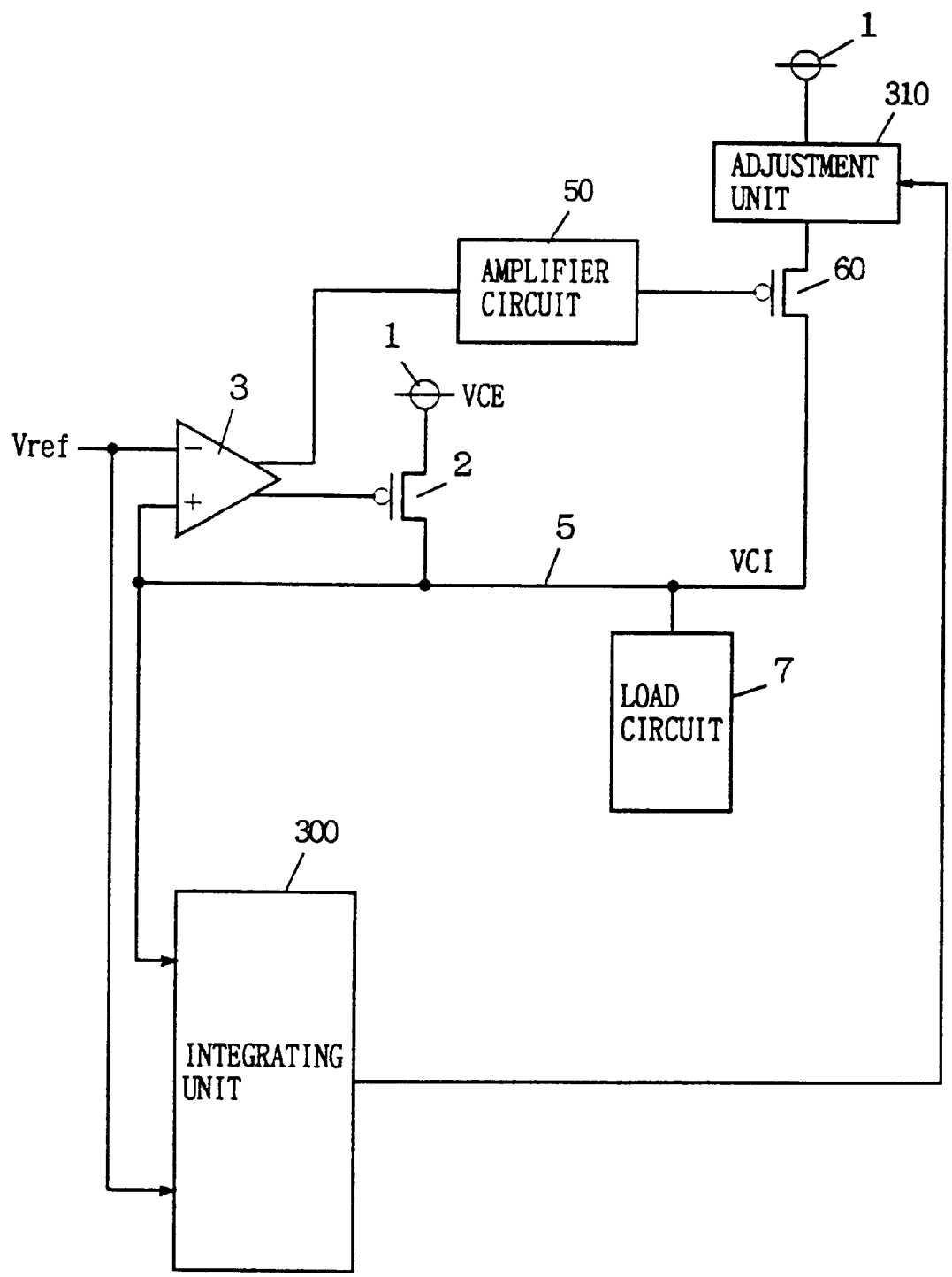
FIG. 60 schematically shows a structure of an internal power supply voltage generation circuit according to a tenth embodiment of the present invention.

FIG. 60 schematically shows a structure of an internal power supply voltage generation circuit according to a tenth embodiment of the present invention. Referring to FIG. 60, the internal power supply voltage generation circuit includes a comparison circuit 3 for comparing reference voltage Vref with voltage VCI on an internal power supply line 5, a p channel MOS transistor 2 responsive to an output of comparison circuit 3 for supplying current from external power supply node 1 to internal power supply line 5, an amplifier circuit 50 for amplifying (a buffering) an output of comparison circuit 3, and a p channel MOS transistor 60 responsive to an output of amplifier circuit 50 for supplying current from external power supply node 1 to internal power supply line 5. Comparison circuit 3 has a structure identical to that of the comparison circuit shown in FIG. 57. Amplifier circuit 50 has a structure similar to that shown in FIG. 57.

The internal power supply voltage generation circuit further includes an integration unit 30 receiving internal power supply voltage VCI and reference voltage Vref for detecting the difference between the amount of overshooting and the amount of undershooting of internal power supply voltage VCI, and an adjustment unit 310 responsive to an output of integration unit 30 for adjusting the supplying amount of current of the p channel MOS transistor (second drive element). Adjustment unit 310 is provided between drive element 60 and external power supply node 1. Integration unit 300 adds (i) the integration value of internal power supply voltage VCI with reference to reference voltage Vref when internal power supply voltage VCI is greater than reference voltage Vref, and (ii) an integration voltage with reference to reference voltage Vref when internal power supply voltage VCI is lower than reference voltage Vref. The amount of current flow through drive element 60 increases when the output of integration unit 300 indicates that the amount of undershooting is greater than the amount of overshooting. In contrast, the current flow in drive element 60 is reduced when the amount of overshooting of internal power supply voltage VCI is greater than the amount of undershooting. The structures of driving drive elements 2 and 60, comparison circuit 3 and amplifier circuit 50, respectively, are similar to those shown in FIG. 43. Using integration unit 300 and adjustment unit 310, the structure in which the supplying amount of current of drive element 60 is adjusted according to the amount of undershooting and overshooting of internal power supply voltage VCI provides the advantages set forth in the following.

When external power supply voltage VCE is reduced in order to reduce power consumption of a system (system including an external processing device and the semiconductor memory device), the response of comparison circuit 3 operating with external power supply voltage VCE as the operating power supply voltage is degraded. Here, when load circuit 7 operates to consume current so that internal power supply voltage VCI is lowered, current sufficient to compensate for this drop of internal power supply voltage VCI cannot be supplied to internal power supply line 5 via first drive element 2. In order to overcome this disadvantage, a second drive element is switched at high speed by amplifier circuit 50 to supply a current on internal power supply line 5. Problems set forth in the following will occur when the supplying amount of current of second drive element 60 is fixedly set.

A semiconductor memory device called a synchronization type semiconductor memory device that takes in an external control signal such as row address strobe signal /RAS, an address signal, and write data in synchronization with an external clock signal such as a system clock is used as the main memory in a data processing system. Such a synchronous semiconductor memory device can accommodate a system clock having a plurality of types of frequencies. Increase in the clock frequency causes a higher operation speed of circuitry (particularly, input buffer circuit), to result in increase in current consumption due to the increased number of switching operations of the transistor. If the supplied amount of current by drive element 60 is set corresponding to the highest clock frequency in which consumed current is the greatest, the supplied amount of current by drive element 60 will be unnecessarily increased when this semiconductor memory device is used in a low-speed system that uses a system clock of a low frequency, resulting in overshooting of internal power supply voltage VCI. However, by means of drive elements 2 and 60, and by adjusting the supplying amount of current of drive element 60 in response to the current consumed by load circuit 7 (load current) as shown in FIG. 60, the above problem is avoided. The optimum amount of current can be supplied to internal power supply line 5, so that generation of overshooting in internal power supply voltage VCI can be suppressed. Therefore, internal power supply voltage VCI can be maintained at a predetermined level stably. A specific structure thereof will be described hereinafter.

First Specific Structure

Figure 61:
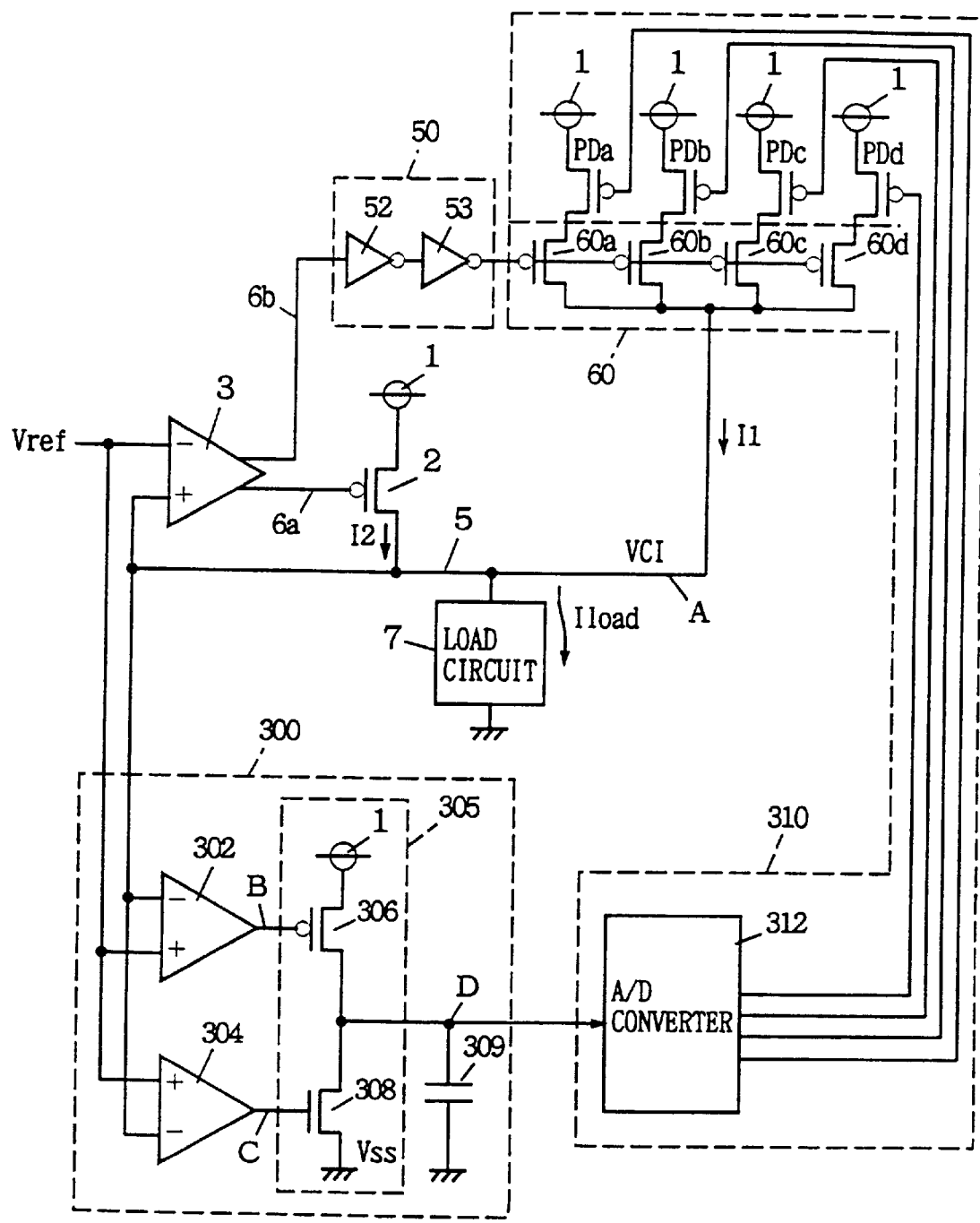
FIG. 61 shows a first specific structure of the internal power supply voltage generation circuit of FIG. 60.

FIG. 61 shows a first specific structure of the tenth embodiment of the present invention. In FIG. 61, amplifier circuit 50 has a structure similar to that shown in FIG. 57, and includes two stages of inverters 52 and 53. The size of the transistor of the first stage inverter 52 is set to be small, and the output load of comparison circuit 3 is reduced. For example, drive element 60 is divided into four p channel MOS transistors 60a, 60b, 60c and 60d connected parallel to each other (the reason thereof will be described afterwards).

Integration unit 300 includes a differential amplifier circuit 302 amplifying the difference of reference voltage Vref and internal power supply voltage VCI, a second differential amplifier circuit 304 amplifying the difference of internal power supply voltage VCI and reference voltage Vref, a loop filter 309 formed of a capacitor, and a charge pump circuit 305 for charging/discharging loop filter 309 according to outputs of differential amplifier circuits 302 and 304.

Charge pump circuit 305 includes a p channel MOS transistor 306 provided between external power supply node 14 and node D, and rendered conductive in response to an output of differential amplifier circuit 302, and an n channel MOS transistor 308 provided between node D and ground node, and rendered conductive in response to an output of differential amplifier circuit 304.

Differential amplifier circuit 302 provides an output of an L level when internal power supply voltage VCI is lower than reference voltage Vref to turn on p channel MOS transistor 306. Differential amplifier circuit 304 provides a signal of an H level when internal power supply voltage VCI is higher than reference voltage Vref to turn on n channel MOS transistor 308. More specifically, when internal power supply voltage VCI is lower than reference voltage Vref in integration unit 300, loop filter 309 is charged via p channel MOS transistor 306. When internal power supply voltage VCI is lower than reference voltage Vref, MOS transistor 308 is turned on to discharge loop filter 309. The output signals of differential amplifier circuits 302 and 304 are changed in an analog manner, whereby the charged potential of loop filter 309 indicates the difference between the amount of overshooting and undershooting in internal power supply voltage VCI.

Adjustment circuit 310 includes an A/D converter 312 for converting the charge potential (potential of node D) of loop filter 309 into a multi-bit digital signal (a digital signal of 4 bits in FIG. 47), and p channel MOS transistors PBa, PBb, PBc and PBd provided corresponding to each bit of the multi-bit digital signal and connected in series with each of drive transistors 60a–60d. The operating frequency of A/D converter 312, although arbitrary, is preferably set to operate it at a speed higher than the fastest system clock (or at the same frequency) when the present invention is applied to a synchronous semiconductor memory device. Integration unit 300 is essentially an integration circuit that operates at low speed, as will be described afterwards. Therefore, the supplied amount of current by drive transistor 60 (60a–60d) in response to an output of integration unit 300 changes mainly in the next cycle rather than the current cycle (the operating cycle of the load circuit). However, when the operating frequency is constant, there is no problem once the supplied amount of current is stable since there is hardly no change thereafter. When the structure shown in FIG. 61 is applied to a synchronous semiconductor memory device, the operating speed of A/D converter 312 is set to be higher (or equal to) than the maximum external clock frequency.

Figure 62:
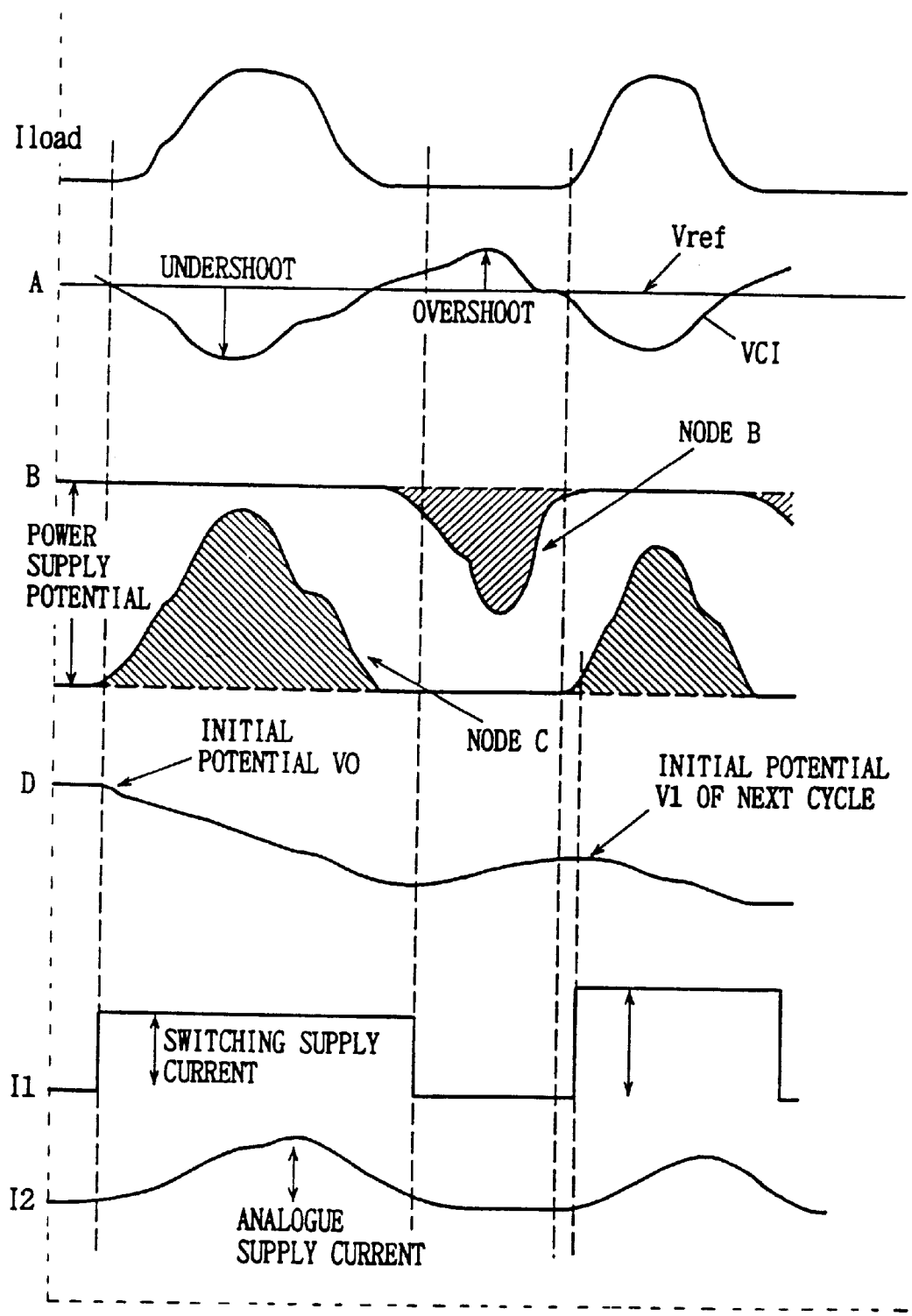
FIG. 62 is a signal waveform diagram showing an operation of the internal power supply voltage generation circuit of FIG. 61.

The operation of the structure shown in FIG. 61 will be described with reference to the waveform diagram of FIG. 62.

Operation of load circuit 7 causes a flow of load current Iload, whereby internal power supply voltage VCI on node A (internal power supply line 5) is lowered. When internal power supply voltage VCI becomes lower than reference voltage Vref, the output of comparison circuit 3 is decreased to turn on drive element 2. Therefore, current is supplied from external power supply node 1 to internal power supply line 5. The amount of current supplied from drive element 2 varies in an analog manner according to the output level of comparison circuit 3.

Amplifier circuit 50 amplifies the output of comparison circuit 3 to rapidly lower the output thereof, whereby drive elements 60a–60d are turned on. MOS transistors PBa–PBd are selectively turned on according to a multi-bit digital signal output from A/D converter 312. The multi-bit digital signal from A/D converter 312 is determined in value according to the initial potential V0. Therefore, only any of drive transistors 60a–60d corresponding to turned on MOS transistors PBa–PBd supplies current towards internal power supply line 5 (node A).

The output of differential amplifier circuit 302 attains an H level since internal power supply voltage VCI is lower than reference voltage vref, whereby MOS transistor 306 is turned off. The output of differential amplifier circuit 304 attains an H level according to the difference between reference voltage Vref and internal power supply voltage VCI, whereby MOS transistor 308 is turned on to discharge loop filter 309. The amount of discharge current of MOS transistor 308 varies in an analog manner according to an output of differential amplifier circuit 304. This discharge of MOS transistor 308 causes the reduction in the charged potential of loop filter 309 (potential of node D) from the level of initial potential V0. The charge/discharge current of charge pump circuit 305 is relatively smaller with respect to the capacitance of loop filter 305, so that the charge potential of loop filter 305 (potential of node D) varies gently. Loop filter 305 is a "lowpass filter", and does not have quick response. The charge potential of loop filter 305 (potential of node D) actually affects the current adjustment operation of adjustment circuit 310 in the next cycle (the next operation cycle of load circuit 7). During the current cycle, the current supplied by drive transistors 60a–60d towards internal power supply line 5 (node A) is substantially constant by control of adjustment circuit 310. By setting the operating speed of A/D converter 312 substantially similar to that of load circuit 7, this operation is reliably realized. This is because the on/off state of MOS transistors PBa–PBd can be fixedly set during the current cycle.

Transition of the output signal of comparison circuit 3 to an L level is brought about as the level of internal power supply voltage VCI is lowered according to undershooting, whereby current I2 supplied by drive element 2 is increased. In contrast, current I1 supplied by drive transistor 60 is substantially constant as described before. When current consumed by load circuit 7 (load current) Iload is reduced, the level of internal power supply voltage VCI rises. Here, the current flow I2 via drive element 2 is accordingly reduced. However, since drive element 60 also supplies current towards internal power supply line 5 (node A), the supplied current is increased. When the operation of load circuit 7 is completed and there is no longer the flow of load current Iload, overshooting is generated in internal power supply voltage VCI on internal power supply line 5 (node A).

When overshooting occurs, transition to an L level of the output of differential amplifier circuit 302 is made, and the output of differential amplifier circuit 304 is pulled down towards an L level. As a result, MOS transistor 306 is driven to an on state, and MOS transistor 308 is turned off. Node D is charged via MOS transistor 306. When overshooting occurs in internal power supply voltage VCI, the output of comparison circuit 3 is pulled up to an H level, whereby drive elements 2 and 60 are both turned off. Overshooting and undershooting are repeated to be gradually recovered to the level of reference voltage Vref. FIG. 62 shows the state where the next cycle of load circuit 7 is initiated at the transition of overshooting to undershooting. The amount of charge of loop filter 309 during one operation cycle of load circuit 7 corresponds to the amount of undershooting of internal power supply voltage VCI (the hatched region of node C in FIG. 62), and the amount of overshooting of internal power supply voltage VCI is represented by the charge current towards loop filter 309 (the hatched region of node B). Therefore, the charge potential current of loop filter 309 (charge potential of node D) is equal to the difference between overshooting and undershooting at the completion of one cycle.

At the next cycle (the operation cycle of load circuit 7), loop filter 309 is charged by the overshooting of internal power supply voltage VCI, so that the charge potential is V1. The charge potential of loop filter 309 is converted into a digital signal by A/D converter 312, and MOS transistors PBa–PBd are selectively turned on. The digital signal provided from A/D converter 312 includes many "1s" and many "0s" when the potential of node D is high and low, respectively.

Undershooting of internal power supply voltage VCI occurs according to the delay in response of comparison circuit 3 and amount of current supplied by drive elements 2 and 60 (supplied current is insufficient when undershooting is great). When the amount of undershooting is greater than the amount of overshooting, the amount of current supplied by drive elements 2 and 60 is insufficient. In this case, many of MOS transistors PBa–PBd are turned on to increase the supplying amount of current towards internal power supply line 5 via drive element 60 to suppress generation of undershooting.

When the amount of overshooting is greater than the amount of undershooting, the current supplied by drive elements 2 and 60 is greater than the load current. In this case, a few of MOS transistors PBa–PBd are turned on to reduce the amount of current supplied via drive element 60 to suppress generation of overshooting. FIG. 62 shows the state where the amount of undershooting is greater than the amount of overshooting, the initial voltage V1 of the next cycle is lower than initial potential V0, and the current supplied via drive element 60 is increased. In this case, internal power supply voltage VCI is restored to a its former level faster than the previous cycle although undershooting occurs due to delay in response of comparison circuit 3. When the amount of overshooting and undershooting is equal, there is no change in the potential of node D, and balance is achieved between overshooting and undershooting. Load current Iload consumed by load circuit 7 and the current supplied by drive elements 2 and 60 are optimized under a balanced state of the overshooting and undershooting of internal power supply voltage VCI. Only a small amount of overshooting/undershooting is generated in internal power supply voltage VCI caused by delay in response of comparison circuit 3. When the operating frequency is modified to cause change in the consumed current of load circuit 7, i.e., load current Iload, an optimizing operation is carried out by integration unit 300 and adjustment circuit 312. The amount of current supplied by drive element 60 is adjusted so that overshooting and undershooting of internal power supply voltage VCi match each other.

The amount of current supplied by drive current 60 that carries a switching operation (digital operation) is adjusted due to the following reason. Drive element 60 is used for the purpose of compensating for drop in internal power supply voltage VCI of load current Iload during a high frequency operation. By adjusting the amount of supplied current of drive element 60, delay in response of the internal power supply voltage generation circuit (particularly comparison circuit 3) with respect to internal power supply voltage VCI is compensated for to reduce the amount of undershooting. Furthermore, the amount of undershooting and overshooting can be equalized.

Figure 63:
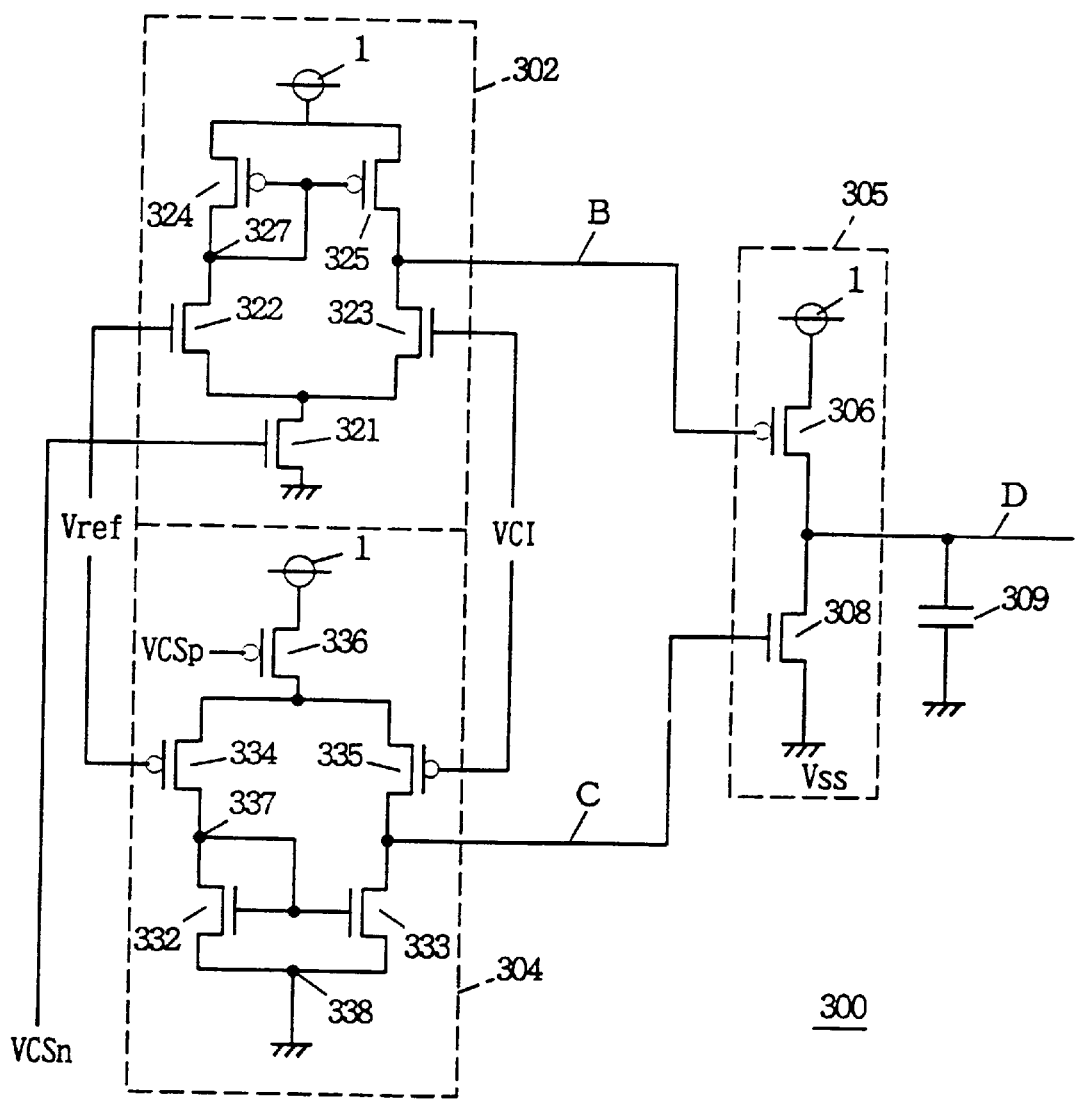
FIG. 63 schematically shows a structure of the first and second differential amplifier circuits of FIG. 61.

FIG. 63 shows a structure of the integration unit shown in FIG. 61. Referring to FIG. 63, a first differential amplifier circuit 302 includes an n channel MOS transistor 321 receiving reference voltage VCSn at its gate to function as a constant current sources an n channel MOS transistor 322 receiving reference voltage Vref at its gate, an n channel MOS transistor 323 receiving internal power supply voltage VCI at its gate, a p channel MOS transistor 324 connected between a node 327 and external power supply node 1, and a p channel MOS transistor 325 connected between node D and external power supply node 1. MOS transistors 322 and 323 have their sources both connected to the drain of MOS transistor 321 and their drains connected to nodes 327 and B, respectively. MOS transistors 324 and 325 have their gates connected to node 327, and form a current mirror circuit.

A second differential amplifier circuit 304 includes a p channel MOS transistor 336 receiving reference voltage VCSp at its gate for functioning as a constant current source to supply current from external power supply node 1, a p channel MOS transistor 334 connected between MOS transistor 336 and a node 337 for receiving reference voltage Vref at its gate, a p channel MOS transistor 335 connected between MOS transistor 336 and node C for receiving internal power supply voltage VCI at its gate, an n channel MOS transistor 333 connected between node C and a node 338 and having its gate connected to node 337, and an n channel MOS transistor 332 connected between nodes 337 and 338 and having its gate connected to node 337. Reference voltage VCSn may be a voltage that attains an inactive state (ground voltage level) at a standby cycle, or may be a signal of a constant voltage level that is constantly applied. Reference voltage VCSp supplied to the gate of MOS transistor 336 may be a signal attaining an active state (a constant reference voltage level) during this operation cycle (operation cycle of load circuit 7), or a signal of a constant voltage level that is constantly applied. The operation thereof will be briefly described.

(i) VCI>Vref

In first differential amplifier circuit 302, the conductance of MOS transistor 322 becomes smaller than that of MOS transistor 323, so that the current flow via MOS transistor 323 becomes greater than the current flow via MOS transistor 322. MOS transistor 321 functions as a constant current source, so that the current flow via MOS transistor 322 is reduced. In response, the current flow via MOS transistor 324 is reduced. MOS transistors 324 and 325 form a current mirror circuit. When MOS transistors 324 and 325 are identical in size, equal current flows through MOS transistors 324 and 325. Therefore, the current supplied via MOS transistor 325 is reduced, whereby the potential of node B is discharged via MOS transistor 323 to be reduced. As a result, MOS transistor 306 in charge pump circuit 305 is turned on, whereby loop filter 309 is charged.

In second differential amplifier circuit 304, the conductance of MOS transistor 335 becomes smaller than that of MOS transistor 334, whereby the current from constant current transistor 336 increases via MOS transistor 334. Therefore, the current flow via MOS transistor 332 is increased. MOS transistors 332 and 333 form a current mirror circuit. When MOS transistors 332 and 333 are identical in size, equal current flows to MOS transistors 332 and 333. Therefore, node C is discharged via MOS transistor 333 to be reduced in its potential level. Here, the level of node C is discharged to the level of ground potential. As a result, MOS transistor 308 is reliably turned off in charge pump circuit 305, so that generation of through current in charge pump circuit 305 is prevented. More specifically, suppression of generation of through current allows charge according to the amount of overshooting of internal power supply voltage VCI to be stored in loop filter 309.

ii) VCI<Vref

In first differential amplifier circuit 302, the conductance of MOS transistor 322 becomes greater than that of MOS transistor 323, whereby the current flow via MOS transistor 322 is increased. In response, the current flow via MOS transistors 324 and 325 are increased. The current supplied by MOS transistor 325 is greater than the discharged current of MOS transistor 323. Therefore, the potential of node B is increased to the level of external power supply voltage VCE. In charge pump circuit 305, MOS transistor 306 is reliably turned off.

In second differential amplifier circuit 304, the conductance of MOS transistor 335 becomes greater than that of MOS transistor 334, whereby the current from constant current source transistor 336 increases via MOS transistor 335. Here, the current flow via MOS transistors 334 and 332 is reduced, which reduces the amount of current discharged by MOS transistor 333. As a result, node C is charged via MOS transistor 335, whereby the level of the potential is increased. MOS transistor 308 is turned on, whereby node C is discharged. The amount of current discharged by MOS transistor 308 in charge pump circuit 305 represents the amount of undershooting in internal power supply voltage VCI. Therefore, the potential of node D, i.e. the charged potential of loop filter 309, equals the difference between the amount of overshooting and undershooting. More specifically, a voltage level is attained corresponding to the sum of the integrated value of the undershooting value of internal power supply voltage VCI based on reference voltage Vref and the integrated value of internal power supply voltage VCI at an overshooting state.

According to the above embodiment, internal power supply voltage VCI is directly supplied to differential amplifiers 302 and 304 to be compared with reference voltage Vref. A signal according to the comparison result thereof is supplied to charge pump circuit 305. Similarly, internal power supply voltage VCI and reference voltage Vref are compared by comparison circuit 3. This may be carried out using a structure in which internal power supply voltage VCI has its level shifted and applied to comparison circuit 3 and differential amplifier circuits 302 and 304. Comparison circuit 3 and differential amplifier circuits 302 and 304 can be operated at the region of maximum sensitivity.

By selectively turning on a plurality of MOS transistors using an A/D converter, the supplied amount of current of drive transistor 60 can be adjusted in a relatively simple manner for every operation cycle of load circuit 7.

Second Specific Structure

Figure 64:
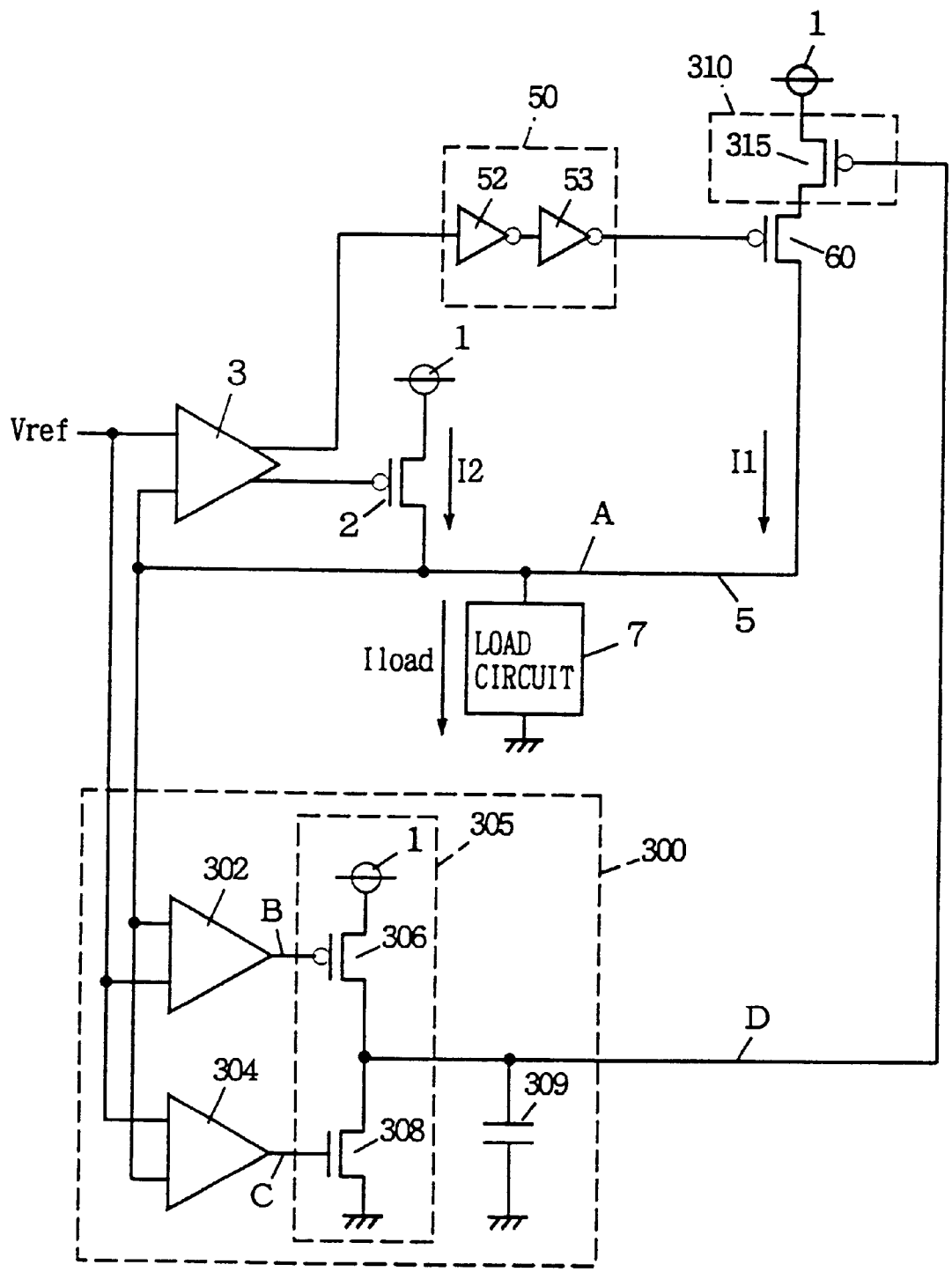
FIG. 64 shows a second specific structure of the internal power supply voltage generation circuit of FIG. 61.

FIG. 64 shows a second specific structure of an internal power supply voltage generation circuit according to the tenth embodiment of the present invention. Referring to FIG. 64, an adjustment circuit 310 includes a p channel MOS transistor 315 provided between external power supply node 1 and drive element 60. The potential of node D is supplied to the gate of MOS transistor 315. The other components are similar to those shown in FIG. 47, and corresponding components have the same reference characters denoted. The operation thereof will be described.

Similar to the structure shown in FIG. 61, the charged potential of loop filter 309 (the potential of node D) corresponds to the integrated value of the prior cycle (the operation cycle of load circuit 7) with reference to reference voltage Vref of internal power supply voltage VCI. When the amount of undershooting of internal power supply voltage VCI is greater than the amount of overshooting, the potential of node D is lowered. In contrast, when the amount of overshooting is greater than the amount of undershooting in internal power supply voltage VCI, the charged potential of loop filter 309 (potential of node D) rises. The charged potential of loop filter 309 (potential of node D) is supplied to the gate of p channel MOS transistor 315 forming adjustment circuit 310.

Therefore, when the amount of overshooting is greater than the amount of undershooting in internal power supply voltage VCI, the resistance of MOS transistor 315 is increased, whereby the amount of current supplied from external power supply node 1 to drive element 60 is reduced. When the amount of undershooting is greater than that of overshooting in internal power supply voltage VCI, the resistance of MOS transistor 315 is reduced, whereby the amount of current supplied from external power supply node 1 to drive element 60 increases. Here, the current supply capability of drive element 60 is set greater than the current driving capability of MOS transistor 315. Therefore, the amount of current supplied from drive element 60 towards internal power supply line 5 can be set to a value according to load current Iload consumed by load circuit 7.

Loop filter 309 carries out an integration operation, and serves as a "lowpass filter". Therefore, although there is variation in the charged potential of loop filter 309 due to the charging/discharging operation of charge pump circuit 305 within one cycle, the variation is gentle. Since the filter 309 has no high frequency response characteristics, the potential of node D can be expected to be substantially constant during one cycle (operation cycle of load circuit 7). Therefore, the current supplied by MOS transistor 315 is substantially constant during one cycle period. More specifically, an operation similar to that shown in the waveform diagram of FIG. 54 can be realized using the circuitry shown in FIG. 64.

According to the structure shown in FIG. 64, the amount of current supplied from external power supply node 1 to drive element 60 can be adjusted in an analog manner (continuously) according to the potential of node D for every cycle (operation cycle of load circuit 7). Therefore, the amount of current supplied by drive element 60 can be adjusted accurately with the occupying area of the adjustment circuit reduced. In response, load current Iload consumed by load circuit 7 can be made to balance with currents I1 and I2 supplied by drive elements 2 and 60, so that overshooting and undershooting can be suppressed. Optimum current with respect to load current Iload can be supplied towards internal power supply line 5.

A structure may be implemented where first and second differential amplifier circuits 302 and 304 operate in a digital manner, and where MOS transistors 306 and 308 carry out a switching operation (digital operation).

According to the present tenth embodiment, a structure is provided where the amount of current supplied by a drive current towards an internal power supply line is adjusted according to difference between overshooting and undershooting in internal power supply voltage VCI. Therefore, an optimum amount of current corresponding to the load current consumed by a load circuit connected to the internal power supply line can be supplied to the internal power supply line. overshooting and undershooting in the internal power supply line can be suppressed.

Although internal power supply voltage is generated by down-converting an external power supply voltage in the above-described embodiments, the present invention is applicable to a circuit that generates internally a second power supply voltage of a predetermined voltage level from a first power supply potential.

Embodiment 11

Figure 65:
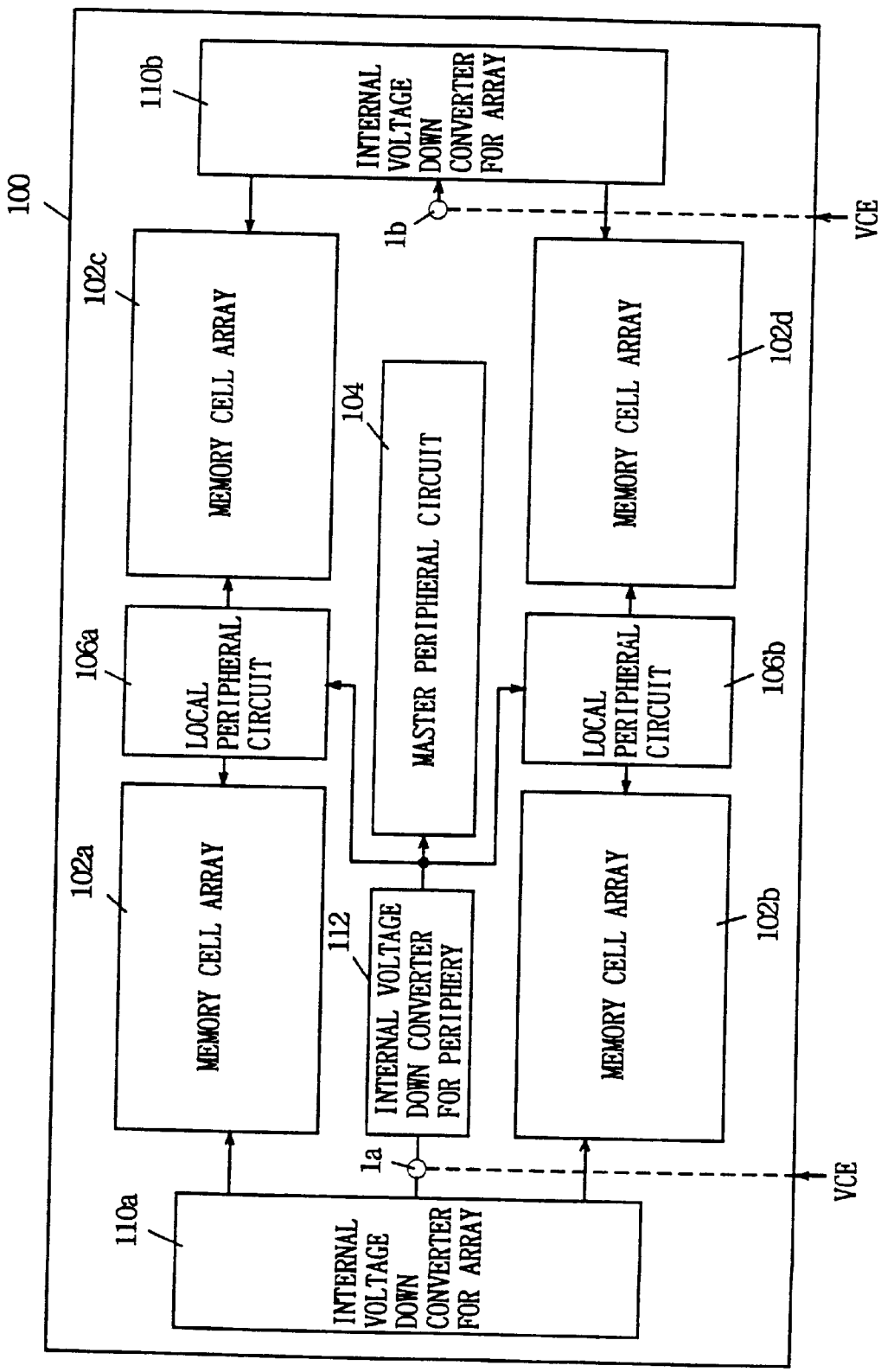
FIG. 65 shows an entire structure of a semiconductor memory device according to an eleventh embodiment of the present invention.

FIG. 65 shows the entire structure of a semiconductor memory device in which an internal voltage down converter is applied according to an eleventh embodiment of the present invention. Referring to FIG. 65, a semiconductor memory device includes four memory cell arrays 102a, 102b, 102c and 102d arranged on a semiconductor chip 100. Each of memory cell arrays 102a–102d includes a plurality of memory cells arranged in a matrix of rows and columns, a bit line pair disposed corresponding to each column, a word line disposed corresponding to each row, and a sense amplifier provided corresponding to each bit line pair. The method of selecting a memory cell from memory cell arrays 102a–102d is appropriately selected. A structure may be employed where a predetermined number of memory cells (for example 1 bit) is selected in each of memory cell arrays 102a–102d in an access mode. Furthermore, a structure may be employed where a predetermined number of arrays (for example, memory cell arrays 102a and 102c) are selected (activated) out of memory cell arrays 102a–102d, and the remaining memory cell arrays maintain a standby state.

The semiconductor memory device further includes a master peripheral circuit 104 provided between of memory cell arrays 102a and 102c, and memory cell arrays 102b and 102d, for generating a control signal with respect to memory cell arrays 102a–102d according to external signals, a local peripheral circuit 106a provided between memory cell arrays 102a and 102c for controlling an access operation towards memory cell arrays 102a and 102c according to a control signal from master peripheral circuit 104, and a local peripheral circuit 108a provided between memory cell arrays 102b and 102d for controlling an access operation towards memory cell arrays 102b and 102d according to a control signal from master peripheral circuit 104.

Master peripheral circuit 104 includes an address buffer and a block decoder for generating an internal control signal in response to a control signal such as an externally applied row address strobe signal /RAS, column address strobe signal /CAS, and write enable signal /WE, for generating an internal address signal, and for generating a block address (specifying a memory cell array to be selected in the case of a block selecting method) responsive to an externally applied address signal. Local peripheral circuits 106a and 106b include a row decoder and a column decoder for selecting a row and column in a corresponding memory cell array.

The semiconductor memory device further includes a peripheral internal voltage down converter 112 for supplying an internal power supply voltage to master peripheral circuit 104 and local peripheral circuits 106a and 106b, an array internal voltage down converter 110a for supplying an internal power supply voltage to memory cell arrays 102a and 102b, and an array internal voltage down converter 110b for supplying an internal power supply voltage to memory cell arrays 102c and 102d. Array internal voltage down converter 110a and peripheral internal voltage down converter 112 receive an external power supply voltage VCE from an external power supply pad 1a provided at the middle portion of chip 100 and generating a predetermined internal power supply voltage. Array internal voltage down converter 110b generates an internal power supply voltage from external power supply voltage supplied to an external power supply pad 1b provided at another region. Although a pad arrangement of the so-called "Lead On Chip (LOC)" is shown in which external power supply pads 1a and 1b are disposed at the center of portion chip 100, the semiconductor memory device of the present-invention may take a configuration where pads for receiving external power supply voltage are arranged along the outer periphery of chip 100.

Array internal voltage down converters 110a and 110b generate an internal power supply voltage used to charge a bit line during operation of a sense amplifier and an internal power supply voltage used to generate an intermediate potential for maintaining the bit line at an intermediate potential in a standby cycle. Since a great many bit lines are charged during the charge/discharge operation of the bit lines (charge/discharge is carried out in all the bit line pairs crossing a selected word line), a great amount of current is expended from the internal power supply line. However, the voltage variation is relatively gentle. This means that the internal voltage down converter generating an internal power supply voltage that is used for charging a bit line during a sensing operation requires a direct current (dc) response characteristics accommodating a relatively gentle voltage variation and a great current supply capability, rather than high frequency response characteristics. In contrast, the peripheral circuitry generating an internal control signal (master peripheral circuit 104 and local peripheral circuits 106a–106b) must have signals ascertained promptly. The internal power supply voltage varies abruptly in order to carry out such an operation at high speed. Therefore, peripheral internal voltage down converter 112 supplying an internal power supply voltage for peripheral circuitry requires high frequency response accommodating the rapid change in the internal power supply voltage. By providing individually array internal voltage down converters 110a and 110b according to the required response characteristics, internal power supply voltage can be generated stably according to the operation of each corresponding internal circuit.

When an internal power voltage down converter that satisfies the high frequency response and direct current linear response shown in FIGS. 59–64 is used, a configuration may be employed where an array internal voltage down converter and a peripheral internal voltage down circuit are made in common. The specific structure of each internal circuit will be described hereinafter.

Internal Voltage Down Converter for Peripheral Circuits

Figure 66:
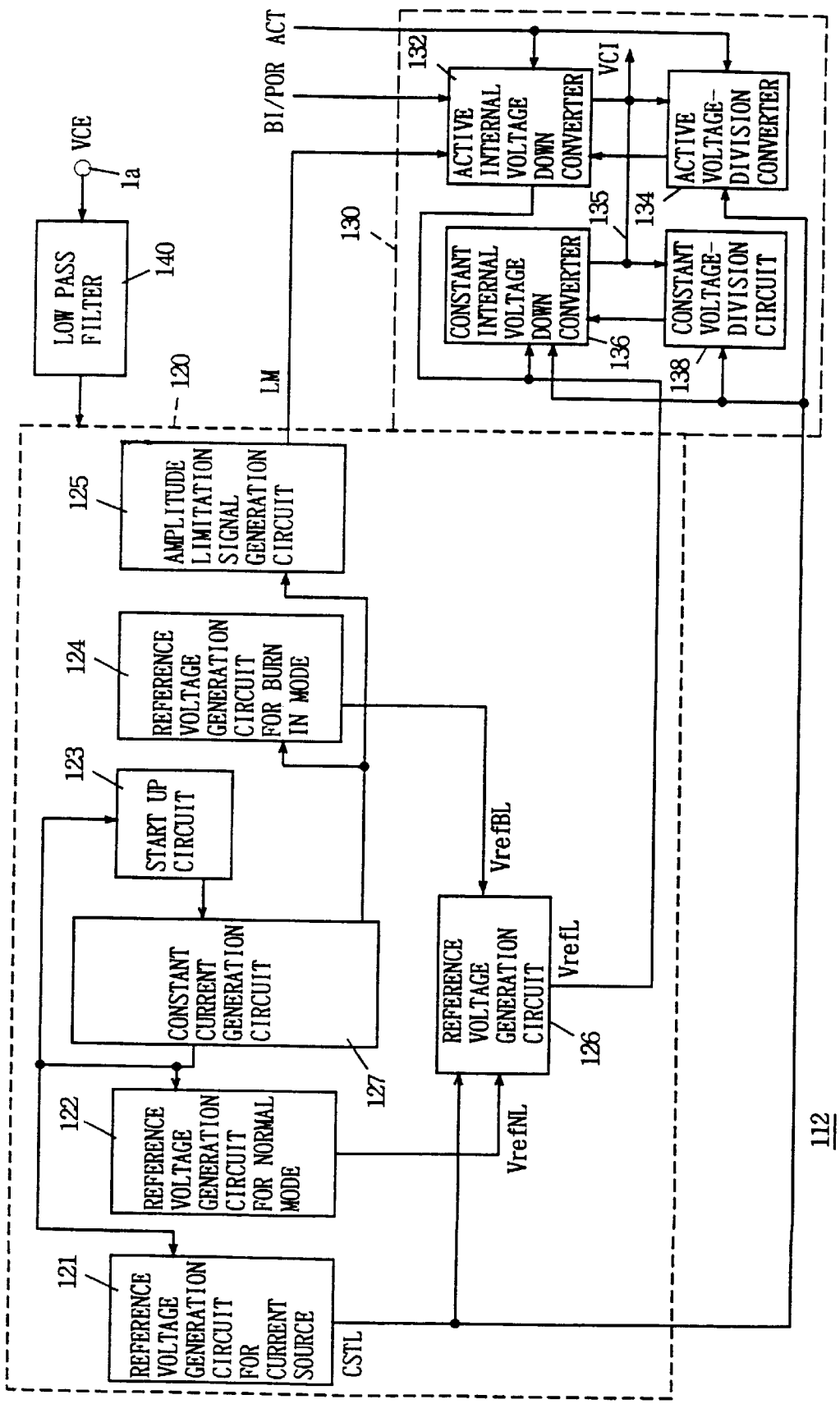
FIG. 66 is a block diagram schematically showing a structure of an internal voltage down converter for the periphery shown in FIG. 65.

FIG. 66 is a block diagram showing a structure of the peripheral internal voltage down converter of FIG. 65. Referring to FIG. 66, peripheral internal voltage down converter 112 includes a reference voltage generation unit 120 for generating a reference voltage VrefL of a predetermined voltage level and an amplitude limitation signal LM, an internal power supply voltage generation unit 130 for maintaining internal power supply voltage VCI at a predetermined level according to reference voltage VrefL from reference voltage generation unit 120 and internal power supply voltage VCI on internal power supply line 135, and a lowpass filter 140 for removing the high frequency component from external power supply voltage VCE applied to external power supply pad 1a and providing the same to the external power supply node of reference voltage generation unit 120 and internal power supply voltage generation unit 130. When external power supply voltage VCE is used during operation of this semiconductor memory device, lowpass filter 140 serves to prevent adverse effect of a bounce of external power supply voltage VCE on the reference voltage generated by reference voltage generation unit 120 (the internal structure will be described in detail afterwards) at the occurrence of the bounce (overshooting and undershooting) in the voltage level of external power supply voltage VCE applied to external power supply pad 1a.

Reference voltage generation unit 120 includes a constant current generation circuit 127 for generating constant current, a start-up of circuit 123 for properly operating constant current generation circuit 127 at the application of external power supply voltage VCE, a current source reference voltage generation circuit 121 for generating a reference voltage CSTL for a current source transistor included in the portion generating a reference voltage according to constant current from constant current generation circuit 127, a normal reference voltage generation circuit 122 for generating reference voltage VrefNL used for the internal power supply voltage employed at a normal operation according to the constant current from constant current generation circuit 127, a burn-in reference voltage generation circuit 124 receiving a constant current from constant current generation circuit 127 for generating a reference voltage VrefBL that varies according to external power supply voltage VCE (output voltage of lowpass filter 140), an amplitude limitation signal generation circuit 125 for generating an amplitude limitation signal LM that limits the amplitude of the gate potential of a drive transistor according to constant current from constant current generation circuit 127, and a reference voltage generation circuit 126 having the current flow of a current source therein determined by reference voltage CSTL from current source reference voltage generation circuit 121 to compare normal reference voltage VrefNL with reference voltage VrefBL from burn in reference voltage generation circuit 124 to select a higher reference voltage thereof to define the level of internal power supply voltage VCI.

Figure 67:
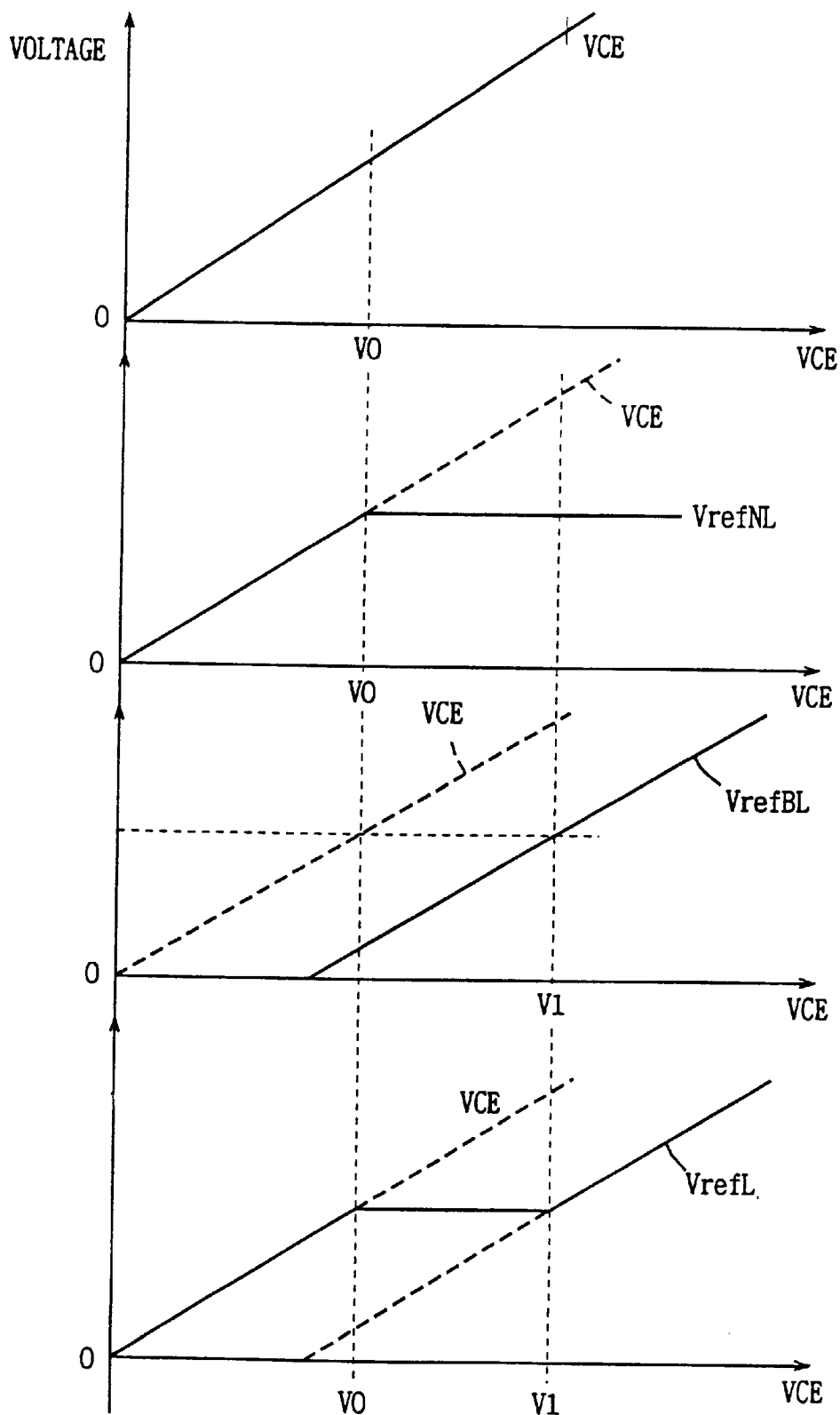
FIG. 67 is a diagram for describing an operation of the reference voltage generation unit shown in FIG. 65.

FIG. 67 schematically shows an operation of the reference voltage generation unit of FIG. 66. The operation of the reference voltage generation unit will now be described with reference to FIGS. 66 and 67.

When external power supply voltage VCE rises, reference voltage VrefNL output from normal reference voltage generation circuit 122 also rises. When external power supply voltage VCE reaches a predetermined level of V0, reference voltage VrefNL from normal reference voltage generation circuit 122 maintains a constant voltage level. In contrast, burn-in reference voltage generation circuit 124 generates a reference voltage VrefBL that is lower than external power supply voltage VCE by a constant value. Therefore, reference voltage VrefBL generated by burn-in reference voltage generation circuit 124 increases in proportion to external power supply voltage VCE.

Reference voltage generation circuit 126 selects one of VrefNL and VrefBL whichever is higher. Since reference voltage VrefNL is higher until external power supply voltage VCE reaches voltage V1, reference voltage VrefL from reference voltage generation circuit 126 is equal to reference voltage VrefNL from normal reference voltage generation circuit 122. In contrast, when external power supply voltage VCE exceeds voltage V1, reference voltage VrefBL becomes higher than reference voltage VrefNL. Therefore, reference voltage VrefL from reference voltage generation circuit 126 is equal to reference voltage VrefBL from burn-in reference voltage generation circuit 124.

In a normal operation mode (memory cell select operation, data writing/reading operation, refresh operation, etc.), external power supply voltage VCE is set at a level between voltage V0–V1. At the marketing of a semiconductor device product, a final testing is carried out to guarantee the reliability of the product such as stabilization of the operation characteristics and to reveal potential defects. This testing, called a burn-in test, is carried out in which internal power supply voltage VCI is increased higher than the level of the normal operation to operate a semiconductor memory device under conditions of high stress. It is necessary to increase internal power supply voltage VCI above that of normal operation in a burn-in mode for burn-in testing and during acceleration testing for checking the life time of the product. For this purpose, the level of reference voltage VrefL determining the level of the internal power supply voltage VCI is increased according to external power supply voltage VCE. As a result, internal power supply voltage VCI can be changed according to external power supply voltage VCE depending on a carried-out operation mode.

Referring to FIG. 66 again, internal power supply voltage generation circuit 130 includes an active voltage-division circuit 134 activated in response to an activation signal ACT such as row address strobe signal /RAS, chip select signal /CS and chip enable signal /CE for decreasing the level of internal power supply voltage VCI on internal power supply line 41 an active internal voltage down converter 132 activated in response to activation signal ACT to compare reference voltage VrefL from reference voltage generation unit 120 with the output voltage of active voltage-division circuit 134 for supplying/blocking current towards internal power supply line 135 according to the comparison result, a constant voltage-division circuit 138 constantly maintaining an active state for decreasing the level of internal power supply voltage VCI on internal power supply line 135, and a constant internal voltage down converter 136 to compare the output voltage of constant voltage-division circuit 138 and reference voltage VrefL from reference voltage generation unit 120 for adjusting the voltage level of internal power supply voltage VCI (supplying/blocking current) on internal power supply line 135 according to the comparison result. The current driving capability of constant internal voltage down converter 136 is set smaller than that of active internal voltage down converter 132. As a result, power consumption during a standby state (inactive state of signal ACT) is reduced.

As described in the previous embodiments 8 and 9, active internal voltage down converter 132 has a structure where internal power supply voltage VCI is made equal to external power supply voltage VCE according to a burn-in mode instructing signal VI or power on detection signal POR. Thus, a structure is realized in which the rise of internal power supply voltage VCI at power-on is speeded and in which internal power supply voltage VCI is increased according to external power supply voltage VCE in a burn-in mode.

When activation signal ACT is active, a peripheral circuit (refer to FIG. 60) operates, whereby current is supplied from internal power supply line 135 to the peripheral circuit (internal power supply voltage VCI is consumed (used)). As a result, the level of internal power supply voltage VCI is lowered. The peripheral circuit operates at high speed, and internal power supply voltage VCI on internal power supply line 135 is lowered abruptly. The level of internal power supply voltage VCI is lowered by active voltage-division circuit 134. The comparison circuit formed of a current mirror type amplifier circuit in active internal voltage down converter 132 is operated at the most sensitive region to realize high speed response. In general, when the level of reference voltage Vref approaches the level of one operating power supply voltage (VCE) in a current mirror type (differential) amplifier circuit, the amount of change in the output signal with respect to the amount of change in the input signal (VCI) is reduced to result in lower sensitivity. Therefore, high speed response characteristic is deteriorated.

More specifically, the conductance of an MOS transistor receiving reference voltage Vref is increased when the level of reference voltage Vref is high. Even if the conductance of the MOS transistor receiving the input signal varies according to change in the voltage level of the input signal, this change in the conductance of the MOS transistor receiving the input signal at its gate provides a small effect on the current flow via the MOS transistor receiving reference voltage Vref at its gate. A great change in current will not occur, and the change in the voltage level of the output node is small. The voltage level of internal power supply voltage VCI is lowered by active voltage-division circuit 134 to improve high speed response performance of active internal voltage down converter 132.

Figure 68:
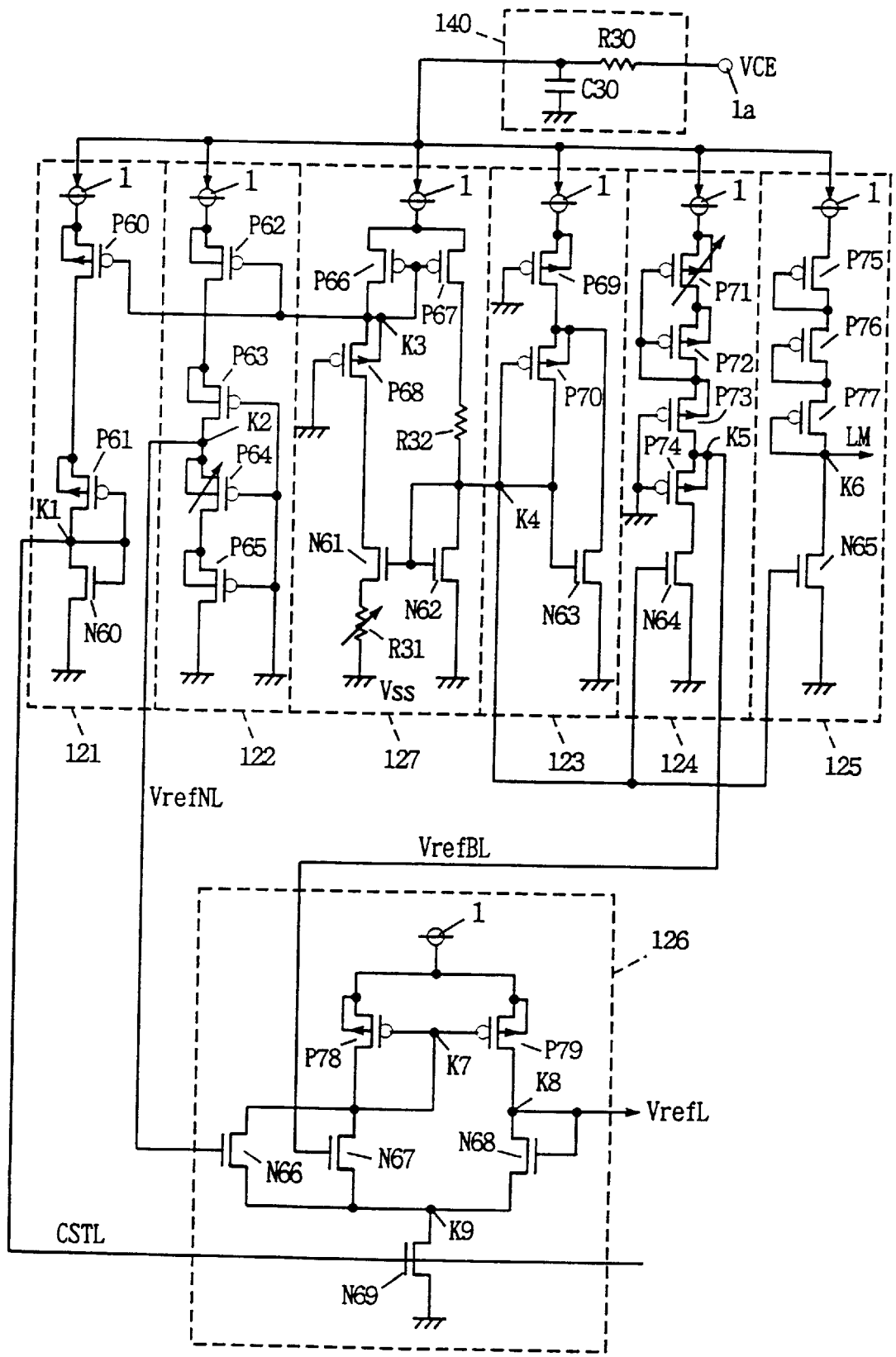
FIG. 68 schematically shows a reference voltage generation unit of FIG. 65.

FIG. 68 shows in detail the structure of the reference voltage generation unit of FIG. 66. The structure and operation of each circuit will now be described.

A lowpass filter 140 includes a resistance element R30 having one end connected to a pad 1a receiving external power supply voltage VCE and the other end connected to external power supply node 1 via an external power supply line, and a capacitor C30 connected between the other end of resistance element R30 and ground node VSS. Lowpass filter 140 is known as an integration circuit to pass through a signal in a frequency range determined by the product of the resistance of resistor R30 and the capacitance of capacitor C30.

Constant current generation circuit 127 includes a p channel MOS transistor P66 having one conduction terminal (source) connected to external power supply node 1, and the other conduction terminal (drain) and gate connected to a node K3, a p channel MOS transistor 68 having one conduction terminal connected to node K3 and its gate connected to ground node VSS, an n channel MOS transistor N61 having one conduction terminal connected to the other conduction terminal of MOS transistor P68 and its gate connected to a node K4, a variable resistor R31 having one end connected to the other conduction terminal of MOS transistor N61 and the other end connected to ground node VSS, an MOS transistor P67 having one conduction terminal connected to external power supply node 1 and its gate connected to node K3, a resistance element R32 having one end connected to the other conduction terminal of MOS transistor P67 and the other end connected to node K4, and an n channel MOS transistor N62 having the gate and one conduction terminal connected to node K4 and the other conduction terminal connected to ground node VSS.

MOS transistors P66 and P67 form a current mirror circuit. A current of a level identical to the current flow via MOS transistor P66 flows through MOS transistor P67. MOS transistors N60 and N62 also form a current mirror circuit. The channel width W (or β) of MOS transistor N61 is set greater than that of MOS transistor N62. P channel MOS transistor P68 functions as a resistance element to reduce the current supplied via MOS transistor P66. Similarly, resistor R32 serves to reduce the current flow via MOS transistor P67.

A start up circuit 123 includes a p channel MOS transistor P69 having one conduction terminal connected to external power supply node 1 and the gate connected to ground node VSS, a p channel MOS transistor P70 having one conduction terminal and substrate connected together to the other conduction terminal of MOS transistor P69, and the gate and the other conduction terminal connected together to node K4, and an n channel MOS transistor N63 having one conduction terminal connected to the one conduction terminal of MOS transistor P70, the gate connected to node K4, and the other conduction terminal connected to ground node VSS.

Constant current generation circuit 127 and start up circuit 123 will be described in operation.

Before the application of external power supply voltage VCE, external power supply node 1 is at the level of ground voltage VSS. Here, the voltage level of each internal node of constant current generation circuit 127 and start up circuit 123 also is at a level of ground voltage VSS.

Upon application of external power supply voltage VCE, the level of external power supply node 1 rises accordingly. When there is no current flow in constant current generation circuit 127, the voltage of node K3 rises according to external power supply voltage VCE. Node K4 maintains the level of ground voltage VSS, so that constant current generation circuit 127 does not effect a desired operation.

In contrast, in start up circuit 123, the rise of external power supply voltage VCE causes current to be supplied from external power supply node 1 to MOS transistor P70 by p channel MOS transistor P69 serving as a resistance element. When the voltage level of one conduction terminal of MOS transistor P70 becomes higher than the level of node K4 by more than Vtp (Vtp is the absolute value of the threshold voltage of MOS transistor P70), a current flows via MOS transistor P70, whereby the gate potential of each of MOS transistors N62 and N61 rises. When the voltage level of node K4 become greater than the threshold voltage Vtn of MOS transistor N62, MOS transistor N62 is turned on. In response, current flows from external power supply node 1 towards ground node VSS via MOS transistor P67, resistor R32, and MOS transistor N62.

MOS transistors N62 and N61 form a current mirror circuit. Therefore, there is a current flow via MOS transistor N61. Similarly, current is supplied from internal power supply node 1 via MOS transistors P66, P68 and N61 and resistor R31. As a result, current is supplied from external power supply node 1 towards ground node VSS in constant current generation circuit 127. Therefore, constant current generation circuit 127 operates properly, and the voltage of each internal node is set to the level of a predetermined voltage.

When the voltage level of node K4 exceeds threshold voltage Vtn of MOS transistor N62, MOS transistor N63 in start up circuit 123 is turned on. MOS transistor P70 has one conduction terminal discharged to the level of ground voltage VSS, whereby MOS transistor P70 is turned off. Therefore, supply of current from start up circuit 123 to constant current generation circuit 127 is inhibited. More specifically, start up circuit 123 functions to supply current to constant current generation circuit 127 upon the supply of external power supply voltage VCE to set the voltage level of the internal node of constant current generation circuit 127 at a predetermined level.

When current flows, the following operation is carried out in constant current generation circuit 127.

MOS transistors P66 and P67 have the same size and form a current mirror circuit. Therefore, MOS transistor P67 supplies current of a level identical to the current flow via MOS transistor P66. MOS transistor N61 has a channel width W (or β) greater than that of MOS transistor N62. MOS transistor N62 has its gate and drain connected together to node K4 and operates in a saturation region. A following current I (N62) flows:

$$I(N62)=\beta(N62)\cdot(Vgs-Vth)^2$$

Here, Vgs is the gate-source voltage of MOS transistor N62. The voltage level of node K4 is shown as V (K4) hereinafter. β (N62) is the coefficient β of MOS transistor N62.

MOS transistors N62 and N61 also form a current mirror circuit. MOS transistor N61 has a channel width W (or β) greater than that of MOS transistor N62. Furthermore, MOS transistor N61 has a current driving capability greater than that of MOS transistor P66. Therefore, the gate-source voltage of MOS transistor N61 substantially attains the level of threshold voltage Vtn. When only a current sufficiently smaller than the current driving capability is supplied in an MOS transistor, the gate-source voltage substantially attains a level of threshold voltage Vtn according to the square characteristics of Igs=β·(Vgs−Vth)².

Therefore, voltage V (R31) applied across resistor R31 is:

$$V(R31)=V(K4)-Vtn$$

Therefore, the current flow via resistor R31 is provided as:

$$I=(V(K4)-Vtn)/R31$$

where R31 is the resistance of resistor R31. This current I is supplied from external power supply node 1 to resistor R31 via MOS transistors P66, P68 and N61. A current having a level identical to that of current I is supplied to MOS transistor N62 via resistor R32 by the current mirror circuit of MOS transistors P66 and P67. As a result, the voltage level of node K4 takes a constant value that is determined by the square characteristics of MOS transistor N62. MOS transistor P68 has a current limitation function to maintain the gate-source voltage of MOS transistor N61 at the level of threshold voltage. Resistor R32 functions to operate MOS transistor N62 in a resistance mode.

An increase in the voltage level of node K4 causes an increase in the voltage across resistor R31. In response, the current flow via MOS transistor N61 causes an increase in the current flow via MOS transistor P66. As a result, the current flow via MOS transistor P67 is increased, and the voltage drop across resistor R32 becomes greater. The voltage level of node K4 is lowered. In contrast, when the voltage level of node K4 is lowered, the voltage across resistor R31 is reduced, whereby the current flow via MOS transistor P66 become smaller. In response, the current flow via MOS transistor P67 is reduced, and the voltage drop in resistor R32 becomes smaller. Therefore, the voltage level of node K4 is increased. Thus, the voltage level of node K4 is made constant. The current flow via MOS transistor N62 is constant, i.e. set to a level identical to the current respectively supplied by MOS transistors P66 and P67.

By using constant current generation circuit 127, a reference voltage for supplying constant current stably can be generated when external power supply voltage VCE exceeds (Vtp+Vtn).

Current source reference voltage generation circuit 121 includes a p channel MOS transistor P60 having one conduction terminal connected to internal power supply node 1 and its gate connected to node K3, a p channel MOS transistor P61 having one conduction terminal connected to the other conduction terminal of MOS transistor P60 and its gate and the other conduction terminal connected together to node K1, and an n channel MOS transistor N60 having one conduction terminal and its gate connected together to node K1 and the other conduction terminal connected to ground node VSS. MOS transistor P60 forms a current mirror circuit together with MOS transistor P66 of constant current generation circuit 127. The current flow via MOS transistor P66 is supplied to MOS transistors P61 and N60. MOS transistors P61 and N60 each function as a resistance element according to the channel resistance. A constant reference voltage CSTL is generated at node K1 according to the resistor-division by the transistor P61 and N60. Current source reference voltage generation circuit 121 operates when external power supply voltage VCE becomes greater than Vtn+vtp to generate a constant reference voltage CSTL independent of external power supply voltage VCE.

Normal reference voltage generation circuit 122 includes a p channel MOS transistor P62 having one conduction terminal connected to external power supply node 1 and its gate connected to node K3, and three MOS transistors P63, P64 and P65 connected in series between the other conduction terminal of MOS transistor P62 and ground node VSS. MOS transistors P63–P65 have their gates connected to ground node VSS to function as resistance elements according to respective On resistances (channel conductance).

In normal reference voltage generation circuit 122, MOS transistor P62 forms a current mirror circuit in combination with MOS transistor P66 of constant current generation circuit 127. MOS transistor P62 supplies a mirror current of the current supplied by MOS transistor P66 to MOS transistors P63–P65. MOS transistor P64 has a variable resistance. This variable resistance can be realized by selectively disconnecting or short-circuiting a plurality of MOS transistors connected in series or in parallel by means of interconnection lines or fuse elements.

Reference voltage VrefNL output from node K2 of normal reference voltage generation circuit 122 is provided by the product of the current supplied by MOS transistor P62 and the sum of the resistance values of MOS transistors P64 and P65. The current supplied by MOS transistor P62 is independent of external power supply voltage VCE in a stable state, and reference voltage VrefNL takes a constant value independent of external power supply voltage VCE. Reference voltage VrefNL increases according to external power supply voltage VCE as shown in FIG. 67 until the current supplied by MOS transistor P62 becomes constant.

Burn-in reference voltage generation circuit 124 includes p channel MOS transistor P71 having one conduction terminal connected to external power supply node 1 and having a resistance variable by a fuse or an interconnection line, a p channel MOS transistor P72 having one conduction terminal connected to the other conduction terminal of MOS transistor P71, its gate connected to the gate of MOS transistor P71 and also to its own other conduction terminal, a p channel MOS transistor P73 having one conduction terminal connected to the gate and the other conduction terminal of MOS transistor P72, its gate connected to ground node VSS and another conduction terminal connected to node K5, a p channel MOS transistor K5 having one conduction terminal connected to node K5 and its gate connected to ground node VSS, and an n channel MOS transistor N64 having one conduction terminal connected to the other conduction terminal of MOS transistor P74, another conduction terminal connected to ground node VSS and its gate connected to node K4.

MOS transistors P73 and P74 has its gate potential fixed at the level of ground voltage VSS, and functions as a resistance element by its On resistance. MOS transistor P72 operates in a resistance mode to function as a resistance element according to the channel conductance.

Although MOS transistor P71 functioning as a resistance element has a variable resistance value, its gate is connected, not to the drain as in the resistance connection of a normal resistance mode, but to the gate and the other conduction terminal (drain) of MOS transistor P72. This is to eliminate the substrate effect of MOS transistor P71 to reliably set the channel conductance of MOS transistor P71 at a desired value by setting the level of the gates of MOS transistors P71 and P72 at the same voltage level to bias MOS transistors P71 and P72 at the same gate voltage.

MOS transistor N64 forms a current mirror with MOS transistor N62 of constant current generation circuit 127. A mirror current of the current flow via MOS transistor N62 flows via MOS transistor N64. Therefore, a constant current is drawn from external power supply node 1 to ground node VSS from burn-in reference voltage generation circuit 124 when MOS transistors P71 and P72 are both turned on. The voltage of node K5 increases according to the relation of VCE–I·R where R indicates the combined resistance of MOS transistors P71, P72 and P73, and I indicates the current flow via MOS transistor N64.

By equalizing the gate voltages of MOS transistors P71 and P72, the timing of MOS transistors P71 and P72 both being turned on in burn-in reference voltage generation circuit 124 can be set substantially equal to the timing of the current flowing in constant current generation circuit 127. (The gate of MOS transistor P71 is connected to the gate and drain of MOS transistor P71. When external power supply voltage VCE exceeds Vtp, MOS transistors P71 and P72 are both turned on. This is substantially simultaneous to the initiation of a current supply by start up circuit 123.)

According to the above-described structure, after constant current generation circuit 127 attains a state where a constant current is supplied stably, reference voltage VrefBL that increases according to external power supply voltage VCE can be generated from node K.

Amplitude limitation signal generation circuit 125 includes diode-connected p channel MOS transistors P75, P76, and P77 connected in series between external power supply node 1 and node K6, and an n channel MOS transistor N65 connected between node K6 and ground node VSS. MOS transistor N65 forms a current mirror circuit with MOS transistor N62 of constant current generation circuit 127. The gate width W of MOS transistors P75–P77 are set sufficiently greater than that of MOS transistor N65. A voltage drop by absolute value Vtp of respective threshold voltages occurs in MOS transistors P75–P77 when they are conductive. Therefore, when external power supply voltage VCE exceeds a predetermined voltage level, amplitude limitation signal LM is set to the voltage level of VCE–3·Vtp. By varying the level of amplitude limitation signal LM according to external power supply voltage VCE, a predetermined amplitude limitation feature is realized corresponding to the level of external power supply voltage VCE at a burn-in mode.

Reference voltage generation circuit 126 includes a p channel MOS transistor P78 having one conduction terminal connected to external power supply node 1, the other conduction terminal connected to node K7 and its gate connected to node K7; a p channel MOS transistor P79 having one conduction terminal connected to external power supply node 1, the other conduction terminal connected to node K8, and its gate connected to node K7; an n channel MOS transistor N66 connected between node K7 and K9 for receiving reference voltage VrefNL at its gate; an n channel MOS transistor N67 connected between nodes K7 and K9 for receiving reference voltage VrefBL at its gate; an n channel MOS transistor N68 connected between nodes K8 and K9 and having its gate connected to node K8; and an n channel MOS transistor N69 connected between node K9 and ground node VSS for receiving reference voltage CSTL from current source reference voltage generation circuit 121 at its gate.

MOS transistor N69 forms a current mirror circuit with MOS transistor N60 of current source reference voltage generation circuit 121 to generate a mirror current of the current flow via MOS transistor N60. MOS transistors P78 and P79 form a current mirror circuit. MOS transistor N69 functions as a constant current source. Here, when reference voltage VrefL is lower than at least one of reference voltages VrefNL and VrefBL, the conductance of MOS transistor N66 or N67 becomes greater than that of MOS transistor N68. The current flow via MOS transistors N66 and N67 increases. This current is supplied from MOS transistor P78. In response, the current flow via MOS transistor P79 forming a current mirror circuit also increases. MOS transistor N68 cannot discharge all the current supplied via MOS transistor P79. Therefore, the voltage level of node K8 increases. More specifically, the voltage level of reference voltage VrefN increases.

In contrast, when reference voltage VrefL is higher than both reference voltages VrefNL and VrefBL, the conductance of MOS transistor N68 becomes greater than those of MOS transistors N66 and N67. MOS transistor N68 discharges all the current supplied from MOS transistor P79 to node K9. As a result, the voltage level of reference voltage VrefL from node K8 is lowered. More specifically, reference voltage generation circuit 126 provides one of reference voltages VrefNL and VrefBL of the higher level as reference voltage VrefL.

Thus, reference voltage required for stabilization can be generated when external power supply voltage VCE arrives at a predetermined voltage level.

Figure 69:
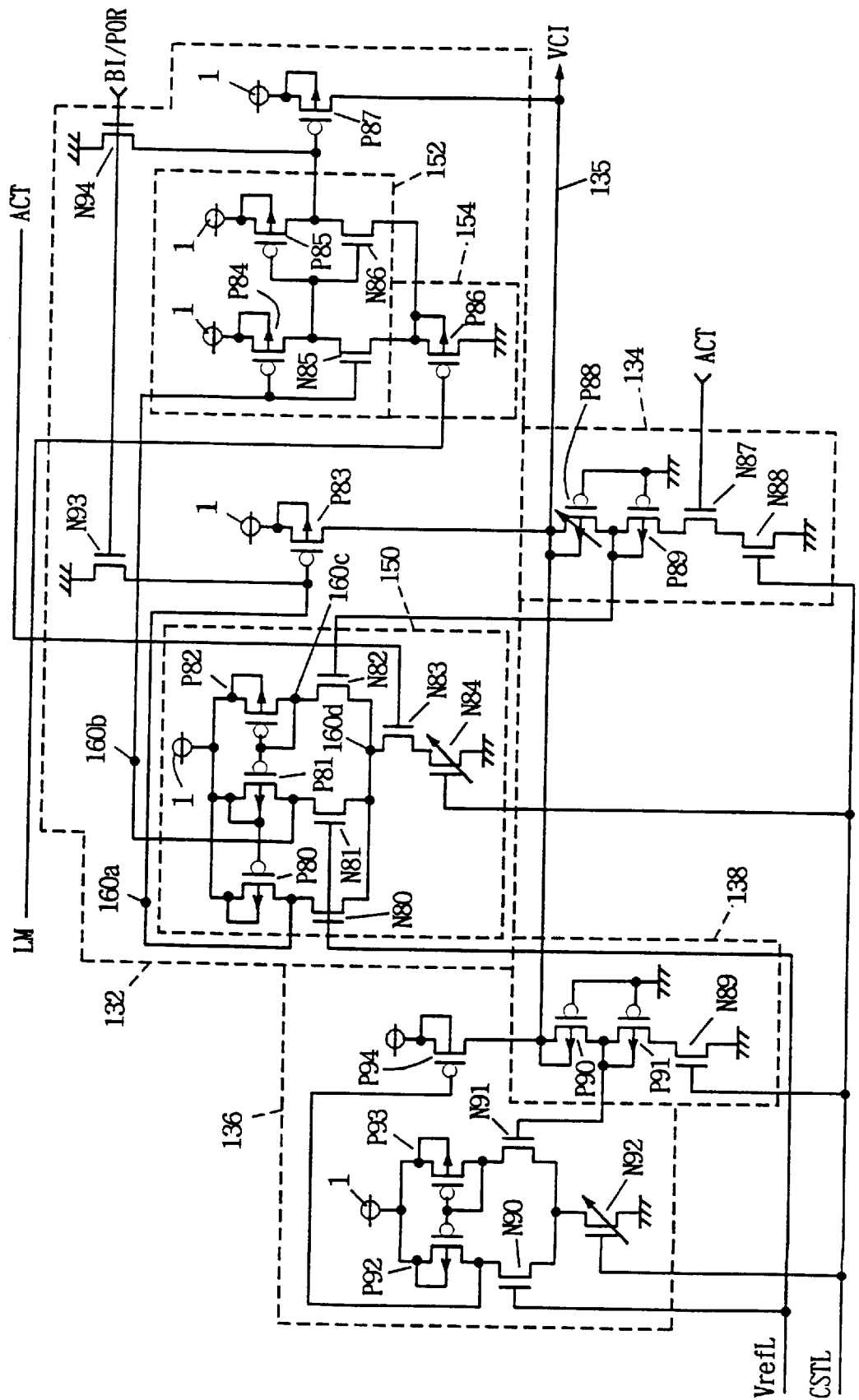
FIG. 69 schematically shows a structure of an internal voltage generation unit shown in FIG. 65.

FIG. 69 shows a specific structure of internal power supply voltage generation unit 130 of FIG. 66. The structure and operation of each circuit will now be described with reference to FIG. 69.

Active voltage-division circuit 134 includes: a p channel MOS transistor P88 having one conduction terminal connected to external power supply line 135 and its gate connected to ground node VSS; a p channel MOS transistor P89 having one conduction terminal connected to the other conduction terminal of MOS transistor P88, and its gate connected to ground node VSS; an n channel MOS transistor N87 having one conduction terminal connected to the other conduction terminal of MOS transistor P89, and its gate receiving activation control signal ACT; and an n channel MOS transistor N88 having one conduction terminal connected to the other conduction terminal of MOS transistor N87, the other conduction terminal connected to ground node VSS, and its gate receiving reference voltage CSTL.

MOS transistors P88 and P89 have their gate potentials fixed to the level of ground voltage VSS, and function as resistance elements according to their respective inherent ON resistances. MOS transistor N87 is turned on when activation control signal ACT attains an H level indicating an active cycle of the semiconductor memory device. MOS transistor M88 receives reference voltage CSTL from current source reference voltage generation circuit 121 shown in FIG. 68 to function as a constant current source. More specifically, MOS transistor N88 forms a current mirror circuit with MOS transistor N60 shown in FIG. 68 to supply a constant current. Therefore, when activation control signal ACT attains an H level, active voltage-division circuit 134 provides a voltage according to the resistance values of MOS transistors P88 and P89 and the current supplied by MOS transistor N88, i.e. the voltage of VCI−I(N88)·R(P88) where I(N88) is the current flow via MOS transistor N88, and R(P88) is the resistance of MOS transistor P88.

MOS transistors P88 and P89 are provided in series in order to set the on resistance of MOS transistor N88 to a substantially negligible value according to the on resistances of MOS transistors P88 and P89 so that the level of the output voltage from voltage-division circuit 134 can be determined by the resistance value of MOS transistor P88. The resistance value of MOS transistor P88 can be varied by selective (connection of a plurality of MOS transistors connected in series or in parallel by means of an interconnection line or a fuse element). Thus, the output voltage of voltage-division circuit 134 can be set to an optimum value.

Active internal voltage down converter 132 includes a comparison circuit 150 activated in response to activation control signal ACT to compare reference voltage VrefL from reference voltage generation circuit 126 shown in FIG. 68 with the output voltage from voltage-division circuit 134, an amplifier circuit 152 for amplifying a first output signal of comparison circuit 150, a p channel MOS transistor P83 responsive to a second output signal of comparison circuit 150 for supplying current from external power supply node 1 to internal power supply line 135, a p channel MOS transistor P87 responsive to an output signal of amplifier circuit 152 for supplying current from external power supply node 1 to internal power supply line 135, an amplitude limitation circuit 154 for limiting the amplitude of an output signal of an L level of amplifier circuit 152, and n channel MOS transistors N93 and N94 responsive to a burn-in mode indicating signal and a power-on detection signal BI/POR for setting the gates of MOS transistors P83 and P87 to the level of ground voltage VSS.

Comparison circuit 150 includes: a p channel MOS transistor P80 having one conduction terminal connected to external power supply node 1, the other conduction terminal connected to a node 160a, and its gate connected to a node 160c; a p channel MOS transistor P81 having one conduction terminal connected to external power supply node, the other conduction terminal connected to node 160b, and its gate connected to node 160c; a p channel MOS transistor P82 having one conduction terminal connected to external power supply node 1, and the other conduction terminal and its gate connected to node 160c; an n channel MOS transistor N80 connected between nodes 160a and 160d, and receiving reference voltage VrefL at its gate; an n channel MOS transistor N81 connected between nodes 160b and 160d and receiving reference voltage VrefL at its gate, and n channel MOS transistors N83 and N84 connected in series between node 160d and ground node VSS.

MOS transistor N83 receives activation control signal ACT at its gate. MOS transistor N84 receives reference voltage CSTL at its gate. The current driving capability of MOS transistor N84 is variable (the current driving capability can be increased by connecting MOS transistors in parallel by means of an interconnection line or a fuse element). Thus, a constant current source is realized that provides optimum current according to the response characteristics and operating current of comparison circuit 150. Comparison circuit 150 has a structure identical to that of the comparison circuit 3 shown in FIG. 58 (except that a voltage having its level shifted is transmitted from the voltage-division circuit). When activation control signal ACT attains an L level of an inactive state, MOS transistor N83 is turned off. There is no current flow in comparison circuit 150, so that nodes 160a and 160b are set substantially at the level of external power supply voltage VCE.

When activation control signal ACT attains an H level of an active state, the voltage level of the output signals of nodes 160a and 160b varies according to the relationship between the output voltage from voltage-division circuit 134 and reference voltage VrefL. MOS transistor P83 supplies current from external power supply node 1 to internal power supply line 135 according to a signal voltage on node 160a. By supplying a voltage which is a reduced version of internal power supply voltage VCI in voltage-division circuit 134 to comparison circuit 150, comparison circuit 150 can carry out a comparison operation at the most sensitive region. Therefore, a comparison circuit superior in fast responsibility can be realized. The size of MOS transistor P83 is increased, so that current is supplied from external power supply node 1 to internal power supply line 135 with great current supplying capability. By turning off MOS transistors N83 and N87 by means of activation control signal ACT, the power consumption in active internal voltage down converter 132 and active voltage-division circuit 134 can be substantially eliminated during a standby state.

Amplify circuit 152 includes a p channel MOS transistor P84 and an n channel MOS transistor N85 forming a CMOS inverter of a first stage, and a p channel MOS transistor P85 and an n channel MOS transistor N86 forming a CMOS inverter of an output stage. Amplitude limitation circuit 154 includes a p channel MOS transistor P86 receiving an amplitude limitation signal LM from amplitude limitation signal generation circuit 125 shown in FIG. 68 at its gate. Amplitude limitation signal LM attains the voltage level of VCE–3·vtp. P channel MOS transistor P86 maintains the source potentials of MOS transistors N85 and N86 at the level of VCC–2·Vtp. As a result, the output signal of amplify circuit 152 is set at a voltage level between VCE and VCE–2·Vtp. Therefore, MOS transistor P87 is prevented from being turned on excessively. MOS transistor P87 corresponds to drive transistor 60 described in the previous FIG. 57 to suppress rapid variation of internal power supply voltage VCI even when power supply voltage VCE of internal power supply line 135 suddenly varies.

MOS transistors N93 and N94 are rendered conductive in response to signal BI/POR which attains an H level of an active state in a burn-in mode or upon power-on, to set the gates of MOS transistors P83 and P87 to the level of ground voltage VSS. As a result, MOS transistors P83 and P87 transmit external power supply voltage VCE on internal power supply line 135, whereby internal power supply voltage VCI is increased speedily when power is turned on. In a burn-in mode, internal power supply voltage VCE is set equal to external power supply voltage VCE.

Constant voltage-division circuit 138 includes an n channel MOS transistor N89 receiving reference voltage CSTL at its gate, and p channel MOS transistors P90 and P91 connected in series between MOS transistor N89 and internal power supply line 135. MOS transistors P90 and P91 have their gates set to the level of ground voltage VSS, and function as resistance elements. Similar to active voltage-division circuit 134, constant voltage-division circuit 138 shifts internal power supply voltage VCI down by a predetermined value. More specifically, internal power supply voltage VCI is lowered by a predetermined value according to the resistance value of MOS transistor P90 and a constant current flow via MOS transistor N89.

Constant internal voltage down converter 136 includes an n channel MOS transistor N90 receiving reference voltage VrefL at its gate, an n channel MOS transistor N91 receiving an output voltage of constant voltage-division circuit 138 at its gate, an n channel MOS transistor N92 provided between the common node of MOS transistors N90 and N91 and ground node VSS and receiving reference voltage CSTL at its gate, and p channel MOS transistors P92 and P93 for supplying current respectively to MOS transistors N90 and N91. MOS transistors P92 and P93 form a current mirror circuits. A mirror current of a level identical to the current flow through MOS transistor P93 flows via MOS transistor P92. The current driving capability of MOS transistor N92 can be varied (by programming of interconnection lines or fuse element). The operating current, i.e. response characteristics, of internal voltage down converter 136 is set to an appropriate value.

Voltage is applied to the gate of drive p channel MOS transistor P94 from the common node of MOS transistors P92 and N90. MOS transistor P94 supplies current from external power supply node 1 to internal power supply line 135 according to the gate voltage. The current driving capability of MOS transistor P94 is set to a relatively small value. This is because a great current driving capability is not required at a standby mode since internal power supply voltage VCI on internal power supply line 135 is substantially constant. In a standby mode, only a standby current such as leakage current is consumed. Only the capability of compensating for this standby current causing reduction in internal power supply voltage VCI is required for MOS transistor P90.

Internal Voltage Down Converter for Array

Figure 70:
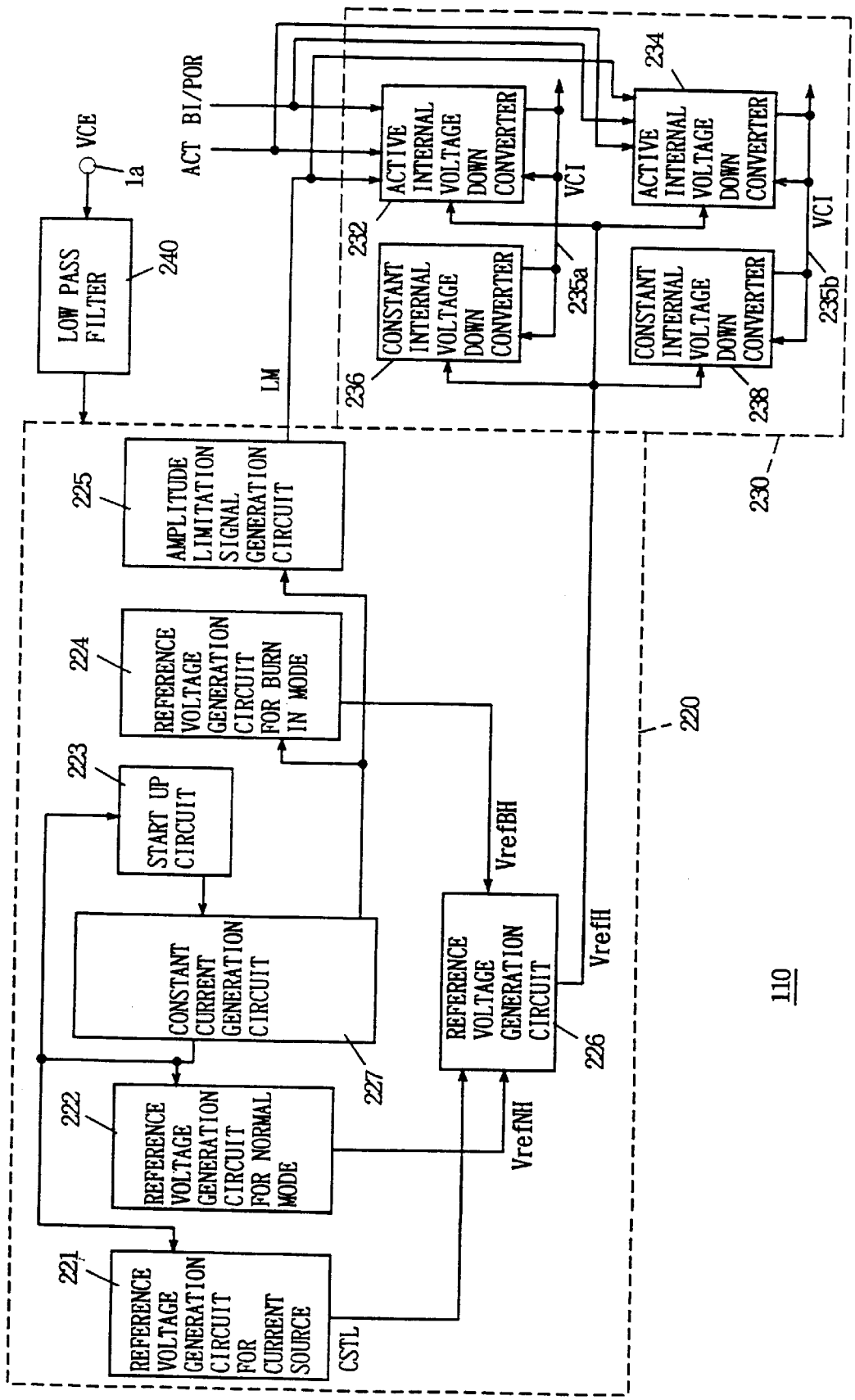
FIG. 70 is a block diagram showing a structure of the array internal voltage down converter of FIG. 65.

FIG. 70 is a block diagram schematically showing a structure of internal voltage down converters 110a and 110b for arrays shown in FIG. 60. In FIG. 70, only one of the two internal voltage down converters 110a and 110b is shown since they have the same structure.

Referring to FIG. 70, an internal voltage down converter (110a, 110b) includes a reference voltage generation unit 220 for generating a reference voltage VrefH, and an internal voltage generation unit 230 to compare reference voltage VrefH from reference voltage generation unit 220 with internal power supply voltage VCI for adjusting (supply current) the voltage level of internal power supply voltage VCI according to the comparison result.

Similar to the structure of peripheral circuit internal voltage down converter shown in FIG. 66, reference voltage generation unit 220 includes a constant current generation circuit 227 for supplying a constant current, a start up circuit 223 for operating constant current source generation circuit 227 accurately when external power supply voltage VCE is supplied, a reference voltage generation circuit 221 for a current source for generating reference voltage CSTL for a constant source, a normal reference voltage generation circuit 222 for generating reference voltage VrefNH used during a normal operation mode, a burn-in reference voltage generation circuit 224 for generating reference voltage VrefBH used in a burn-in mode, an amplitude limitation signal generation circuit 225 for generating an amplitude limitation signal LM, and a reference voltage generation circuit 226 for generating the higher one of reference voltages VrefNH and VrefBL from reference voltage generation circuits 222 and 224, as reference voltage VrefH.

The structure and operation of reference voltage generation circuit 220 corresponds to those of the reference voltage generation unit within the peripheral circuit internal voltage down converter shown in FIGS. 68 and 69, provided that the voltage level of reference voltages VrefNH and VrefBH generated by normal reference voltage generation circuit 222 and burn-in reference voltage generation circuit 224, respectively, are set higher than reference voltages VrefNL and VrefBL, respectively. The structure for setting reference voltages VrefNH and VrefBH higher than reference voltages VrefNL and VrefBL, respectively, is realized by setting both the resistance values of MOS transistor P64 (in reference voltage generator 122) and MOS transistor P71 (in reference voltage generation circuit 124) of FIG. 68 smaller. The structure and operation of reference voltage generation circuit 220 are similar to those described with reference to FIG. 68. The only difference is that the voltage level of reference voltages VrefNH and VrefBH are set higher. The reason why reference voltages VrefNH and VrefBH are set higher will be described in detail afterwards.

Internal voltage generation unit 230 includes two internal power supply voltage generation systems. This is to supply an internal power supply voltage to the two memory cell arrays corresponding to one array internal voltage down converter individually from respective systems.

More specifically, internal voltage generation unit 230 includes active internal voltage down converters 232 and 234 operative in response to activation control signal ACT and burn-in mode indicating signal/power on detection signal BI/POR, and constant internal voltage down converters 236 and 238 for maintaining the voltage level of each internal power supply voltage VCI at a predetermined level in a standby mode. Active internal voltage down converter 232 and constant internal voltage down converter 236 control the voltage level of internal power supply voltage VCI on an internal power supply line 235a. Active internal voltage down converter 234 and constant internal voltage down converter 238 adjust the voltage level of internal power supply voltage VCI on an internal power supply line 235b.

In contrast to the structure shown in FIG. 66, a voltage-division circuit for lowering the voltage level of internal power supply voltage VCI is not provided in internal voltage generation unit 230. At an operation period of voltage-division circuit, current flows from an internal power supply line to a ground node, whereby current consumption is increased. Therefore, a voltage-division circuit for reducing the consumed current is not provided. As described above, an internal power supply voltage mainly generated by internal voltage generation unit 230 in order to charge a bit line is used as the array internal power supply voltage. The change in internal power supply voltage during the bit line charging operation is relatively gentle so that high speed response is not required. Therefore, internal power supply voltage VCI can be restored to its former level when lowered even if the sensitivity of the comparison circuit is slightly reduced (the comparison circuit is included in active A internal voltage down converters 232, 234 and constant internal voltage down converters 236 and 238). Since no voltage-division circuit is used, the voltage level of VrefNH and VrefBH from reference voltage generation circuits 222 and 224, respectively, are set to a higher level.

The internal structures of active internal voltage down converters 232 and 234 and constant internal voltage down converters 236 and 238 shown in FIG. 70 are similar to those of FIG. 64, except that the level of reference voltage VrefH differs and that internal power supply voltage VCI on internal power supply lines 235a and 235b are directly applied to the comparison circuit. The structure and operation thereof are substantially similar to those shown in FIG. 69, and the description thereof will not be repeated.

By adjusting the voltage level of internal power supply voltage VCI without using an array internal voltage down converter as a voltage-division circuit as shown in FIG. 70, an internal voltage down converter of low power consumption can be realized.

External power supply voltage VCE supplied to external power supply pad 1a is filtered by lowpass filter 240 to be supplied to reference voltage generation unit 220 and internal voltage generation unit 230 as the operating power supply voltage.

As described above, MOS transistors N93 and N94 are provided, and transistors P83 and P87 are turned on in a burn-in mode, so that the output of comparison circuit 150 is neglected. Burn-in reference voltage generation circuits 124 and 224 are provided, whereby reference voltages VrefBL and VrefBH are increased according to external power supply voltage VCE at a burn-in mode. The reason of such an arrangement is set forth in the following. As shown in FIG. 69, MOS transistors P83 and P87 have their gate voltages set to the level of ground voltage VSS at a burn-in mode, so that power supply voltage VCI on internal power supply line 135 is set equal to external power supply voltage VCE. In active internal voltage down converters 132 and 232, when the voltage level of node 160a shown in FIG. 69 attains the level of ground voltage VSS, there is a great current flow via MOS transistor P82 if internal power supply voltage VCI is higher than reference voltage VrefL. A current of a level as high as this great current flows via MOS transistors P80 and P81, resulting in increase in the consumed current of comparison circuit 150. To prevent this increase, reference voltages VrefL and VrefH are respectively increased according to external power supply voltage VCE in a burn-in mode. Here, the current driving capability of MOS transistors N93 and N94 are set to a sufficiently low level in order to prevent unnecessary current consumption. Similarly, in a constant internal voltage down converter, the gate voltage of the drive MOS transistor is not discharged to the ground voltage level. Therefore, in order to realize an operation to properly equalize external power supply voltage VCE and internal power supply voltage VCI in a constant internal voltage down converter, it is necessary to set reference voltages VrefL and VrefH higher according to external power supply voltage VCE. According to the above structure, an array internal voltage down converter that generates internal power supply voltage VCI stably at low current consumption can be realized.

Modification 1

Figure 71:
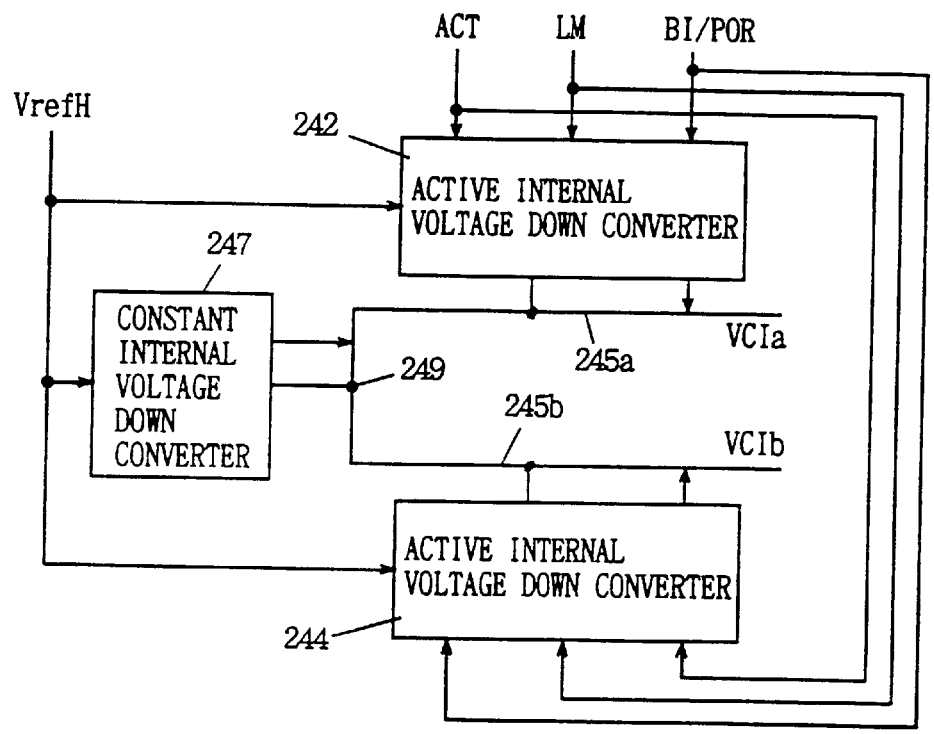
FIGS. 71 and 72 are first and second modifications of the internal power supply voltage generation unit of FIG. 70.

FIG. 71 shows a first modification of an array internal voltage down converter. Referring to FIG. 71, an array internal voltage down converter includes an active internal voltage down converter 242 for adjusting the voltage level of internal power supply voltage on internal power supply line 245a at an active state, an active internal voltage down converter 244 for adjusting the voltage level of internal power supply voltage VCIb on internal power supply line 245b when active, and a constant internal voltage down converter 247 for adjusting the voltage level of internal power supply voltages VCIa and VCIb on internal power supply lines 245a and 245b, respectively. Internal power supply lines 245a and 245b may be formed of different interconnections or of the same interconnections. More specifically, a structure is provided where internal power supply lines 245a and 245b supply internal power supply voltages VCIa and VCIb to different memory cell arrays. The voltage level of internal power supply voltages VCIa and VCIb are adjusted by comparing reference voltage VrefH and the voltage on node 249 common to internal power supply lines 245a and 245b by constant internal voltage down converter 247. Active internal voltage down converter 242 carries out voltage adjustment in response to activation control signal ACT amplitude limitation signal LM and burn-in mode indicating signal/power on detection signal BI/POR. Similarly, active internal voltage down converter 244 adjusts the power supply voltage according to activation control signal ACT, amplitude limitation signal LM, and burn-in mode indicating signal/power on detection signal BI/POR.

When activation control signal ACT is rendered active, active internal voltage down converters 242 and 244 adjust the levels of internal power supply voltages VCIa and VCIb on internal power supply lines 245a and 245b independently of each other. When internal power supply lines 245a and 245b are formed of different interconnections, the voltage variation level of internal power supply voltages VCIa and VCIb may differ from each other. Therefore, internal power supply voltages VCIa and VCIb can be maintained at a predetermined voltage level by accurately absorbing to change during operation of internal power supply voltages VCIa and VCIb.

In a standby state, active internal voltage down converters 242 and 244 are rendered inactive. Here, adjustment of the voltage level of internal power supply voltages VCIa and VCIb is carried out by constant internal voltage down converter 247. In a standby state, the internal circuit connected to internal power supply lines 245a and 245b attain a standby state, so that the power is only consumed by the leakage current. The variation in internal power supply voltages VCIa and VCIb is so small that even constant internal voltage down converter 247 having a small current driving capability can properly maintain internal power supply voltages VCIa and VCIb at a predetermined voltage level.

According to the structure shown in FIG. 71, constant internal voltage down converter 247 is commonly used by active internal voltage down circuits 242 and 244 (commonly used by internal power supply lines 245a and 245b). Therefore, the occupying area of constant internal voltage down converters 247 can be reduced, resulting in reduction in the consumed current thereof. Thus, an array internal voltage down converter can be realized that is reduced in the occupying area and consuming current.

Modification 2

Figure 72:
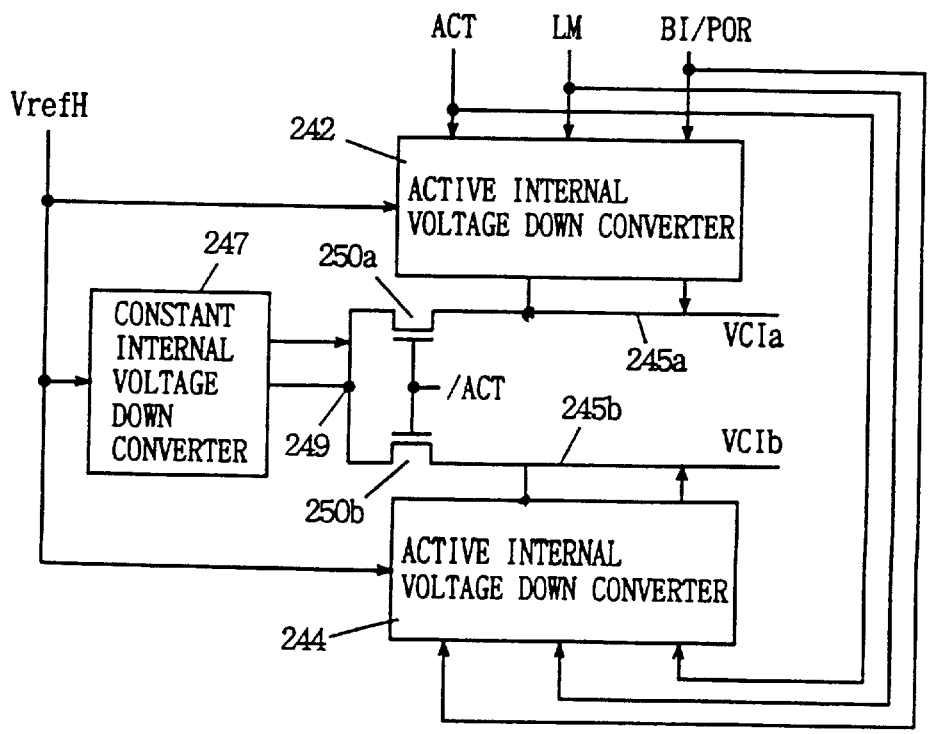

FIG. 72 shows a structure of a second modification of an internal power supply voltage generation circuit according to the present invention. According to the structure shown in FIG. 72, internal power supply lines 245a and 245b are disconnected from constant internal voltage down converter 247 by means of switching elements 250a and 250b formed of, for example, an n channel MOS transistor rendered conductive in response to an activation control signal/ACT. More specifically, when switching elements 250a and 250b are rendered active (when signal /ACT attains an L level of an active state), internal power supply lines 245a and 245b are disconnected from constant internal voltage down converter 247. Internal power supply voltages VCIa and VCIb on internal power supply lines 245a and 245b, respectively, have the voltage level adjusted by active internal voltage down converters 242 and 244, respectively. Constant internal voltage down converter 247 compares reference voltage VrefH with the voltage on node 249 to maintain the voltage level of the power supply voltage on node 249 at the level of reference voltage VrefH according to the comparison result.

When activation control signal /ACT attains an H level, switching elements 255a and 255b are turned on, whereby internal power supply lines VCIa and VCIb are connected to node 249. Activation control signal ACT attains an inactive state of an L level, whereby active internal voltage down converters 242 and 244 are rendered inactive and the power supply voltage adjustment operation thereof is inhibited. In this state, i.e. in a standby state, constant internal voltage down converter 247 adjusts the voltage level of internal power supply voltages VCIa and VCIb on internal power supply lines 245a and 245b via node 249, respectively, at the level of a constant reference voltage VrefH.

According to the structure shown in FIG. 72, constant internal voltage down converter 247 is shared by two active internal voltage down converters 242 and 244. Therefore, the occupying area and power consumption of the internal voltage down converter can be reduced. Furthermore, node 249 is disconnected from internal power supply lines 245a and 245b. Therefore, variation in the voltage level of node 249 can be made substantially zero, and the consumed current in constant internal voltage down converter 247 can be substantially be made zero (since a current supply operation from external power supply node 1 to node 249 is substantially not carried out). It is to be noted that operating current flows in the comparison circuit.

A structure may be used where only one of switching elements 250a and 250b of FIG. 72 is employed. More specifically, constant internal voltage down converter 247 is connected to one of constant internal power supply lines 245a and 245b wherein internal power supply lines 245a and 245b are connected to node 249 only at the standby mode.

According to the structure of modifications 1 and 2, a constant internal voltage down converter can be shared by two active internal voltage down converters. Thus, an internal voltage down converter of low power consumption and small occupying area can be realized.

When an array internal voltage down circuit and a peripheral internal voltage down circuit are shared, high frequency response and direct current response (the characteristics coping with the gentle change during an array charging operation) both must be realized. In this case, the circuit configuration shown in FIG. 59 may be employed. When the circuit configuration shown in FIG. 59 is employed, the occupying area of the internal voltage down circuit can further be reduced by employing the structure shown in FIGS. 71 and 72.

In this case, the active internal voltage down circuit is used for both the array and the periphery, so that no division thereof is provided.

The present invention is not limited to a semiconductor memory device as shown in the eleventh embodiment, and the present invention is applicable to any semiconductor device that has a structure where the voltage level of a predetermined internal node is maintained at a constant level according to an output signal of a comparison circuit.

Embodiment 12

Figure 73:
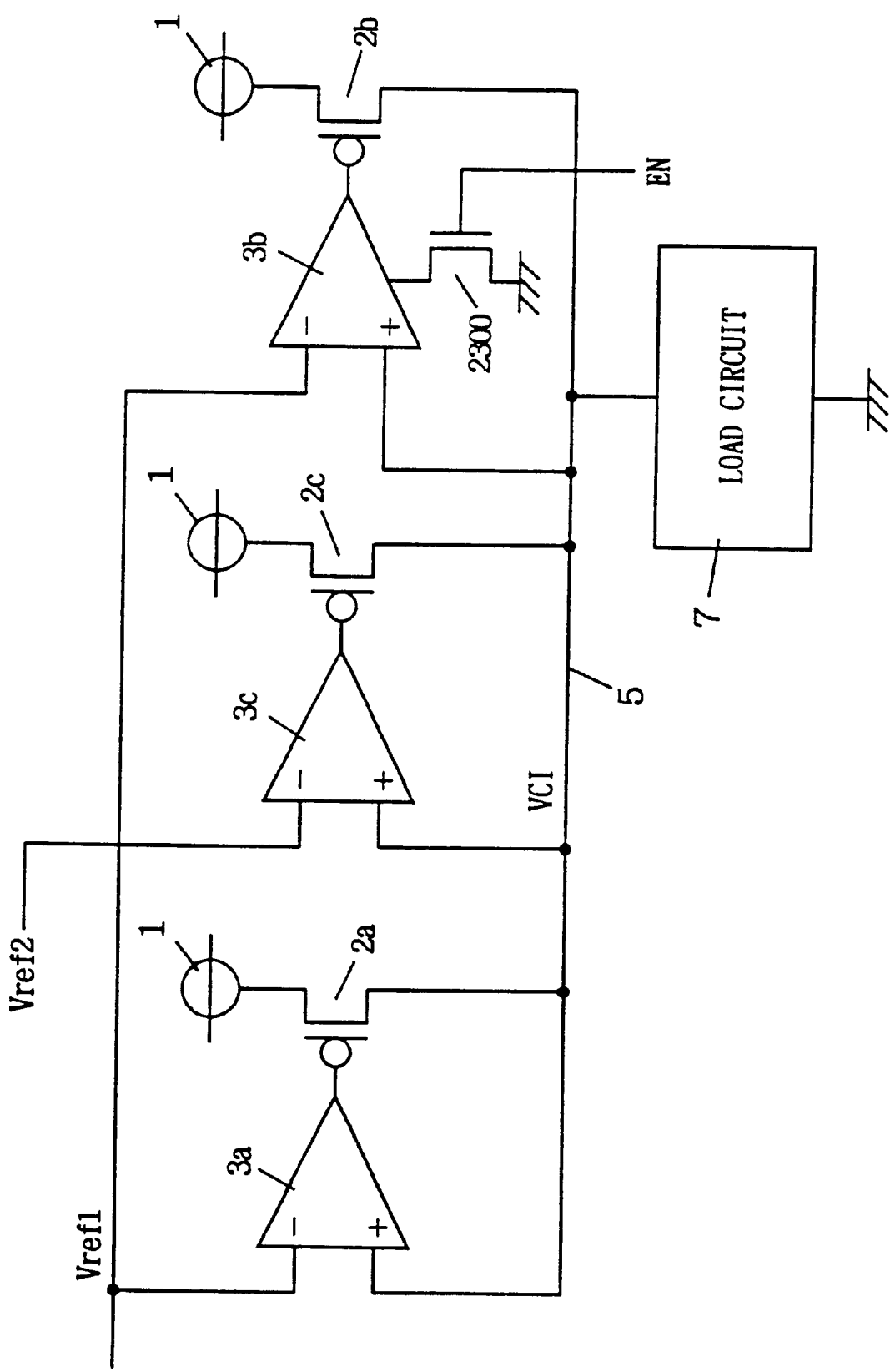
FIG. 73 shows a structure of the main portion of a semiconductor device according to a twelfth embodiment of the present invention.
Figure 74:
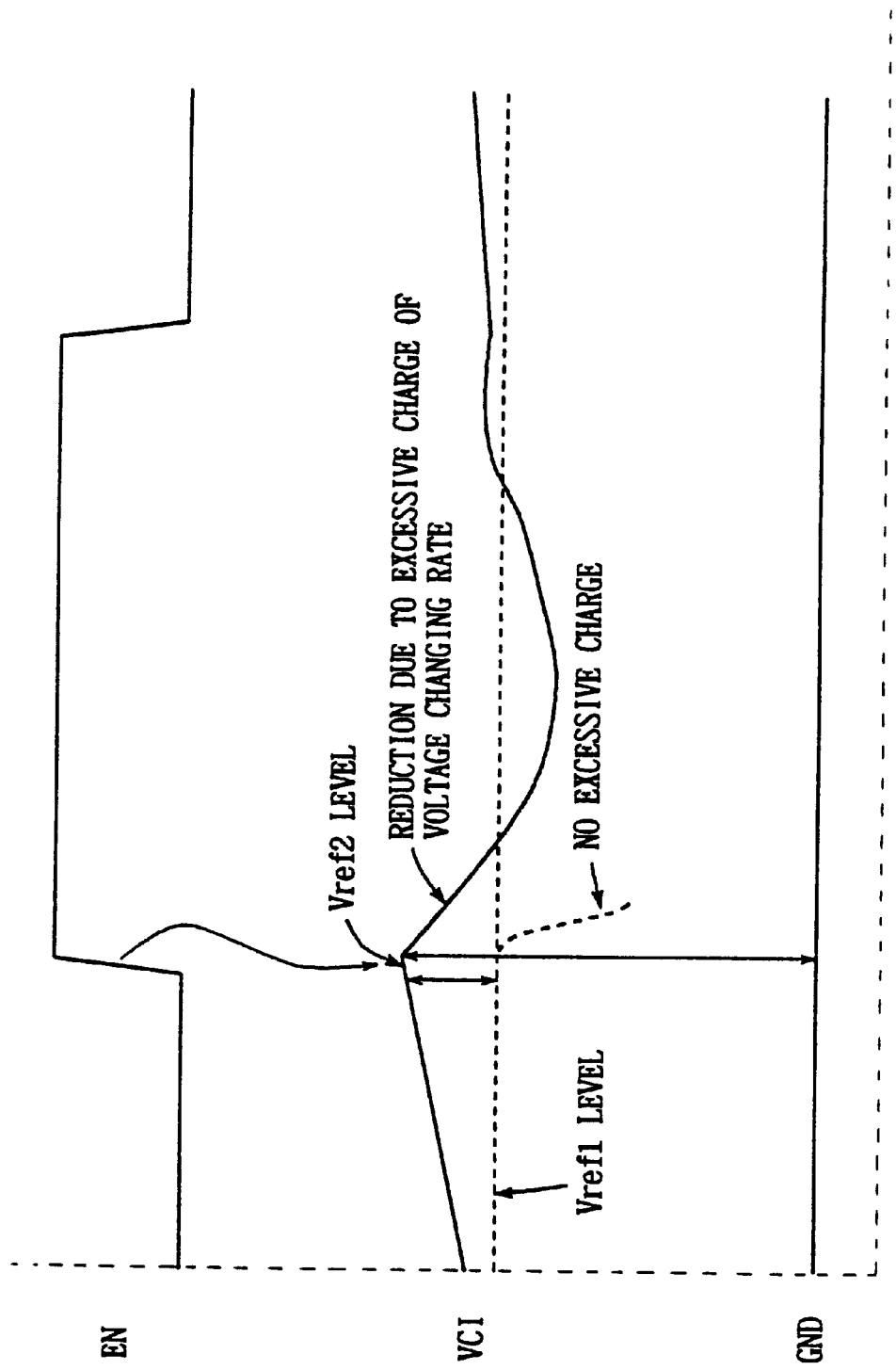
FIG. 74 is a signal waveform diagram showing an operation of the semiconductor device of FIG. 73.

FIG. 73 shows a structure of the main portion of a semiconductor device according to a twelfth embodiment of the present invention. Three internal voltage generation circuits are provided in FIG. 73. Referring to FIG. 73, a first internal voltage generation circuit includes a comparator 3a formed of a differential amplifier for comparing an internal power supply voltage VCI on internal power supply line 5 and a first reference voltage Vref1, and a drive element 2a connected between a node 1 to which an external power supply voltage is supplied (referred to as "voltage source node" hereinafter) and an internal power supply line 5 as a variable conductance element having the conductance varied according to an output signal of comparator 3a for adjusting the amount of a current flowing between voltage source node 1 and internal power supply line 5.

A second internal voltage generation circuit includes a comparator 3b activated in response to an operation timing signal EN for comparing internal power supply voltage VCI on internal power supply line 5 and reference voltage Vref1 when activated, and a drive element 2b connected between voltage source node 1 and internal power supply line 5 for adjusting the amount of current flowing between voltage source node 1 and internal power supply line 5 according to an output signal of comparator 3b.

A third internal voltage generation circuit includes a comparator 3c for comparing a second reference voltage Vref2 higher than the first reference voltage Vref1 with internal power supply voltage VCI on internal power supply line 5, and a drive element 2c for adjusting the amount of current flowing between voltage source node 1 and internal power supply line 5 according to an output signal of comparator 3c. Voltage source node 1 to which drive elements 2a–2c are connected do not have to be a common node, and may be separate nodes as long as external power supply voltage can be transmitted.

The current supply capability of drive element 2a and the driving capability (response rate) of comparator 3a are set to relatively low values. This is to reduce the current consumption of comparator 3a since it operates constantly. A transistor 2300 conducts to form a current path in response to an operation timing signal EN that determines the operation time period of load circuit 7, whereby comparator 3b is activated. Comparator 3b has its response rate set to a relatively great value to compensate for variation in the power supply voltage on internal power supply line 5 according to an operation of load circuit 7. The current supply capability of drive element 2b is also set to a relatively high value. The current driving capability of drive element 2c and the response rate of comparison circuit 3c are both set to a low value in order to reduce current consumption. The operation of the internal power supply voltage generation circuit of FIG. 73 will be described hereinafter with reference to a waveform diagram of FIG. 75.

When operation timing signal EN attains a low level of an inactive state, comparison circuit 3b attains an inactive state (current source transistor 2300 is OFF), and drive element 2b substantially maintains an OFF state. Load circuit 7 does not operate and the semiconductor device is at a standby state when operation timing signal EN is inactive. Here, comparison circuits 3a and 3c operate, and a charging operation to internal power supply line 5 is carried out via drive elements 2a and 2c, respectively. Reference voltage Vref2 has a level higher than that of reference voltage Vref1. Therefore, at this state, internal power supply voltage VCI on internal power supply line 5 is set to the voltage level of second reference voltage Vref2. The charging voltage on internal power supply line 5 is accumulated as excessive charge in the parasitic capacitance (not shown) related to internal power supply line 5.

When operation timing signal EN is rendered active to a logical high level, comparison circuit 3b is activated to carry out a comparison operation. Prior to an operation of load circuit 7, power supply voltage VCI on internal power supply line 5 is set to the level of second reference voltage Vref2. Then, load circuit 7 operates to consume the voltage (current) on internal power supply line 5, whereby power supply voltage VCI on internal power supply line 5 is reduced in level. Here, power supply voltage VCI on internal power supply line 5 is lowered from the level of second reference voltage Vref2 since current is supplied to load circuit 7 from the excessive charge stored in the parasitic capacitance of internal power supply line 5. Therefore, power supply voltage VCI on internal power supply line 5 can be prevented from being lowered than first reference voltage Vref1. Comparison circuit 3b rapidly follows the response of reduction of power supply voltage VCI on internal power supply line 5 to restore power supply voltage VCI to the level of first reference voltage Vref1 via drive element 2b. Comparison circuit 3c is used only for the purpose of accumulating excessive charge on internal power supply line 5 during a standby state. High speed response is not required in the operation of load circuit 7. High speed response is required only for comparison circuit 3b.

Comparison circuit 3a and 3c operate constantly. Comparison circuit 3c and drive element 2c only boosts the voltage on internal power supply line 5 that is charged by comparison circuit 3a and drive element 2a. Therefore, the charging operation up to the level of first reference voltage Vref1 is carried out by two comparison circuits 3a and 3c (and drive elements 2a and 2c), and the charging operation up to the level of second reference voltage Vref2 is carried out by comparison circuit 3c and drive element 2c. Therefore, the current driving capability of this elements can be sufficiently lowered to a low level.

It is to be noted that comparison circuit 3a and drive element 2a may be omitted. The occupying area of the circuit as well as current consumption can be reduced if the number of elements can be lessened. (This is because operating current flows constantly in comparison circuit 3 even when drive element 2a is substantially turned off, and the operating current can be reduced.) Thus, the twelfth embodiment has a structure in which the voltage on an internal power supply line is charged to a higher level prior to operation of a load circuit, and excessive charge is stored in the internal power supply line. Therefore, the voltage on the internal power supply line can be prevented from becoming lower than a predetermined level during the operation of the load circuit. Thus, internal power supply voltage can be supplied stably.

Embodiment 13

Figure 75:
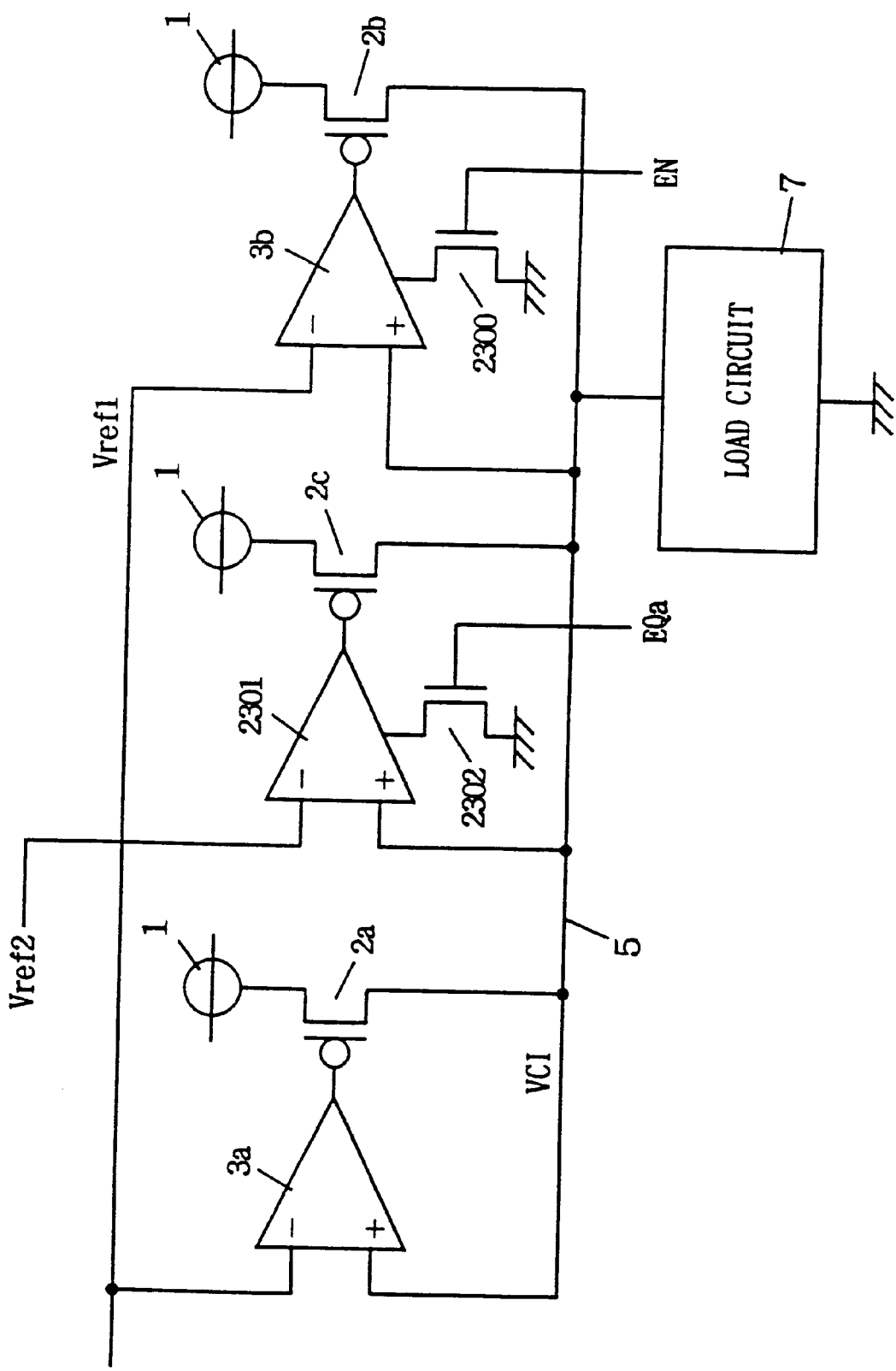
FIG. 75 schematically shows a structure of the main portion of a semiconductor device according to a thirteenth embodiment of the present invention.

FIG. 75 shows a structure of the main portion of a semiconductor device according to a thirteenth embodiment of the present invention. Referring to FIG. 75, a comparator 2301 for charging voltage VCI on internal power supply line 5 to the level of second reference voltage Vref2 is activated by an activation transistor 2302 that conducts in response to an activation signal EQa. The remaining structure is similar to that of FIG. 73, and corresponding components have the same reference characters denoted. The details thereof will not be repeated. Activation signal EQa attains an active state for a predetermined time period (logical high in the drawing) when operation timing signal EN is inactive. Current consumption is reduced by shortening the operation time period (activation period) of comparator 2301 for boosting the voltage on internal power supply line 5 to the level of second reference voltage Vref2. The operation of the structure of FIG. 75 will now be described with reference to the waveform diagram of FIG. 75.

When operation timing signal EN is inactive, activation transistor 2300 is non-conductive, and comparator 3b is rendered inactive. Activation signal EQa attains an active state of logical high for a predetermined time period during the inactivate period of operation timing signal EN. Activation transistor 2302 conducts, and a path through which the operating current flows is formed in comparator 2301. Therefore, comparator 2301 operates to boost voltage VCI on internal power supply line 5 to the level of second reference voltage Vref2. Similar to the previous embodiment 12, the charge voltage on internal power supply line 5 is charged in the parasitic capacitance of internal power supply line 5. When activation signal EQa is rendered to an inactive state of logical low, comparator 2301 is rendered inactive, and the charging operation on internal power supply line 5 via drive element 2c is suppressed.

Then, operation timing signal EN is rendered active, and comparator 3b attains an active state by activation transistor 2300 to adjust the voltage level on internal power supply line 5. Load circuit 7 operates at a predetermined timing according to operation timing signal EN, whereby voltage VCI on internal power supply line 5 is consumed. Here, voltage VCI on internal power supply line 5 is prevented from being lowered significantly even in the case where a great amount of current is consumed during the operation of load circuit 7 since load circuit 7 is supplied with current by the excessive charge in a not shown parasitic capacitance related to internal power supply line 5. More specifically, the dropping rate of the voltage on internal power supply line 5 is slowed by the excessive charge stored in internal power supply line 5, which and the relaxed drop rate is followed by comparator 3b which in turn supplies a current flow via drive element 2b. Even in the case where the response rate is not so high in order to reduce current consumption in comparator 3b, internal power supply voltage VCI can be supplied stably following the voltage change on internal power supply line 5 by comparison circuit 3b as a result of reducing the voltage changing rate on internal power supply line 5 by the excessive charge.

Operation timing signal EN may be, for example, a chip enable signal or an internal row address strobe signal RAS in a semiconductor memory device. Activation signal EQa responds to an inactive operation timing signal EN to attain an active state for a predetermined time period.

Modification

Figure 77:
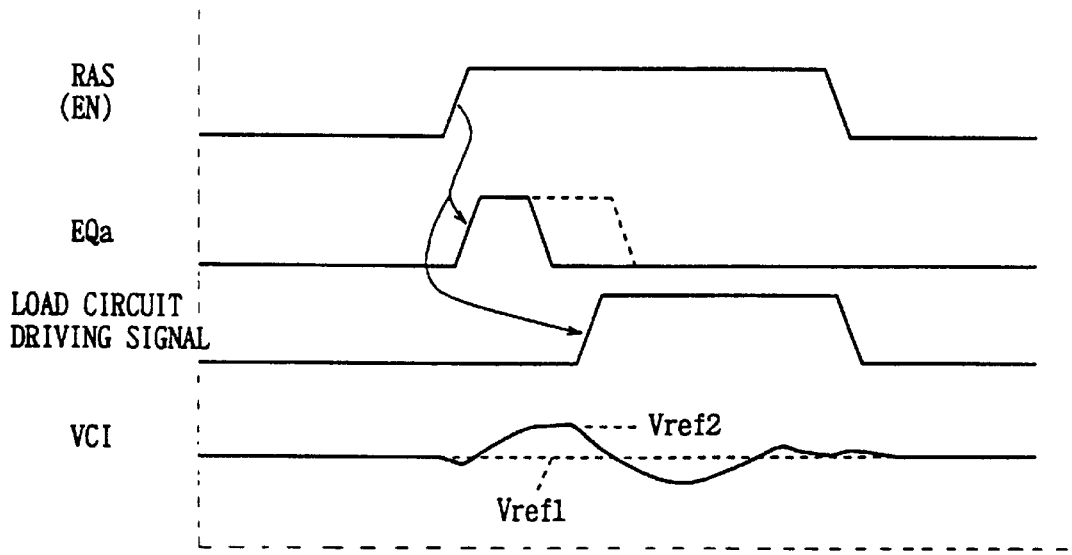
FIG. 77 shows a modification of an operation of the semiconductor device of FIG. 75.

FIG. 77 is an operation waveform diagram showing a modification of the circuit of FIG. 75 of the thirteenth embodiment. The waveform diagram of FIG. 77 shows the case where the semiconductor device is a semiconductor memory device. Referring to FIG. 77, a row address strobe signal RAS is used as operation timing signal EN. When row address strobe signal RAS attains a logic low level of an inactive state, the semiconductor device attains a standby state, and the internal circuitry does not operate. Here, only comparator 3a shown in FIG. 75 operates, and power supply voltage VCI on internal power supply line 5 maintains the level of first reference voltage Vref1.

The semiconductor device attains an operation state when row address strobe signal RAS is active. In response, comparator 3b is activated, and internal circuitry (load circuit and other circuits not shown) operates, so that power supply voltage VCI on internal power supply line 5 changes in level. However, since current consumption by the internal circuitry is low due to a small change in current in this case, the former level of the power supply voltage can be recovered following the change of power supply voltage VCI sufficiently even when there is a delay in the response of comparator 3b.

In response to activation of internal row address strobe signal RAS, control signal EQa is activated for a predetermined time period. This causes comparator 2301 to be rendered active, whereby power supply voltage VCI on internal power supply line 5 is charged to the level of second reference voltage Vref2 via drive element 2c.

At the elapse of the activation period of operation timing signal EQa, the load circuit driving signal is activated. In response, load circuit 7 operates to consume a great amount of current. This load circuit driving signal corresponds to, for example, a sense amplifier driving signal in a semiconductor memory device. In this case, load circuit 7 is a sense amplifier to charge/discharge a bit line. In this case, there is a significant change in current on internal power supply line 5. However, since the voltage on internal power supply line 5 is boosted to the level of second reference voltage Vref2 already by comparator 2301, this current change can be equivalently set to a small current change. The level of power supply voltage VCI on internal power supply line 5 can be restored to the level of a predetermined voltage following the small change by comparator 3b of slow response.

Therefore, activation control signal EQa should be preset to an active state only when there is a possibility that an operation of load circuit 7 operates would cause a significant change in current. Generally in a semiconductor memory device, such a great current consumption can be predicted as in the case of a sense amplifier operation. This operation control signal EQa can be activated only for a required predetermined time period according to an operation timing signal EN.

In FIG. 77, operation control signal EQa may have a timing where it is still activated even when a load circuit driving signal is activated as shown in the broken line.

According to the structure of the thirteenth embodiment, the current consumption can further be reduced in addition to the effect of the twelfth embodiment since a comparator is activated for only a predetermined period that charges the voltage on internal power supply line 5 to the level of second reference voltage Vref2.

Embodiment 14

Figure 78:
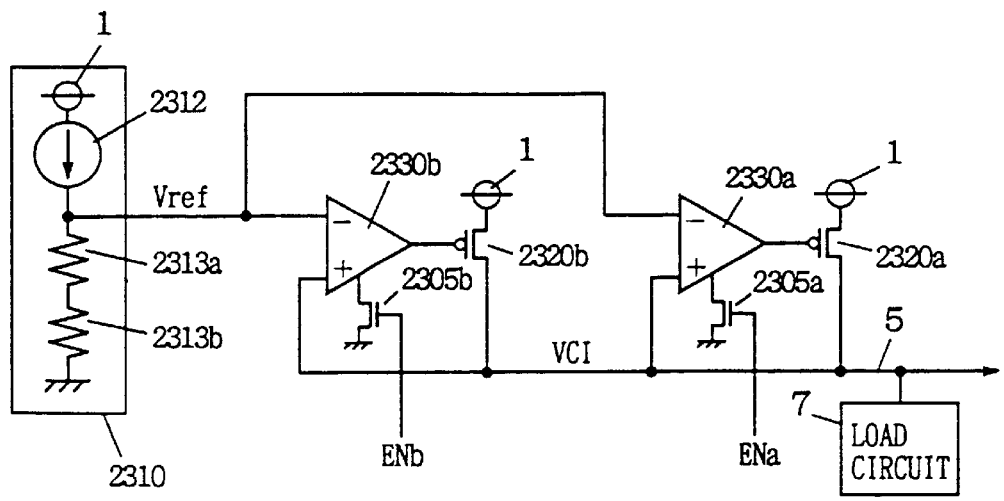
FIG. 78 shows a modification of the thirteenth embodiment of the present invention.

FIG. 78 shows the main portion of a semiconductor device according to a fourteenth embodiment of the present invention.

Referring to FIG. 78, the semiconductor device includes a comparator 2330a for comparing reference voltage Vref from a reference voltage generation circuit 2310 with power supply voltage VCI on internal power supply line 5, a drive element 2320a for adjusting the amount of current flowing between voltage source node 1 and internal power supply line 5 according to an output signal of comparator 2330a, a comparator 2330b for comparing reference voltage Vref from reference voltage generation circuit 2310 with VCI on internal power supply line 5, and a drive element 2320b for adjusting the amount of current flowing from voltage source node 1 to internal power supply line 5 according to an output signal of comparator 2330b. Comparator 2330a attains an active state when receiving an operating current supplied from an activation transistor 2305a that conducts in response to an operation timing signal ENa that attains an active state when the semiconductor device (load circuit 7) is active. Comparator 2330b attains an active state when receiving an operating current from an active control transistor 305b that conducts in response to an operation control signal ENb that is rendered active only when load circuit 7 is active (i.e., operating) during a general operation mode excluding particular operation modes.

Reference voltage generation circuit 2310 includes, for example, a constant current source 2312 connected to a voltage source node and supplying a constant reference current, and resistance elements 2313a and 2313b connected in series between constant current source 2312 and a ground node (the other voltage source node). Reference voltage Vref is determined by the resistance of resistance elements 2313*a* and 2313*b* and a constant current from constant current source 2312. The operation of internal power supply voltage generation circuit shown in FIG. 78 will be described. It is assumed that the semiconductor device is a semiconductor memory device in the following description.

When an external access is made to the semiconductor device, internal circuitry (load circuit 7) is required of high speed operation to realize a high speed access. In this case, active control signals EQa and EQb are both rendered active, whereby comparators 2330*a* and 2330*b* both attain an active state according to the operation timing of load circuit 7. Under the control of the two comparators 2330*a* and 2330*b*, current is supplied on internal power supply line 5 by drive elements 2320*a* and 2320*b* to suppress change in power supply voltage VCI during operation of load circuit 7 (internal circuitry). Since current is supplied to internal power supply line 5 by two drive elements 2320*a* and 2320*b*, a sudden change of the voltage on internal power supply line 5 during operation of load circuit 7 can be compensated for at high speed following that change adequately. Therefore, power supply voltage VCI can be restored to the level of a predetermined reference voltage Vref.

In a particular operation mode such as a refresh cycle or a data holding mode, active control signal ENb is continuously set to an inactive state to inhibit the comparison operation of comparator 2330*b*. only active control signal ENa is rendered active according to the operation timing of load circuit 7. In this case, internal power supply line 5 is supplied with current only via one drive element 2320*a*. Therefore, the return of voltage VCI on internal power supply line 5 to the level of voltage VCI is delayed than that in a normal operation cycle. However, external access is not carried out in the refresh cycle or the data holding mode so that a high speed access is not required. This means that there is no particular problem even if the operation start timing of load circuit 7 is carried out after power supply voltage VCI on internal power supply line 5 is stable. Current consumption can be reduced by driving only one comparator in a refresh cycle or data holding mode.

Figure 79:
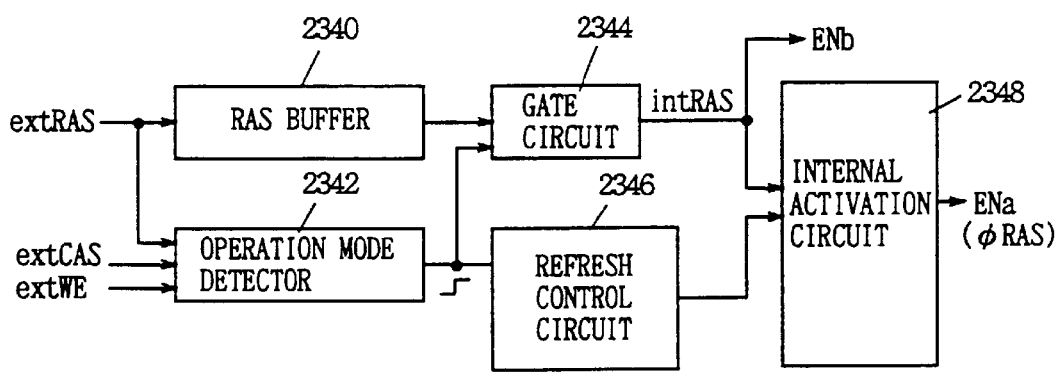
FIG. 79 schematically shows a circuit structure for generating an operation timing signal shown in FIG. 78.

FIG. 79 schematically shows an example of a circuit structure for generating active control signals ENa and ENb of FIG. 78. Referring to FIG. 79, a control signal generation system includes an RAS buffer 2340 for receiving an externally applied row address strobe signal extRAS for providing an internal row address strobe signal, an operation mode detector 2342 for receiving an internal row address strobe signal extRAS, an external column address strobe signal extCAS, and an external write enable signal extWE for detecting whether a particular operation mode of a refresh mode or a sleep mode (data holding mode) is specified or not, a gate circuit 2344 for providing an internal row address strobe signal intRAS according to output signals of operation mode detector 2342 and RAS buffer 2340, a refresh control signal 2346 for carrying out operation required for data refresh at a predetermined timing according to an output signal from operation mode detector 2342, and an internal activation circuit 2348 responsive to internal row address strobe signal intRAS from gate circuit 2344 and an activation signal output from refresh control circuit 2346 for activating an internal row system circuit (circuitry related to a row select operation: a row address decoder, a sense amplifier, and precharge/equalize circuit, etc.) for providing an internal activation signal ENa (ERAS).

Operation mode detector 2342 detects that a refresh cycle is specified when, for example, external column address strobe signal extCAS and external write enable signal extWE are activated (low level) prior to activation (fall) of external row address strobe signal extRAS. Operation mode detector 2342 may also have a structure where detection of designation of a particular operation mode is made using additionally a particular address key. The operation mode detected by operation mode detector 2342 is a refresh cycle in which an external access is not carried out or a data holding mode in which only data is maintained.

Gate circuit 2344 inhibits transmission of an output signal of RAS buffer 2340 when operation mode detector 2342 detects designation of a particular operation mode. Gate circuit 2344 transmits an output signal of RAS buffer 2340 in normal operation mode other than the above-described particular operation modes. Gate circuit 2344 can be implemented using a 2-input gate circuit according to the logic level of the active states of the output signals of RAS buffer 2340 and operation mode detector 2342 and the logic level of internal row address strobe signal intRAS attaining an active state.

Refresh control circuit 2346 generates a control signal for carrying out a refresh operation at a predetermined timing when a particular operation mode is specified by operation mode detector 2342. Refresh control circuit 2346 provides a row system circuit activation signal at a predetermined timing with respect to internal row address strobe signal intRAS. In a self refresh cycle and a data holding mode, this internal row system circuit activation signal is activated at a predetermined interval.

Internal activation circuit 2348 renders its activation control signal ENa active when one of the signals from gate circuit 2344 and refresh control circuit 2346 attains an active state. Internal activation circuit 2348 can be implemented by a 2-input gate circuit according to a logic level of an active internal row address strobe signal intRAS and an active row system circuit control signal provided from refresh control circuit 2346. Internal address strobe signal intRAS from gate circuit 2344 is used as an active control signal ENb.

Internal activation control signal φRAS from internal activation circuit 2348 is used as activation control signal ENa. In a normal operation mode, active control signals ENa and ENb are both rendered active according to an internal row address strobe signal intRAS from gate circuit 2344 and comparator 2330*a* and 2330*b* shown in FIG. 78 are actuated. In a refresh cycle or a data holding mode, active control signal ENa is rendered active according to the internal row system circuit activation control signal from refresh control circuit 2346. Active control signal ENb is fixed to an inactive state by gate circuit 2344. In this case, only comparator 2330*a* is activated.

It is to be noted that a comparator that operates constantly irrespective of an operation cycle and a standby cycle of load circuit 7 and a drive circuit that transmits current to internal power supply line 5 in response to an output of that constantly operating comparator may be provided in the structure of FIG. 78.

According to the structure of the present fourteenth embodiment, variation of the power supply voltage on internal power supply line 5 is compensated for at high speed according to a great current supply capability with a plurality of comparators rendered active according to great current supply capability when internal circuitry (load circuit) operates in a general operation cycle, and compensates for variation in the power supply voltage on internal power supply line 5 according to one comparator in a particular operation mode such as a refresh cycle or a data holding mode. Therefore, current consumption can be reduced in high speed access and in a particular mode.

Embodiment 15

Figure 80:
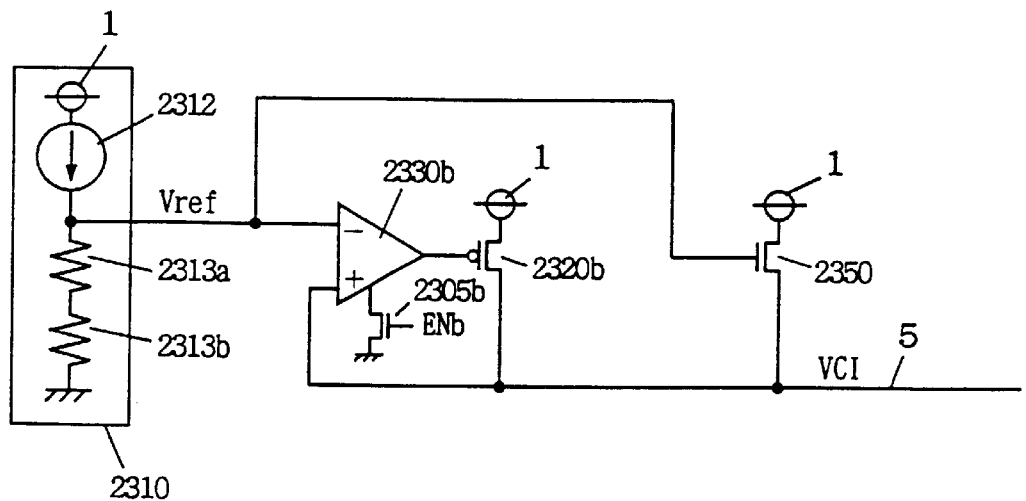
FIG. 80 shows a structure of a semiconductor device according to a fourteenth embodiment of the present invention.

FIG. 80 schematically shows a structure of an internal power supply voltage generation circuit according to a fifteenth embodiment of the present invention. The structure shown in FIG. 80 has an n channel MOS transistor as a current drive element 2350 between voltage source node 1 and internal power supply line 5 for receiving reference voltage Vref from reference voltage generation circuit 2310 at its gate. Current drive element 2350 has a threshold voltage that is 0 V or a very low threshold voltage substantially approximating 0 V.

The internal power supply voltage generation circuit further includes a comparator 2330b rendered active by an active control transistor 2305b attaining a conductive state in response to a control signal ENb that attains an active state according to an operation timing of internal circuitry in a normal operation mode, and a drive element 2320b for supplying current from voltage source node 1 to internal power supply line 5 according to an output signal of comparator 2330b.

Similar to the structure of FIG. 78, reference voltage generation circuit 2310 includes constant current source 2312 and resistance elements 2312a and 2313b. According to the structure of the internal voltage generation circuit shown in FIG. 80, current drive element 2350 conducts constantly, and current is supplied from voltage source node 1 to internal power supply line 5 according to reference voltage Vref supplied to the gate electrode of drive element 2350. The threshold voltage of current drive element 2350 is substantially 0 V, and power supply voltage VCI on internal power supply line 5 is fixed to the level of reference voltage Vref when comparator 2330b is inactive.

During a normal operation, active control signal ENb is rendered active according to the operation timing of internal circuitry (not shown in FIG. 80), whereby comparator 2330b operates. Power supply voltage VCI on internal power supply line 5 is adjusted to the level of reference voltage Vref via drive element 2320b. Active control signal ENb is rendered active when an external access is carried out in a normal cycle requiring high speed access. More specifically, the operation of both power supply drive element 2350 and drive element 2320b causes increase in the amount of current supplied to internal power supply line 5, so that internal power supply voltage VCI can be adjusted to the level of a predetermined voltage Vref at high speed following the change of power supply voltage on internal power supply line 5. When external access is not carried out, only current drive element 2350 supplies current on internal power supply line 5, so that current consumption is reduced.

Modification

Figure 81:
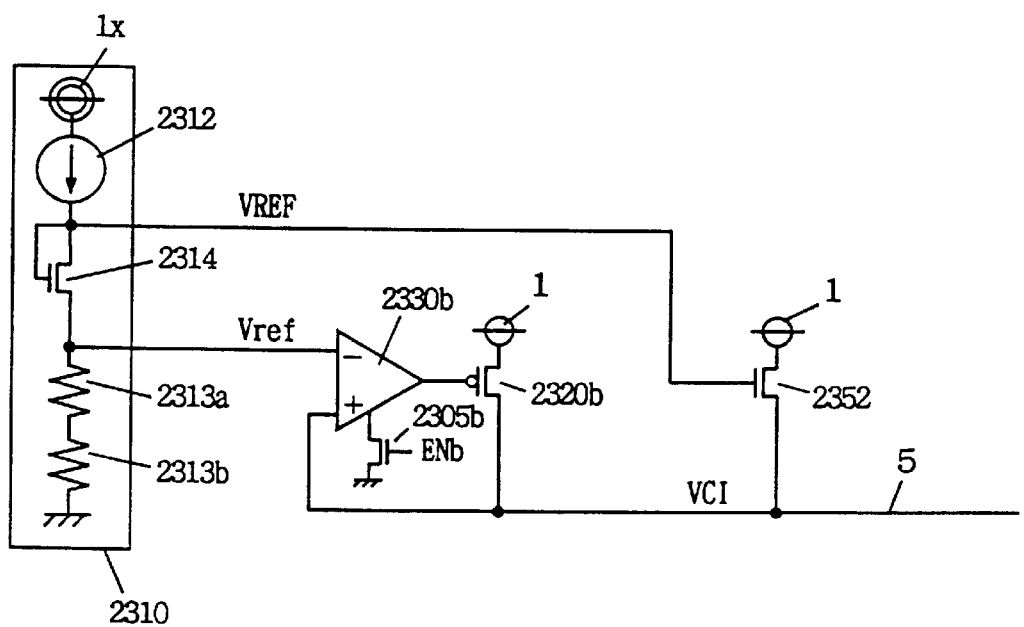
FIG. 81 shows a modification of the fourteenth embodiment of the present invention.

FIG. 81 shows a modification of the internal power supply voltage generation circuit according to the fifteenth embodiment of the present invention. Referring to FIG. 81, a reference voltage generation circuit 2310 includes a diode-connected n channel MOS transistor 2314 between a constant current source 2312 and a resistance element 2313a. MOS transistor 2314 has a channel resistance sufficiently lower than the resistances of resistance elements 2313a and 2313b, and also has a great current driving capability. All the current from constant current source 2312 is supplied to resistance elements 2313a and 2313b. Here, MOS transistor 2314 operates in a diode mode, whereby the threshold voltage Vth between the gate and the drain and source drops. More specifically, reference voltage generation circuit 2310 generates two reference voltages VREF and Vref. Reference voltage VREF=Vref+Vth. Current drive circuit 2352 formed of an n channel MOS transistor connected between voltage source node 1 and internal power supply line 5 receives reference 5 voltage VREF at its gate.

Comparator 2330b and drive element 2320b have a structure similar to those shown in FIG. 80 to receive reference voltage Vref. When current drive element 2352 has a threshold voltage Vth identical to that of transistor 2314 in reference voltage generation circuit 2310, current drive element 2352 operates in a source follower, and power supply voltage VCI on internal power supply line 5 maintains the level of reference voltage VREF. When internal power supply voltage VCI on internal power supply line 5 is reduced in level, the gate-source voltage of current drive element 2352 increases, whereby the drain current flowing through current drive element 2352 increases. When the level of power supply voltage VCI on internal power supply line 5 is boosted, the gate-source voltage of current drive element 2352 is reduced. As a result, the drain current supplied by current drive element 2352 is reduced. Thus, similar to a voltage generation circuit using a comparator, a current corresponding to the level of power supply voltage VCI on internal power supply line 5 is supplied to adjust the voltage level of power supply voltage VCI. More specifically, current drive element 2352 functions to clamp power supply voltage VCI on internal power supply line 5 to the level of reference voltage VREF−Vth.

According to the structure of FIG. 81, reference voltage generation circuit 2310 uses an MOS transistor 2314 for shifting threshold voltage Vth. It is therefore not necessary to use an n channel MOS transistor that has a threshold voltage of 0 V or a low voltage approximating 0 V as current drive element 2352. The manufacturing process can be simplified since an additional manufacturing step for adjusting the threshold voltage is not required.

Reference voltage generation circuit 2310 is supplied with current from voltage source node 1x. When the difference between the power supply voltage applied to voltage source node 1x and reference voltage Vref is small in such a case, there is a possibility that no current flows to constant current source 2312 and MOS transistor 14 is not turned on. In order to guarantee the operation of reference voltage generation circuit 2310, a boosted voltage higher than the voltage level applied to voltage source node 1 is supplied to voltage source node 1x. When the semiconductor device is a semiconductor memory device, an internal circuit for generating a boosting voltage for driving a word line is provided. A structure can be used where this boosting voltage is applied to voltage source node 1x.

When external access is not made, internal power supply voltage is generated using only a current drive element formed of an n channel MOS transistor, and when external access is made, the comparator is operated only when high speed response is required since the level of the internal power supply voltage is adjusted using the comparator and a drive element. Therefore, current consumption can be reduced and high speed access can be realized.

Embodiment 16

Figure 82:
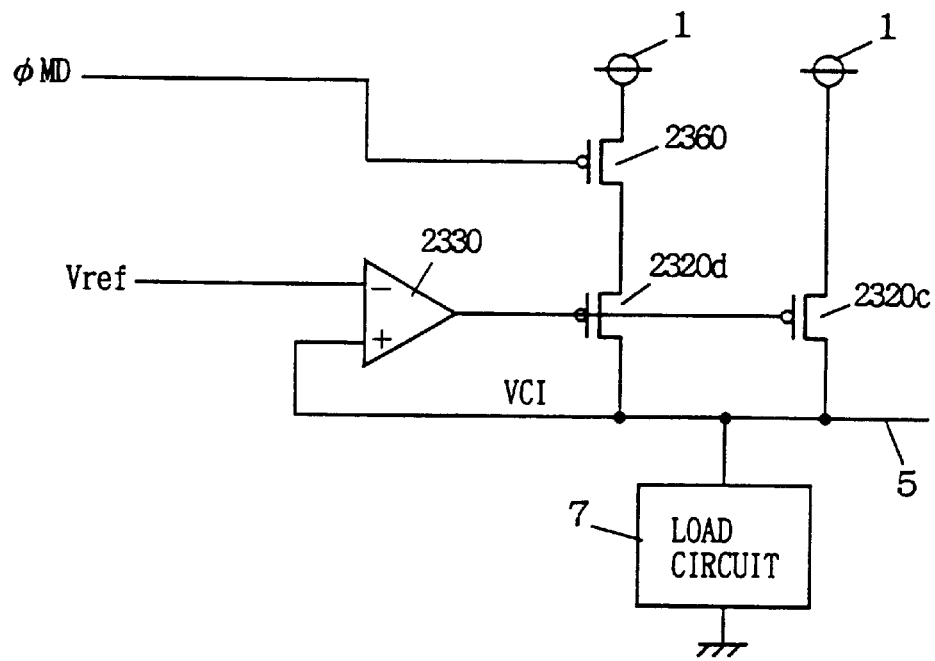
FIG. 82 shows a structure of the main portion of a semiconductor device according to a fifteenth embodiment of the present invention.

FIG. 82 shows a structure of an internal power supply voltage generation circuit according to a sixteenth embodiment of the present invention. Referring to FIG. 82, an internal power supply voltage generation circuit includes a comparator 2330 for comparing power supply voltage VCI on internal power supply line 5 and reference voltage Vref, a drive element 2320c for adjusting the amount of current flowing between voltage source node 1 and internal power supply line 5 according to an output signal of comparator 2330, a drive element 2320d as a variable conductance element having its conductance varied according to an output signal of comparator 2330, and a drive element 2360 connected in series with drive element 2320d and formed of a p channel MOS transistor rendered conductive/nonconductive according to an operation mode specify signal φMD.

Operation mode specify signal φMD is a binary signal, and is set to logical high or logical low according to the operation mode of the semiconductor device. The operation mode is set forth in the following.

(1) In a refresh operation, the number of word lines attaining a selected state is set greater than the number of select word lines in a normal operation.

(2) In a test mode, the number of select word lines is set greater than the number of select word lines in a normal operation for margin testing or for testing multi-bit data.

(3) In a testing operation, the number of selected column select lines (output signal lines of a column decoder transmitting a column select signal for selecting a bit line pair) is set greater than that of a normal operation mode to evaluate the acceptance of multi-bit data at the same time.

In these operation modes, the current consumed by load circuit 7 (or internal circuitry) connected on internal power supply line 5 increases in comparison with that in a normal operation mode, and variation in power supply voltage VCI becomes greater. In order to compensate for this great current consumption, operation mode specify signal φMD is set to a low level, and drive element 2360 is rendered conductive. In this state, internal power supply line 5 has the level of power supply voltage VCI adjusted under the control of comparator 2330 via drive elements 2320c and 2320d. Since two drive elements 2320c and 2320d operate in parallel, a great amount of current can be supplied from voltage source node 1 to internal power supply line 5 to compensate for the reduction in internal power supply voltage VCI at high speed.

The operation mode specified by operation mode specify signal φMD further includes an operation current margin testing that reduces the amount of current that can be supplied to internal power supply line 5 to check the margin of current consumed during an operation by a semiconductor device. In this case, operation mode specify signal φMD is set to logical high, and drive element 2360 is rendered non-conductive. In this case in a normal operation mode, the voltage on internal power supply line 5 is adjusted by two drive elements 2320c and 2320d. In a test mode, current is supplied to internal power supply line 5 only by drive element 2320c. By switching the current supply capability of the internal power supply voltage according to the amount of current consumption of internal circuitry (load circuit), the amount of current that is required for a stable operation mode is supplied to stabilize power supply voltage VCI on internal power supply line 5.

There is a case where the structure of the number of selected word lines in a refresh cycle differs from semiconductor to semiconductor (switch a refresh cycle according to device application). In this case, the required current supply capability can be provided to the internal power supply voltage generation circuit by setting the operation mode specify signal φMD to logical high or logical low according to the refresh cycle, to generate an internal power supply voltage VCI stably.

Figure 83A:
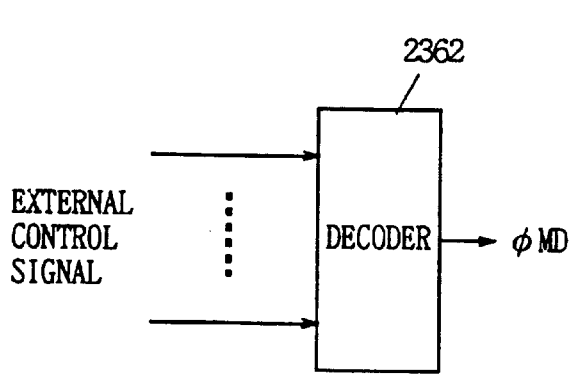
FIGS. 83A and 83B show a structure for generating an operation timing signal shown in FIG. 80.
Figure 83B:
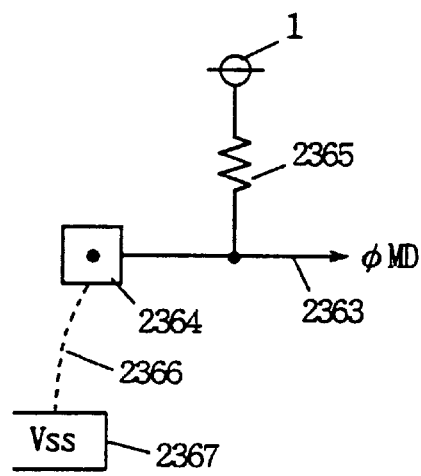

FIGS. 83A and 83B show a circuit structure for generating an operation mode specify signal φMD. In (83A), the operation mode specify signal generation circuit is formed of a decoder 2362 that decodes an externally applied control signal. The usage of decoder 2362 allows a required current supply capability to be provided to the internal power supply voltage generation circuit to accommodate the number of types of operation modes. The usage of decoder 2362 also provides the advantage of realizing both the enhancement and dehancement of the current supply capability of this internal power supply voltage generation circuit.

The operation mode specify signal generation circuit shown in FIG. 83B includes a resistance element 2365 of high resistance connected between a signal line 2363 and voltage source node 1. Signal line 2363 is connected to pad 2364. Pad 2364 is selectively connected to a frame 2367 via a bonding wire 2366. Frame 2367 receives an externally applied ground voltage Vss. When pad 2364 is connected to frame 2367 by bonding wire 2366, operation mode specify signal φMD from signal line 2363 is set to logical low level of ground voltage Vss. Resistance element 2365 has a high resistance, and the consuming current thereof is so low that it can be neglected. When bonding wire 2366 is not connected between pad 2364 and frame 2367, signal line 2363 is set to logical high level of the internal power supply voltage by resistance element 2365.

By providing a structure in which operation mode specify signal φMD is generated according to presence/absence of bonding wire 2366, the current supply capability provided from the internal power supply voltage generation circuit can be programmed appropriately according to the application in which this semiconductor device is used.

Figure 84A:
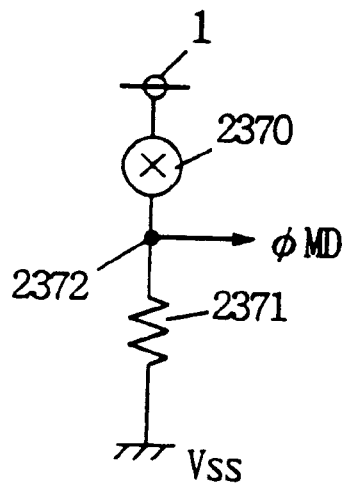
FIGS. 84A and 84B show another structure for generating an operation timing signal of FIG. 80.
Figure 84B:
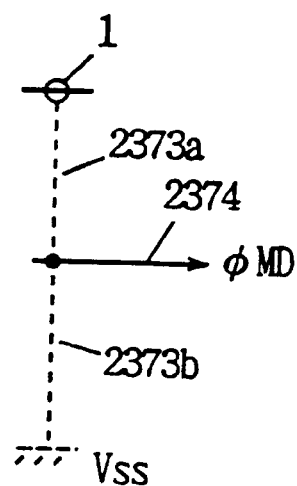

FIGS. 84A and 84B show another structure for generating an operation mode specify signal shown in FIG. 82. Referring to FIG. 84A, a fusible link element 2370 is provided between voltage source node 1 and an output node 2372, and a resistance element 2371 of high resistance is provided between output node 2372 and the ground voltage supply node. Operation mode specify signal φMD is provided from output node 2372. During a conductive period of link element 2370, the voltage level of output node 2372 is that supplied to voltage source 1. When link element 2370 is fused out, the voltage level of output node 2372 is set to the level of ground voltage Vss by resistance element 2371.

Referring to the structure of FIG. 84B, one of wiring 2373a and 2373b is selectively provided between signal line 2374 and voltage source node 1 or ground voltage Vss supply node. By selectively connecting wiring 2373a or 2373b, operation mode specify signal φMD can be set to a desired logic level.

According to the structure of the sixteenth embodiment of the present invention, the current supply capability of an internal power supply voltage generation circuit is switched according to an operation mode. Therefore, the current supply capability of the internal power supply voltage generation circuit can be adjusted according to the amount of current consumed by internal circuitry (load circuit) according to an operation mode.

Thus, internal power supply voltage VCI can be generated stably.

More specifically, the problems of generation of ringing in internal power supply voltage VCI in response to an excessive current supply due to a great current supply capability, and the non-follow-up to variation in internal power supply voltage VCI due to a small current supply capability can be eliminated to provide internal power supply voltage VCI stably.

Embodiment 17

Figure 85:
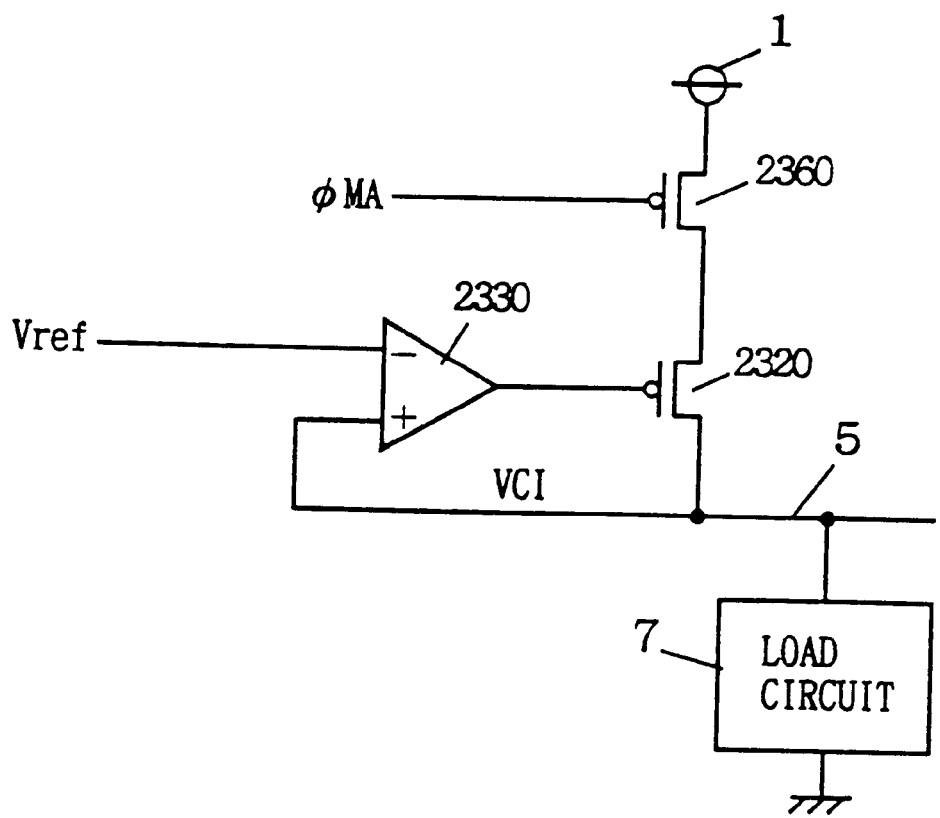
FIG. 85 shows a structure of the main portion of a semiconductor device according to a sixteenth embodiment of the present invention.

FIG. 85 shows a structure of an internal power supply voltage generation circuit according to a seventeenth embodiment of the present invention.

Referring to FIG. 85, an internal power supply voltage generation circuit includes a comparator 2330 for comparing voltage VCI on internal power supply line 5 with reference voltage Vref, a drive element 2320 having its conductance varied according to an output signal of comparator 2330 to change the amount of current supply, and a drive element 2360 connected between drive element 2320 and voltage source node 1 for receiving operation mode specify signal φMA at its gate. Drive element 2360 is formed of a P channel MOS transistor. Operation mode specify signal φMA that is provided to the gate of this P channel MOS transistor has an intermediate potential level between the voltage supplied to voltage source node 1 and ground voltage Vss. Drive element 2360 has its channel resistance varied according to operation mode specify signal φMA of this intermediate potential level. The conductance of drive element 2360 is altered according to an operation mode. A current supply capability according to the operation mode can be provided to the internal power supply voltage generation circuit. Thus, an optimum current supply capability according to current consumption of load circuit 7 can be provided to the internal power supply voltage generation circuit.

The operation mode specified by this operation mode specify signal φMA is similar to that described in the previous embodiment 16. Increase in the voltage level of operation mode specify signal φMA causes reduction in the conductance of drive element 2360, whereby the amount of current flowing therethrough is limited. As a result, the current supply capability of the internal power supply voltage generation circuit is lowered. When the voltage level of operation mode specify signal φMA is reduced, the conductance of drive element 2360 is increased, whereby the amount of current supplied to drive element 2320 increases. As a result, the current supply capability of the internal power supply voltage generation circuit is increased. Drive element 2320 provides current to internal power supply line 5 according to an output signal of comparator 2330 with drive element 2360 functioning as a variable conductance element as a current source to adjust variation of internal power supply voltage VCI.

Figure 86A:
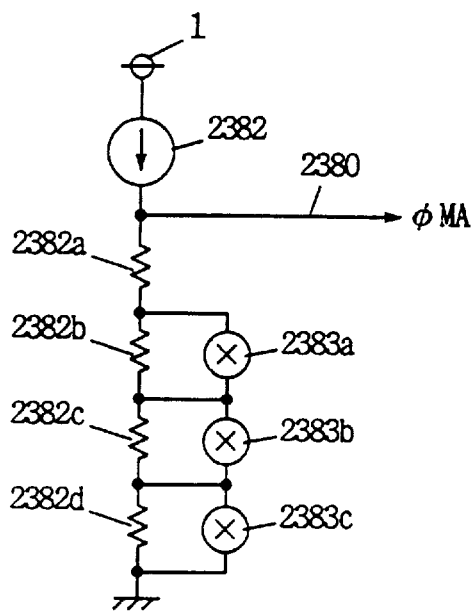
FIGS. 86A–86C show a structure for generating an operation mode specify signal of FIG. 85.
Figure 86B:
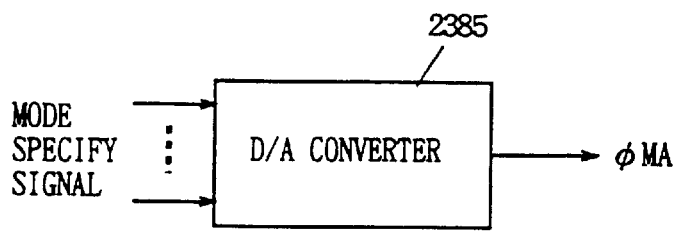
Figure 86C:
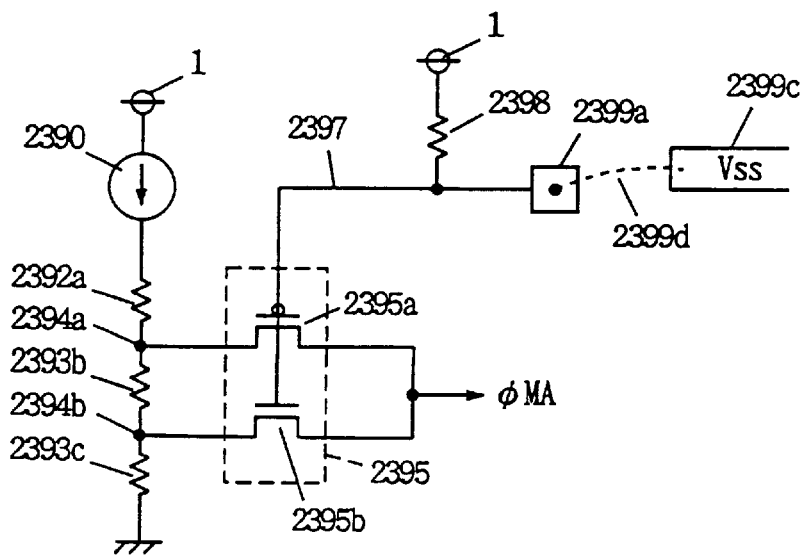

FIGS. 86A–86C show an example of a structure for generating operation mode specify signal φMA shown in FIG. 85.

Referring to FIG. 86A, an operation mode specify signal generation circuit includes a constant current source 2382 connected between voltage supply node 1 and signal line 2380 for supplying a constant current, resistance element 2382a–2382d connected in series between constant current source 2382 and a ground voltage Vss supply node, and fusible link elements 2383a–2383c each connected in parallel to resistance elements 2382b–2382d. The number of resistance elements 2382a–2382d and also the number of link elements 2383a–2383c are arbitrary. When all link elements 2383a–2383c conduct, the voltage level of operation mode specify signal φMA on signal line 2380 is set to a voltage level determined by the current supplied by constant current source 2382 and the resistance of resistance element 2382a. By selectively fusing out link elements 2383a–2383c, the resistance value between signal line 2380 and the ground voltage supply node increases, whereby the voltage level of operation mode specify signal φMA is increased. By selectively blowing out (programming) link elements 2383a–2383c according to an operation mode, the voltage level of operation mode specify signal φMA can be set to a desired intermediate potential level.

In FIG. 86B, a D/A converter 2385 receiving a multi-bit mode specify signal for applying digital-analog conversion thereof is used as an operation mode specify signal generation circuit. By a combination of the bits of the mode specify signal, the voltage level of operation mode specify signal φMA can be set. A structure may be employed as for a mode specify signal in which an operation specifying a voltage level of an operation mode specify signal is set under the condition of WCBR, for example, and the voltage level of this operation mode specify signal φMA is determined by the combination of the bits of currently applied address signal. Alternatively, a structure may be employed in which a mode specify signal is set in a command register that is usually used in a semiconductor memory device as will be described afterwards. At initialization of a semiconductor memory device, the voltage level of operation mode specify signal φMA can easily be set to a desired voltage level.

The operation mode specify signal generation circuit shown in FIG. 86C includes a constant current source 2390 connected to voltage source node 1 for supplying a constant current of a predetermined value from voltage source node 1, resistance elements 2392a–2393c connected in series between constant current source 2390 and the ground voltage supply node, and a selector 2395 for selecting voltage of either node 2394a or node 2394b. according to a select signal applied via signal line 2397. Selector 2395 includes a p channel MOS transistor 2395a for selecting the voltage level on node 2394a between resistance element 2392a and 2393b according to a signal potential on signal line 2397, and an n channel MOS transistor 2395b for selecting the voltage on a node 2394b between resistance elements 2393b and 2393c when the potential on signal line 2397 attains logical high. Operation mode specify signal φMA is provided from selector 2395.

Signal line 2397 is connected to pad 2399a, and also to voltage source node 1 via resistance element 2398 of high resistance. Pad 2399a is selectively connected to a frame 2399c providing ground voltage Vss via a bonding wire 2399d. When bonding wire 2399d is not provided, the potential on signal line 2397 is set to the voltage level on voltage source node 1 by resistance element 2398. In selector 2395, MOS transistor 2395b conducts, and MOS transistor 2395a is rendered non-conductive. Under this state, the voltage on node 2394b is connected to be output as operation mode specify signal φMA. When bonding wire 2399d is connected between pad 2390a and frame 2399c, the voltage level on signal line 2397 attains the level of ground voltage Vss. In this state, MOS transistor 2395a is rendered conductive, and MOS transistor 2395b is rendered nonconductive. Here, the voltage on node 2394a is selected to be provided as operation mode specify signal φMA. An operation mode specify signal φMA can be generated having a voltage level of one of two voltage levels according to presence/absence of a bonding wire to the pad.

According to the present seventeenth embodiment, a variable conductance element is connected in series with a drive element that adjusts the power supply voltage level on internal power supply line 5 according to an output signal of a comparator. Thus, a semiconductor device is realized having a current supply capability appropriate to the usage of the semiconductor device. Here, only one variable conductance element 1 is used. Therefore, the circuit complexity of the internal power supply voltage generation circuit is reduced.

Embodiment 18

Figure 87:
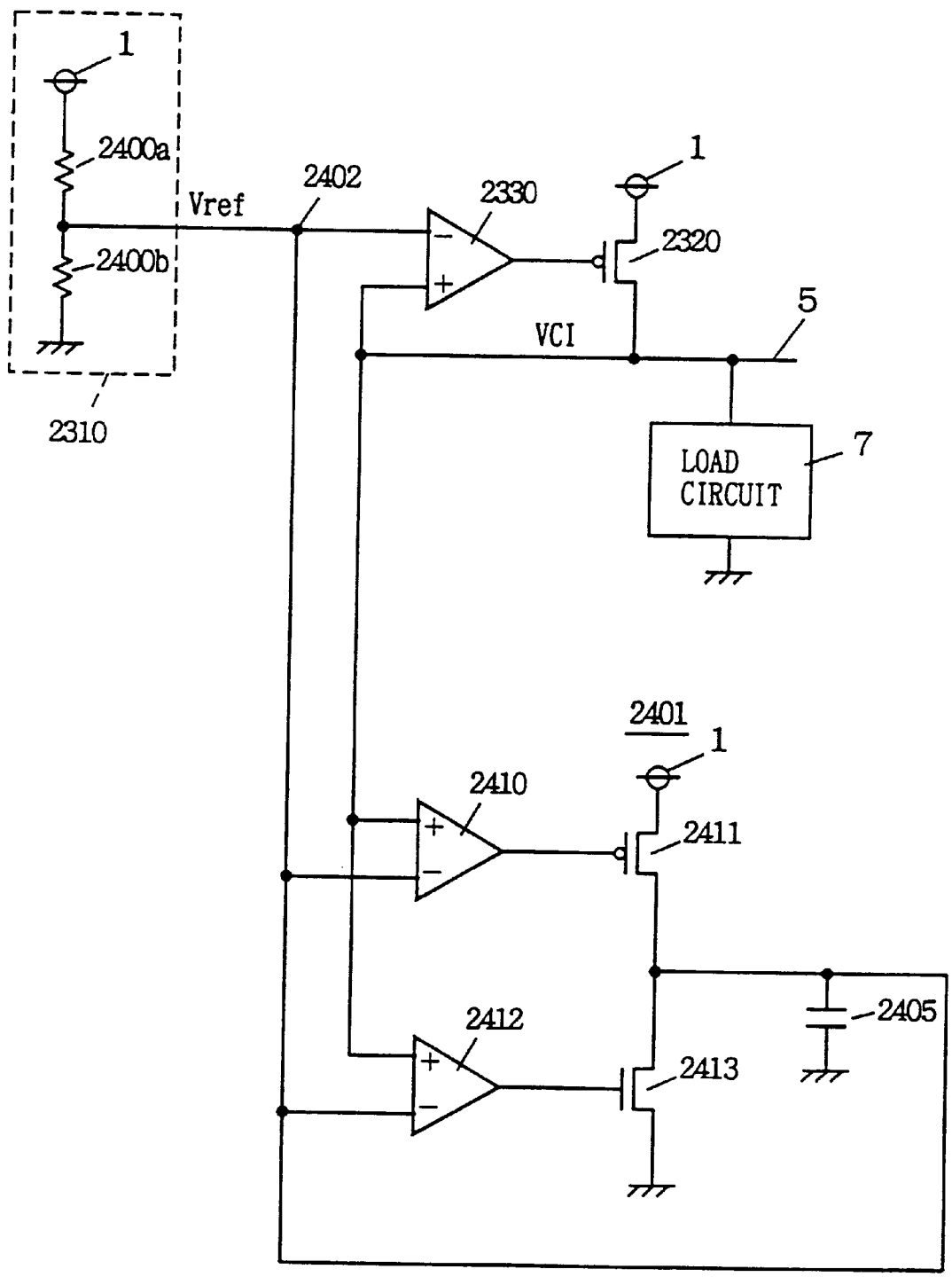
FIG. 87 shows a structure of the main portion of a semiconductor device according to a seventeenth embodiment of the present invention.

FIG. 87 schematically shows a structure of an internal power supply voltage generation circuit according to an eighteenth embodiment of the present invention. Referring to FIG. 87, the internal power supply voltage generation circuit includes a comparator 2330 for comparing reference voltage Vref transmitted from reference voltage generation circuit 2310 onto a reference voltage transmission line 2402 with power supply voltage VCI on internal power supply line 5, a drive element 2302 for adjusting the amount of current flowing from voltage source node 1 to internal power supply line 5 according to an output signal of comparator 2330, and a level adjust circuit 2405 for adjusting the voltage level of reference voltage Vref according to power supply voltage VCI on internal power supply line 5 and reference voltage Vref on reference voltage transmission line 2402.

Reference voltage generation circuit 2310 is shown being formed of resistance elements 2400a and 2400b connected in series between voltage source node 1 and the ground voltage supply node. A constant current source may be used instead of resistance element 2400a.

Level adjuster 2401 includes a comparator 2410 formed of a differential amplifier receiving a power supply voltage VCI on power supply line 5 at its positive input and reference voltage Vref on reference voltage transmission line 2402 at its negative input, a current drive element 2411 for supplying current from voltage source node 1 to reference voltage transmission line 2402 according to an output signal of comparator 2410, a comparator 2412 formed of a differential amplifier receiving the power supply voltage VCI on internal power supply line 5 at its positive input and reference voltage Vref on reference voltage transmission line 2402 at its negative input, and a current drive element 2413 for discharging current from reference voltage transmission line 2402 to the ground voltage supply node according to an output signal of comparator 2412. Reference voltage transmission line 2402 is provided with a capacitor 2405 for stabilization. Capacitor 2405 may be formed of a parasitic capacitance of reference voltage transmission line 2402. The operation will now be described.

Reference voltage Vref determined according to the resistance values of resistance elements 2400a and 2400b is provided from reference voltage generation circuit 2310. Comparator 2330 compares power supply voltage VCI on internal power supply line 5 with reference voltage. Vref on reference voltage transmission line 2402. When power supply voltage VCI is lower than reference voltage Vref, the output of comparator 2330 is reduced in voltage level, and the conductance of drive element 2320 increases. In level adjuster 2401, comparators 2410 and 2412 carry out a comparation operation in a manner similar to that of comparator 2330. The conductance of current drive element 2411 is increased, whereas the conductance of current drive element 2413 is reduced. As a result, current is supplied from voltage source node 1 via current drive element 2411 onto reference voltage transmission line 2401, whereby the level of reference voltage Vref is increased. In response, the voltage level of the output signal of comparator 2330 is further reduced, and the conductance of drive element 2320 is also reduced. As a result, the voltage of power supply voltage VCI is boosted at high speed.

When power supply voltage VCI is higher than reference voltage Vref, the voltage level of the output signal of comparator 2330 increases, and the conductance of current drive element 2320 is reduced. As a result, supply of current from voltage source node 1 to internal power supply line 5 is substantially inhibited. Here, in level adjuster 2401, the voltage level of the output signals of comparators 2410 and 2412 increases, and current drive element 2411 is rendered substantially non-conductive. The conductance of current drive element 2413 is increased, and the voltage level of reference voltage transmission line 2402 (stabilization capacitor 2405) is reduced. As a result, the voltage level of the output signal of comparator 2330 is further increased, and drive element 2320 is rendered substantially to an non-conductive state.

By adjusting the voltage level of reference voltage Vref by level adjuster 2401, the level of reference voltage Vref is boosted to raise the voltage level of the output of comparator 2330 when drive element 2320 must supply a great amount of current by comparator 2330, and the voltage level of reference voltage Vref is reduced to raise the voltage level of VCI through the output signal of comparator 2330 when drive element 2320 does not have to supply a great amount of current. By level adjuster 2401, the voltage level of reference voltage Vref is adjusted, which improves the response to comparator 2330. Even in the case where power supply voltage VCI on internal power supply line 5 is varied due to an operation of load circuit 7 at high speed, power supply voltage VCI can be supplied at a constant level stably.

Reference voltage Vref has its level determined by resistance elements 2400a and 2400b in reference voltage generation circuit 2310 and the conductance of current drive elements 2411 and 2413. It is not necessary to use a constant current source that generates a reference current of an accurate constant current level in reference voltage generation circuit 2310. Therefore, the circuit structure of reference voltage generation circuit 2310 can be simplified.

According to the structure of the present eighteenth embodiment, the voltage level of reference voltage Vref is adjusted according to the voltage level of internal power supply voltage VCI by a level adjuster, and the response performance of comparator 2330 is equivalently improved. Therefore, the current supply capability of drive element 2320 can be adjusted at high speed according to the operation state of load circuit 7, and internal power supply voltage VCI can be provided stably.

Embodiment 19

Figure 88:
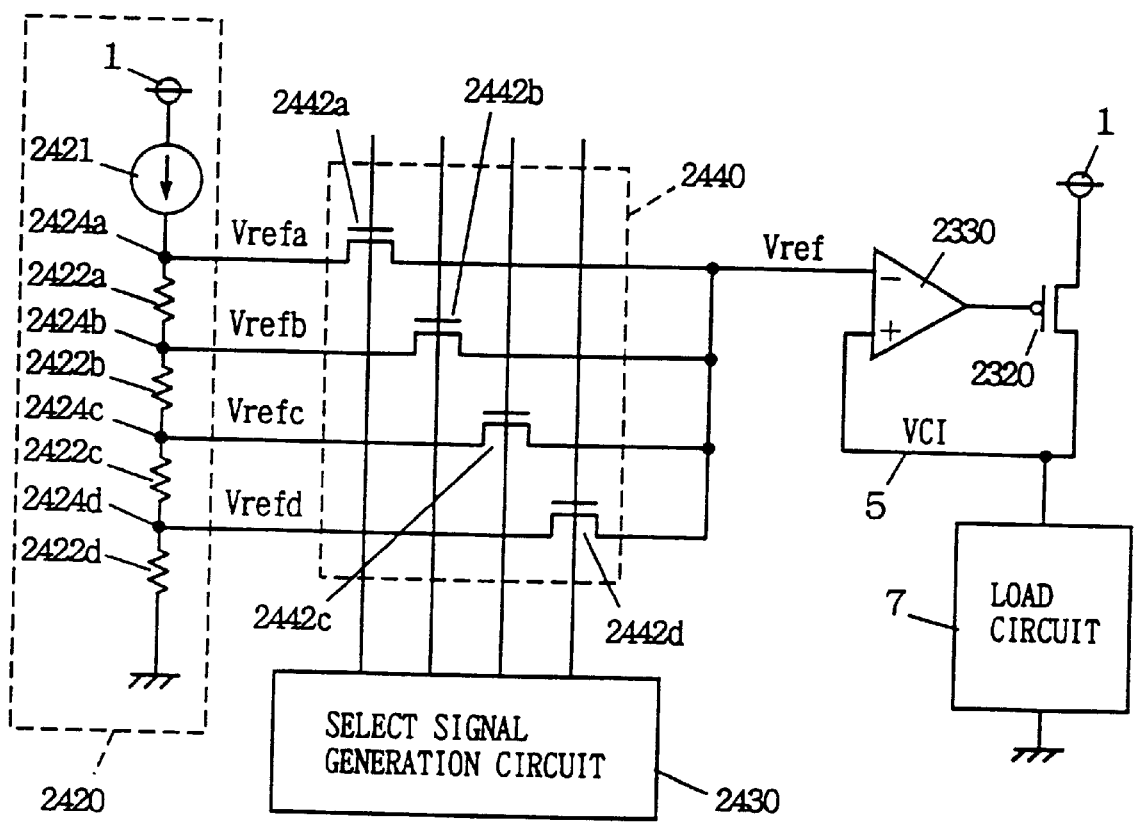
FIG. 88 shows a structure of the main portion of a semiconductor device according to an eighteenth embodiment of the present invention.

FIG. 88 schematically shows a structure of internal power supply voltage generation circuit according to a nineteenth embodiment of the present invention. Referring to FIG. 88, an internal power supply voltage generation circuit includes a reference voltage generation circuit 2420 for generating a plurality of reference voltages Vrefa, Vrefb, Vrefc, and Vrefd of different voltage levels, a select signal generation circuit 2430 for generating a signal that selects one of the output reference voltages Vrefa–Vrefd from reference voltage generation circuit 2420, a select circuit 2440 responsive to a reference voltage select signal from select signal generation circuit 2430 for selecting and providing one of reference voltages Vrefa–Vrefd from reference voltage generation circuit 2420, a comparator 2330 for comparing reference voltage Vref from select circuit 2440 with internal power supply voltage VCI on internal power supply line 5, and a drive element 2320 for supplying current from voltage source node 1 to internal power supply line 5 according to an output signal of comparator 2330.

Reference voltage generation circuit 2420 includes a constant current source 2421 connected to a voltage source node 1 for supplying a constant current, and resistance elements 2422a, 2422b, 2422c, and 2422d connected in series between constant current source 2421 and the ground voltage supply node. Reference voltages Vrefa, Vrefb, Vrefc and Vrefd are provided from a node 2420a between constant current source 2421 and resistance element 2422a, and from each of nodes 2424b, 2424c and 2424d of resistance elements 2422a–2422d, respectively.

Select circuit 2440 includes select gates 2442a–2442d provided corresponding to each of reference voltages Vrefa–Vrefd and conducting according to a select signal from select signal generation circuit 2430 (the structure thereof will be described in detail afterwards) for passing a corresponding reference voltage. In FIG. 88, each of select gates 2442a–2424d is formed of an n channel MOS transistor. Alternatively, select gates 2442a–2442d may be CMOS transmission gates. The operation will now be described.

Reference voltage generation circuit 2420 provides reference voltages Vrefa–Vrefd of different voltage levels according to the current supplied from constant current source 2421 and each resistance value of resistance elements 2422a–2422d. Select circuit 2440 selects and provides one reference voltage according to a select signal from select signal generation circuit 2430. When high speed operation is not required in load circuit 7, select signal generation circuit 2430 generates a signal selecting a reference voltage of a relatively low voltage level. By comparator 2330 and drive element 2320, power supply voltage VCI on internal power supply line 5 is set to the level of reference voltage Vref selected by select circuit 2440. When an MOS transistor is included as a component of load circuit 7, the operation speed of that MOS transistor is determined by power supply voltage VCI. This is because the charging/discharging speed of an internal node by the MOS transistor is determined by the gate potential and the potential of the drain or source receiving the power supply voltage. When reference voltage Vref has a low voltage level, high speed operation of load circuit 7 is not required even when the level of power supply voltage VCI is reduced during operation of load circuit 7. Therefore, delay in the recovery of power supply voltage VCI due to a feedback loop of comparator 2330 and drive element 2320 induces no problem even if power supply voltage VCI suddenly changes during operation of load circuit 7.

When high speed operation of load circuit 7 is required, select signal generation circuit 2430 generates a signal that selects a voltage of a relatively high voltage level. In this case, power supply voltage VCI on internal power supply line 5 is set to a relatively high voltage level by comparator 2330 and drive element 2320. Therefore, load circuit 7 can operate at high speed. Even when power supply voltage VCI suddenly changes during operation of load circuit 7, the reduction of power supply voltage VCI from the voltage level required for operating load circuit 7 at high speed can be suppressed (similarly to the state where the voltage level of internal power supply voltage VCI is set higher than a predetermined value during standby in the previous sixteenth and seventeenth embodiments) as long as the voltage level of reference voltage Vref is set to a level higher than the minimum required voltage level of internal power supply voltage VCI. Therefore, power supply voltage VCI can be supplied stably to ensure high speed operation of load circuit 7.

Figure 89:
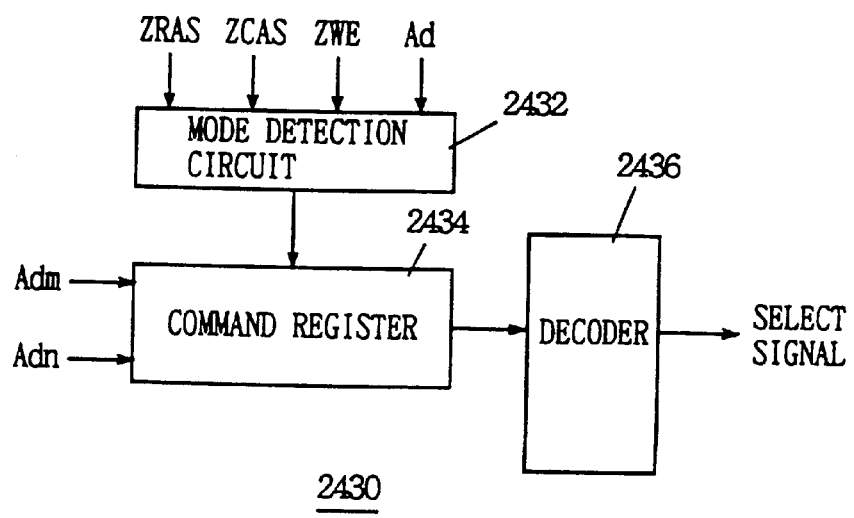
FIG. 89 schematically shows a structure of the select signal generation circuit of FIG. 88.

FIG. 89 shows a structure of select signal generation circuit 2430 of FIG. 88. Referring to FIG. 89, select signal generation circuit 2430 includes a mode detection circuit 2432 for detecting designation of an operation mode in which a reference voltage level is set according external signals ZRAS, ZCAS and ZWE and address signal Ab, a command register 2434 for taking and holding internal address signals Adm and Adn according to a mode detection signal from mode detection circuit 2432, and a decoder 2436 for decoding data held in command register 2434 to generate a select signal. Mode detect circuit 2432 detects whether a reference voltage level setting mode is designated or not according to the so-called "WCBR+address key" condition. The WCBR+address key condition indicates the state where column address strobe signal ZCAS and write enable signal ZWE fall and a particular address signal bit Ab is set to a preset value prior to the fall of row address strobe signal ZRAS. Command register 2434 is generally provided to specify an internal operation condition in a semiconductor memory device. Command register 2434 has a latching function to take continuously hold the applied address signals Adm and Adn. Decoder 2436 decodes 2 bits of address signals Abm and Abn from command register 2434 to provide a signal that selects one of reference voltages Vrefa–Vrefd shown in FIG. 88. When command register 2434 has a structure in which an address signal of 4 bits is received, a structure may be employed where a select signal is directly generated according to an applied address signal without passing through decoder 2436.

According to the structure of the select signal generation circuit shown in FIG. 89, the reference voltage, i.e. the voltage level of internal power supply voltage VCI can be set according to the operation condition of the semiconductor device. More specifically, in a refresh cycle or a data holding mode where high speed access is not required, the level of reference voltage is set to a low value. In a normal operation mode where a high speed access is required, the reference voltage Vref is set to a high level. By reducing the internal power supply voltage VCI in an operation mode where low current consumption performance is required, the charging current of internal power supply line 5 can be reduced.

Figure 90:
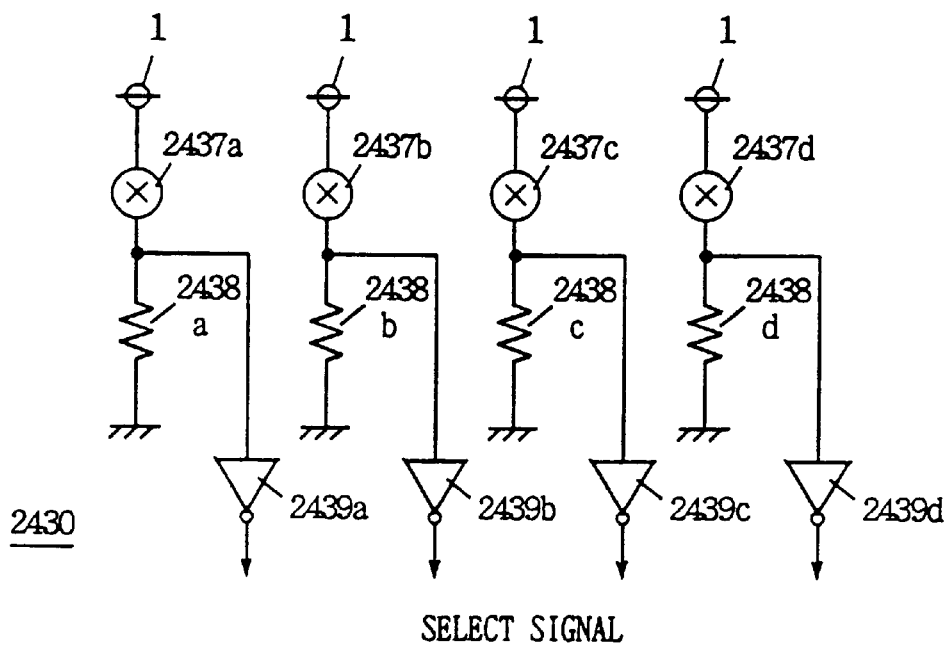
FIG. 90 shows another structure of the select signal generation circuit of FIG. 88.

FIG. 90 shows another structure of select signal generation circuit 2430 of FIG. 88. In the structure of FIG. 90, link element 2437 (2437a–2437d), resistance elements 2438 (2438a–2438d), and an inverter 2439 (2439a–2439d) are provided with respect to reference voltages Vrefa–Vrefd, respectively. Link element 2437 and resistance element 2438 are connected in series between voltage source node 1 and the ground node. Inverter 2439 receives and inverts a signal potential on one end (the node not connected to ground node) of resistance element 2438 to provide a select signal.

When link elements 2437a–2437d attain a conductive state (non-cut-off state), the output signals of inverters 2439a–2439d all attain a low level. When any of link elements 2437a–2437d is cut off, the output signal of a corresponding one of inverters 2439a–2439 attains a high level, whereby a corresponding reference voltage Vrefa–Vrefd is selected. For example, when link element 2437a is cut off, the input signal of inverter 2439a attains a low level by resistance element 2438a and the output signal of inverter 2439a also attains a high level. As a result, reference voltage Vrefa is transmitted.

According to the structure of FIG. 90, a corresponding reference voltage is selected by cutting off a link element. Alternatively, a structure may be employed in which a signal selecting a corresponding reference voltage is generated during a conductive state of a link element. When the reference voltage level is set by programming the fuse out/non-fuse of this link element, a reference voltage level can be set according to the application of a semiconductor device, i.e. according to a semiconductor device requiring high speed operation and a semiconductor device not requiring high speed operation. Therefore, it is possible to accommodate a semiconductor device that operates at high speed and a semiconductor device that has low power consumption with the same circuit structure.

Since the voltage level of reference voltage Vref determining the voltage level of internal power supply voltage VCI is selectable according to the structure of the nineteenth embodiment, an optimum reference voltage can be provided according to the operation condition and usage application of the semiconductor device. Power supply voltage VCI can be supplied stably via a reference voltage according to the operation state.

Embodiment 20

Figure 91:
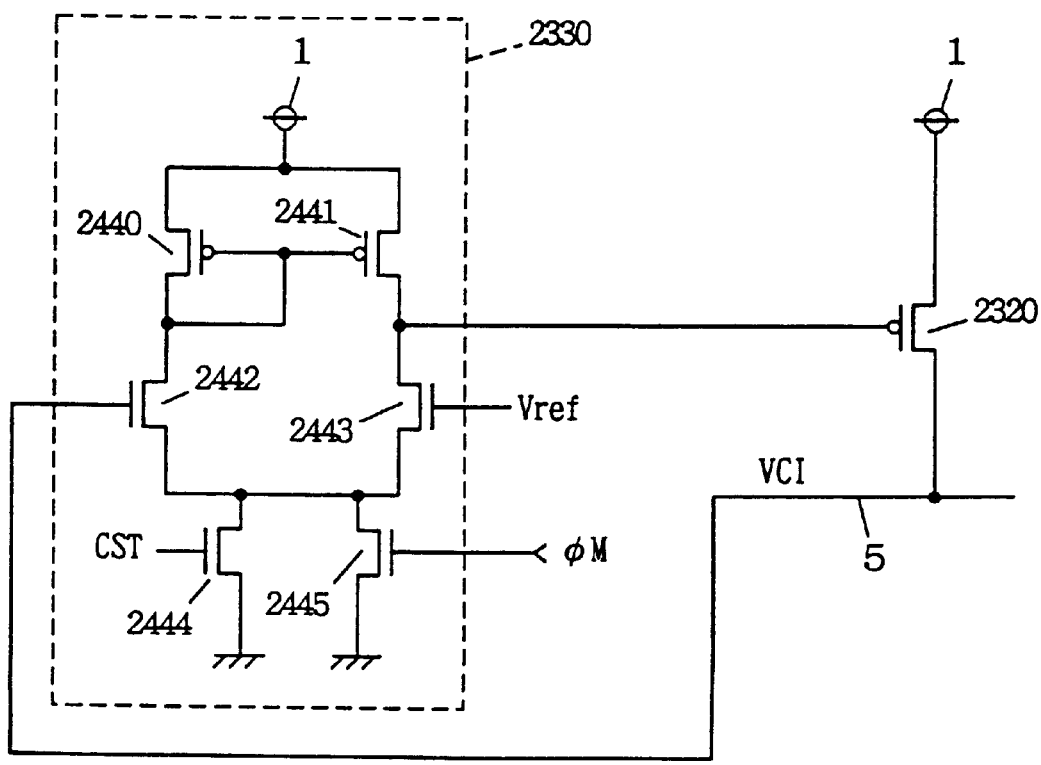
FIG. 91 shows a structure of the main portion of a semiconductor device according to the eighteenth embodiment of the present invention.

FIG. 91 shows a structure of an internal power supply voltage generation circuit according to a twentieth embodiment of the present invention. In FIG. 91, a comparator 2330 that adjusts the gate potential of drive element 2320 according to the difference between reference voltage Vref and power supply voltage VCI on internal power supply line 5 can have its response speed switched according to an operation mode.

More specifically, comparator 2330 includes p channel MOS transistors 2440 and 2441 forming a current mirror stage, n channel MOS transistors 2442 and 2443 forming a differential stage for comparing reference voltage Vref with internal power supply voltage VCI, and current source transistors 2444 and 2445 for determining the amount of operating current flowing through comparator 2330. MOS transistor 2440 has its gate and drain connected together. MOS transistor 2440 and MOS transistor 2442 are connected in series, and MOS transistor 2441 and MOS transistor 2443 are connected in series.

Current source transistor 2444 receives a reference voltage CST of a constant voltage level at its gate. Reference voltage CST may be a power supply voltage applied to voltage source node 1. A switching current source transistor 2445 selectively rendered conductive in response to operation mode specify signal φM is provided parallel to current source transistor 2444. Operation mode specify signal φM is a binary logical signal. Switching current source transistor 2445 is set to a conductive state or a non-conductive state according to a operation mode specify signal φM.

Comparator 2330 is formed of a general differential amplifier to invert and amplify the difference between reference voltage Vref and internal power supply voltage VCI. The amplified signal is provided to the gate of drive element 2320. The operation speed of comparator 2330 is determined by the operating current flowing through current source transistors 2444 and 2445. More specifically, when the current flowing through MOS transistor 2443 is great, the potential applied to the gate of drive element 2320 changes at high speed. When the amount of current flowing through MOS transistor 2443 is small, the gate potential of drive element 2320 changes mildly. By adjusting the amount of current flowing through current source transistors 2444 and 2445, the responsibility of comparator 2330 can be adjusted. Therefore, two states can be set, one which follows at high speed the rapid change of external power supply voltage VCI, and another which follows the change in a relatively mild manner.

When operation mode specify signal φM attains a low level and switching current source transistor 2445 is rendered non-conductive, the operating current of comparator 2330 is determined by current source transistor 2444. In this case, the potential change of the output node of comparator 2330 is gentle, and the response rate is lowered. When operation mode specify signal φM attains a high level and switching current source transistor 2445 is rendered conductive, the operating current of comparator 2330 is determined by the amount of current flowing through transistor 2444 and 2445, whereby the operating current increases. In this case, the gate potential changing speed of drive element 2320 by comparator 2330 is increased, and the response speed of comparator 2330 is improved. Therefore, power supply voltage can be supplied stably following at high speed sudden change of internal power supply voltage VCI on internal power supply line 5. The manner of operation mode specify signal φM generation will be described.

Figure 92A:
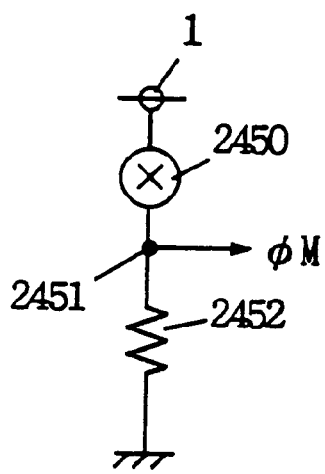
FIGS. 92A–92C show a structure for generating an operation mode specify signal shown in FIG. 91.
Figure 92B:
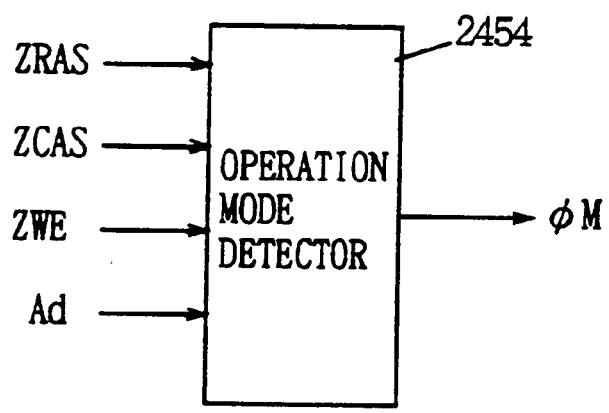
Figure 92C:
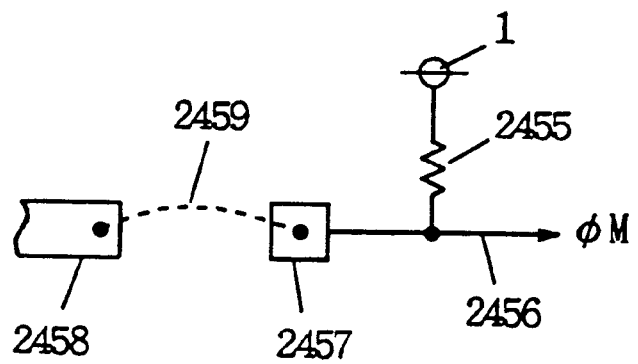

FIGS. 92A–92C show a structure of the operation mode specify signal generation circuit of FIG. 91. Referring to FIG. 92A, the operation mode specify signal generation circuit includes link elements 2450 and a resistance element 2452 connected in series between power voltage source node 1 and the ground node (ground voltage supply node). Operation mode specify signal φM is provided from a node 2451 between link element 2450 and resistance element 2452. By fusing out link element 2450, operation mode specify signal φM is pulled down to logical low of the ground voltage level by a pull down resistance element 2452. When link element 2450 is rendered conductive (non-fuse state), the voltage level provided to voltage supply node 1 attains a high level since resistance element 2452 has a high resistance. By setting the voltage level of operation mode specify signal φM by programming link element 2450, the response rate of the comparator can be fixedly set according to the application in which that semiconductor device is used. The operating characteristics of the comparator can be fixedly set accordingly to a device in which high speed access is required and to a device in which low current consumption characteristic are required.

The operation mode specify signal generation circuit of FIG. 92B is formed of an operation mode detector 2454 for detecting whether a predetermined operation mode is specified or not according to externally applied row address strobe signal ZRAS, column address strobe signal ZCAS, write enable signal ZWE, and address signal Ad, and setting operation mode specify signal φM to a high level or to a low level when a predetermined operation mode is specified. When operation mode specify signal φM attains a high level, operation modes in which the operation speed (response speed) of comparator 2330 is increased include a page mode, a static column mode, a clock synchronized operation operating in synchronization with a periodically applied clock signal, and an EDO mode. Although, an operation similar to a nibble mode is carried out in an EDO mode, except the timing of resetting data output. This resetting timing is the rise of column address strobe signal ZCAS in a nibble mode. In EDO mode, this timing is the fall of column address strobe signal ZCAS or the rise of both signals ZCAS and ZRAS to a high level. The time period in which output data keeps an ascertain state is increased in EDO mode, and an operation is realized that is higher in speed than the nibble mode. In a high speed operation mode, the power supply voltage on internal power supply line 5 must be restored to a desired voltage level at high speed. In this case, the response speed of comparator 2330 is increased with operation mode specify signal φM at a high level.

In a data holding mode or a refresh operation mode where external access is not required, operation mode specify signal φM is set to a low level. This is because high speed operation ability is not required and low current consumption ability is required in these operation modes.

The refresh cycle mode includes an RAS only refresh mode controlling a refresh operation by an externally applied row address strobe signal ZRAS, a CBR refresh mode in which a refresh operation is specified by the relation of the timings of write enable signal ZWE, column address strobe signal ZCAS, and row address strobe signal ZRAS, and a self refresh mode where a refresh operation is carried out automatically internally at predetermined periods. There is also a hidden refresh cycle mode in which a refresh operation is carried out for a non-selected block different from an accessed memory block. When internal power supply line 5 is provided for each of the memory blocks in a hidden refresh cycle mode, a structure is provided where only internal power supply line 5 provided corresponding to the memory block to be refreshed has the response speed of comparator 2330 slowed down. When internal power supply line 5 is provided in common to all the memory blocks, the normal access operation and the hidden refresh operation are carried out in parallel. In this case, operation mode specify signal φM is set to a high level to compensate for reduction of power supply voltage VCI due to current consumption of internal power supply line 5.

In a test mode, operation mode specify signal φM is set to a low level when an operation margin testing is carried out that intentionally slows down the response speed of comparator 2330. Where determination is made whether a plurality of memory cell data are acceptable/not acceptable simultaneously while selecting a plurality of memory cells greater in number than the number of bits of the memory cells in a normal operation, operation mode specify signal φM is set to a high level to increase the response speed of comparator 2330. The reduction in power supply voltage VCI due to current consumption of internal power supply line 5 is compensated for.

The operation mode specify signal generation circuit shown in FIG. 92C includes a resistance element 2455 of high resistance connected between voltage source node 1 and a signal line 2456. Signal line 2456 is connected to a pad 2457. By selectively connecting pad 2457 and frame 2458 by a bonding wire 2459, the logic level of operation mode specify signal φM is fixedly set. The object and effect similar to those obtained by programming using link element 2450 shown in FIG. 92A are achieved. According to the structure shown in FIG. 92C, the logic level of operation mode specify signal φM is set by bonding wire 2459 according to the number of input/output data bits when the number of input/output data bits differs a different product device. The response speed of comparator 2330 can be fixedly set. Thus, semiconductor memory devices having a plurality of different types of input data bits can be accommodated by the same circuit structure.

Modifications

Figure 93:
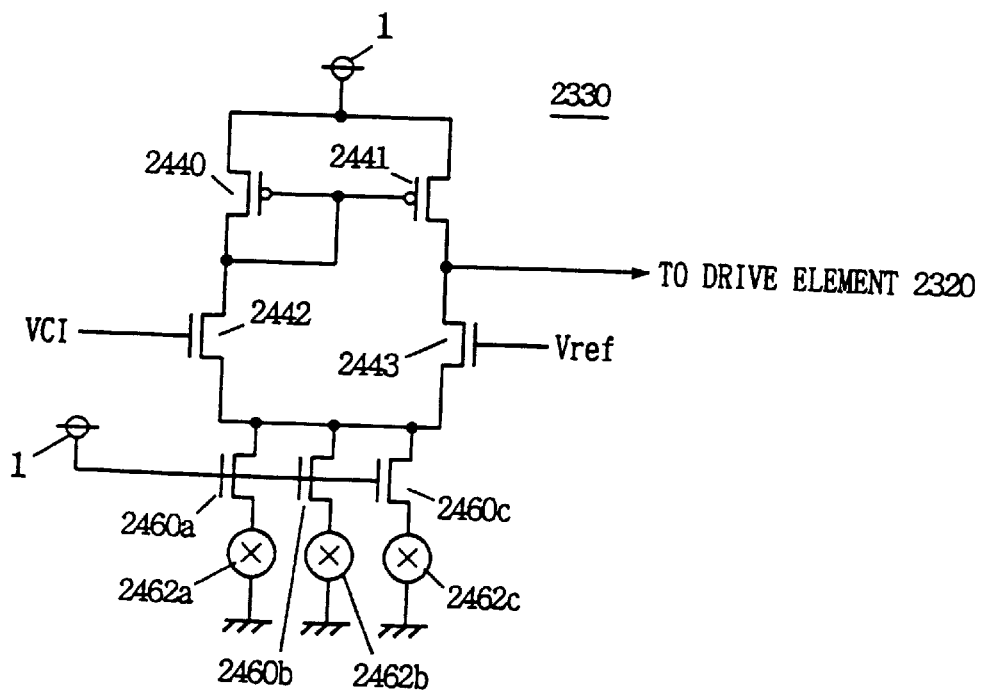
FIGS. 93 and 94 show a structure of first and second modifications of the eighteenth embodiment of the present invention.

FIG. 93 shows a structure of the main portion of a modification of the internal power supply voltage generation circuit of the twentieth embodiment. In FIG. 93, only comparator 2330 for adjusting the gate potential of drive element 2320 (refer to FIG. 91) is shown. In comparator 2330 of FIG. 93, n channel MOS transistors 2460a–2460c each having its gate connected to voltage source node 1 are provided as current source transistors determining the operating current of comparator 2330. Link elements 2462a, 2462b and 2462c are provided in series with MOS transistors 2460a–2460c. By selectively fusing out link elements 2462a–2462c, the operating current of comparator 2330 can be adjusted. The aimed response speed can be provided to comparator 2330.

The components of the remaining structure of comparator 2330, i.e. the current mirror means and the differential amplifier means have a structure similar to those shown in FIG. 91.

Modification 2

Figure 94:
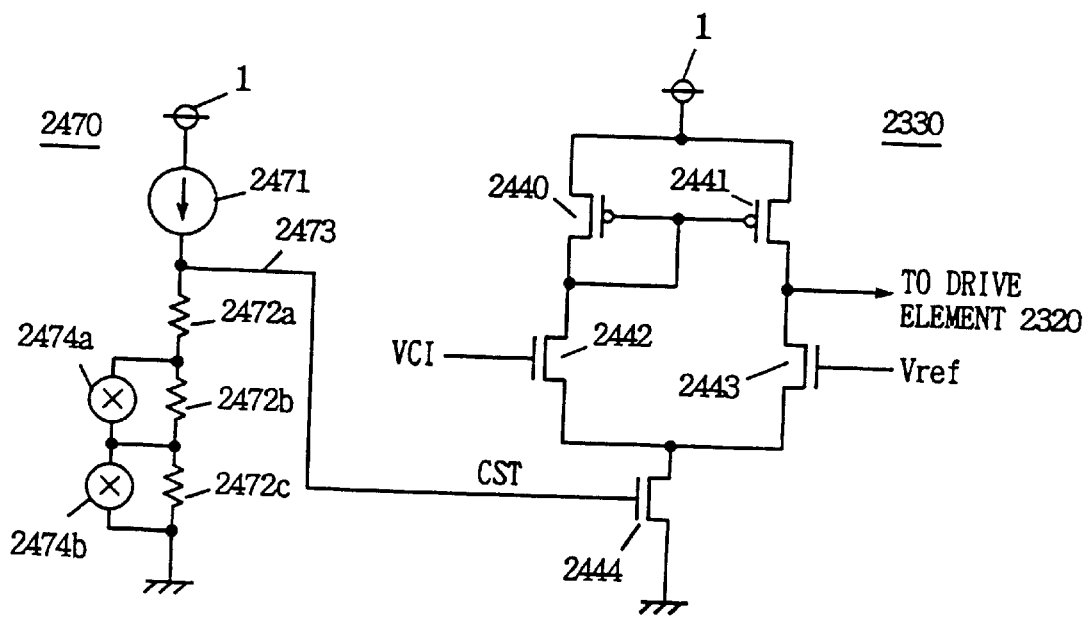

FIG. 94 shows a structure of the main portion of another modification of the internal power supply voltage generation circuit of the twentieth embodiment. The structure shown in FIG. 94 has the voltage level of reference voltage CST applied to the gate of a current-reduction transistor 2460 of comparator 2330 altered. The structure of comparator 2330 is similar to that shown in FIG. 91.

Reference voltage generation circuit 2470 generating reference voltage CST includes a constant current source 2471 connected to a voltage source 1 for providing a constant current, resistance elements 2472a–2472c connected in series between constant current source 2471 and the ground node, and link elements 2474a and 2474b connected in parallel to resistance elements 2472b and 2472c, respectively. Reference voltage CST is provided from the node between constant current source 2471 and resistance element 2472a onto signal line 2473. When link elements 2474a and 2474b are both conduct (non-fuse state), resistance elements 2472b and 2472c are short-circuited by link elements 2474a and 2474b, respectively. The level of reference voltage CST on signal line 2473 is determined by the current supplied from constant current source 2471 and the resistance value of resistance element 2472a.

By selectively fusing out link elements 2474a and 2474b, the number of resistance elements connected between signal line 2473 and the ground node is increased. Accordingly, the voltage level of reference voltage CST on signal line 2473 increases. When the voltage level of reference voltage CST is high, constant current source transistor 2444 has its conductance increased to generate a great operating current. When the voltage of reference voltage CTS is low, a relatively low operating current is generated. This is because the MOS transistor has its drain current determined by the potential of the gate.

As shown in FIG. 94, the amount of operating current of comparator 2330 can be adjusted by adjusting the gate potential, in contrast to the structure shown in FIGS. 91–93 where the gate width (channel width) of the current source transistor is altered equivalently. Thus, an effect similar to those shown in FIGS. 91–93 can be obtained.

The number of current source transistors shown in FIGS. 91 and 93 and the number of resistance elements in the reference voltage generation circuit shown in FIG. 94 are appropriately selected according to its application.

Furthermore, a structure may be employed in which reference voltage generation circuit 2470 generates reference voltage CST of a plurality of voltage levels, wherein one of the plurality of reference voltages is selected and provided to the gate of current source transistor 2444 according to the operation mode.

Thus, the response rate of the comparator that adjusts the amount of supplied current of the drive element is altered by adjustment of the operating current according to an operation mode or application of usage. Thus, an internal power supply voltage generation circuit (comparator) that includes operating characteristics corresponding to high speed access and low current consumption can easily be realized.

Embodiment 21

Figure 95:
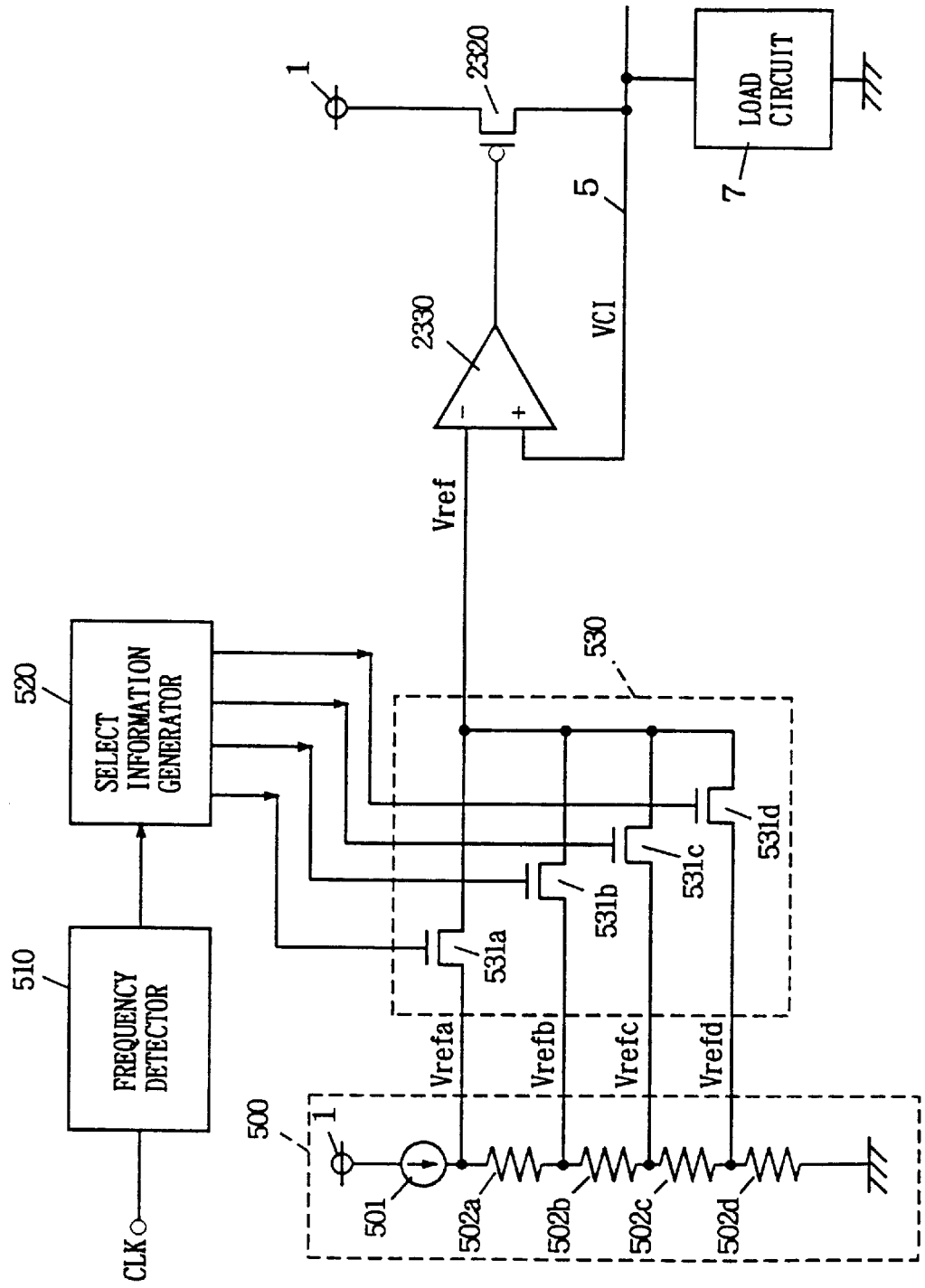
FIG. 95 schematically shows a structure of a semiconductor device according to a nineteenth embodiment of the present invention.

FIG. 95 shows a structure of the main portion of an internal power supply voltage generation circuit according to a twenty first embodiment of the present invention. In FIG. 95, reference voltage Vref setting the voltage level of power supply voltage VCI on internal power supply line 5 is set according to the frequency of a periodic externally applied clock signal CLK that determines the operating rate of the semiconductor device. In a general clock synchronous semiconductor device (for example, an SDRAM), a clock signal CLK is applied periodically from an external source, and input of an external control signal and data input/output are carried out in synchronization with clock signal CLK. A system clock is generally used as this clock signal. The frequency of 30 MHz, 50 MHz, and 100 MHz or a frequency greater than 100 MHz are used as the frequency of clock signal CLK. Load circuit 7 which is internal circuitry operates in synchronization with clock signal CLK (the generation timing of an internal control signal is determined by clock signal CLK). This means that high speed operation and low speed operation is determined according to the frequency of clock signal CLK. By adjusting the level of internal power supply voltage VCI according to the frequency of clock signal CLK, internal power supply voltage VCI can be set to a level according to the operating rate of load circuit 7.

The internal power supply voltage generation circuit includes a frequency detector 510 for detecting the frequency of periodic externally applied clock signal CLK to select one of reference voltages Vrefa, Vrefb, Vrefc and Vrefd of different voltage levels from reference voltage generation circuit 500, a select information generator 520 for generating select information to select a corresponding reference voltage according to the frequency information detected by frequency detector 510, and a select circuit 530 for selecting and providing as a reference voltage Vref, one of reference voltages Vrefa–Vrefd according to the reference voltage select information from select information generator 520. Reference voltage generation circuit 500 includes a constant current source 501 for supplying a constant current from voltage source node 1, and resistance elements 502a–502d connected in series between constant current source 501 and the ground node. Reference voltages Vrefa–Vrefd are provided from each one end of resistance elements 502a–502d.

Frequency detector 510 having a structure which will be described afterwards provides information (parameter) indicating the frequency of clock signal CLK. When the frequency information output from frequency detector 510 indicates a high frequency, select information generator 520 generates select information that selects the reference voltage of a high level. Select circuit 530 includes select gates 531a–531d provided corresponding to reference voltages Vrefa–Vrefd, respectively. One select gate is rendered conductive according to the select information from select information generator 520, whereby one of the plurality of reference voltages Vrefa–Vrefd is selected and output as reference voltage Vref.

According to the structure shown in FIG. 95, by adjusting the voltage level of reference voltage Vref according to the frequency of clock signal CLK that is periodically applied from an external source to determine the operating rate of the semiconductor device, internal power supply voltage VCI can be set to a level suiting to the operating rate. When internal power supply voltage VCI becomes lower than a predetermined voltage level during high speed operation, comparator 2330 restores at high speed power supply voltage VCI to a predetermined voltage level when the voltage level of reference voltage Vref is higher than a predetermined voltage level. The structure of a select circuit will be described in detail.

Figure 96:
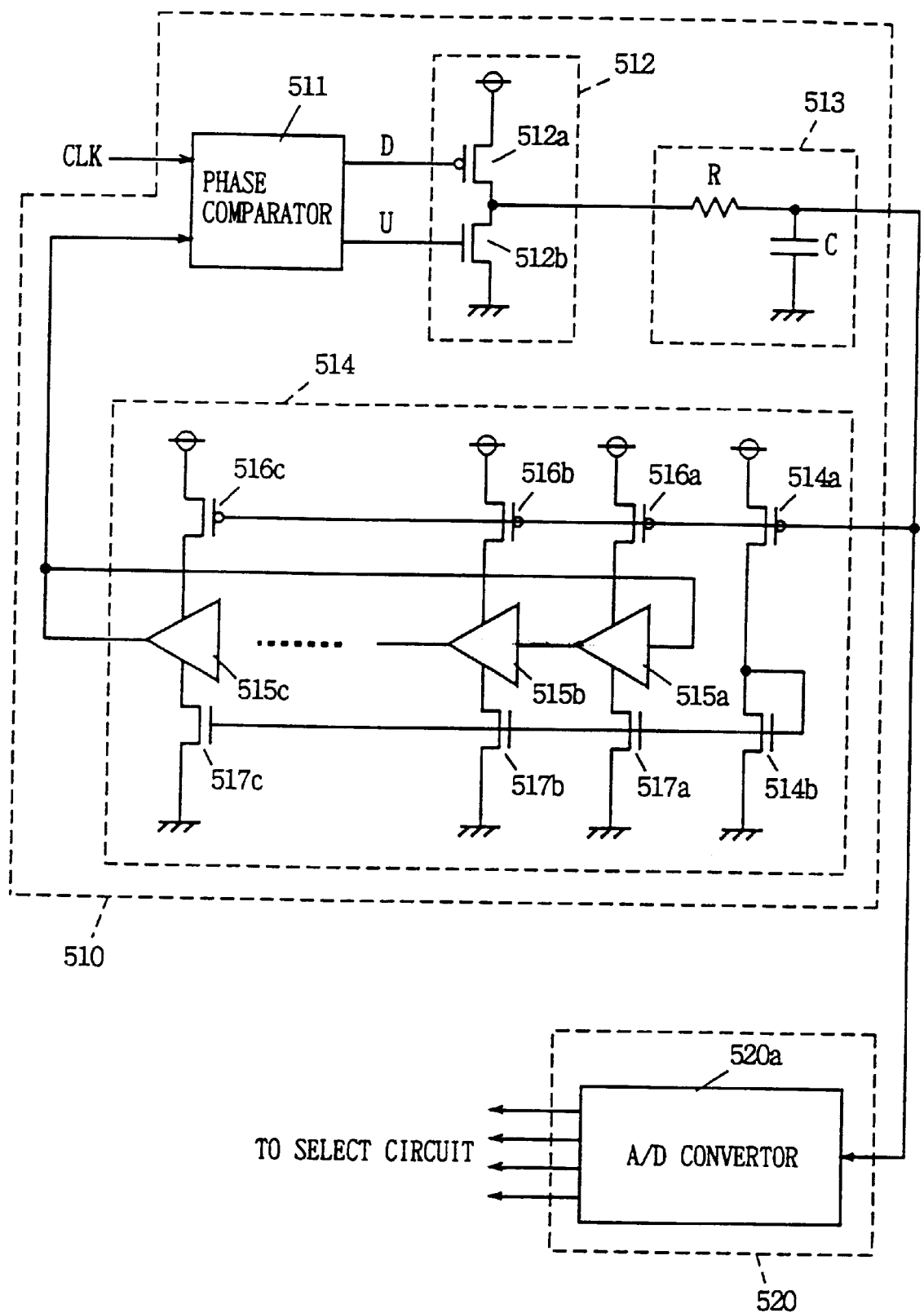
FIG. 96 schematically shows a structure of the frequency detector and the select information generator of FIG. 95.

FIG. 96 shows a structure of frequency detector 510 and select information generator 520 of FIG. 95. In FIG. 96, frequency detector 510 is formed of a PLL. More specifically, frequency detector 510 includes a phase comparator 511 for comparing the phase of clock signal CLK and the output signal of a voltage control generator (VCO) 514, a charge pump circuit 512 serving as a D/A converter for converting phase error signals D and U from phase comparator 511 into analog signals, a loop filter 513 having its charging potential set by an output signal of charge pump circuit 512, and a VCO 514 having its oscillation frequency varied according to the voltage applied from loop filter 513.

Charge pump circuit 512 includes a p channel MOS transistor 512 receiving error signal D from phase comparator 511 at its gate, and an n channel MOS transistor 512b receiving phase error signal U from a phase comparator 511 at its gate. Loop filter 513 functions as a lowpass filter, and includes, for example, a resistor R and a capacitor C. The charging potential of capacitor C varies according to an output signal of charge pump circuit 512.

VCO 514 includes an odd number of stages of cascade-connected inverters 515a–515c, p channel MOS transistors 516a–516c and n channel MOS transistors 517a–517c for supplying operating current to inverters 515a–515c, respectively, and an n channel MOS transistor 514b for determining the operating current of n channel MOS transistors 517a–517c. MOS transistors 514a and 514b are connected in series between power supply node (may be a node receiving internal power supply voltage, or a node receiving external power supply voltage) and the ground node. MOS transistor 514b has its gate and drain interconnected to form a master stage of a current mirror circuit with respect to MOS transistors 517a–517c. The current flowing amount in MOS transistors 517a–517c is identical to the amount of current flowing in MOS transistor 514b (when MOS transistor 514b and MOS transistors 517a–517c have the same size).

Select information generator 520 is formed of an A/D converter 520a that changes the charging potential at loop filter 513 into a digital signal. The step (the magnitude of an analog value between each digital value) of A/D converter 520a is determined appropriately according to the number of the selected reference voltages. The operation will now be described.

A frequency detector 510 is mainly formed of a PLL. When the phase of clock signal CLK is ahead of the phase of the output signal from VCO 514, phase comparator 511 sets signals D and U both to a high level. When the phase of clock signal CLK is behind the phase of the output of VCO 514, signals D and U are both set to a low level. When the phase of clock signal CLK is identical to the phase of the output signal of VCO 514, phase comparator 511 pulls up signal D to a high level and pulls down signal U to a low level. Charge pump circuit 512 has MOS transistors 512a and 512b selectively rendered conductive/non-conductive according to signals D and U.

The charging potential of capacitor C in loop filter 513 is determined by charge pump circuit 512. The conduction/non-conduction of MOS transistors 512a and 512b in charge pump circuit 512 corresponds to the phase difference between clock signal CLK and the output signal of VCO 514. The charging potential of capacitor C included in loop filter 513 is the voltage level according to the phase difference of clock signal CLK and the output signal of VCO 514. VCO 514 is formed of an odd number stages of inverters 515a–515c to carry out oscillation as a ring oscillator.

The operating rate of inverters 515a–515c are determined according to the operating current provided via MOS transistors 516a–516c and 517a–517c. Inverters 515a–515c operate at a high speed if the operating current is great, whereby the oscillation frequency is increased. A smaller operating current causes a slower operating rate of inverters 515a–515c, whereby the oscillation frequency is reduced. The amount of current flowing through MOS transistors 516a–516c is determined by the charging voltage of capacitor C included in loop filter 513. An increase in the charging voltage of capacitor C causes increase in the gate potentials of MOS transistors 516a–516c, whereby the operating current is reduced. When the charging potential of capacitor C in lowpass filter 513 is reduced, the gate potentials of MOS transistors 516a–516c are reduced, whereby the operating current of inverters 515a–515c increases. The current flowing through MOS transistor 514a is conducted via MOS transistor 514b. MOS transistor 514b forms a current mirror circuit with MOS transistors 517a–517c. Therefore, a current flows via MOS transistors 516a–516c and MOS transistors 517a–517c, which current is identical in amount to that flowing through MOS transistors 514a and 514b. The voltage level of capacitor C included in loop filter 513 is eventually stabilized according to the phase comparison operation in phase comparator 511, whereby the output signal of VCO 514 is brought into synchronization with the phase of clock signal CLK.

When the frequency of clock signal CLK is high, VCO 514 carries out an oscillation operation at high speed. Therefore, the charging potential of capacitor C included in lowpass filter 513 is reduced. When the frequency of clock signal CLK is reduced, the oscillation frequency of VCO 514 is reduced. Therefore, the charging potential of capacitor C in lowpass filter 513 is increased. The charging potential of capacitor C in loop filter 513 is converted into select information by A/D converter 520a. Reference voltages Vrefa–Vrefd output from reference voltage generation circuit 500 shown in FIG. 95 is selected according to the select information from A/D converter 520a. Thus, a reference voltage according to the frequency of clock signal CLK, i.e., according to the operating rate of the semiconductor device can be selected.

The structures of the charge pump circuit and loop filter 513 in frequency detector 510 are only a way of example, and another circuit structure may be employed as long as a voltage corresponding to the frequency of clock signal CLK is provided.

Modification

Figure 97:
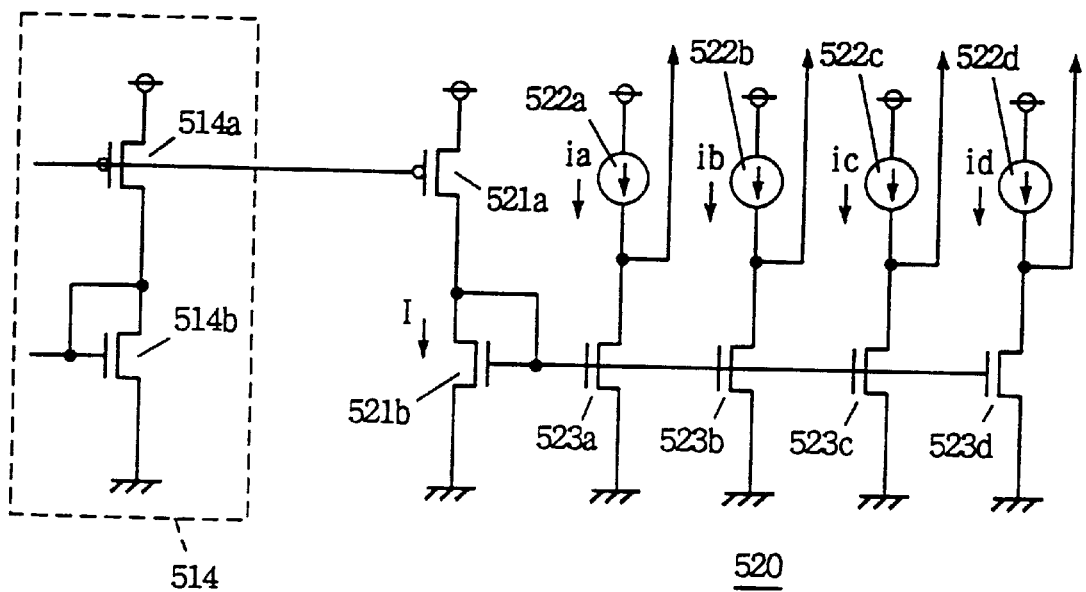
FIG. 97 shows another structure of the select information generator of FIG. 95.

FIG. 97 shows another structure of the select information generator shown in FIG. 95. Referring to FIG. 97, a select information generation circuit 520 monitors the operating current in VCO 514 of FIG. 96 to generate select information.

More specifically, select information generator 520 includes a p channel MOS transistor 521a receiving the gate potential of MOS transistor 514a in VCO 514 (charging potential of capacitor C of loop filter 513 of FIG. 96) at its gate, a diode-connected n channel MOS transistor 521b operating with MOS transistor 521a as a current source, current sources 522a–522d provided corresponding to reference voltages Vrefa–Vrefd, respectively, and n channel MOS transistors 523a–523d provided corresponding to current sources 522a–522d, respectively. MOS transistors 523a–523d has each gate connected to the gate of MOS transistor 521b to form a slave stage of a current mirror circuit. Current sources 522a–522d supply currents ia–id of different levels. The operation will now be described. It is assumed that constant currents ia–id supplied by current sources 522a–522d satisfy the following condition of:

$$ia > ib > ic > id$$

A current corresponding to the operating current of the ring oscillator in VCO 514 flows in MOS transistor 521a. In MOS transistor 521b, current I supplied from MOS transistor 521a flows. MOS transistor 521b forms a master stage of a current mirror circuit. A current of an amount identical to that of current I flows in MOS transistors 523a–523d forming a slave stage of a current mirror circuit (assuming that MOS transistor 521b and MOS transistors 523a–523d have the same size). When current I is greater than all constant currents ia–id, MOS transistors 523a–523d discharge a current greater than that supplied from corresponding current sources 522a–522d. Therefore, the potential of the output node (drain edge) of MOS transistors 523a–523d attain a low level. When current I is smaller than all constant currents ia–id, MOS transistors 523a–523d cannot discharge constant currents ia–id supplied from corresponding constant current sources 522a–522d to respective ground nodes. Therefore, the potentials of the drain terminals of MOS transistors 523a–523d attain a high level. More specifically, the potential levels of the drain terminals of MOS transistors 523a–523d are determined by the amount of current I flowing through MOS transistor 521b and constant currents ia–id supplied from corresponding constant current sources 522a–522d. Thus, information for selecting a reference voltage according to current I can be provided from select information generation circuit 520.

According to the structure of select information generation circuit 520 shown in FIG. 97, an amplifier circuit may further be provided at the output stage. This provides the advantage that an accurate reference voltage select information can be provided by amplifying a small potential difference when the difference between current I and constant current Ia–Id is small.

Modification

Figure 98:
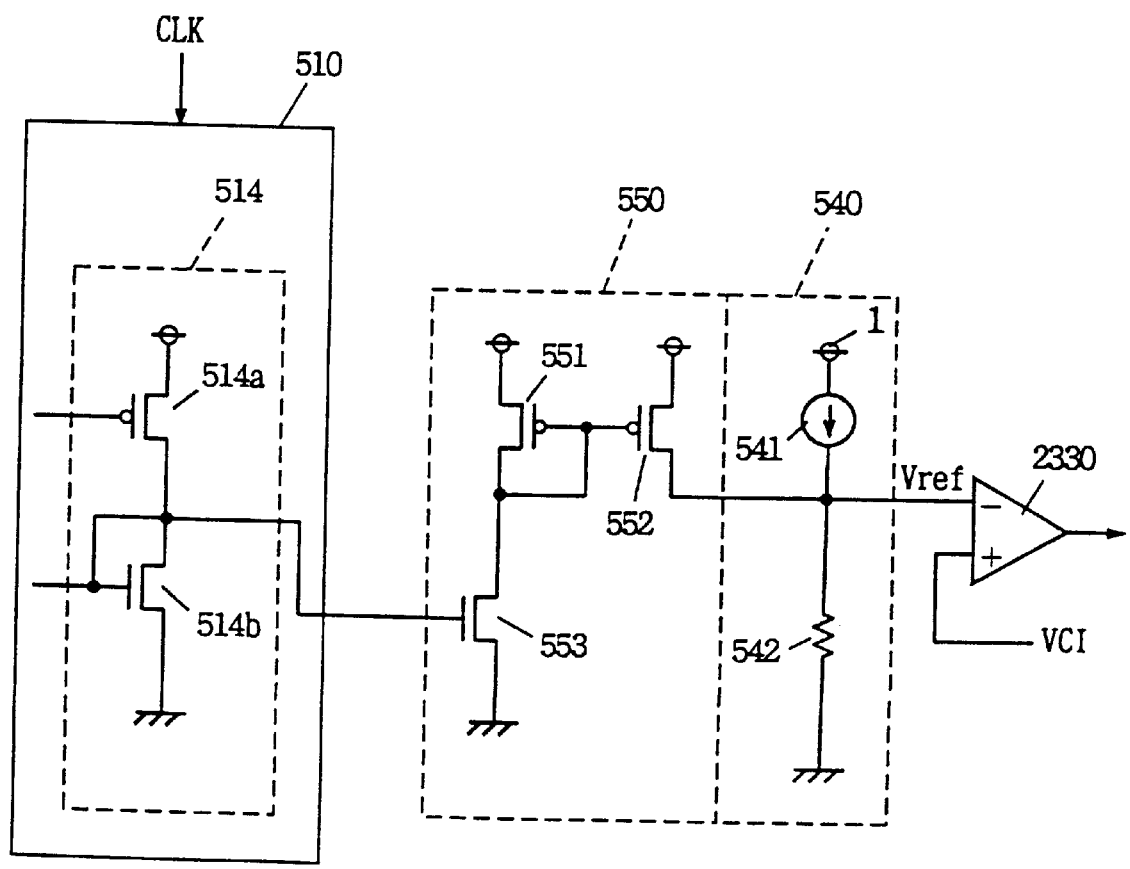
FIG. 98 shows a structure of the modification of the nineteenth embodiment of the present invention.

FIG. 98 shows a structure of a modification of the internal power supply voltage generation circuit according to a twenty first embodiment of the present invention. Similar to the structure shown in the previous FIG. 95, the internal power supply voltage generation circuit of FIG. 98 is supplied with clock signal CLK indicating an operating rate. The level of reference voltage Vref is adjusted according to the frequency of clock signal CLK. A structure similar to that shown in FIG. 96 is employed as the structure for detecting frequency information.

More-specifically, the internal power supply voltage generation circuit of FIG. 98 includes a VCO 514 as frequency information detection means for detecting frequency information, a reference voltage level adjustment circuit 550 for providing reference voltage level adjustment information by detecting the amount of current flowing through MOS transistor 514b in VCO 514, and a reference voltage generating circuit 540 for generating reference voltage Vref having the voltage level set according to current supplied from reference voltage level adjustment circuit 550. Reference voltage Vref from reference voltage generation circuit 540 is supplied to comparator 2330 comparing internal power supply voltage VCI with reference voltage Vref. The output signal of comparator 2330 is supplied to the gate of a drive element not shown.

Reference voltage generation circuit 540 includes a constant current source 541 connected to voltage source node 1 for supplying a constant current, and a resistance element 542 connected in series with constant current source 541.

Level adjust circuit 550 includes an n channel MOS transistor 553 for receiving the potential of the gate and drain of MOS transistor 514b in VCO 540 at its gate, a p channel MOS transistor 551 connected in series between n channel MOS transistor 553 and the power supply node (may be either an external power supply node or an internal power supply node), and a p channel MOS transistor 552 forming a current mirror circuit with p channel MOS transistor 551. MOS transistor 551 has its gate and drain interconnected. MOS transistor 552 has its output node (drain terminal) connected to one end of resistance element 542 included in reference voltage generation circuit 540. The operation will now be described.

When the frequency of clock signal CLK is great, the current flowing through MOS transistor 514b in VCO 514 included in frequency information detector 510 is increased. In response, the current is increased via MOS transistor 553 included in level adjust circuit 550. The current flowing through MOS transistor 553 is supplied from MOS transistor 551. The current flowing through MOS transistor 551 is mirror-reflected by MOS transistor 552, whereby a current corresponding to the current flowing through VCO 514 and MOS transistor 514b is supplied from level adjust circuit 550 to resistance element 542 of reference voltage generation circuit 540. The voltage level of reference voltage Vref is determined by the combined current value of the current supplied from constant current source 541 and the current supplied from level adjust circuit 550, and the resistance value of resistance element 542. In this case, the current flowing via resistance element 542 is increased, whereby the voltage level of reference voltage Vref is increased. When clock signal CLK has a low frequency, the current flowing through MOS transistor 514b is reduced. In response, the amount of current supplied from level adjuster 550 to resistance element 542 is reduced. This causes reduction in the voltage level of reference voltage Vref. More specifically, the voltage level of reference voltage Vref is increased and decreased when clock signal CLK has a high frequency so that the semiconductor device operates at high speed and when clock signal CLK has a low frequency so that the semiconductor device operates at low speed, respectively. Thus, the level of reference voltage Vref can be set according to the operation rate the semiconductor device (semiconductor memory device). In a high speed operation, the voltage level of power supply voltage VCI on internal power supply line 5 is increased to allow high speed operation of the semiconductor device.

According to the structure of the twenty-first embodiment of the present invention, the frequency of a clock signal defining the operating rate of the semiconductor device is detected, and the voltage level of reference voltage Vref determining the voltage level of internal power supply voltage VCI is set according to the frequency of the detected clock signal. Therefore, internal power supply voltage VCI can be set to an appropriate level according to the operating rate of the semiconductor device. A semiconductor device (a semiconductor memory device) that operates stably can be implemented. Realization of a stable high speed operation by virtue of increase of reference voltage Vref is provided due to a reason similar to that of the previous embodiment.

Embodiment 22

Figure 99:
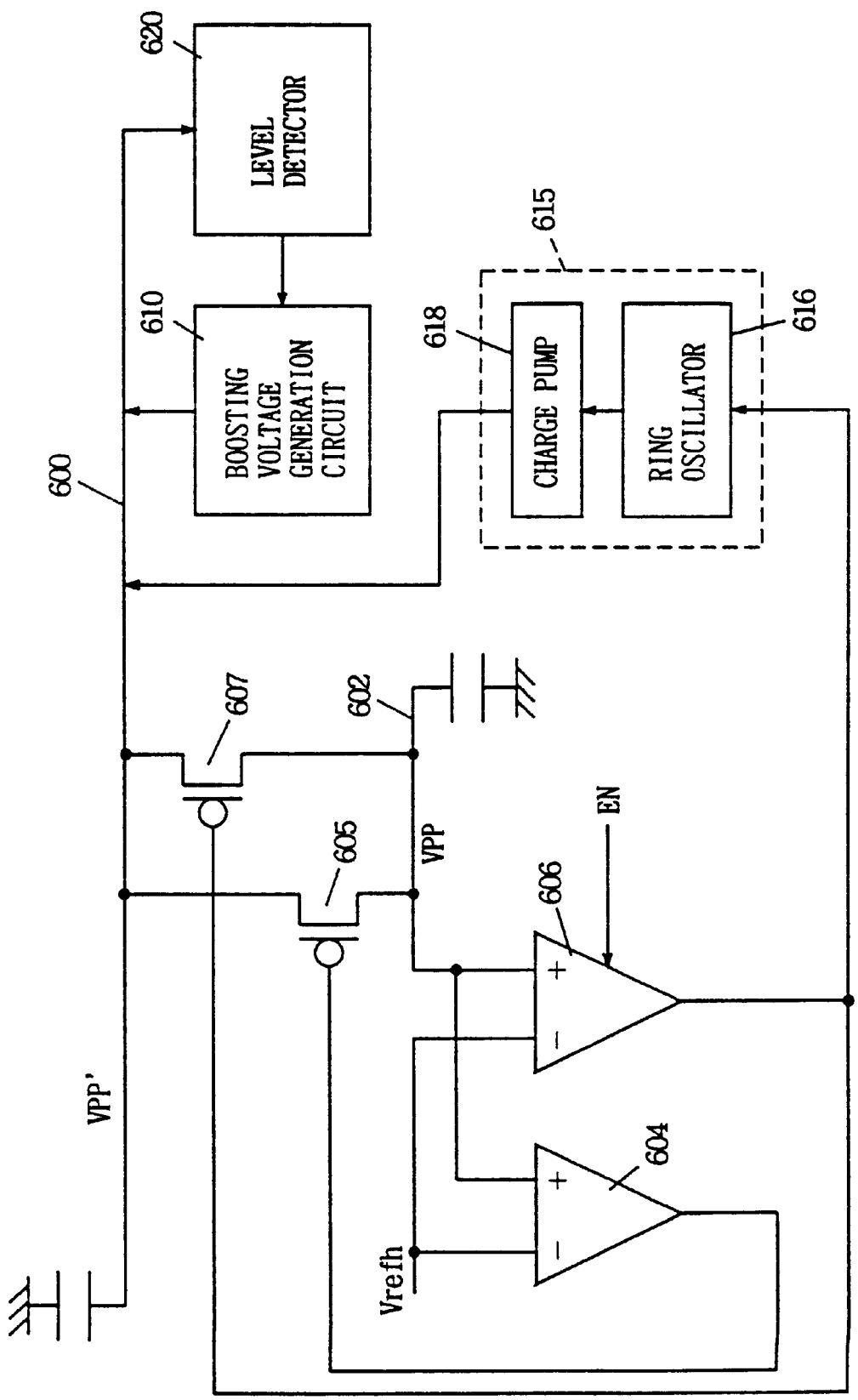
FIG. 99 schematically shows a structure of the main portion of a semiconductor device according to a twentieth embodiment of the present invention.

FIG. 99 shows a structure of the main part of a semiconductor device according to a twenty second embodiment of the present invention. According to the structure shown in FIG. 99, a high voltage VPP' higher than the power supply voltage is first generated, and a required high voltage VPP is generated from voltage VPP'.

Referring to FIG. 99, a semiconductor device includes boosting voltage generation circuits 610 and 615 for generating a high voltage VPP' of a required level on a high-voltage line 600, a comparator 604 for comparing high voltage VPP on a second high-voltage line 602 with reference voltage Vrefh, a drive element 605 formed of a p channel MOS transistor for adjusting the amount of current flowing from first high-voltage line 600 to second high-voltage line 602 according to an output signal of comparator 604, a comparator 606 activated in response to operation timing signal EN for comparing high voltage VPP on second high-voltage line 602 with reference voltage Vrefh, a second drive element 607 formed of a p channel MOS transistor for adjusting the amount of current flowing from first high-voltage line 600 to second high-voltage line 602 according to an output signal of comparator 606, and a level detector 620 for detecting the voltage level on first high-voltage line 600 for selectively suppressing or weakening generation of a boosting voltage of boosting voltage generation circuit 610 according to the detected result.

Figure 100:
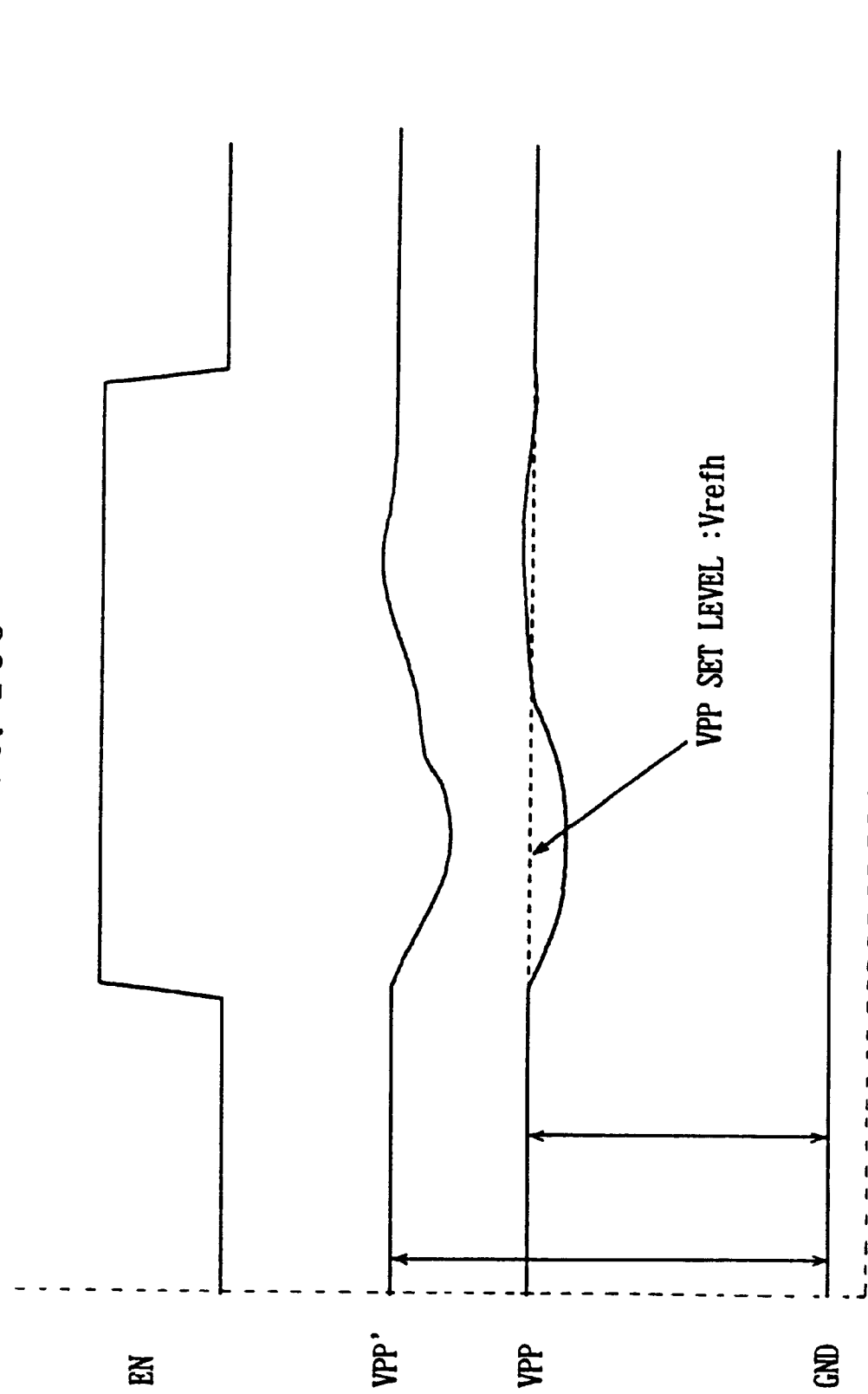
FIG. 100 is a signal waveform diagram showing an operation of the semiconductor device shown in FIG. 99.

Boosting voltage generator 615 includes a ring oscillator 616 having its oscillation frequency varied according to an output signal of comparator 606, and a charge pump 618 carrying out a charge pumping operation according to a clock signal from ring oscillator 616 to generate high voltage VPP'. The operation thereof will be described with reference to FIG. 100 which is a waveform diagram of the semiconductor device of FIG. 99. Reference voltage Vrefh has a level higher than that of internal power supply voltage VCI, and can be generated by connecting a constant current source and a resistance element between the node providing high voltage VPP' (first high-voltage line 600) and the ground node. Reference voltage Vrefh sets the voltage level of second high voltage VPP. When operation timing signal EN is inactive, a load circuit (not shown) using voltage VPP on second high-voltage line 602 attains a standby state, and voltage VPP on second high-voltage line 602 is not used, so that the voltage level of reference voltage Vrefh is substantially maintained. During a standby cycle mode, the adjusting operation of the voltage level of high voltage VPP is carried out by comparator 604 and drive element 605. Boosting voltage generation circuit 610 carries out a boosting operation under the control of level detector 620, and high voltage VPP' on first high voltage line 600 maintains a predetermined voltage level. In boosting voltage generation circuit 615, comparator 606 is inactive, and the operating current of ring oscillator 616 is reduced significantly. Therefore, the oscillation operation is substantially suppressed or carried out at an extremely low rate. Since charge pump 618 carries out a charge pumping operation according to an output signal of ring oscillator 616, substantially no charge pumping operation is carried out in this state.

When operation timing signal EN is activated, a load circuit not shown operates at a predetermined timing, whereby the current from second high-voltage line 602 is consumed by the load circuit carrying out this operation. Therefore, the voltage level of high voltage VPP is reduced. During this reduction, the level of the output signal of comparison circuit 606 is reduced, whereby current is supplied from first high-voltage line 600 to second high-voltage line 602 via drive element 607 with a relatively great driving capability to compensate for reduction in the potential of second high-voltage VPP. When the voltage level of high voltage VPP' on first high-voltage line 600 is reduced due to the supply of current to second high-voltage line 602, boosting voltage generation circuit 610 carries out a boosting operation according to an output signal of level detector 620, whereby high voltage VPP' on first high-voltage line 600 is restored to a predetermined voltage level at high speed.

Furthermore, the oscillation frequency of ring oscillator 616 included in boosting voltage generation circuit 615 is increased according to an output signal of comparator 606, whereby charge is supplied towards first high-voltage line 600 by charge pump 618. Therefore, first high voltage VPP' is restored to a predetermined voltage level at high speed.

The circuit using high voltage VPP on second high-voltage line 602 is stably supplied with high voltage VPP. According to a structure in which a comparator 604 that operates constantly and a comparator 606 that operates only when operation timing signal EN is active are provided by which drive elements 605 and 607 are driven, high voltage VPP maintaining a stable voltage level can be supplied similar to that of internal power supply voltage VCI in the previous embodiment by supplying current from first high-voltage line 600 to second high-voltage line 602 using drive element 607 having a great current driving capability when the level of high voltage VPP on second high-voltage line 602 is reduced.

In the case where current flows from first high-voltage line 600 to second high-voltage line 602 to result in reduction in high voltage VPP' a sudden change in high voltage VPP' occurs during activation of operation timing signal EN, so that high voltage VPP' on first high-voltage line 600 can be rapidly restored to a predetermined voltage level by the two boosting voltage generation circuits 610 and 615.

Figure 101:
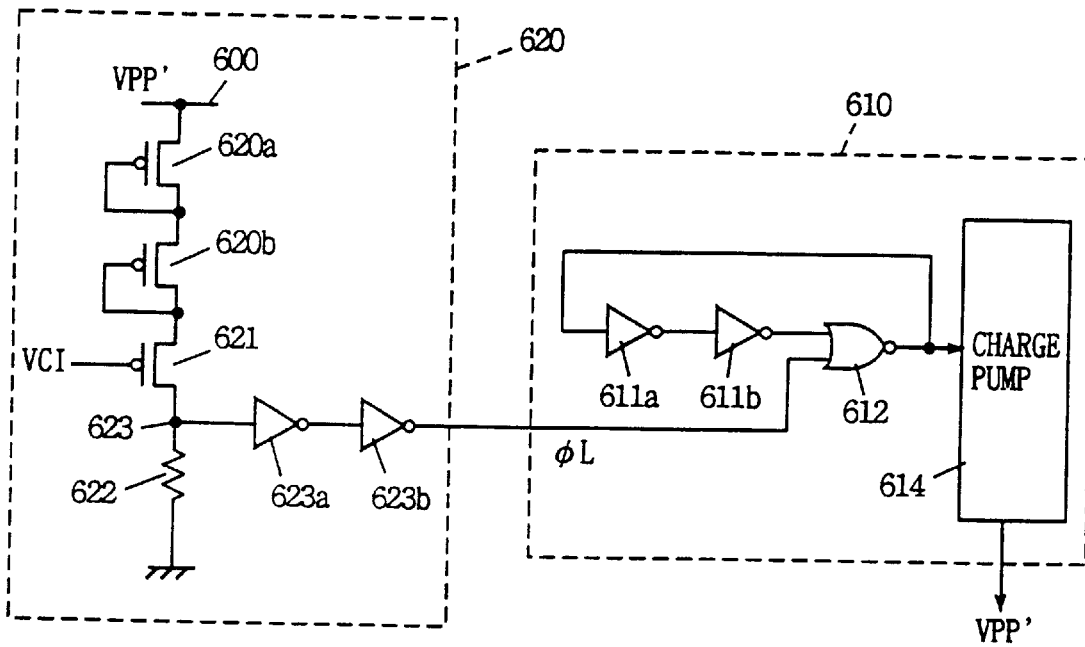
FIG. 101 schematically shows a structure of the boosted voltage generation circuit and the level detector of FIG. 99.

FIG. 101 shows an example of a structure of boosting voltage generation circuit 610 and level detector circuit 620 of FIG. 99. Level detector circuit 620 of FIG. 101 includes p channel MOS transistors 620a, 620b, and 621 connected in series between first high-voltage line 600 and node 623, a resistance element 622 connected between node 623 and the ground node, and two stages of cascade-connected inverters 623a and 623b for amplifying the potential on node 623.

P channel MOS transistors 620a and 620b each are diode-connected to cause a voltage drop in the absolute value Vthp of the threshold voltage during conduction thereof. Internal power supply voltage VCI is supplied to the gate of P channel MOS transistor 621.

Boosting voltage generation circuit 610 includes two stages of inverters 611a and 611b, a 2-input NOR gate 612 for receiving an output signal of inverter 611b and an output signal of inverter 623b in level detect circuit 620, and a charge pump 614 for carrying out a charge pump operation according to an output signal of NOR gate 612. Charge pump 614 is formed of a well-known circuit to generate high voltage VPP' by a charge pumping operation of the capacitor. Charge pump 614 preferably uses an external power supply voltage so as to generate high voltage VPP' efficiently. The operation will be described.

In level detector 620, p channel MOS transistor 621 conducts when the gate potential becomes lower than the source potential by more than the absolute value Vthp of the threshold voltage. MOS transistors 620a and 620b each cause a voltage drop of absolute value Vthp of the threshold voltage when conductive. When power supply voltage VPP' on high voltage line 600 is at least VCI+3·Vthp, MOS transistors 620a, 620b and 621 conduct, whereby current flows to resistance element 622 to pull up the potential on node 623 to a high level. A signal φL of a high level is provided by inverters 623a and 623b. In boosting voltage generation circuit 610, an output signal of NOR gate 612 is fixed to a low level, so that the charge pumping operation of charge pump 814 is inhibited.

When high voltage VPP' on first high-voltage line 600 becomes lower than VCI+3·Vthp, p channel MOS transistor 621 is rendered nonconductive, whereby the current path between first high-voltage line 600 and node 623 is cut off. This causes the potential of node 5623 to be discharged to the level of ground potential by resistance element 622, whereby output signal φL from inverter 623b is pulled down to a low level. As a result, NOR gate 612 functions as an inverter in boosting voltage generation circuit 610, and inverters 611a, 611b and NOR gate 612 form a ring oscillator. A clock signal of a predetermined frequency and a predetermined pulse width is provided to charge pump 614, whereby an operation of generating boosting voltage VPP' is carried out. Thus, high voltage VPP' is maintained at the level of VCI+3·Vthp.

First Modification of Boosting Voltage Generation Circuit 610

Figure 102:
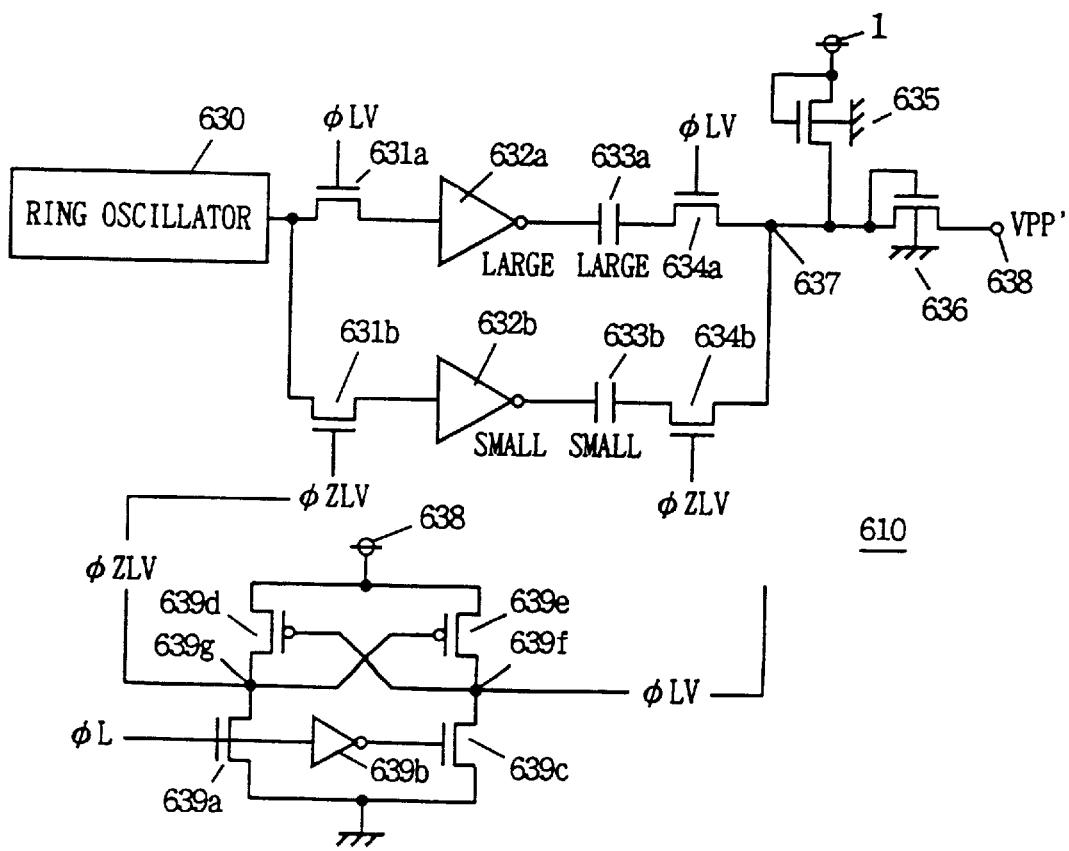
FIG. 102 shows another structure of the boosted voltage generation circuit of FIG. 99.

FIG. 102 shows a structure of a first modification of boosting voltage generation circuit 610. Referring to FIG. 102, boosting voltage generation circuit 102 includes a ring oscillator 630 for generating a clock signal, a transfer gate 631a responsive to a level detection signal φLV for passing through an output signal of ring oscillator 630, an inverter driver 632a for waveform-shaping and providing a clock signal transmitted from transfer gate 631a, a charge pump capacitor 633a for carrying out a charge pump operation according to an output signal of inverter driver 632a, a transfer gate 634a responsive to level detection signal φLV for transmitting the charge provided from charge pump capacitor 633a, a diode-connected n channel MOS transistor 635 for clamping node 637 to the level of the voltage applied to voltage source 1 (a low voltage level of the threshold voltage), and an output gate 636 formed of a diode-connected n channel MOS transistor for transmitting the charge supplied to node 637 to output node 638. MOS transistors 635 and 636 has its substrate region fixed to the level of the ground voltage. When the potential of node 637 is increased, PN junction formed between the substrate region and the impurity region is prevented from entering a forward bias state.

Boosting voltage generation circuit 610 further includes a transfer gate 631b formed of an n channel MOS transistor responsive to a level detection signal φZLV which is complementary to level detection signal φLV for transmitting a clock signal from ring oscillator 630, an inverter driver 632b for waveform-shaping a clock signal applied from transfer gate 631b, a charge pump capacitor 633b for carrying out a charge pumping operation according to a signal from inverter driver 632b, and a transfer gate 634b formed of an n channel MOS transistor responsive to level detection signal φZLV for transmitting charge provided from charge pump capacitor 633b to node 637.

The charge driving capability of driver 632a and charge pump capacitor 633a is set greater than that of inverter driver 632b and capacitor 633b. In a charge pumping operation, the amount of charge applied to node 637 in response to one change of a clock signal is determined by the capacitance of the charge pump capacitor, the width of the clock signal, and the voltage level thereof. The level of each respective charge supply capability is differentiated by appropriately selecting these parameters.

Level detection signals φLV and φZLV are provided from the level conversion circuit shown in FIG. 102. The potential of node 637 is the level of high voltage VPP'. As shown in FIG. 102, signals φLV and φZLV have the voltage swing of level detection signal φL generated from the level detection circuit of FIG. 101 and level-shifted by a level conversion circuit connected between node 638 and the ground node. This level conversion circuit includes an n channel NOS transistor 639a for receiving level detection signal φL at its gate, an inverter 639b for inverting level detection signal φL, an n channel MOS transistor 639c for receiving an output signal of inverter 639b at its gate, a p channel MOS transistor 639d connected in series between node 638 and MOS transistor 639a, and a p channel MOS transistor 639e connected in series between node 638 and MOS transistor 639c. Level detection signal φLV is provided from a node 639f, and level detection signal φZLV is provided from a node 639e.

In this level conversion circuit, MOS transistor 639a attains a conductive state and MOS transistor 639c attains a nonconductive state when level detection signal φL attains a high level. Node 639f is charged by MOS transistor 639e to the voltage level of node 638 and is driven to a high level. Node 639e is discharged by MOS transistor 639a, to be pulled down to a low level. As a result, level-converted level detection signals φLV and φZLV are provided. By generating a signal through level-conversion of the boosted voltage to serve it as a switching signal of the boosting voltage generation circuit, the loss by the threshold voltage in the MOS transistor is compensated for, and charge is transmitted efficiently.

When level detection signal φL attains a high level and high voltage VPP' is lower than a predetermined voltage level, transfer gates 631a and 634a conduct, and transfer gates 631b and 634b both attain a non-conductive state. Under this state, a charge pumping operation is carried out by inverter driver 632a having a great driving capability and/or charge pump capacitor 633a of a great capacitance. Charge injection is carried out efficiently, and high voltage VPP' of node 638 is restored at high speed to the level of a predetermined voltage.

When voltage VPP' on node 638 is greater than a predetermined voltage level, level detection signal φL attains a low level. In response, transfer gates 631a and 634 are rendered nonconductive, and transfer gates 631b and 634b are both rendered conductive. In this state, the circuit portion having a relatively small charge driving capability formed of inverter driver 632b and charge pump capacitor 633b operates, whereby a charge pumping operation with respect to node 637 is carried out. In this case, the voltage level of high voltage VPP' provided from output node 638 is just maintained.

By switching the charge supply capability of a boosting voltage generation circuit according to a voltage level of high voltage VPP', high voltage VPP' can be supplied stably and at low current consumption. Low current consumption characteristics is realized since the current consumed by inverter driver 632b is small due to its low driving capability.

Ring oscillator 630 of FIG. 102 is formed of an odd number of stages of inverters.

Second Modification of Boosting Voltage Generation Circuit

Figure 103:
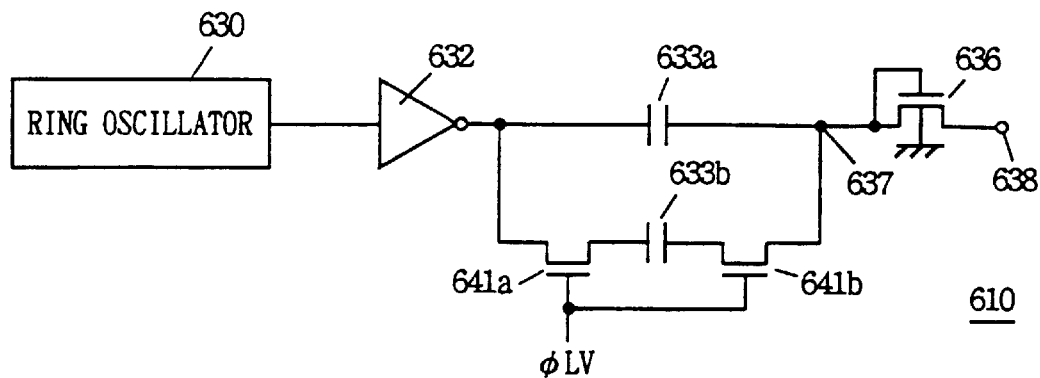
FIGS. 103–105 show a structure of second, third, and fourth modifications of the boosted voltage generation circuit of FIG. 99, respectively.

FIG. 103 shows another modification of boosting voltage generation circuit 610 of FIG. 99. Referring to 103, the boosting voltage generation circuit includes an inverter driver 632 for waveform-shaping a clock signal from ring oscillator 630, a charge pump capacitor 633a for carrying out a charge pumping operation according to an output signal of inverter driver 632, and an output transistor 636 for transmitting the charge of node 637 provided by a charge pumping operation to output node 638. For the sake of simplification, a clamp transistor (transistor 635 in FIG. 102) for clamping node 637 to a predetermined potential is not shown in FIG. 103.

The boosting voltage generation circuit of FIG. 103 further includes a charge pump capacitor 633b connected in parallel with charge pump capacitor 633a by transfer gates 641a and 641b conducting in response to level detection signal φLV. More specifically, when high voltage VPP' is lower than a predetermined voltage level, level detection signal φLV is pulled up to a high level to cause conduction of transfer gates 641a and 641b, whereby charge pump capacitor 633b is connected in parallel to charge pump capacitor 633a. The capacitance of the charge pump capacitor supplying charge to node 637 is increased, and the amount of charge stored in node 637 is increased.

This is because the amount of charge Q stored in node 637 increases in response to increase of the capacitance value C of the charge pump capacitor even when Q=C·V and the voltage changing amount V applied to inverter driver 632 is constant. Thus, a great amount of charge is transmitted to output node 638 via output transistor 636 to restore high voltage VPP' to a predetermined voltage level at high speed.

A structure may be employed in which the capacitance of charge pump capacitors 633a and 633b differ from each other, and a charge pumping operation is carried out using only one charge pump capacitor according to level detection signal φLV.

Third Modification of Boosting Voltage Generation Circuit 610

Figure 104:
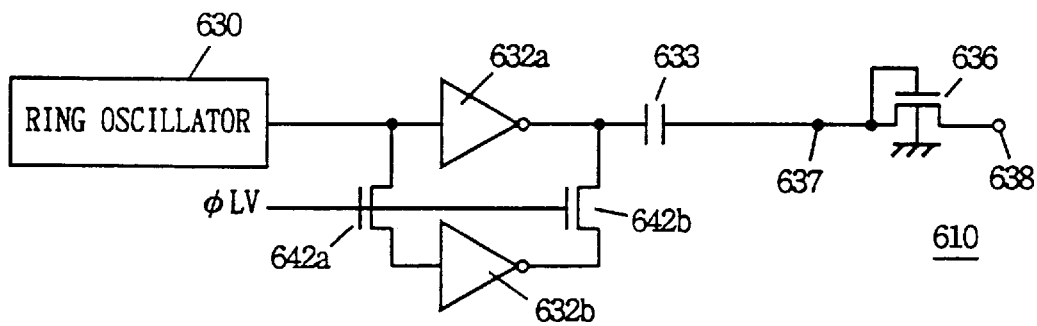

FIG. 104 shows another structure of boosting voltage generation circuit 610 of FIG. 99. In the structure shown in FIG. 104, inverter drivers 632a and 632b are employed as the inverter driver for driving a charge pumping operation. Inverter driver 632a has its input connected to the output (input of inverter driver 632a) of ring oscillator 630 via transfer gate 642a, and its output connected to the output of inverter driver 632a via transfer gate 642b. Transfer gates 642a and 642b are formed of an n channel MOS transistor to conduct in response to level detection signal φLV. For the sake of simplification, the diode-connected transistor for precharging node 637 to a predetermined voltage level is not illustrated in the structure of FIG. 104.

According to the structure shown in FIG. 104, level detection signal φLV attains a high level to cause transfer gates 642a and 642b to conduct when high voltage VPP' is lower than a predetermined voltage level. A clock signal from ring oscillator 630 is provided to two inverter drivers 632a and 632b, from which an output signal thereof is applied to one electrode of charge pump capacitor 633. Since the charge from two inverter drivers 632a and 632b is supplied to one electrode of charge pump capacitor 633, an amount of charge corresponding to the charge applied from the two drivers 632a and 632b is provided to node 637 by a charge pumping operation. Therefore, the amount of charge applied to node 637 is increased to cause a corresponding increase in the amount of charge provided to output node 638 via output transistor 636. Thus, high voltage VPP' can be restored to a predetermined voltage level at high speed. When level detection signal φLV is pulled down to a low level and high voltage VPP' is greater than a predetermined voltage level, transfer gates 642a and 642b are both rendered nonconductive, so that the output signal (clock signal) of ring oscillator 630 is applied to only inverter driver 632a. In this case, a charge pumping operation is carried out only by inverter driver 632a and charge pump capacitor 633. Thus, the operation of maintaining the voltage level of high voltage VPP' is carried out.

In the embodiment of FIG. 104, a structure may be employed in which only one of inverter drivers 632a and 632b having different driving capabilities is operated according to the logic level of level detection signal φLV.

According to the structure of FIG. 104, only one inverter driver operates so that current consumption can be reduced when high voltage VPP' is greater than a predetermined voltage level. In contrast, when high voltage VPP' is lower than a predetermined voltage level, two inverter drivers operate to allow high voltage VPP' to be driven to a predetermined voltage level at high speed.

Fourth Modification of Boosting Voltage Generation Circuit

Figure 105:
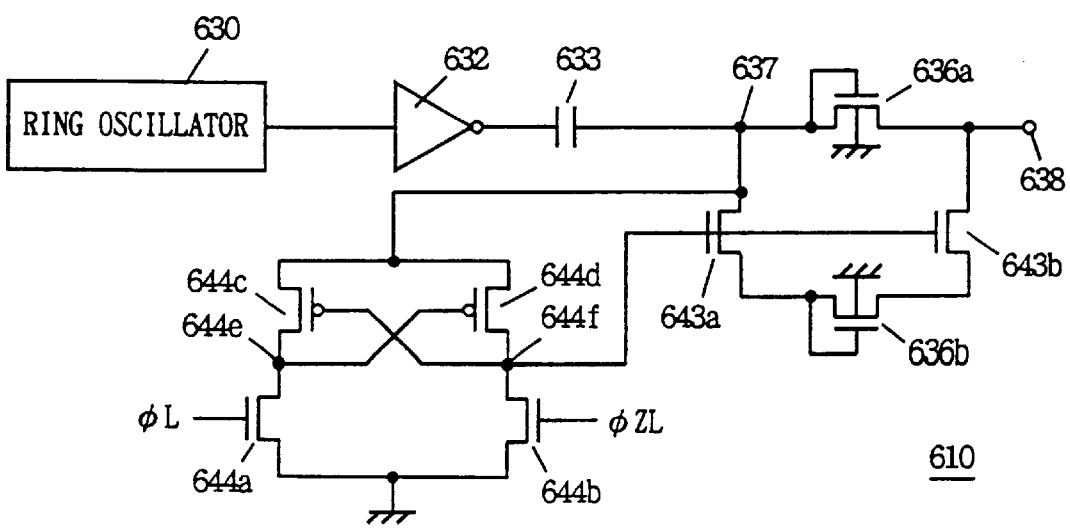

FIG. 105 shows another structure of boosting voltage generation circuit 610 shown in FIG. 99. According to the structure of FIG. 105, voltage is generated by an inverter driver 632 for shaping a clock signal from ring oscillator 630, and by a charge pump capacitor 633 for carrying out charge pumping operation according to an output signal of inverter driver 632. Two output transistors 636a and 636b are arranged between a node 637 and an output node 638. Output transistor 636b is connected between node 637 and output node 638 by transfer gates 643a and 643b conducting according to a level detection signal.

A level detection signal φLV having its level converted by a level conversion circuit is supplied to the gates of transfer gates 643a and 643b. This level conversion circuit includes an n channel MOS transistor 644a receiving level detection signal φLV at its gate, an n channel MOS transistor 644b for receiving an inversion signal φZL of level detection signal φLV at its gate, a p channel MOS transistor 644c connected between nodes 637 and 644e and having its gate connected to a node 644f, and a p channel MOS transistor 644d between nodes 637 and 644f and having its gate connected to node 644e. A signal is provided from node 644f to the gates of transfer gates 643a and 643b. A diode-connected transistor (transistor 635 in FIG. 102) for clamping node 637 to a predetermined voltage level is not shown in the structure of FIG. 105 for the sake of simplification.

When high voltage VPP' provided from node 638 is greater than a predetermined voltage level, level detection signal φL attains a low level, and level detection signal φZL attains a high level. Here, node 644f attains a low level of the ground voltage, and transfer gates 643a and 643b are both turned off. Therefore, the charge transmitted to node 637 by ring oscillator 630, inverter driver 632 and charge pump capacitor 633 is provided to output node 638 only via output transistor 636a. Therefore, a charge supply operation is carried out in a relatively gentle manner, and the operation of only maintaining the voltage level of high voltage VPP is carried out.

When high voltage VPP' from output node 638 becomes lower than a predetermined voltage level, level detection signal φL is pulled up to a high level, and level detection signal φZL is pulled down to a low level. Here, the voltage level of node 644e in the level conversion circuit attains a low level of the ground voltage. MOS a transistor 644d conducts, and the potential of node 644f attains the potential level of node 637. The potential level of node 637 changes according to the charge pumping operation of charge pump capacitor 633. Therefore, the gate voltage supplied to transfer gates 643a and 643b varies according to the potential level on node 637.

When a charge pumping operation is carried out by charge pump capacitor 633 to cause a rise in the potential of node 637, the potential level of node 637 becomes higher than that of output node 638 (the potential of node 637 is higher by the threshold voltage of output transistor 636a). Transfer gates 643a and 643b are turned off, and output transistor 636b is connected between node 637 and output node 638. This causes the charge stored in node 637 to be provided to output node 638 via output transistors 636a and 636b. Therefore, charge is transmitted from node 637 to output node 638 at high speed and efficiently. The voltage level of high voltage VPP' changes at high speed.

When the output signal of inverter driver 632 attains a low level and the potential of node 637 is reduced, output transistor 636a attains a reverse bias state to be rendered non-conductive. Here, output transistor 636b attains a reverse bias state so that output transistor 636b is rendered nonconductive even when transfer gate 643a and 643b conduct. Transfer gate 643b has its gate potential driven below that of the drain (potential of output node 638) to function as a resistance element. Therefore, the charge of output node 638 is prevented from flowing into output transistor 636b.

Thus, according to the structure of FIG. 105, when high voltage VPP' is lower than a predetermined voltage level, charge is supplied from internal node 637 to output node 638 by two output transistors to increase the transmission rate of charge provided to output node 638. The charge injection efficiency into output node 638 is increased, so that high voltage VPP' can be driven to a predetermined voltage level at high speed.

Structure of Boosting Voltage Generation Circuit 615

Figure 106:
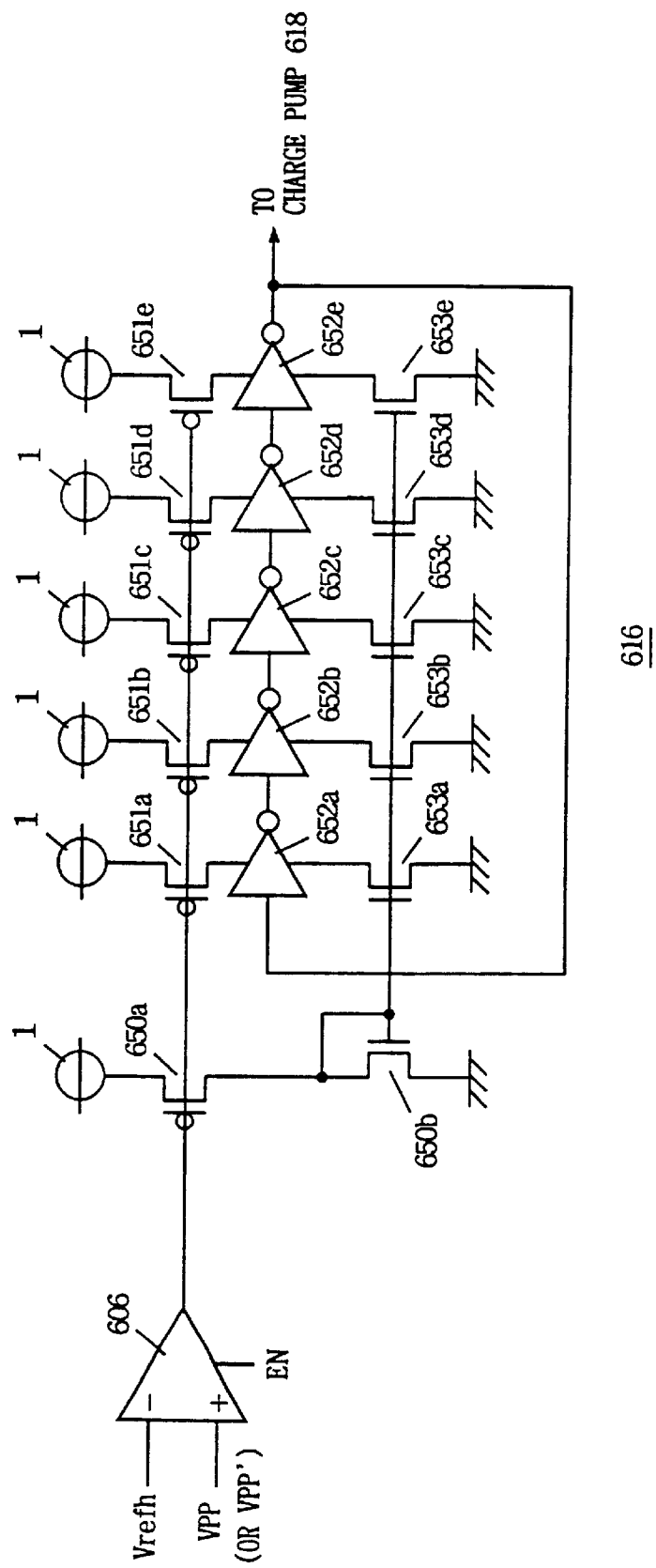
FIG. 106 shows a structure of the ring oscillator of FIG. 99.

FIG. 106 shows a specific structure of boosting voltage generation circuit 615 of FIG. 99. In FIG. 106, only the components of ring oscillator 616 is shown, and a specific structure of charge pump 618 is not provided. The structure of charge pump 618 is similar to the charge pump shown in FIGS. 102–105, and includes an inverter driver, a charge pump capacitor, and a diode-connected transistor for output and a diode-connected transistor for clamping. It is assumed that the charge supply capability of charge pump 618 is fixed.

Referring to FIG. 106, a ring oscillator 616 includes a p channel MOS transistor 610a connected to voltage source 1 to supply current according to an output signal of comparator 606, an diode-connected n channel MOS transistor 610b connected between p channel MOS transistor 610a and the ground node, p channel MOS transistors 651a–651e connected to voltage source node 1 for receiving an output signal of comparator 606 at a gate thereof, an odd number of stages of inverters 652a–652e to which operating current is supplied from p channel MOS transistors 651a–651e, respectively, and n channel MOS transistors 653a–653e provided corresponding to inverters 652a–652e, respectively, for supplying discharge current to the ground node of a corresponding one of inverters 652a–652e. MOS transistors 653a–653e have their gates connected to the gate of MOS transistor 610b. More specifically, MOS transistors 610b and 653a–653e form a current mirror circuit with MOS transistor 650b as a master stage. A clock signal is provided from inverter 652e to be received by charge pump 618. The operation will be described.

A current according to the voltage level of the output signal of comparator 606 is supplied to MOS transistor 610b by p channel MOS transistor 610a. Similarly, MOS transistors 651a–651e supply a current corresponding to the output signal of comparator 606 to corresponding inverters 652a–652e from voltage source 1. MOS transistors 653a–653e generate a current flow of a level identical to that flowing through MOS transistor 610b (when the size of MOS transistors 650b and MOS transistors 653a–653b are the same). It is also assumed here that MOS transistor 650a and MOS transistors 651a–651e have the same size.

When the output signal of comparator 606 attains a high level, the amount of current flowing through p channel MOS transistors 610a and 651a–651e is substantially null or very small. Similarly, MOS transistor 610b is supplied with current from MOS transistor 610a to generate a current flow of a level identical to that flowing through MOS transistor 610a. Therefore, a current flows in MOS transistor 653a–653e of a level identical to that of MOS transistors 651a–651e. Here, inverters 652a–652e have a very small or almost no operating current, so that its operation is extremely slow. The frequency of the clock signal provided from inverter 652e is extremely low, or hardly any oscillation operation is carried out. In this case, charge pump 618 carries out almost no, or an extremely mild, charge pumping operation.

When the output signal of comparator 606 attains a high level, the voltage level of high voltage VPP is high, so that it is not required to supply current from high-voltage line 600 to another high-voltage line 602 via a drive element. Here, the oscillation frequency of ring oscillator 616 is set to a low value, and the boosting voltage generation operation is suppressed or carried out extremely mildly. When comparator 606 is inactive during an inactive period of operation timing signal EN, the output signal of comparator 606 attains a high level substantially at the level voltage source. MOS transistors 610a and 651a–651b are substantially turned off, so that the oscillation operation of ring oscillator 616 is suppressed (since no operating current is supplied).

When operation timing signal EN is rendered active and comparator 606 attains an active state, high voltage VPP is (suddenly) varied according to the operation of the load circuit thereof. The level of the output signal of comparator 606 is reduced. In response, the amount of current flowing through MOS transistors 610a and 651a–651e increases. Accordingly, the amount of current flowing through MOS transistors 610b and 653a–653e also increases. This causes increase in the operating current of inverters 652a–652e, whereby the operating rate of inverters 652a–652e is increased. Therefore, the frequency of the clock signal provided from inverter 652e is increased, whereby charge pump 618 carries out a charge pumping operation at high speed. Charge is generated at high speed to be provided to first high-voltage line 600. The potential level of high voltage VPP' is raised. By this series of operations, reduction in high voltage VPP' during the reduction of high voltage VPP is suppressed, so that high voltage VPP can be restored to a predetermined voltage level via drive element 607 (refer to FIG. 99).

By using voltage source node 1 as the operating voltage source of ring oscillator 616 and charge pump 618, the amplitude of the clock signal thereof can be made larger than in the case where an internal power supply voltage is used. Also, the clamp potential of an internal node in the charge pump can be increased. Therefore, high voltage VPP' can be generated efficiently. This high voltage generation circuit may be used as boosting voltage generation circuit 610 shown in FIG. 99.

Another Structure of Boosting Voltage Generation Circuit

Figure 107:
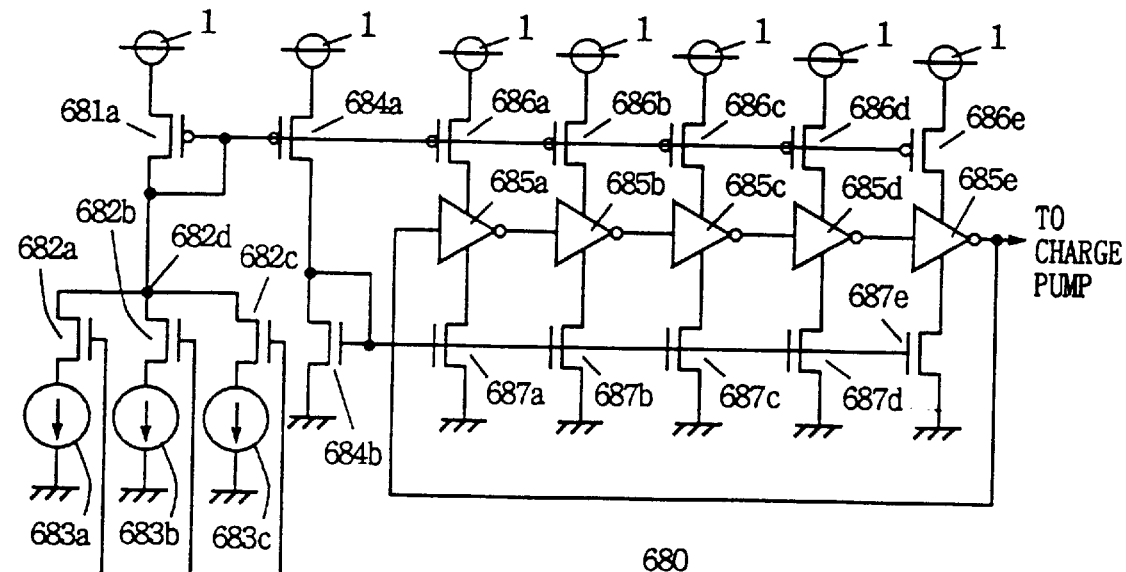
FIG. 107 shows a structure of a first modification of the twentieth embodiment of the present invention.
Figure 107:
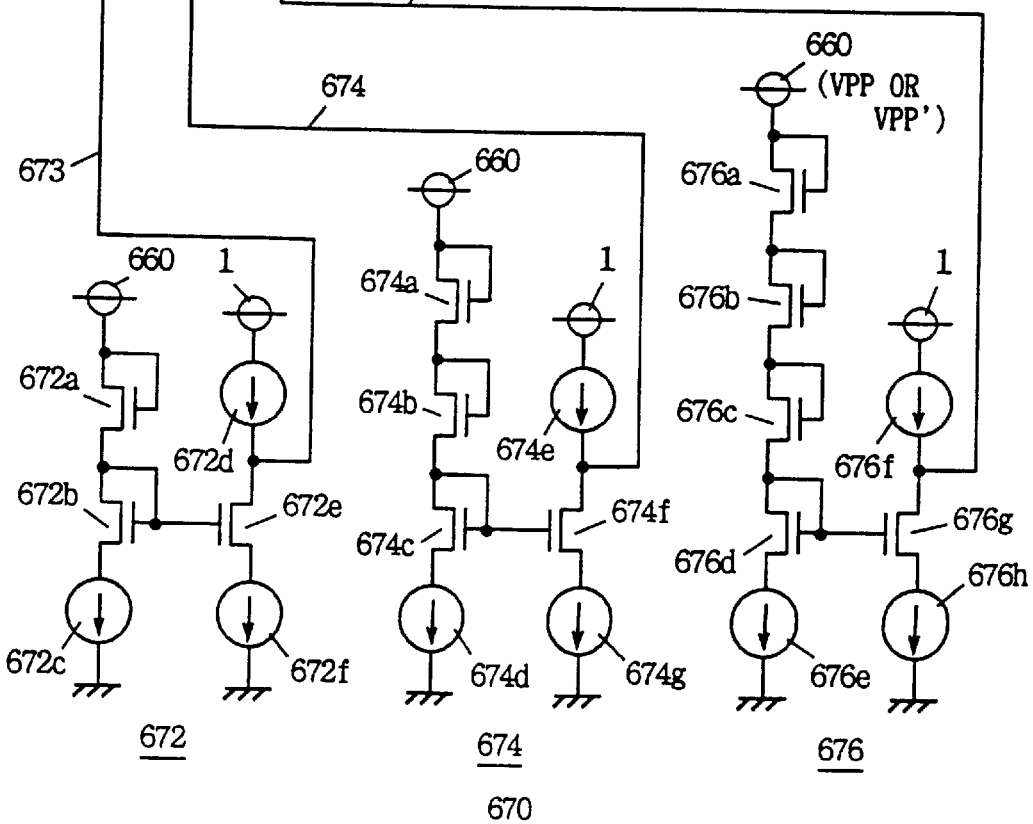

FIG. 107 shows another structure of the boosting voltage generation circuit of FIG. 99. According to the structure shown in FIG. 107, a change in the voltage level of any of first high voltage VPP and second high voltage VPP' can be detected.

Referring to FIG. 107, the boosting voltage generation circuit includes a level detector 670 for detecting the voltage level of a high voltage line 660 (first or second high-voltage line), and a ring oscillator 680 having its oscillation frequency changed in response to a detection signal of level detector 670. An output signal of ring oscillator 680 is applied to a charge pump not shown as a clock signal for driving a charge pumping operation.

Level detector 670 includes, for an example, three voltage level detectors 672, 674 and 676. First level detection unit 672 includes diode-connected n channel MOS transistors 672a–672b connected in series to high voltage node 660, a current source 672c connected between MOS transistor 672b and the ground node, a current source 672d connected to voltage source node 1 for supplying a current, an n channel MOS transistor 672e receiving a current from current source 672d and having its gate connected to the gate of MOS transistor 672b, and a current source 672f connected between MOS transistor 672e and the ground node. The current supply amount of a current sources 672c and 672f is set greater than the amount of current supplied from current source 672d.

Second level detection unit 674 includes diode-connected n channel MOS transistors 674a–647c connected in series with high voltage node 660, a current source 674d connected between MOS transistor 674c and the ground node, a current source 674e for supplying current from voltage source node 1, an n channel MOS transistor 674f supplied with current from current source 674e and having its gate connected to the gate of MOS transistor 674c, and a current source 674e connected between MOS transistor 674f and the ground node. The current supply amount of current source 674e is set smaller than the current supply amount of each of current sources 674d and 674f.

Third level detection unit 676 includes diode-connected n channel MOS transistors 676a–676d connected in series with high voltage node 660, a current source 676e connected between MOS transistor 676d and the ground node, a current source 676f connected to voltage source node 1 for supplying a current therefrom, an n channel MOS transistor 676g supplied with current from current source 676f and having a gate connected to the gate of MOS transistor 676d, and a current source 676h connected between MOS transistor 676g and the ground node. The supplying amount of current of current source 676f is set lower than that of the current sources 676e and 676h. The level detection signal of level detector 670 is transmitted on signal lines 673, 674 and 675.

Ring oscillator 680 includes a diode-connected p channel MOS transistor 681a connected between voltage source node 1 and node 682d, n channel MOS transistors 682a, 682b and 682c to node 682d connected in parallel with each other and having respective gates connected to signal lines 673, 674, and 675, and current sources 683a, 683b and 683c connected in series between each of MOS transistors 682a–682c and the ground node.

Ring oscillator 680 further includes a p channel MOS transistor 684a connected in series between voltage source node 1 and the ground node, and on n channel MOS transistor 684b. MOS transistor 684a has its gate connected to the gate of MOS transistor 681a. MOS transistor 684b has its gate and drain interconnected.

Ring oscillator 680 further includes an odd number of stages of cascade-connected inverters 685a, 685b, 685c, 685d and 685e, p channel MOS transistors 686a–686e connected to voltage source node 1 and its gate connected to the gate of MOS transistor 684a for supplying charge current to corresponding inverters 685a–685e, and n channel MOS transistors 687a, 687b, 687c, 687d and 687e connected between each of inverters 685a–685e and the ground node, and its gate connected to the gate of MOS transistor 684b. Inverters 685a–665e form a ring oscillator in an operating state. The operation thereof will be described.

First level detector 672 conducts when the voltage level of high voltage node 660 becomes greater than a first predetermined value (the sum of the operating voltage of current source 672c and the threshold voltage of MOS transistors 672a and 672b). In order to simplify the description, it is assumed that current sources 672c, 674d and 676e attain an active state when a voltage of at least the level of voltage VT is applied. Furthermore, the threshold voltages of the MOS transistors are all Vth.

In first level detector 672, MOS transistors 672a and 672b conduct through which a current flows in the path thereof when the voltage level of high voltage node 660 is at least VT+2·Vth. In response, MOS transistor 672e conducts, whereby the current supplied from current source 672d is discharged according to the amount of current driven by current source 672f. The amount of discharge current of current source 672f is greater than that supplied by current source 672a. Therefore, the voltage level on signal line 673 attains a low level. When the voltage of high voltage node 660 is smaller than VT+2·Vth, MOS transistors 672a and 672b are rendered nonconductive, so that no current flows in these MOS transistors. In response, no current will flow in MOS transistor 672e (the gate potential of MOS transistor 672e is identical to that of MOS transistor 672b, and attains a low level when no current flows). Therefore, the potential on signal line 673 is charged by current source 672d to be pulled up to a high level.

In second level detector 674, the potential of signal line 674 is pulled down to a low level and a high level when the voltage level of high voltage node 660 is VT+3·Vth and lower than VT+3·Vth, respectively.

In third level detector 676, current flows when the voltage level of high voltage node 660 is at least VT+4·Vth to pull down the potential on signal line 675 to a low level. When the potential of high voltage node 660 is lower than the VT+4·Vth, signal line 675 is charged by current source 676f to be pulled up to a high level.

In ring oscillator 680, MOS transistors 682a–682c are selectively conductive according to the potential on signal lines 673–675. More specifically, when all the potential on signal lines 673–675 attains a high level, i.e. when the voltage of high voltage node 660 is lower than VT+2·Vth, all MOS transistors 682a–682c conduct, and a great amount of current flows to MOS transistor 681a by current sources 683a–683c. When all the potential on signal lines 673–675 attain a low level, i.e., when the voltage on high voltage node 660 is at least VT+4·Vth, all MOS transistors 682a–682c are rendered non-conductive, so that current does not flow to MOS transistor 681a.

MOS transistors 684a and 686a–686e form a current mirror circuit with MOS transistor 681a, so that an amount of current corresponding to the current flowing through MOS transistor 681a is generated. MOS transistor 684b generates an amount of current of a level identical to that flowing through MOS transistor 684a (in the case of the same size). In response, a current amount identical to that flowing through MOS transistor 684b flows also in MOS transistors 687a–687e (in the case of the same size).

MOS transistors 686a–686e and MOS transistors 687a–687e determine the operating current of inverters 685a–685e. Therefore, when the amount of current flowing through MOS transistor 681a is great, i.e., when the voltage level of high voltage node 660 is low, a great amount of operating current is supplied to inverters 685a–685e, which in turn operate at high speed. In response, the frequency of the clock signal output from ring oscillator 680 is increased, so that a charge pumping operation is carried out at high speed in the charge pump (not shown). When the amount of current flowing through MOS transistor 681a is very low or null, the voltage on high voltage node 660 is high. Here, the operating current of inverters 685a–685e is low to suppress the operation or allow operation at an extremely low speed of inverters 685a–685e. Accordingly, the charge pump supplies charge extremely mildly or inhibits the charge pumping operation.

According to the above structure, the potential level of high voltage node 660 can be rapidly restored to a predetermined potential level by adjusting the oscillation frequency of the ring oscillator according to a voltage level of high voltage node 660. When the voltage level of high voltage node 660 is high and no high speed operation is required, the operating current is lowered to reduce current consumption.

Second Modification of Boosting Voltage Generation Circuit

FIG. 10 shows a modification of boosting voltage generation circuit 610 or 615 shown in FIG. 99. Different from the structure shown in FIG. 107, a driving current source 690 applying an operating current of the inverter forming a ring oscillator has its amount of driving current varied in an analog manner by a control signal that varies in an analog manner from a level detector that will be described afterwards. Therefore, the frequency of a ring oscillator is varied in an analog manner according to the voltage level of the high voltage node.

Figure 108:
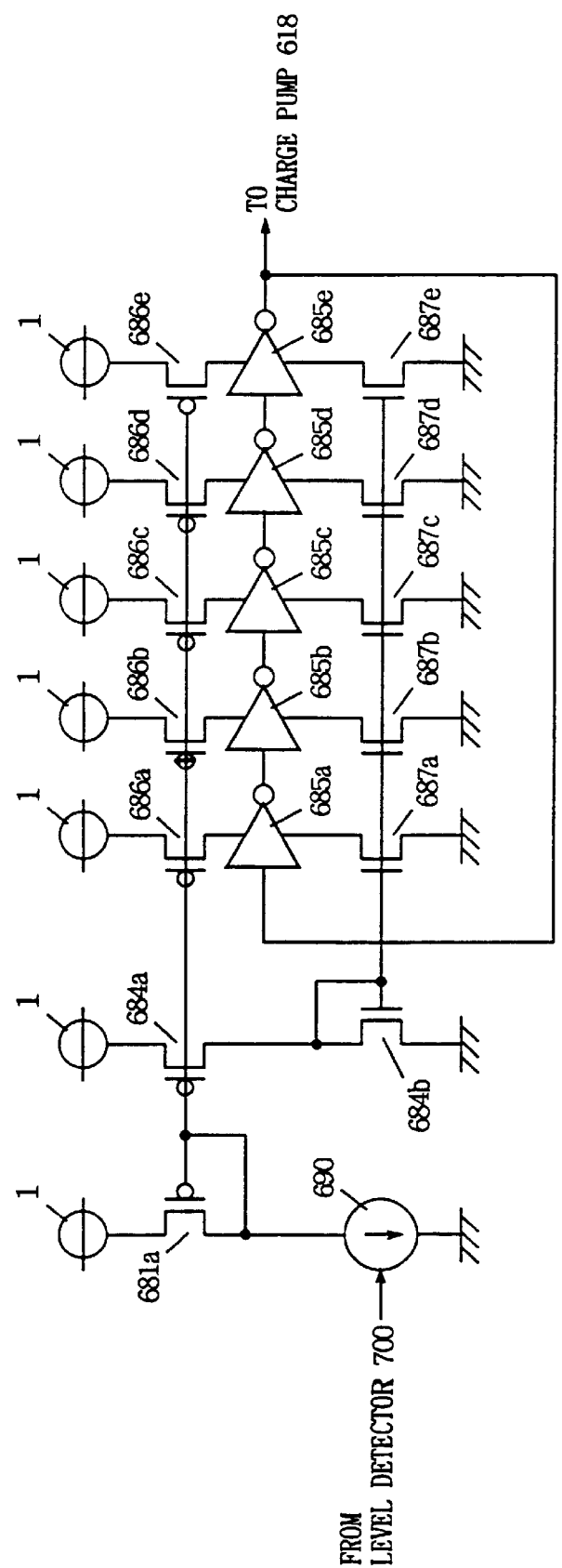
FIG. 108 shows a modification of the structure shown in FIG. 107.

In FIG. 108, components corresponding to those in the ring oscillator of FIG. 107 have the same reference characters denoted, and their details will not be repeated.

Figure 109:
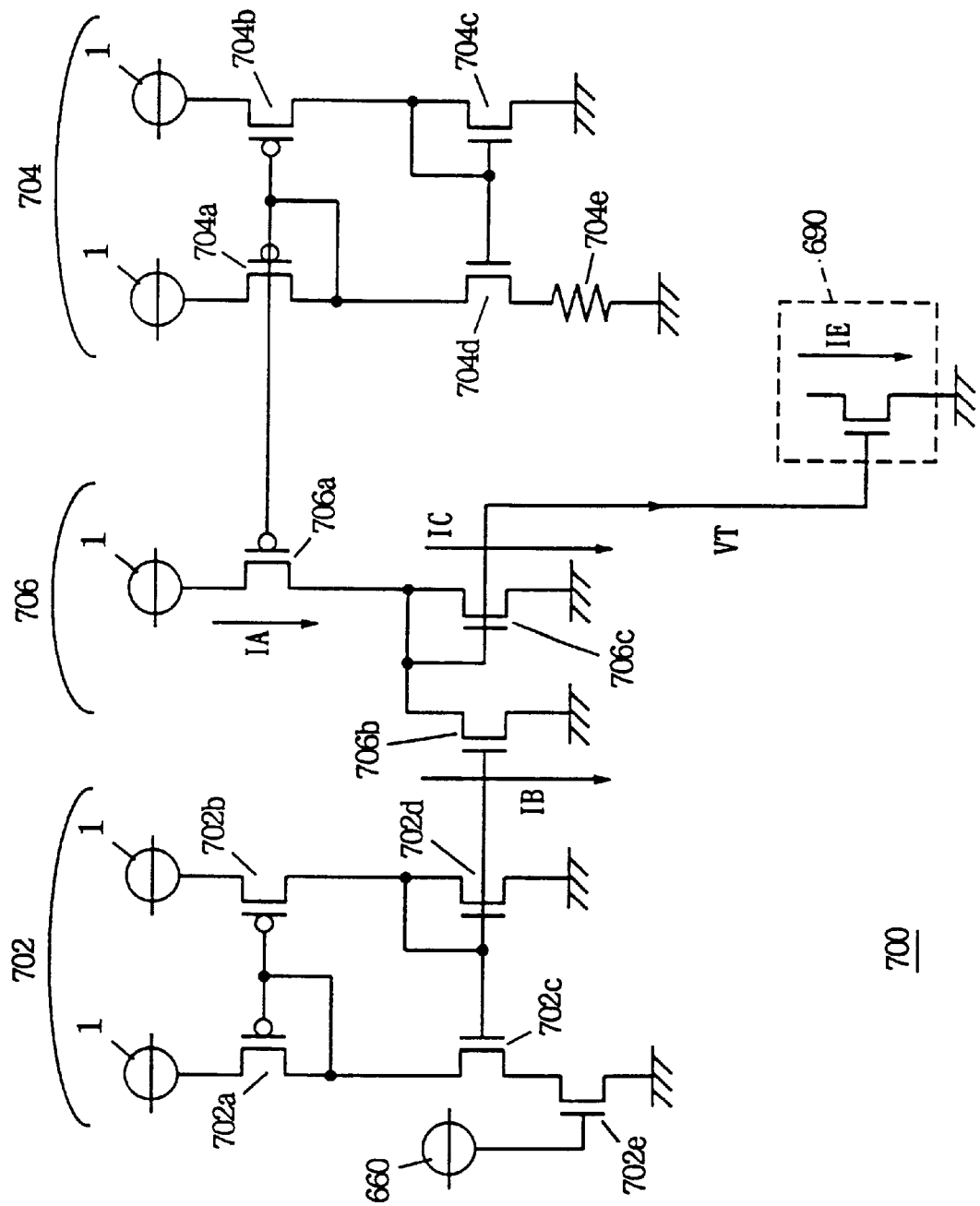
FIG. 109 shows a structure of a load current control unit of FIG. 108.

FIG. 109 shows a structure of level detector 700 providing a signal for adjusting the operating current of the ring oscillator shown in FIG. 108. Referring to FIG. 109, a level detector 700 includes a reduction current source 702 for supplying a reduction current IB having its current value varied according to the voltage level of high voltage node 660, a constant current source 704 for continuously supplying a constant current, ' and a subtraction circuit 706 for combining (subtracting) the output signals of reduction current source 702 and constant current source 704 for providing a signal VT to adjust the amount of current flowing through driving current source 690 shown in FIG. 108.

Reduction current source 702 includes p channel MOS transistors 702a and 702b forming a current mirror circuit connected to voltage source node 1, an n channel MOS transistor 702c supplied with current from MOS transistor 702a, a resistance-connected n channel MOS transistor 702d to which current is supplied from MOS transistor 702b, and an n channel MOS transistor 702e connected between MOS transistor 702c and the ground node, and receiving a signal on high voltage node 660 at its gate.

MOS transistor 702d has its gate connected to the gate of MOS transistor 702c. MOS transistor 702c has its current driving capability (β or channel width) set sufficiently greater than that of MOS transistor 702d. MOS transistor 702a has its gate and drain interconnected.

Constant current source 704 includes p channel MOS transistors 704a and 704b connected to voltage source node 1 and forming a current mirror circuit, an n channel MOS transistor 704d supplied with current from MOS transistor 704a, a resistor-connected n channel MOS transistor 704 connected between MOS transistor 704b and the ground node, and a resistance element 704e connected between MOS transistor 704d and the ground node. MOS transistor 704a has its gate and drain interconnected. The current supply amount of MOS transistor 704d is set sufficiently greater than that of MOS transistor 704c.

Subtraction circuit 706 includes a p channel MOS transistor 706a connected to voltage source node 1, and its node connected to the gates of MOS transistors 704a and 704b, an n channel MOS transistor 706c supplied with current from p channel MOS transistor 706a to draw out a constant amount of current IC, and an n channel MOS transistor 706b connected between MOS transistor 706a and the ground node, and its gate connected to the gates of MOS transistors 702c and 702d. The operation will now be described.

In constant current source 704, MOS transistor 704c operates in a saturation region, and the drain current I is represented by square characteristics. MOS transistor 704d has a current supply capability of a sufficient level, and the gate-source potential is substantially the threshold voltage Vth. Therefore, a current according to the source potential of MOS transistor 704d flows into resistance element 704e. Current from MOS transistor 704a is supplied to MOS transistor 704d. MOS transistors 704a and 704b form a current mirror circuit. Therefore, a mirror circuit of the current flowing through MOS transistor 704d flows through MOS transistors 704b and 704c. Eventually, a current represented as:

$$Id=\beta(Vgs\ (704)-Vth)^2$$

flows to MOS transistor 704c. Vgs (704) is the gate-source voltage of MOS transistor 704c. Therefore, a current represented as:

$$I=(Vgs\ (704)-Vth)/R(704e)$$

flows through resistance element 704e. R (704e) represents the resistance of resistance element 704e. Eventually, Id=I when the size of MOS transistors 704a and 704b are identical, and the gate potential of MOS transistor 704e becomes constant. Therefore, a current provided by constant potential Vgs (704) and the resistance value R (704e) of resistor 704e flows.

Instead of resistor 704e of constant current source 704, reduction current source 702 has an MOS transistor 702e having its gate connected to high voltage node 660. The channel resistance of MOS transistor 702e varies according to the voltage level of high voltage node 660. In this case, a current IB according to the voltage level of high voltage node 660 flows from reduction current source 702 according to a similar operation (it is assumed that MOS transistor 702d and MOS transistor 706b have the same size). An increase in the voltage level of high voltage node 660 causes reduction in the channel resistance of MOS transistor 702e, whereby reduction current IB increases. When the voltage level of high voltage node 660 is reduced, the channel resistance of MOS transistor 702e is increased to reduce reduction current IB.

In subtraction circuit 706, a current IA of a level determined by constant current source 704 flows via MOS transistor 706a. This current IA has a constant value. Constant current IA flows through MOS transistors 706b and 706c. Currents IB and IC flowing through MOS transistors 706b and 706c satisfy the relationship of IA=IB+IC. Therefore, an increase in reduction current IB causes the reduction in constant current IC (reduction of VT), and reduction of reduction current IB causes the increase in constant current IC (increase of VT). Constant current IC flows via the MOS transistor forming driving current source 690. Therefore, the current flowing through driving current source 690 shown in FIG. 108 can be adjusted according to the voltage level of high voltage node 660. Thus, the oscillation frequency of the ring oscillator can be adjusted.

Figure 110:
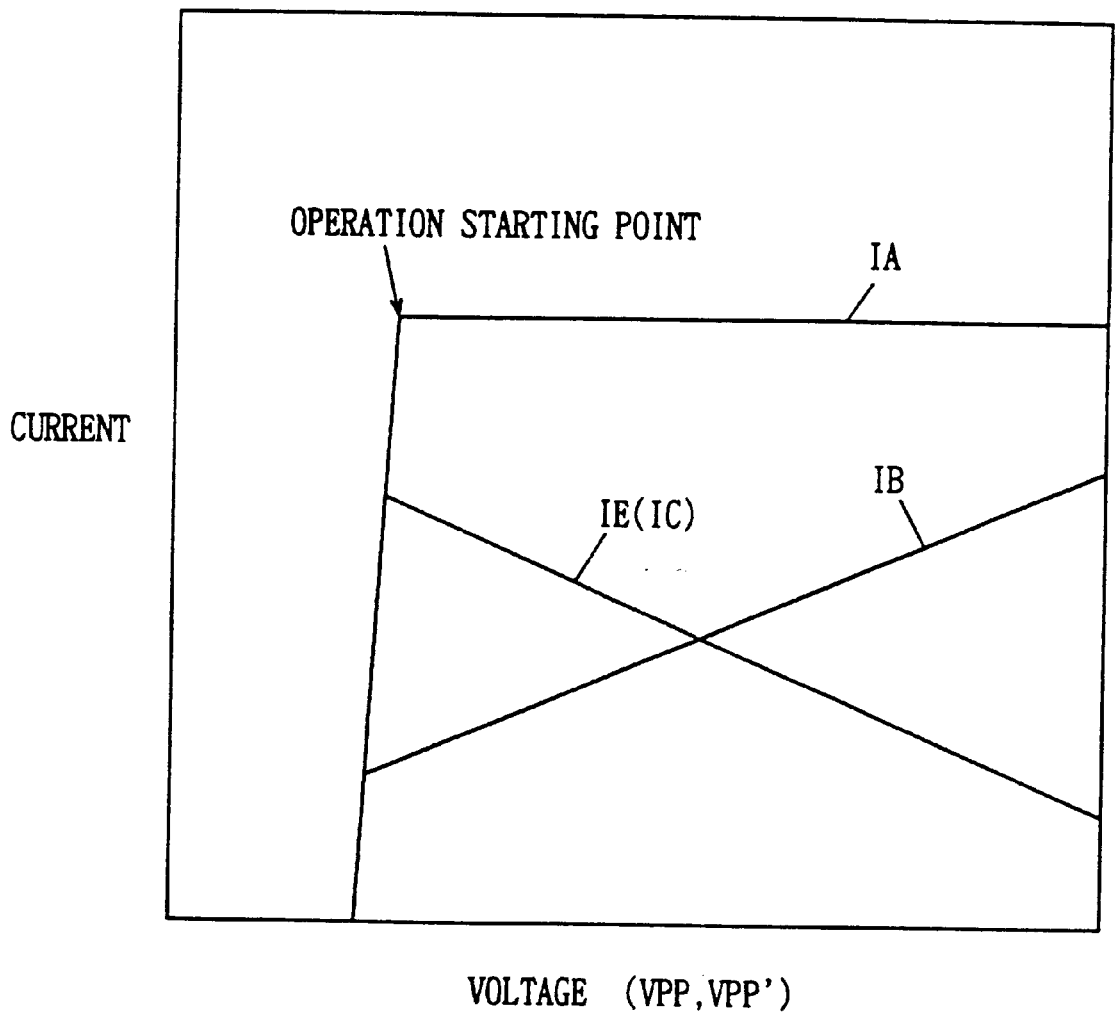
FIG. 110 shows an operation of the circuit of FIG. 109.

As shown in FIG. 110, each MOS transistor conducts when the voltage of a high voltage node 660 becomes greater than a predetermined voltage, whereby current flows in each circuit portion, resulting in the flow of constant current IA. Reduction current IB increases as the voltage level of the voltage (VPP or VPP') of high voltage node 660 increases. Since constant current IE (IC) is represented by the difference between constant current IA and reduction current IB, it decreases according to the rise of the level of high voltage (VPP or VPP') of voltage node 660. Therefore, the oscillation frequency of the ring oscillator for generating a high voltage can be reduced according to the level of the high voltage.

A structure may be employed in which an output signal complementary to the output signal of comparator 606 shown in FIG. 99 is applied to the gate of MOS transistor 702e. Alternatively, a structure may be employed in which a p channel MOS transistor is used as MOS transistor 702e to which gate the output signal of comparator 606 shown in FIG. 99 is supplied.

A structure for adjusting the oscillation frequency of the ring oscillator shown in FIGS. 108 and 109 may be provided in which the oscillator frequency is increased during reduction of the operating power supply voltage. Furthermore, an internal power supply voltage, and not an external power supply voltage, may be applied to voltage source node 1 of FIG. 109.

According to the structure of the twenty second embodiment of the present invention, the circuit structure of generating a second high voltage that is actually used by a load circuit from the first high voltage is provided to increase the driving capability of the boosting voltage generation circuit at the change of the first or second high voltage. Therefore, high voltage can be supplied to the load circuit stably. Thus, the load circuit can be operated stably.

The structure of the twenty second embodiment has a high voltage first generated from a power supply voltage, and then has second high voltage. However, the structure of the twenty second embodiment can be applied to any circuits that first generates a voltage of a different voltage level from the power supply voltage and then generates a required voltage from this different voltage level.

Embodiment 23

Figure 111:
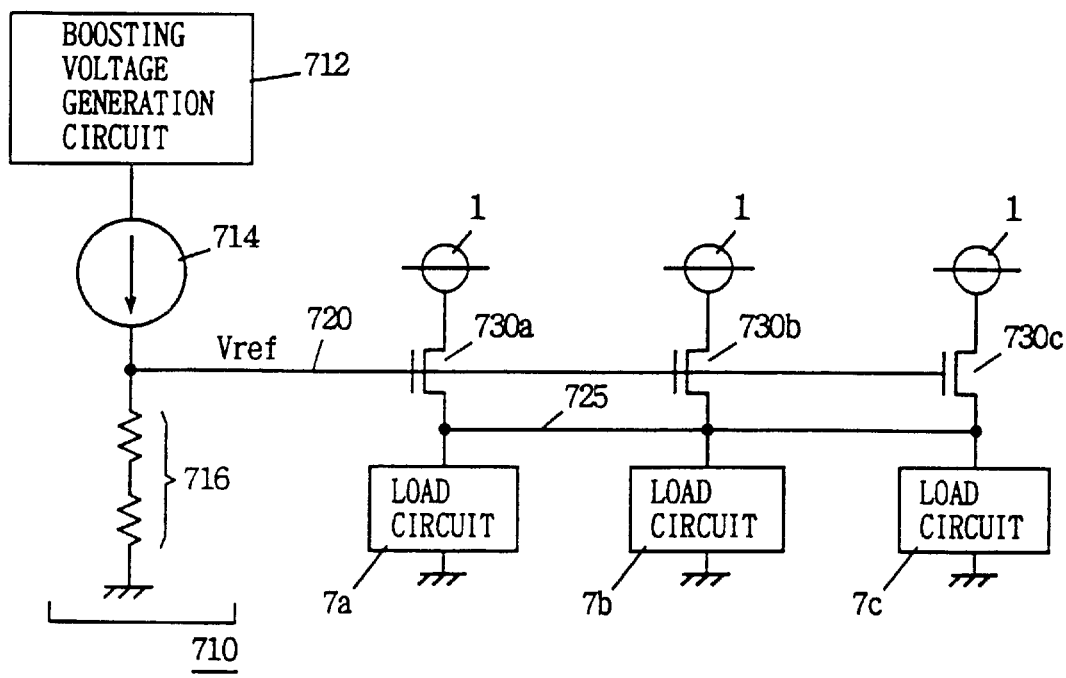
FIG. 111 schematically shows a structure of a semiconductor device according to a twenty third embodiment of the present invention.

FIG. 111 schematically shows a structure of an internal power supply voltage generation circuit according to a twenty third embodiment of the present invention. Referring to FIG. 111, an internal power supply voltage generation circuit includes a reference voltage generation circuit 710 for generating a reference voltage Vref, and a plurality of drive elements 730a–730c arranged in a distributed manner corresponding to a plurality of load circuits 7a–7c, respectively, for transmitting an internal power supply voltage to internal power supply line 725 according to a reference voltage Vref transmitted via reference voltage transmission line 720. Each of drive elements 730a–730c is formed of an n channel MOS transistor. Each drive element operates in a source follower manner to supply current from voltage source node 1 to internal power supply line 725. The power supply voltage on internal power supply line 725 maintains the voltage level of Vref=Vth.

Reference voltage generation circuit 710 includes a boosting voltage generation circuit 712 for generating a boosting voltage of a level higher than the voltage applied to voltage source node 1, a constant current source 714 connected to boosting voltage generation circuit 712 for supplying a constant current, and a resistance element 716 connected between constant current source 714 and the ground node. Boosting voltage generation circuit 712 is provided in reference voltage generation circuit 710 for the purpose of generating a voltage higher than the internal power supply voltage on internal power supply line 725 by the threshold voltage of drive elements 730a–730c.

When the power supply potential on internal power supply line 725 is reduced, drive elements 730a–730c supply a current from voltage source node 1 to increase the potential level on internal power supply line 725. Since a drive element is provided corresponding to each of load circuits 7a–7c, the current supply capability to internal power supply line 725 is increased to suppress voltage reduction caused by interconnection line resistance or the like in internal power supply line 725. By arranging drive elements 730a–730c corresponding to load circuits 7a–7c, respectively, the distance between drive elements 730a–730c and load circuits 7a–7c is reduced. Accordingly, the delay of the voltage change due to line resistance and line capacitance can be compensated for. Current can be supplied from voltage source node 1 to internal power supply line 725 by drive elements 730a–730c according to voltage change during operation of load circuits 7a–7c. Thus, the response characteristic is improved. As to the operation of drive elements 730a–730c, the gate potentials of drive elements 730a–730c rise equivalently when the potential of internal power supply line 725 is reduced. In response, the drain current is increased to prevent the potential reduction of internal power supply line 725.

Modification

Figure 112:
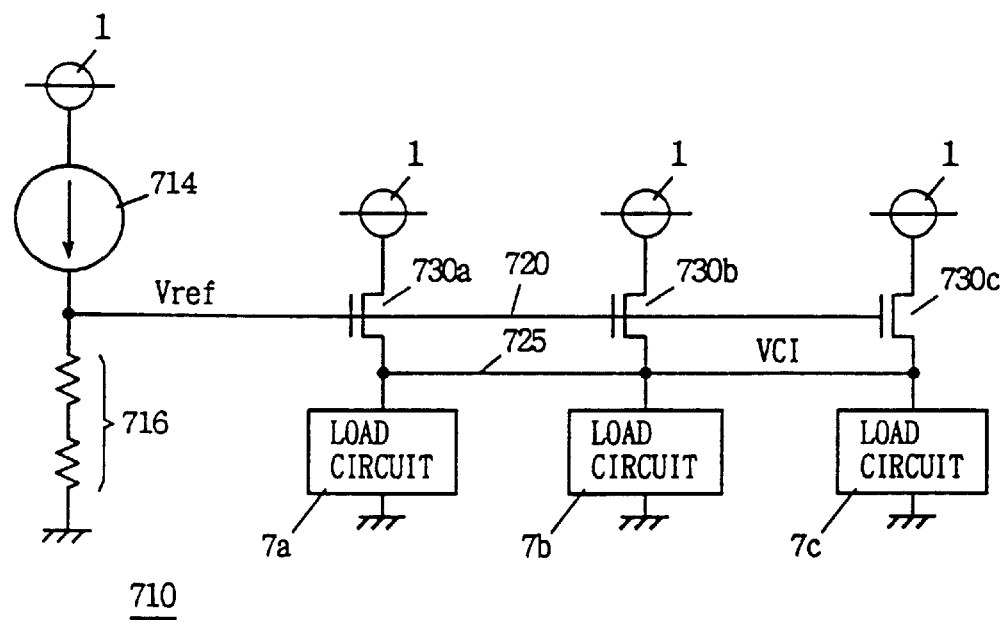
FIG. 112 shows a structure of a modification of the twenty third embodiment of the present invention.

FIG. 112 shows a modification of the twenty third embodiment. Referring to FIG. 112, a reference voltage generation circuit 710 generates a reference voltage Vref from voltage source node 1 receiving an external power supply voltage. A boosting voltage generation circuit 712 is not used. Here, the threshold voltage of the n channel MOS transistor forming drive elements 730a–730c is set to 0 V, or an MOS transistor of a low threshold voltage is used. A depletion type MOS transistor may be used as drive elements 730a–730c. The potential level of reference voltage Vref is determined by internal power supply voltage VCI and the threshold voltage Vth of the MOS transistor forming drive elements 730a–730c (VCI+Vth=Vref).

Since boosting voltage generation circuit 712 is not used in the structure shown in FIG. 112, the current consumption in this reference voltage generation circuit can be reduced significantly. When this structure of an internal power supply voltage generation circuit is applied to, for example, a semiconductor memory device, a comparator for driving a drive element and a boosting voltage generation circuit are not required. Therefore, a semiconductor memory device with low current consumption characteristics can be realized. When this structure is particularly applied into a semiconductor memory used as a storage device in a battery driven type computer such as a personal computer, an internal power supply voltage generation circuit that can reduce power consumption significantly in a data holding mode can be realized.

According to the structure shown in FIGS. 111 and 112, division internal power supply lines that are isolated from each other and provided corresponding to respective load circuits 7a–7c may be used for internal power supply line 725.

Embodiment 24

Figure 113:
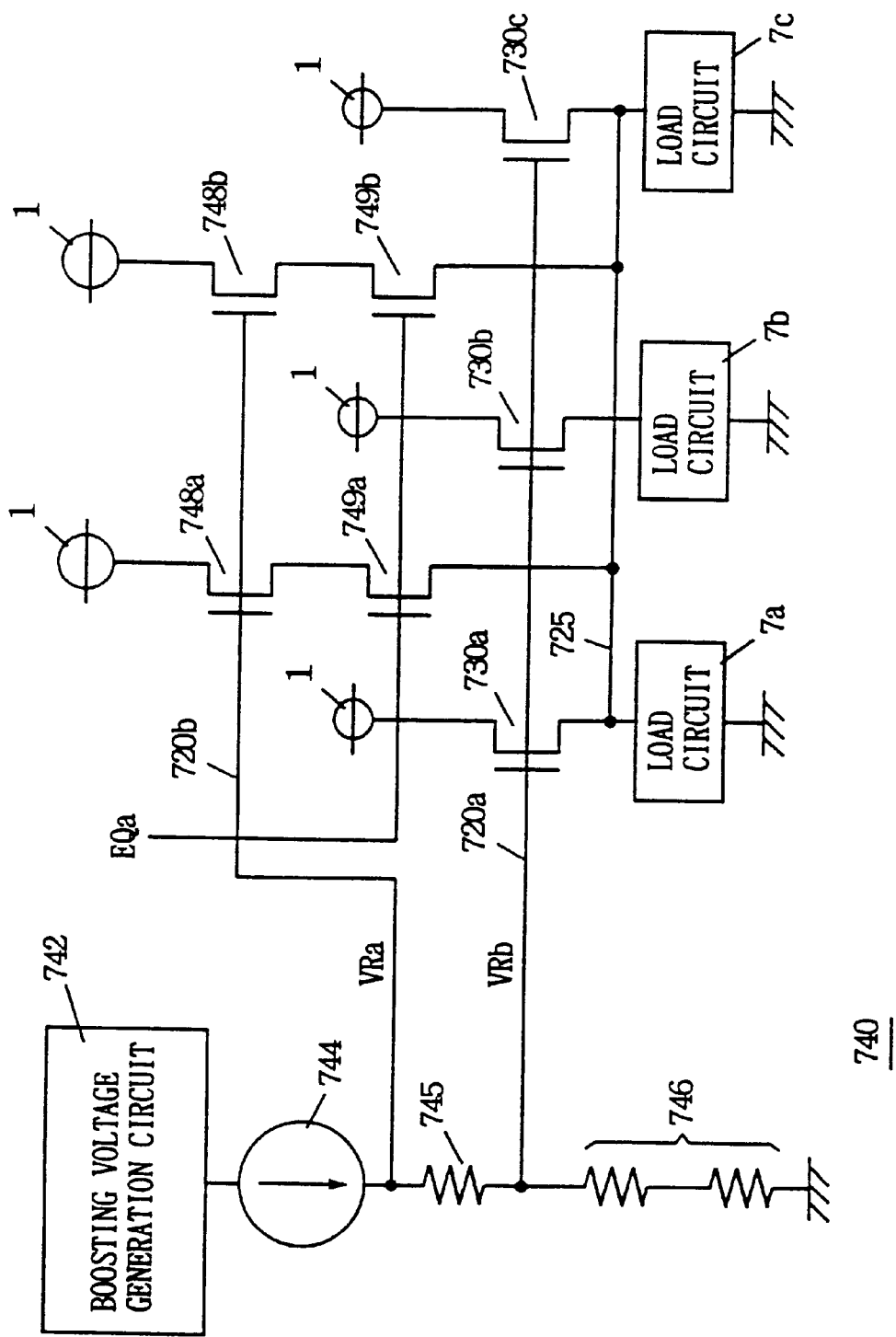
FIG. 113 schematically shows a structure of a semiconductor device according to a twenty fourth embodiment of the present invention.

FIG. 113 shows a structure of an internal power supply voltage generation circuit according to a twenty fourth embodiment of the present invention. Referring to FIG. 113, an internal power supply voltage generation circuit includes a reference voltage generation circuit 740 for generating reference voltages VRa and VRb differing in voltage level from each other. Reference voltage generation circuit 740 includes a constant current source 744 connected to a boosting voltage generation circuit 742 that generates a boosting voltage of a level higher than that of the power supply voltage (both internal and external power supply voltages) for supplying a constant current, and resistance elements 745 and 746 connected in series between constant current source 744 and the ground node. Reference voltage VRa is provided from the connection node of constant current source 744 and resistance element 745. Reference voltage VRb is provided from the connection node of resistance elements 745 and 746. Reference voltage VRa has a voltage level determined by the current supplied from constant current source 744 and the combined resistance values of resistance elements 745 and 746. Reference voltage VRb has a voltage level determined by the value of the current supplied from constant current source 744 and the resistance value of resistance element 746.

Figure 76:
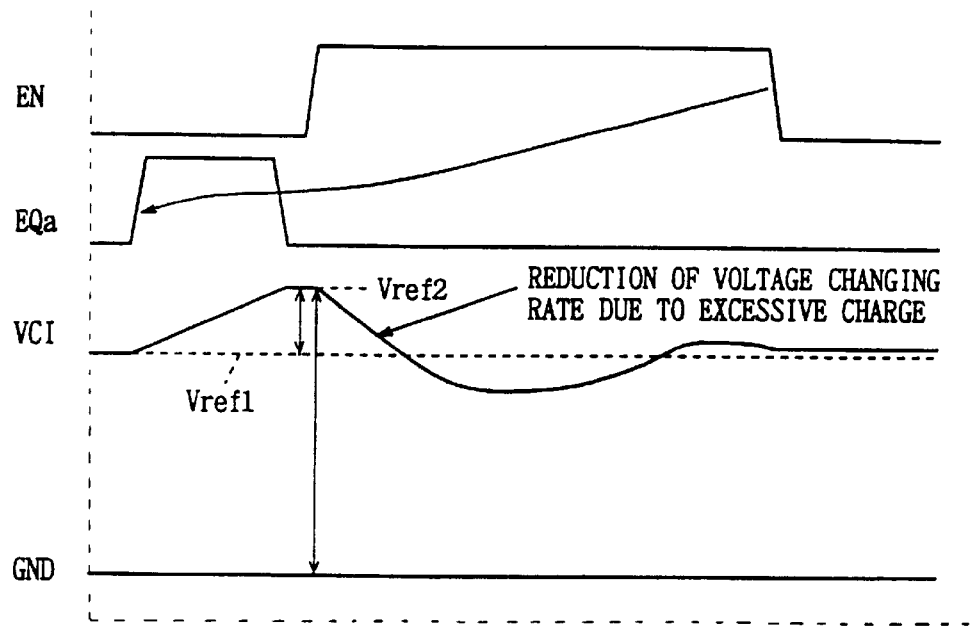
FIG. 76 is a signal waveform diagram showing an operation of the semiconductor device of FIG. 75.

The internal power supply voltage generation circuit further includes drive elements 730a–730c arranged corresponding to a plurality of load circuits 7a–7c, respectively, and formed of an n channel MOS transistor for supplying current from voltage source node 1 to internal power supply line 725 according to reference voltage VRb, drive elements 750a and 750b formed of an n channel MOS transistor having one conduction node connected to voltage source node 1 and a gate receiving reference voltage VRa, and switching transistors 752a and 752b connected in series with drive elements 750a and 750b, and formed of an n channel MOS transistor conducting in response to an operation timing signal EQa. Similar to operation timing signal EQa shown in FIG. 76 and 77, operation timing signal EQa is rendered active at a high level for a predetermined time period prior to activation of load circuits 7a–7c.

When operation timing signal EQa is inactive, switching transistors 752a and 752b are both nonconductive. The current path between drive elements 750a and 750b and internal power supply line 725 is cut off. Here, the voltage level on internal power supply line 725 is set to a level determined by reference voltage VRb and the threshold voltage of drive elements 730a–730c by drive elements 730a–730c. Operation timing signal EQa is activated for a predetermined time period prior to operation of load circuits 7a–7c, and switching transistors 752a and 752b are both rendered conductive. Here, a current path between drive elements 750a and 750b and internal power supply line 725 is formed. The voltage level on internal power supply line 725 rises to a level that is determined by reference voltage VRa and the threshold voltages of drive elements 750a and 750b.

Since a boosted voltage is used during the operation of load circuits 7a–7c, the voltage level on internal power supply line 725 can be prevented from becoming lower than reference voltage VRb. Therefore, the voltage level on internal power supply line 725 can be maintained at a predetermined voltage level. More specifically, during the operation of load circuits 7a–7c, the level of the power supply voltage on internal power supply line 725 is raised to the level of reference voltage VRa, and the current supply capability of internal power supply line 725 is increased by using the stored charge of internal power supply line 725. In response, the reduction in the level of the power supply voltage on internal power supply line 725 is suppressed. Therefore, the power supply voltage on internal power supply line 725 does not decrease even when a great amount of current is consumed during operation of load circuits 7a–7c.

The provision of drive elements 730a–730c corresponding to load circuits 7a–7c, respectively, and the distributed allocation of a plurality of drive elements 750a and 750b with respect to internal power supply line 725 allows current to be supplied to internal power supply line 725 via a plurality of drive elements 750a and 750b. The voltage on internal power supply line 725 can be maintained at the level of reference voltage VRa stably with no influence of the line resistance and line capacitance of internal power supply line 725.

It is to be noted that operation timing signal EQa may be activated during the operation of load circuits 7a–7c, not for a predetermined time period prior to the a operation of load circuit 7a.

According to the structure of the present twenty fourth embodiment, the voltage on internal power supply line 725 is charged to the level of high reference voltage VRa during operation of a plurality of load circuits 7a–7c. Therefore, the current supply capability of internal power supply line 725 can be increased equivalently to suppress voltage reduction in internal power supply line 725 during operation of load circuit 7a–7c. Thus, an internal power supply voltage can be supplied stably.

The voltage transmitted to internal power supply line 725 in the twenty third and twenty fourth embodiments are not limited to an operating power supply voltage, and may be a general reference voltage (for example, an intermediate voltage) or high voltage VPP.

Embodiment 25

First Layout of Distribution Drive Element

Figure 114:
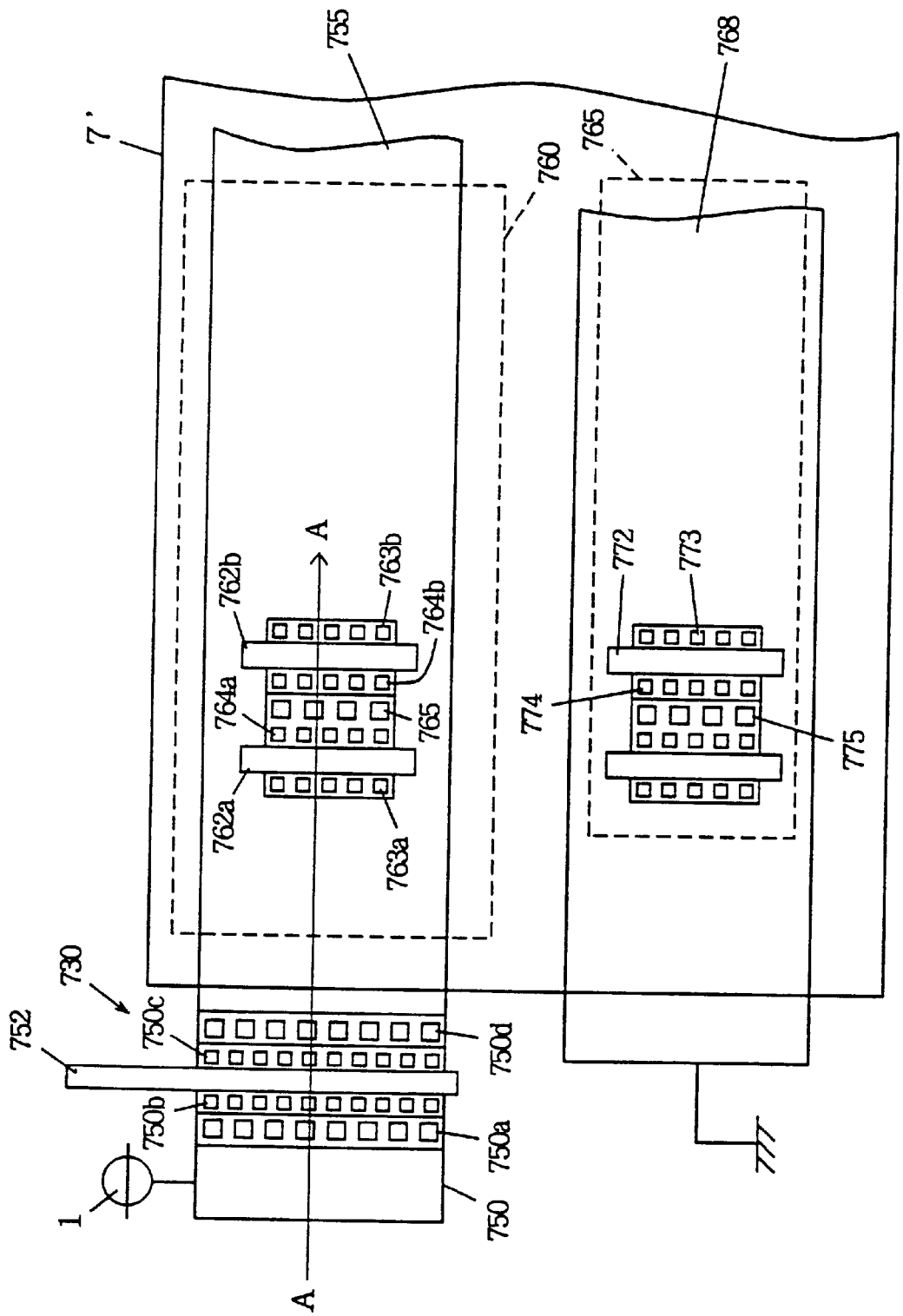
FIG. 114 shows a structure of the main portion of a semiconductor device according to a twenty fifth embodiment of the present invention.

FIG. 114 shows a structure of the main part according to a twenty fifth embodiment of the present invention. FIG. 114 shows the layout of drive elements 730a–730c arranged in a distributed manner shown in FIGS. 111–113. FIG. 114 typically shows drive element 730 provided corresponding to one load circuit.

The load circuit is formed in a load circuit formation region 7'. Load circuit formation region 7' includes an N well 760 where a p channel MOS transistor is formed, and an n channel MOS transistor formation region 765 where an n channel MOS transistor is formed. This n channel MOS transistor formation region 765 may be formed within a P well at the surface of the semiconductor substrate. Furthermore, load circuit formation region 7' may have a triple well structure.

Drive element 730 disposed corresponding to load circuit formation region 7' includes a gate electrode layer 752 to which a reference voltage is transmitted, an external power supply line 750 formed of a second layer aluminum interconnection layer connected to voltage source node 1, one active region connected via contact holes 750a and 750b, and another active region connected to an internal voltage transmission line 755 formed of the second layer (level) aluminum interconnection layer extending over N well 760 of load circuit formation region 7' via contact holes 750c and 750d. As will be described afterwards, contact hole 750a connects a first layer aluminum interconnection layer formed below the second layer aluminum interconnection layer with internal power supply interconnection 750. Contact hole 750b connects the first layer aluminum interconnection layer with the one active region. Contact hole 750c connects the other active region with another first layer aluminum interconnection layer. Contact hole 750d connects this another first layer aluminum interconnection layer with an internal voltage transmission line 755 formed of the second layer aluminum interconnection layer. The gate width (channel width) of drive element 730 length perpendicular to the extending direction of internal voltage transmission line 755, i.e. the width thereof. This drive element has a great current supply capability of a sufficient.

A p channel MOS transistor is formed in N well 760. In FIG. 114, two p channel MOS transistors are typically shown. One p channel NOS transistor includes a gate electrode layer 762a, a one active region connected to internal voltage transmission line 755 via contact holes 764a and 765, and another active region connected via contact hole 763a, to an internal interconnection layer formed of a first layer (level) aluminum interconnection layer, for example, in this load circuit.

The other p channel MOS transistor includes a gate electrode layer 762b, one active region connected to another first layer aluminum interconnection layer via contact hole 764b, and the other active region connected to an internal interconnection layer not shown via contact hole 763b. The gate width of p channel MOS transistor formed in N well 760 is set smaller than the gate width of drive element 730. The only requirement for any transistor in well 760 is to charge/discharge the internal power supply line in load circuit formation region 7', and the gate width (channel width) thereof is determined according to the design rule.

A ground line 768 formed of a second layer aluminum interconnection layer in parallel to internal voltage transmission line 755 and connected to the ground node is disposed over n channel MOS transistor formation region 765 of load circuit formation region 7'. The n channel MOS transistor is formed beneath ground line 768. As an example, this n channel MOS transistor includes a gate electrode layer 772, a one active region connected to ground line 768 via contact holes 774 and 775, and the other active region connected to an internal interconnection line (not shown) via a contact hole 773.

Figure 115:
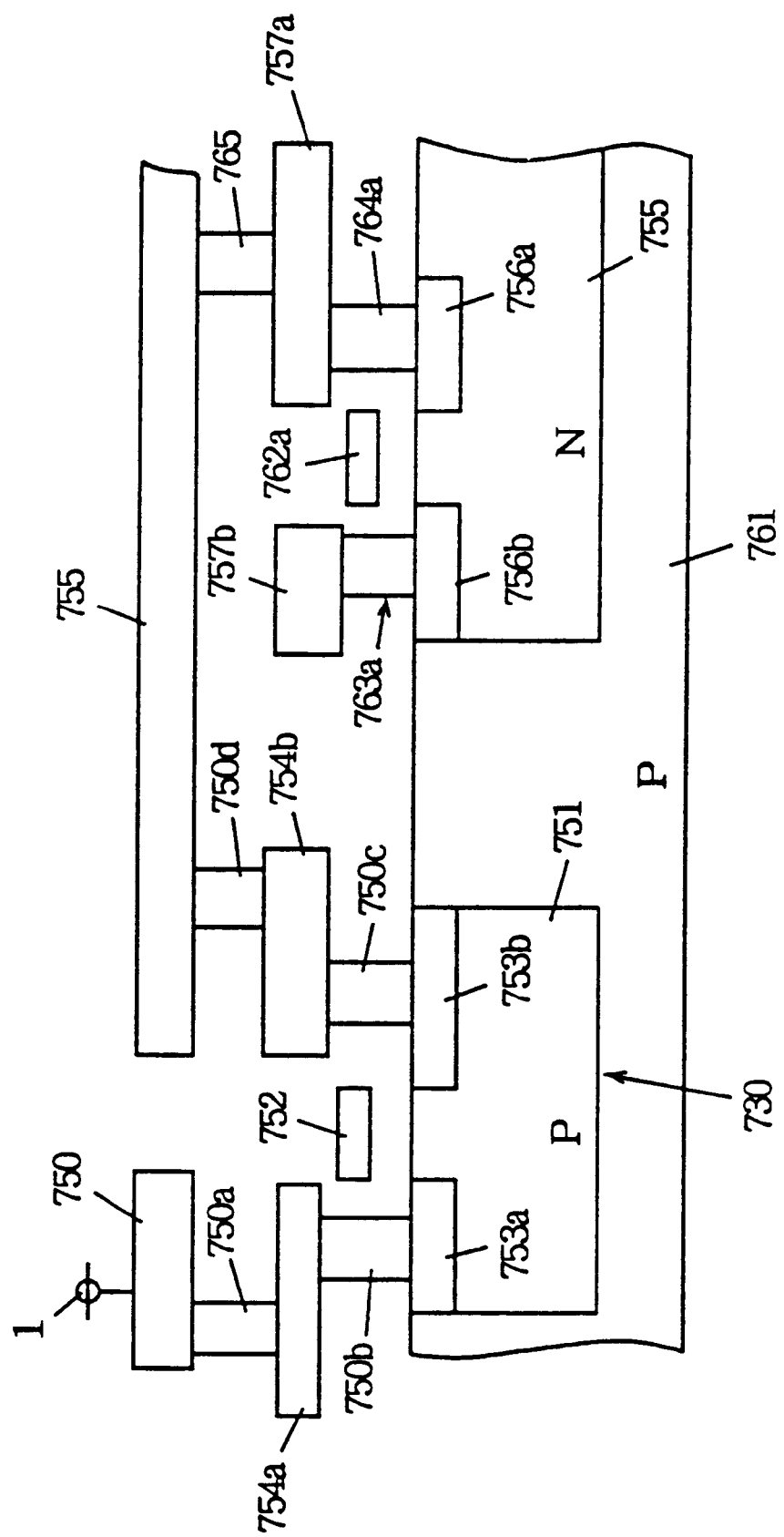
FIG. 115 schematically shows the semiconductor device taken along line A—A of FIG. 114.

FIG. 115 shows a sectional structure taken along line A—A of FIG. 114. Referring to FIG. 115, drive element 730 is formed within a P well 751 formed at the surface of a P type semiconductor substrate 761. Drive element 730 includes an N type impurity region 753a formed at the surface of P well 751 as the one active region, and an N type impurity region 753b formed in N well 751 as the other active region. Impurity region 753a is connected to first layer aluminum interconnection layer 754a via contact hole 750b. First layer aluminum interconnection layer 754a is connected to external power supply line 750 via contact hole 750a. The other active region 753b is connected to first layer aluminum interconnection layer 754b via contact hole 750c. First layer aluminum interconnection layer 754b is connected to internal voltage transmission line 755 via contact hole 750d. A reference voltage transmission line 752 is formed on a channel region between impurity regions 753a and 753b with a gate insulating film not shown thereunder.

Reference voltage transmission line 752 may be formed of a polysilicon interconnection line of low resistance, or a polysilicon interconnection layer lined by aluminum, or a multilayer interconnection formed of a refractory metal layer such as molybdenum or tungsten. A low resistance eliminates potential reduction due to that interconnection resistance to allow a reliable transmission of a reference voltage of a predetermined level.

The p channel MOS transistor which is a component of load circuit formation region 7' includes P type impurity regions 756a and 756b formed apart from each other on the surface of N well 755. Impurity region 756a serving as one active region is connected to first layer aluminum interconnection layer 757a via contact hole 764a. This first layer aluminum interconnection layer 757a is connected to internal voltage line 755 via contact hole 765. The other active region 756b is connected to first layer aluminum interconnection layer 757b forming an internal interconnection layer via contact hole 763a. Gate electrode 762a is disposed on a channel region between impurity regions 756a and 756b with a gate insulating film (not shown) thereunder. Internal, interconnection 757b may be formed of another interconnection layer (for example, a polysilicon interconnection layer of low resistance) instead of the first layer aluminum interconnection By connecting second aluminum interconnection layers 750 and 755 to active regions 753a, 753b and 756a with first layer aluminum interconnection layers 754a, 754b and 757a therebetween, the aspect ratio in the contact region can be reduced to realize a good contact.

As shown in FIGS. 114 and 115, the channel width of drive element 730 can be set substantially equal to the width of internal voltage transmission line 755, and sufficiently greater than the channel width of the p channel MOS transistor which is the component in the load circuit. This allows an internal voltage of a predetermined level to be transmitted in a sufficiently stable manner during operation of a p channel MOS transistor which is the component formed in load circuit formation region 7'. This great current driving capability provides the benefit of supplying a great amount of current even during the operation of the circuit element formed in load circuit formation region 7' to suppress change in the internal voltage during operation of load circuit 7.

Although drive element 730 is formed in P well 751 in the structure shown in FIG. 115, drive element 730 may be directly formed at the surface of semiconductor substrate 761.

Second Layout of Drive Element

Figure 116:
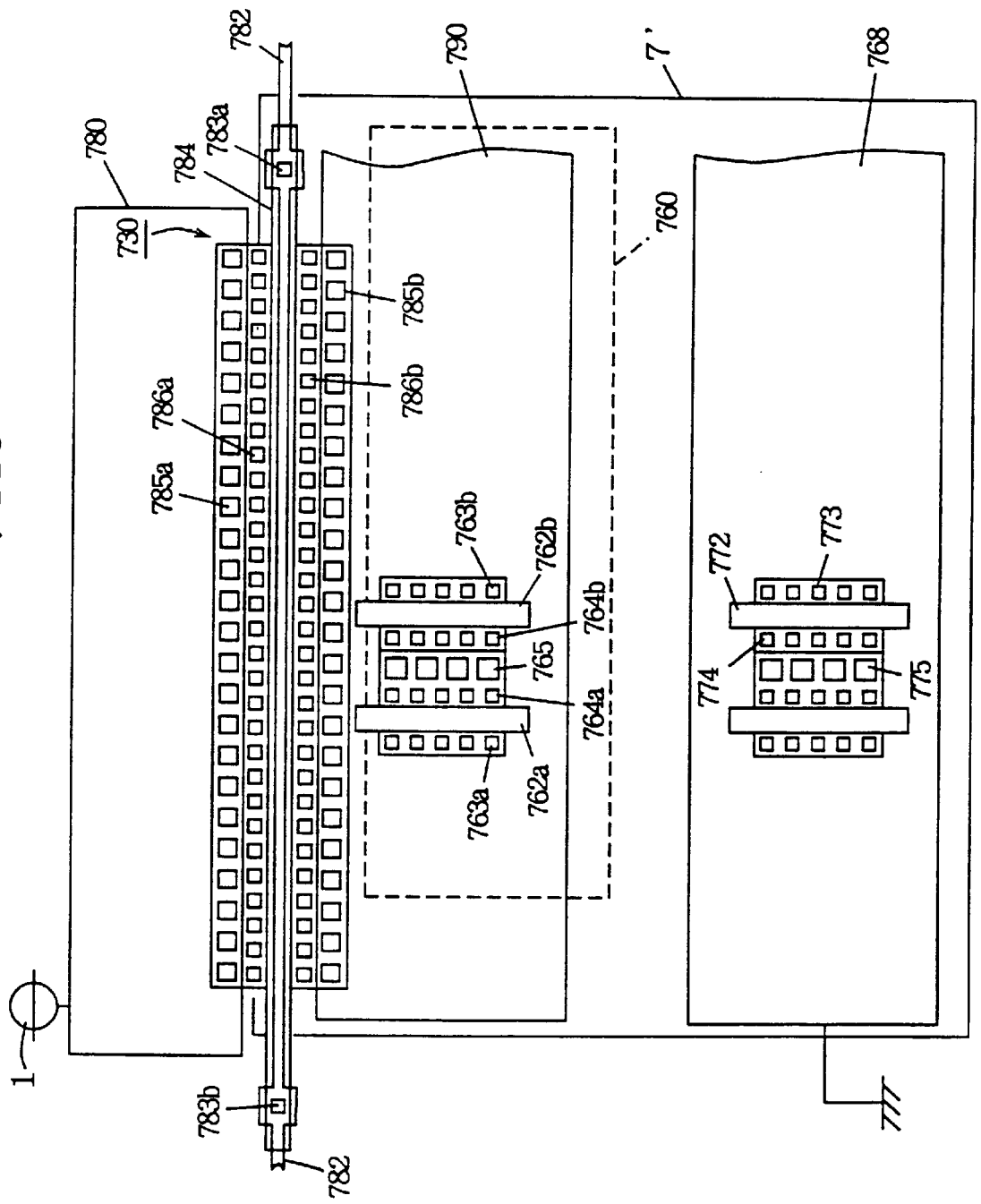
FIGS. 116 and 117 show first and second modifications, respectively, of the twenty fifth embodiment of the present invention.

FIG. 116 shows a second layout of a drive element. The structure of FIG. 116 has an external power supply line 780 formed of a second layer aluminum interconnection layer connected to voltage source node 1 along one side of load circuit formation region 7'. Drive element 730 includes one active region formed with a predetermined width along the extending direction of external power supply line 780 and connected to external power supply line 780 via contact holes 785a and 786a, a gate electrode layer 584 connected to a reference voltage transmission line 782 formed of a first layer aluminum interconnection layer of low resistance that transmits the reference voltage via contact holes 783a and 783b, and the other active region connected to internal voltage transmission line 790 via contact holes 785b and 786b.

Internal voltage transmission line 790 is formed of a second layer aluminum interconnection layer arranged over load circuit formation region 7' (the p channel MOS transistor formation region in load circuit formation region 7'). N well 760 for forming a p channel MOS transistor is provided beneath internal' voltage transmission line 790 formed of this second layer aluminum interconnection layer. In FIG. 116, two p channel MOS transistors formed in N well 760 is typically shown. As to the p channel MOS transistor as a component formed in N well 760 of FIG. 116, reference numerals identical to those of the p channel MOS transistor in FIG. 114 are denoted, and the detail will not be repeated. These p channel MOS transistors are connected to an internal voltage transmission line 790 to receive a predetermined voltage.

Ground line 768 formed of a second layer aluminum interconnection is provided extending over load circuit formation region 7' in parallel to internal voltage transmission line 790. An n channel MOS transistor is formed beneath ground line 768. These MOS transistors have reference numerals identical to those of the n channel MOS transistors shown in FIG. 114 denoted, and their description will not be repeated.

When the load circuit formed in load circuit formation region 7' is, for example, a memory cell array of a semiconductor memory device, and the gate electrode of the memory cell transistor is formed of polysilicon, the so-called "word line shunt structure" is used to reduce the resistance of this polysilicon gate equivalently. A word line driving signal is transmitted via a first aluminum interconnection layer of low resistance to be physically connected to the polysilicon forming the gate electrode of the memory cell transistor at a predetermined region via a contact of low resistance.

This reference voltage transmission line 782 is formed during the same manufacturing process of a first layer aluminum interconnection layer used in the word line shunt structure. Thus, a reference voltage can be transmitted to the gate of each drive element with no voltage reduction caused by interconnection resistance even in the case where gate electrode layer 784 of drive element 730 is formed of a material of a relatively high resistance such as polysilicon.

According to the structure shown in FIG. 116, external power supply interconnection 780 is provided extending along one side portion of load circuit formation region 7', and an active region of drive element 730 is formed along external power supply line 780. Therefore, the gate width of drive element 730 can be increased sufficiently, and an external voltage of a constant voltage level can be transmitted to the load circuit formed in load circuit formation region 7' stably. (Even when current is consumed during operation of the load circuit, operating current can be supplied with sufficient margin by virtue of the great current driving capability of drive element 730).

A structure may be employed in which reference voltage transmission line 782 formed of, for example, a first layer aluminum interconnection layer is not provided, and gate electrode layer 784 is formed of a polysilicon layer lined with aluminum or a low resistance material such as refractory silicide layer so that gate electrode layer 784 directly transmits the reference voltage.

Third Layer of Drive Element

Figure 117:
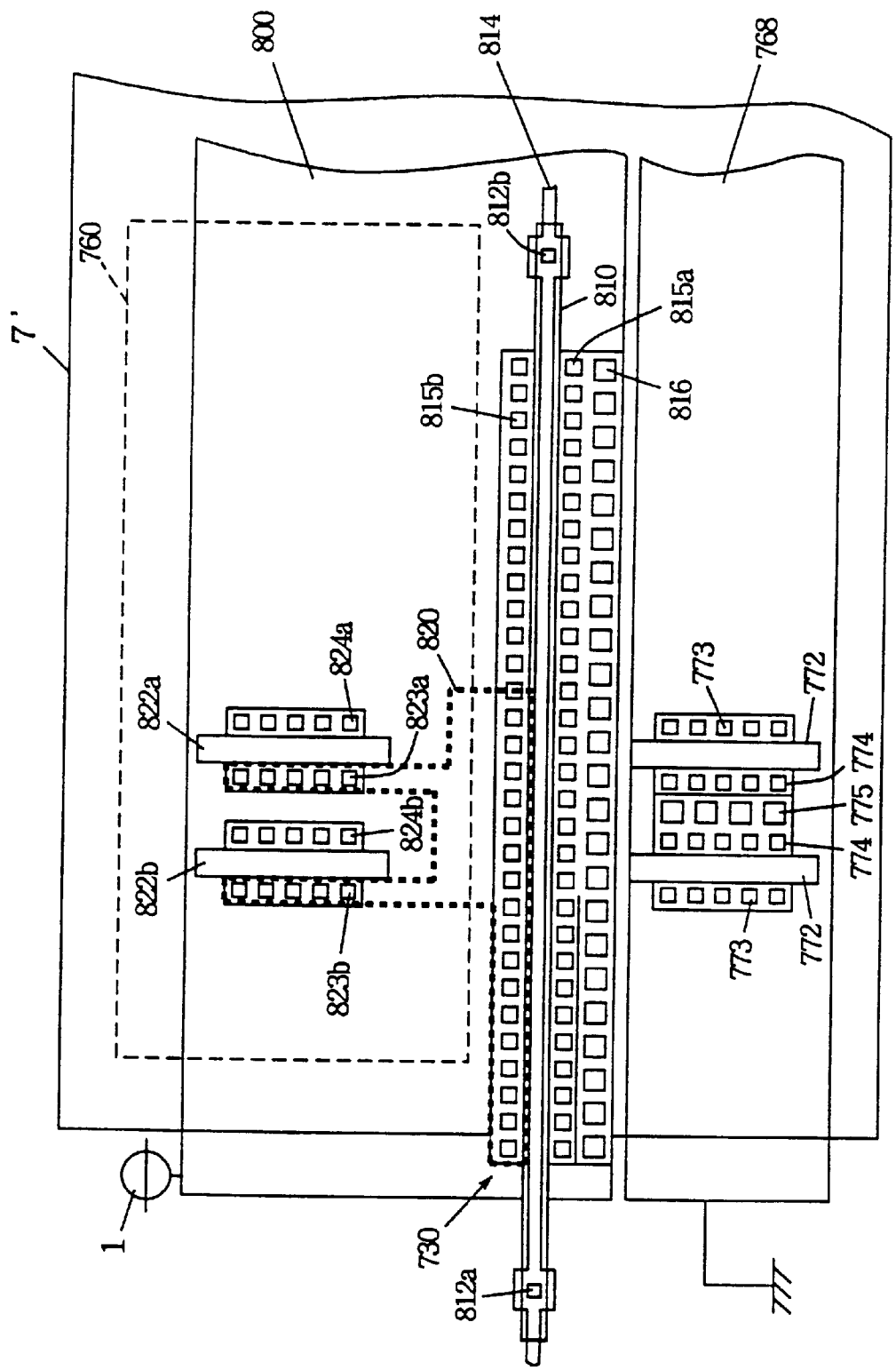

FIG. 117 shows another structure of a drive element. The structure of FIG. 117 has an external power supply line 800 formed of a second layer aluminum interconnection layer along the extending direction of an N well 760 in which a p channel MOS transistor is formed in load circuit formation region 7'.

Drive element 730 is formed external to the region of N well 760 and in a region overlapping external voltage interconnection 800 in a plan view along the extension of N well 760. Drive element 730 includes a gate electrode interconnection 810 connected to reference voltage transmission line 814 formed of a first layer aluminum interconnection layer, for example via contact holes 812a and 812b formed at predetermined positions, one active region connected to an external power supply interconnection line 800 via contact holes 815a and 816, and the other active region connected to an internal voltage transmission line 820 formed of, for example, first layer aluminum layer via a contact hole 815b.

Internal voltage transmission line 820 is connected to one active region of the p channel MOS transistor formed in N well 760 via a contact hole 823 (823a, 823b). This p channel MOS transistor which is a component of the load circuit includes the other active region connected to each gate electrode layer 822 (822a, 822b) and an internal interconnection line not shown via contact hole 824 (824a, 824b).

A ground line 768 formed of, for example, a second layer aluminum interconnection layer for transmitting ground voltage is disposed over load circuit formation region in parallel to external power supply interconnection 800. Ground line 768 is formed on an n channel MOS transistor formation region formed external to the region of N well 760. The n channel MOS transistor which is the component of a load circuit includes one active region connected to ground line 768 via contact holes 774 and 775, and the other active region connected to an internal interconnection line not shown via a contact hole 773. In FIG. 117, two n channel MOS transistors are typically shown.

By forming a drive element 730 along N well 760 at a region external to N well 760 as shown in FIG. 117, a drive element that has a sufficiently large gate width (channel width) can be provided. By arranging an internal voltage transmission line 820 formed of a first layer aluminum interconnection layer for the p channel MOS transistor formed in N well 760, the layout of internal voltage transmission 820 is facilitated since it has to be arranged only in a required region.

It is not required to provide this internal voltage transmission line in other unnecessary regions, so that the occupying area of the internal voltage transmission line is reduced to facilitate layout of other internal interconnection lines. Furthermore, it is not necessary to provide a drive element in a region external to the load circuit formation region since drive element 730 is formed within load circuit formation region 7'. The occupying area of an element for transmitting an internal voltage can be reduced.

When gate electrode interconnection 810 is formed of an interconnection layer of a sufficient low resistance (multilayer interconnection structure including refractory metal layer or a polysilicon interconnection lined by aluminum) in the arrangement shown in FIG. 117, reference voltage transmission line 814 does not have to be particularly provided.

According to the present twenty fifth embodiment, a drive element having a channel width sufficiently greater than that of an MOS transistor is provided at the proximity of or internal to the load circuit formation region, and internal voltage is transmitted from an external power supply interconnection line into the load circuit formation region via a drive element having this great channel width. Therefore, an internal voltage can be supplied to a corresponding load circuit with a great current supply capability to drive the load circuit stably.

The voltage transmitted to internal voltage transmission lines 755, 790 and 820 of the twenty fifth embodiment may be a reference voltage of another constant required voltage level (high voltage or intermediate voltage) instead of the operating power supply voltage.

Since an internal voltage transmission line is provided only with respect to load circuit formation region 7', reduction of the internal voltage due to internal interconnection line resistance can be prevented. An internal voltage of a predetermined voltage level can be transmitted to each load circuit without any loss, whereby each load circuit can be operated under the same operating condition. Therefore, reliability of the device is improved.

Embodiment 26

Figure 118:
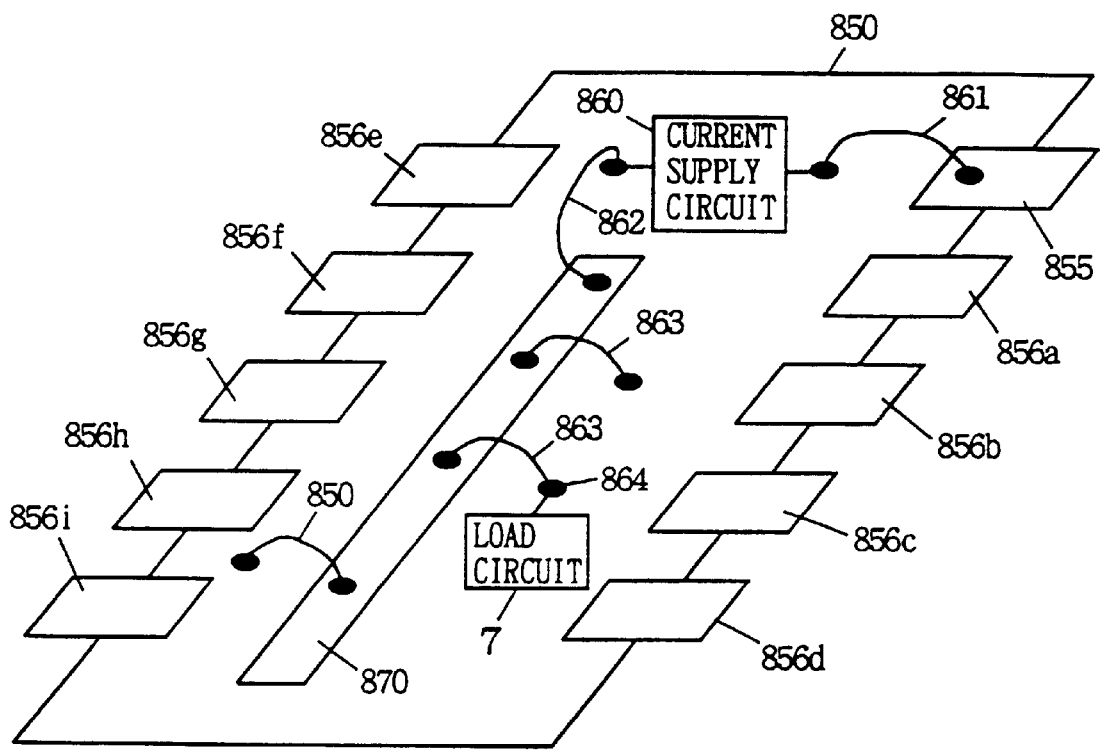
FIG. 118 schematically shows a structure of a semiconductor device according to a twenty sixth embodiment of the present invention.

FIG. 118 schematically shows a structure of a twenty sixth embodiment of the present invention. The structure of FIG. 118 has a current supply circuit 860 provided on a semiconductor chip 850 in which a semiconductor device is formed, for receiving an external power supply voltage from a frame lead 855 connected to an external pin terminal via a bonding wire 861 to generate a predetermined internal voltage. Current supply circuit 860 has a structure including the drive element and the comparator shown in the previous embodiments. It may be a circuit that generates an internal power supply voltage or a high voltage VPP.

Frame leads 856a–856i are provided in semiconductor chip 850 to establish an interface with an external device (in order to carry out data input/output). For the same of simplification, the destination of the connections of leads 856a–856i are not illustrated. A frame for transmitting an internal voltage (referred to as "dummy lead") 870 is provided on semiconductor chip 850 which is supported on a frame (metallic mold) not shown in FIG. 118 of the lead frame during bonding. Dummy lead 870 is connected to an output portion of current supply circuit 860 via bonding wire 862. Dummy lead 870 is connected to an internal voltage supply node 864 via bonding wire 863 in the proximity of load circuit 7 formed on semiconductor chip 850. Here, only one load circuit 7 is typically shown in FIG. 118.

Dummy lead 870 is formed of a material identical to that of the frame lead connected to an external pin terminal, and has a width of substantially equal size. Dummy lead 870 is thus formed of a low resistance material such as copper and nickel of a large line width that is greater than that of the internal interconnection line formed of aluminum. Therefore, by transmitting voltage/current from current supply circuit 860 to the proximity of load circuit 7 using dummy lead 870 formed over semiconductor chip 850, the line resistance from current supply circuit 860 to load circuit 7 can be reduced significantly. An internal voltage of a predetermined voltage level can be transmitted to each load circuit 7. Since dummy lead 870 is formed further above the internal interconnection layer, an internal voltage of a predetermined voltage level can be transmitted to each load circuit with no influence on the layout of an internal interconnection. Since an internal voltage line for transmitting this internal voltage is formed of dummy lead 870, an internal voltage of a constant level can be supplied to each load circuit 7 from one current supply circuit 860 with no voltage reduction even in the case where current supply circuit 860 cannot easily be disposed in a distributed manner correspondingly to each load circuit, due to the limitation of the circuit arrangement on semiconductor chip 850. Furthermore, a great amount of current can be conducted due to its sufficient large line width of dummy lead 870, so that current can be supplied stably to each load circuit 7 from one current supply circuit 860. Thus, an internal voltage of a stable level can be supplied.

Figure 119:
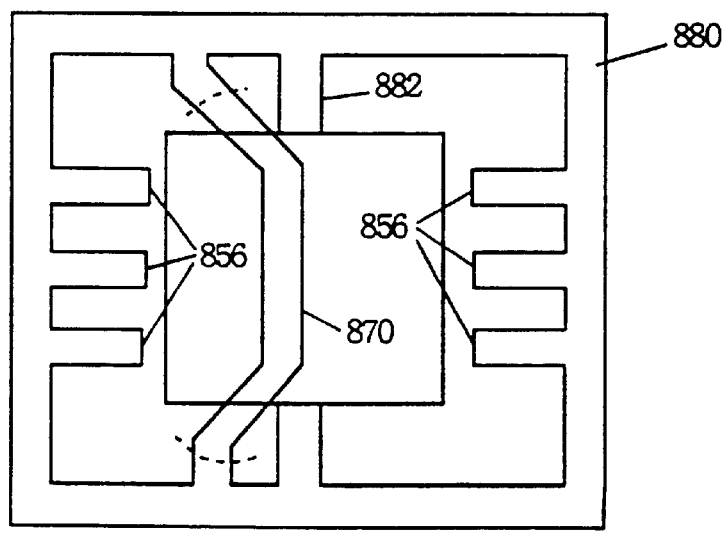
FIG. 119 is a diagram for describing the arrangement of a dummy lead shown in FIG. 118.

FIG. 119 shows a form of the frame shown in FIG. 118. A semiconductor chip 850 is formed on a mount base (not shown) connected to lead 852 supported on frame 880. Frame 880 has a frame lead 856 provided corresponding to a bonding pad formed on semiconductor chip 850. A dummy lead 870 is fixedly held by frame (metallic mold) 880. The necessary wiring is carried out with respect to each frame lead 856 and dummy lead 870. Then, sealing is carried out using resin, followed by a die-stamping process for cutting frame 880 away. As shown in the broken line of the FIG. 119, dummy lead 870 is cut. Since dummy lead 870 is not removed off the device (not taken external to the package), there is no problem, and an internal voltage of a required level is simply transmitted by dummy lead 870 in the package.

Connection Arrangement of Internal Wiring and Dummy Lead

Figure 120:
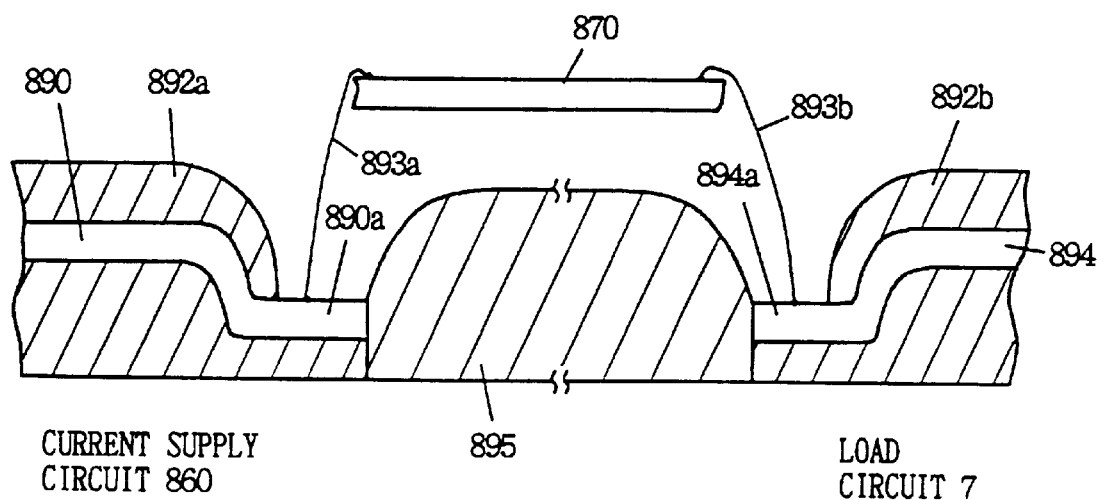
FIG. 120 shows connection between a dummy lead and an internal circuit shown in FIG. 118.

FIG. 120 shows an example of a connection between an internal interconnection line and a dummy lead. Referring to FIG. 120, an internal voltage line 890 for transmitting an internal voltage from current supply circuit 860 is connected to a dummy lead 870 by a bonding wire 893*a* in a connection region 890*a* having a relatively large width. Internal voltage line 890 may be a first level aluminum interconnection layer or a second level aluminum interconnection layer. A passivation layer 892*a* which is the final protection film of the semiconductor device is provided on internal voltage line 890. In load circuit 7, internal voltage transmission line 894 is connected to dummy lead 870 via a bonding wire 893*b* in a connection region 894*a* having a relatively large width. A similar passivation layer 892*b* is formed on internal voltage transmission line 894*a*. An insulation layer 895 is provided between current supply circuit 890 and load circuit 7. Insulation layer 895 is shown only for the purpose of simplifying the drawing, and another internal circuit may be provided in this region.

By providing regions 890*a* and 894 of relatively large width in internal voltage line 890 and internal voltage transmission line 894, respectively, dummy lead 870 can be reliably interconnected with current supply circuit 860 and load circuit 7 using bonding wires 893*a* and 893*b*.

Second Connection Between Dummy Lead and Internal Wiring

Figure 121:
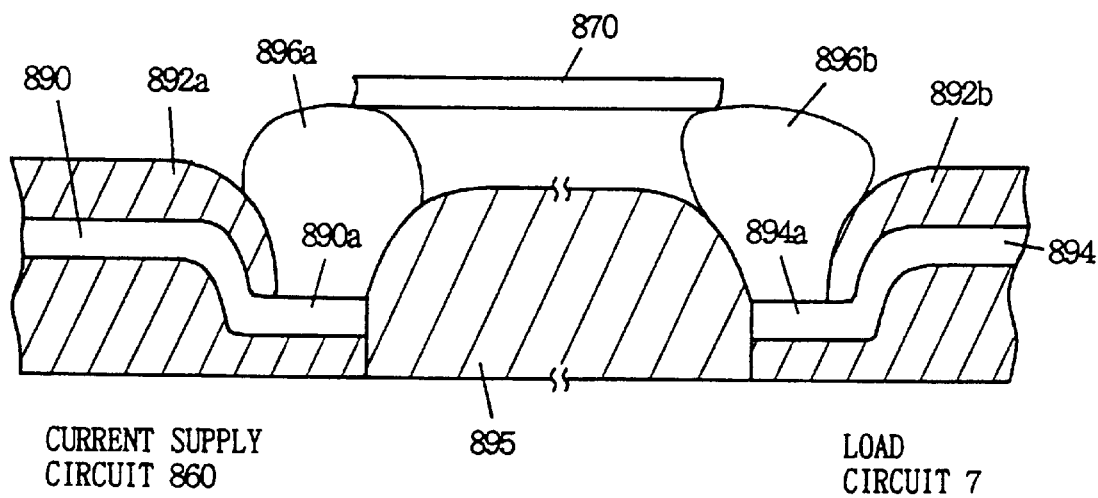
FIG. 121 shows another structure of the connection between a dummy lead and an internal circuit of FIG. 118.

The structure of FIG. 121 has bump spheres 896*a* and 896*b* formed of a solder layer in connection regions 890*a* and 894*a*, respectively. Bump spheres 896*a* and 896*b* are connected to dummy lead 870. The structure of interconnecting dummy lead 870 with internal voltage line 890 and internal voltage transmission line 894 using bump spheres 896*a* and 896*b* can be achieved by a method similar to that of the surface mount technique that directly connects flip chips on a circuit substrate using a bump sphere.

A structure may be employed in which aluminum is deposited in a columnar form instead of bump spheres 896*a* and 896*b* formed of solder, to obtain contact between the deposited aluminum and dummy lead 870. In other words, an aluminum layer may be formed at the positions of bump spheres 896*a* and 896*b*.

In the frame of FIG. 118, the pads for receiving/transmitting signals and power supply voltage/ground voltage are provided at both sides of the outer periphery of semiconductor chip 890. The present invention is not limited to this frame (pad) arrangement, and pads may be arranged all along the four sides of semiconductor chip 850. Alternatively, a frame of the so-called LOC (Lead-On-Chip) structure may be employed where a pad is provided at the center of semiconductor chip 850 for signal input/output and receiving power supply voltage/ground voltage.

Modification

Figure 122:
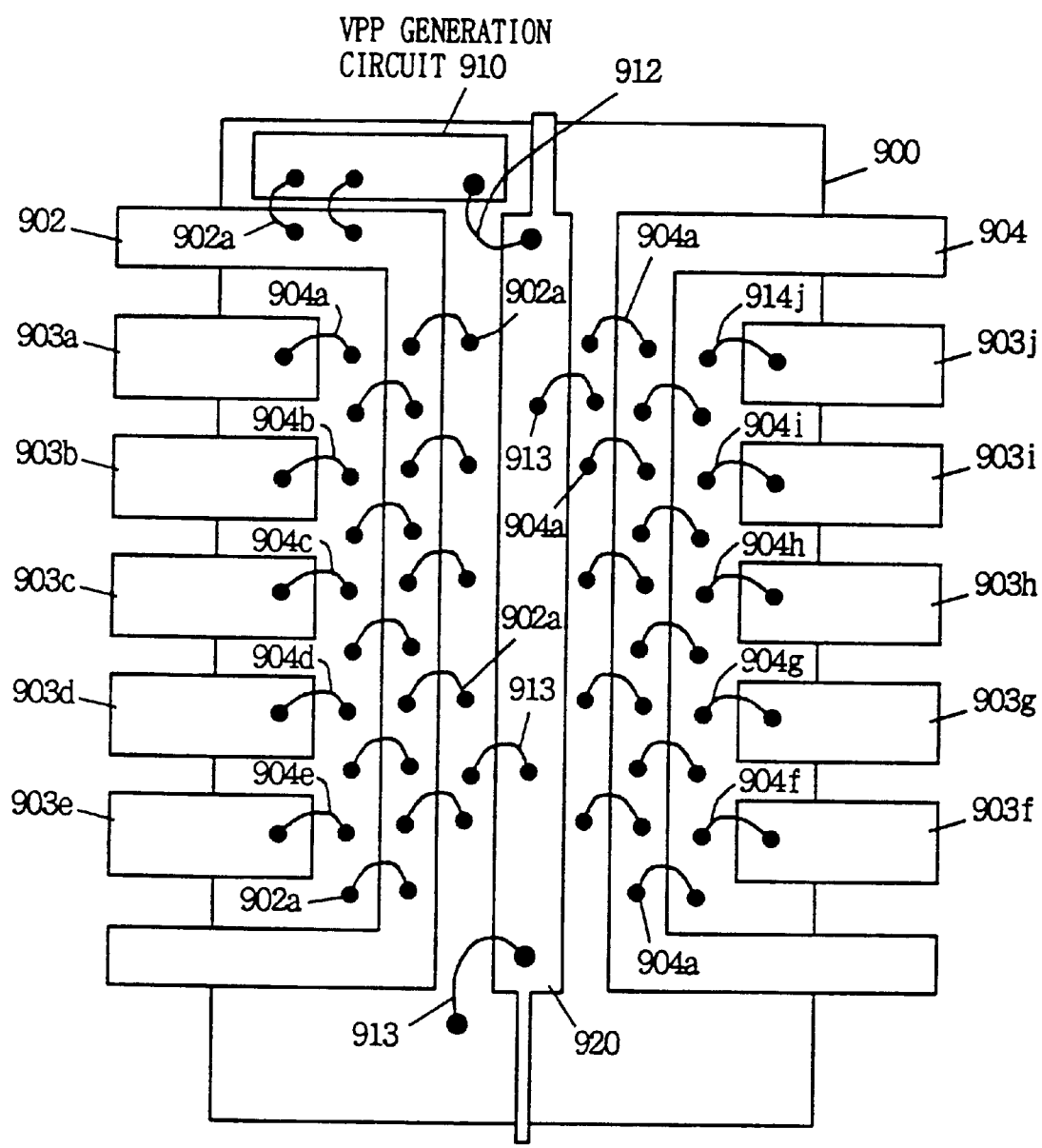
FIG. 122 shows a modification of the twenty sixth embodiment of the present invention.

FIG. 122 shows a modification of the twenty sixth embodiment. Frame leads 903*a*–903*j* for carrying out signal input/output are arranged for semiconductor chip 900. Frame leads 903*a*–903*j* are connected to pads (indicated by a solid circle ● in the drawing) formed on semiconductor chip 900 via bonding wires 904*a*–904*j*, respectively. A one side power supply frame lead 902 formed in a side ways U-shaped configuration is provided so as to surround frame leads 903*a*–903*e* to transmit power supply voltage VCC over chip 900. In a manner symmetrical to power supply frame lead 902, the other power supply frame lead 904 for transmitting power supply voltage is provided in a substantially U-shaped configuration so-as to surround frame leads 903*f*–903*j*.

Power supply frame leads 902 and 904 are connected to an internal power supply node (pad) via bonding wires 902*a* and 904*a* for transmitting the power supply voltage to each circuit component formed on semiconductor chip 900. By arranging power supply frame leads 902 and 904 extending over semiconductor chip 900, power supply voltage can be supplied stably to the circuit portion formed on semiconductor chip 900.

Semiconductor chip 900 further has a VPP generation circuit 910 provided at the periphery portion thereof for receiving a power supply voltage from power supply frame lead 902 for generating a high voltage VPP higher than power supply voltage VCC. A frame lead for high voltage (dummy lead) 920 is provided between power supply frame leads 902 and 904 in order to transmit the high voltage from VPP generation circuit 910 to each circuit portion formed on semiconductor chip 900.

Dummy lead 920 corresponds to dummy lead 870 shown in FIG. 118. Dummy lead 920 is connected to a high voltage output node of VPP generation circuit 910 by a bonding wire 912. Dummy lead 920 is also connected to a high voltage node of the load circuit using high voltage VPP formed on semiconductor chip 900 via bonding wire 913. By using a dummy lead 920 of low resistance, high voltage VPP can be supplied stably with no drop in voltage to all load circuits formed on semiconductor chip 90 utilizing a high voltage.

An aluminum interconnection or a bump formed of solder or the like may be used instead of bonding wires 912 and 913.

The configuration of the frame is arbitrary also in the modification shown in FIG. 122. A frame according to the shape of the package in which semiconductor chip 900 is accommodated must be accounted for.

In the twenty sixth embodiment of the present invention, a lead frame is used for transmitting a voltage of a predetermined level, so that internal voltage of a predetermined voltage level can be transmitted to a circuit on a semiconductor chip with low resistance and no voltage drop. The frame lead maintains a great current supply capability since it has a width sufficiently greater than that of the internal interconnection line. An internal voltage of a stable voltage level can be supplied to each load circuit.

Embodiment 27

Figure 123:
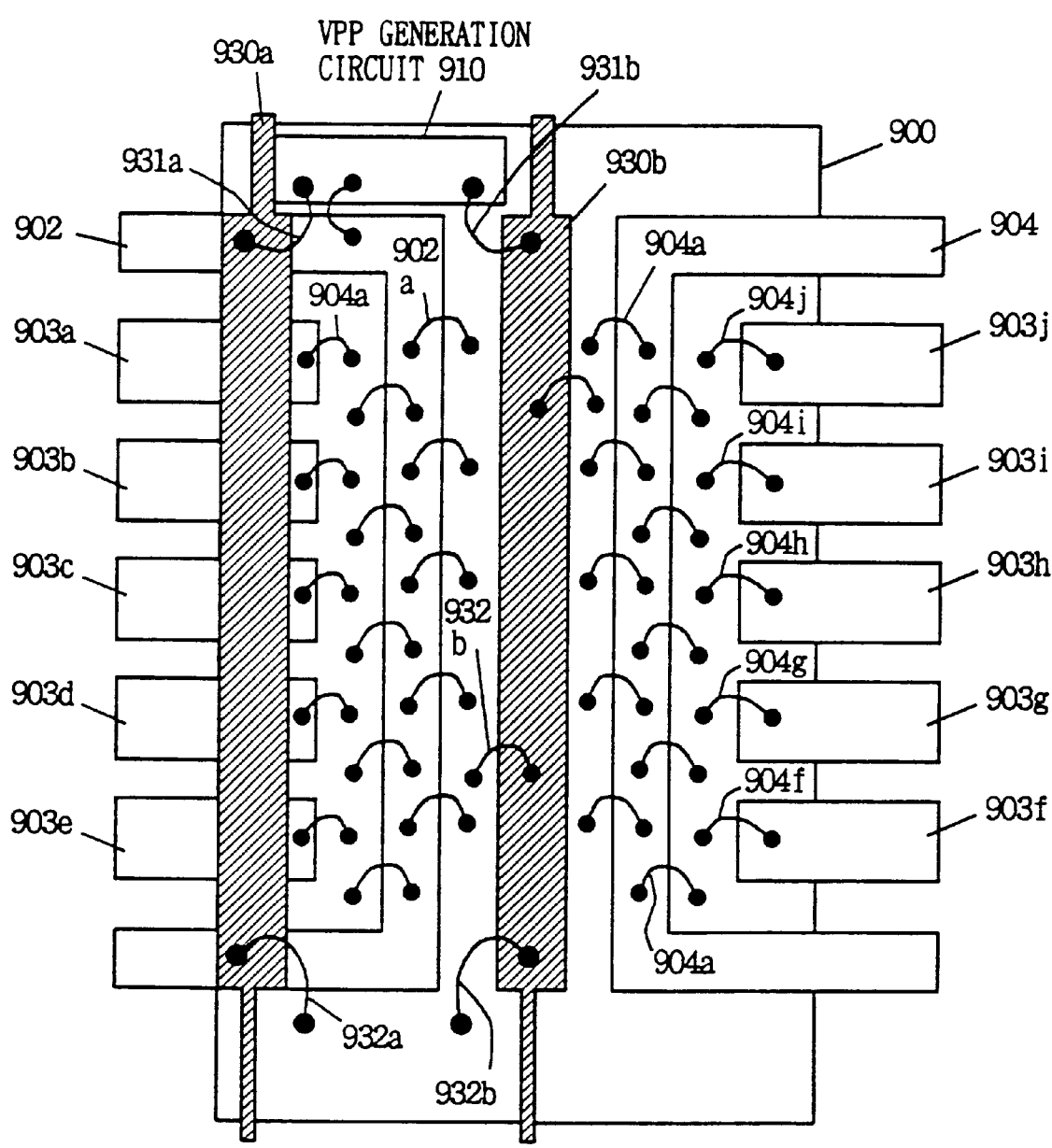
FIG. 123 schematically shows a structure of a semiconductor device according to a twenty seventh embodiment of the present invention.

FIG. 123 shows the main part of a semiconductor device according to a twenty seventh embodiment of the present invention. In the structure of FIG. 123, frame leads 930*a* and 930*b* of a layer higher than frame leads 902, 903*a*–903*j* and 904 are used to generate high voltage VPP from high voltage VPP generation circuit 910. The remaining components in the structure are similar to those of FIG. 122, and corresponding components have the same reference characters allotted.

In FIG. 123, a frame lead (dummy lead) 930*a* formed on frame lead 902 and 903*a*–903*e* at one side of semiconductor chip 900 is connected to the output of VPP generation circuit 910 via bonding wire 931*a*, and is connected to a high voltage node in the proximity of a load circuit that uses high voltage VPP via bonding wire 932*a* in the other end portion of semiconductor chip 900. Dummy lead 930*b* formed at a layer above of the region between frame leads 902 and 904 is connected to the high voltage output portion of VPP generation circuit 910 via bonding wire 931*b*, and connected, via bonding wire 932*b* to the high voltage node of a load circuit that uses high voltage VPP. VPP generation circuit 910 receives a power supply voltage from power supply frame 902 to generate power voltage VPP of a predetermined level.

According to the structure shown in FIG. 123, the effect as set forth in the following is achieved in addition to the advantage that high voltage VPP can be supplied stably to the load circuit on semiconductor chip 900. When a dummy lead at a layer identical to that of frames 902, 903*a*–903*j* and 904 is used, the connection position between the dummy lead and an internal load circuit is influenced by the configuration of frames 902, 903*a*–903*j* and 904 (in the case of an LOC structure). Even in this case, dummy leads 930*a* and 930*b* for transmitting a high voltage VPP to an arbitrary position on semiconductor chip 900 can be disposed by establishing a multilayer structure with respect to the dummy lead and the frame lead. High voltage VPP can be supplied stably to the circuit portion of an arbitrary position on semiconductor chip 900 utilizing high voltage.

Figure 124A:
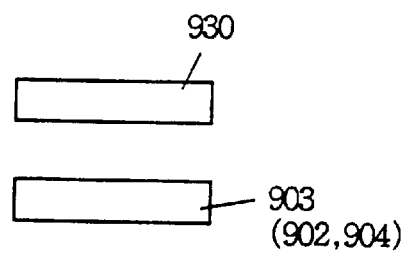
FIGS. 124A and 124B are diagrams showing the position relationship of the dummy lead and the frame lead of FIG. 123 in the vertical direction.
Figure 124B:
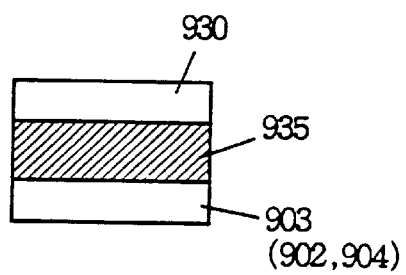

FIGS. 124A–124B show the arrangement between the upper layer dummy lead and the lower layer frame lead. Referring to FIG. 124A, the space between dummy lead 930 and frame 903 (902 or 904) is hollow. Leads 930 and 903 (902 or 904) are held by a frame not shown, and no particular problem is encountered.

Referring to FIG. 124B, an insulation layer 935 formed of a polymer insulating material of polyimide, for example, or an insulating tape (film) used in TAB (Tape-Automated-Bonding) is provided between dummy lead 930 and the lower frame 903 (902 or 904). The insulation between dummy lead 930 and frame 903 (902 or 904) can be ensured. Dummy lead 930 may be formed below frame lead 903.

The voltage transmitted on dummy leads 930*a* and 930*b* may be a reference voltage of another required constant voltage level (internal high voltage or intermediate voltage) differing from high voltage VPP.

Second Modification

Figure 125:
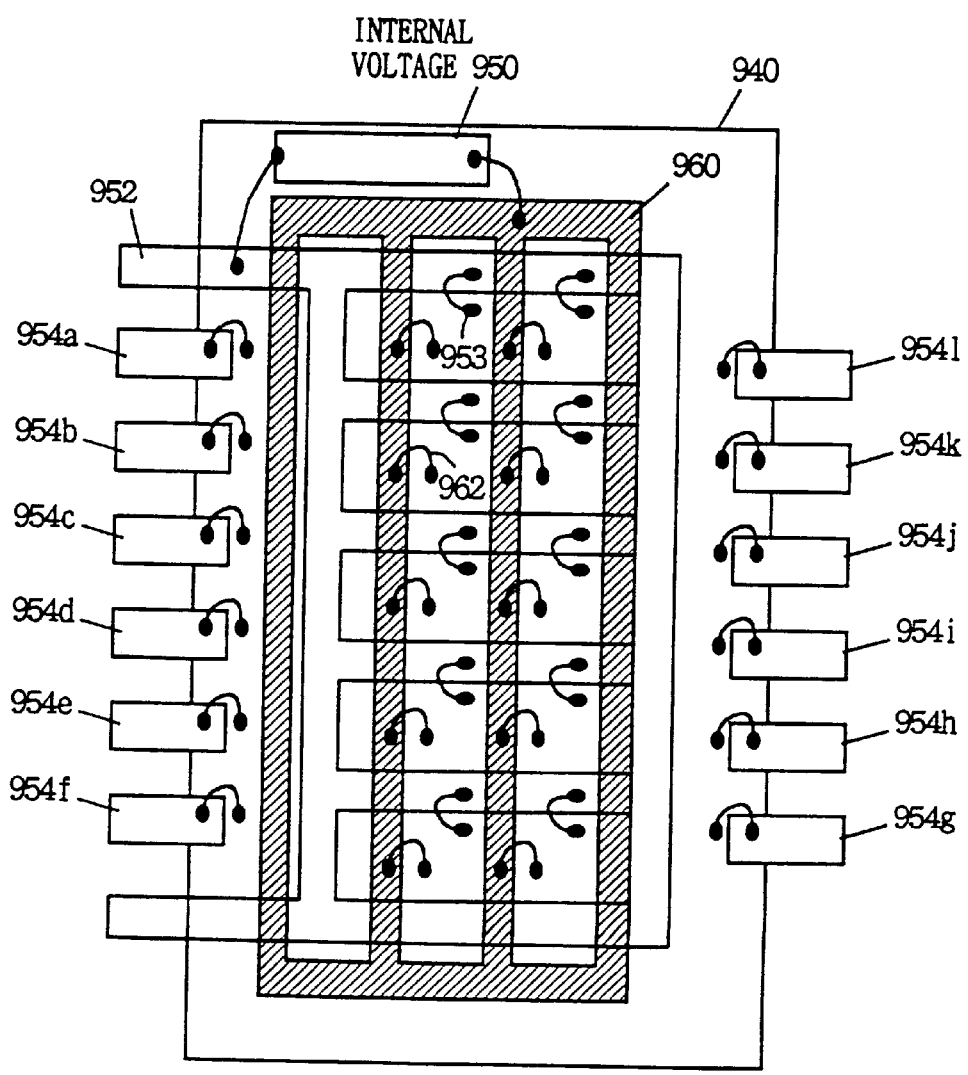
FIG. 125 shows a structure of a modification of the twenty sixth embodiment of the present invention.

FIG. 125 shows a second modification of the twenty-seventh embodiment. At both of the long sides of semiconductor chip 940, frame leads 954*a*–9541 for signal input/output are provided corresponding to respective pads. Frame leads 954*a*–9541 are connected to a corresponding pad via a bonding wire.

A power supply frame lead 952 for transmitting power supply voltage VCC is arranged all over the surface of semiconductor chip 940. Power supply frame lead 952 includes a portion extending in one direction (horizontal direction in FIG. 125) and a portion extending in the other direction (vertical direction in FIG. 125) to form a plurality of loops. The internal of each loop in power supply frame lead 952 is an empty region. A dummy lead 960 for transmitting an internal voltage from an internal voltage generation unit 950 receiving power supply voltage from power supply frame lead 952 for generating an internal voltage of a predetermined level is provided at a layer above power supply frame lead 952.

Dummy lead 960 has a portion extending in a direction perpendicular to the extension of power supply frame lead 952, and includes a plurality of loops. The loop formation regions of power supply frame lead 952 and dummy lead 960 are disposed at right angle with each other, so that an empty region is present in a plan view. In this empty region, an electrical contact is made between power supply frame lead 952 and dummy lead 960, and respective predetermined circuits using a bonding wire, a bump, or a connection member 953 and 962 such as of aluminum. Power supply voltage and an internal voltage of a constant voltage level can be supplied stably to all circuit portions formed on semiconductor chip 940.

In FIG. 125, the configuration of the loop of dummy lead 960 and power supply frame lead 952 is arbitrary.

By forming power supply frame lead 952 and dummy lead 960 for transmitting an internal voltage so as to include a plurality of loops, the current flowing through each loop is in an opposite direction when noise is generated, so that the noise is canceled. Therefore, power supply voltage and internal voltage can be supplied stably even when noise is generated.

According to the structure of the twenty seventh, embodiment the frame for signal input/output and for receiving voltage is provided in a layer different from the layer of the frame for transmitting a predetermined internal voltage. Therefore, internal voltage of a predetermined level can be transmitted stably to the circuit portion using an internal voltage on a semiconductor chip.

Embodiment 28

Figure 126:
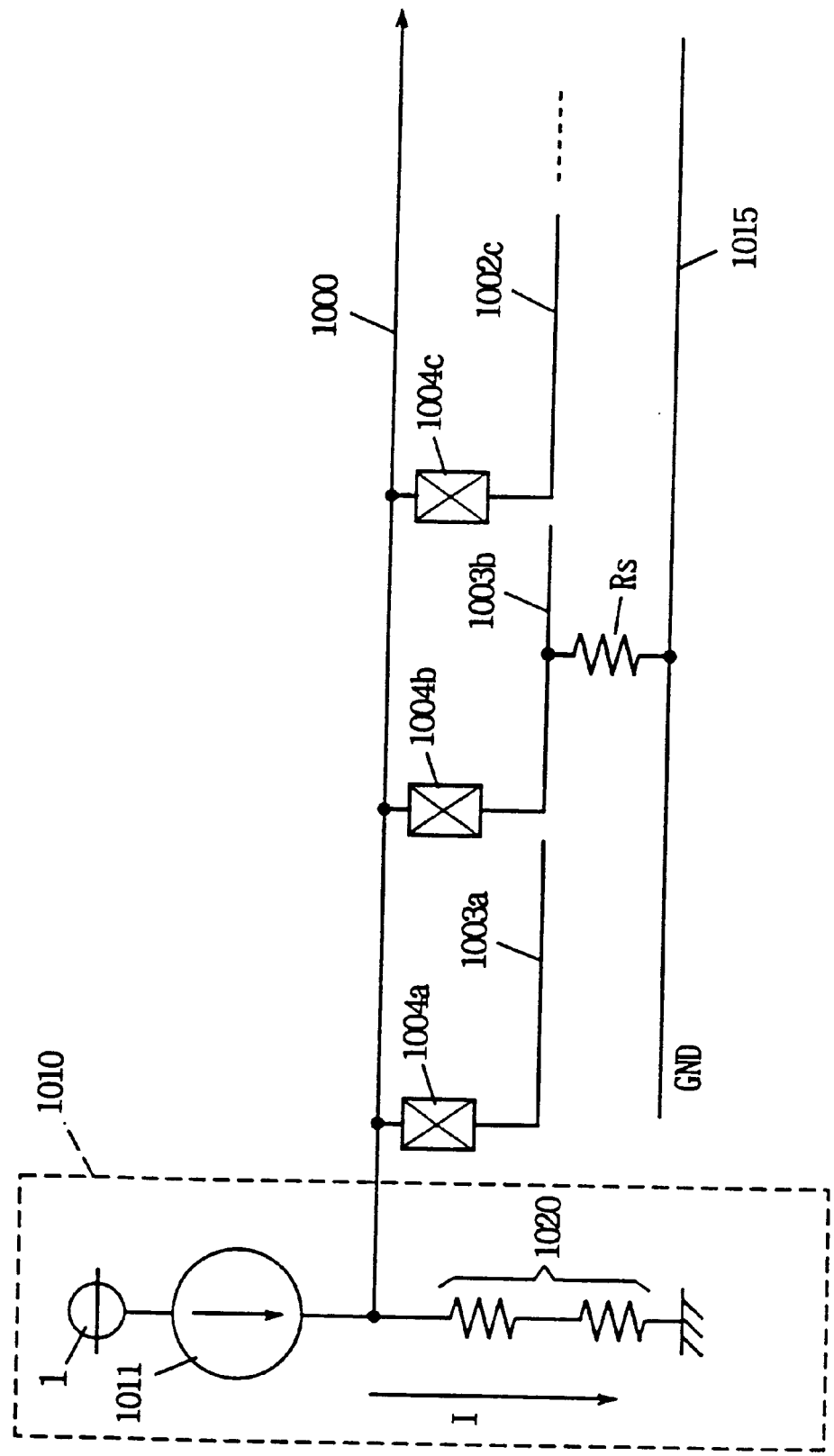
FIG. 126 shows a structure of the main portion of a semiconductor device according to a twenty eighth embodiment of the present invention.

FIG. 126 shows a structure of the main part of a semiconductor device according to a twenty-eighth embodiment of the present invention. An internal voltage from an internal voltage generation circuit 1010 is transmitted on an internal voltage line 1000. Internal voltage line 1000 has a parasitic capacitance and has the potential level determined by the level of the internal voltage from internal voltage generation circuit 1010. Internal voltage generation circuit 1010 includes a constant current source 1011 connected to voltage source node 1 for supplying a constant current, and a resistance element 1012 connected between constant current source 1011 and the ground node. Resistance element 1012 generates an internal voltage according to current I supplied from constant current source 1011. The internal voltage generated by internal voltage generation circuit 1010 may be an operating power supply voltage, an intermediate voltage used during precharging in a semiconductor memory device, or a required reference voltage.

A plurality of subinternal voltage lines 1002a, 1002b, 1003, . . . isolated from each other are provided to internal voltage line 1000. Fusible link elements 1004a, 1004b, 1004c, . . . are arranged between each of subinternal voltage lines 1002a–1003c, . . . and internal voltage line 1000.

Subinternal voltage lines 1002a–1003c, . . . may be arranged according to the functions of load circuits connected thereto, or according to the positions of load circuits on a semiconductor chip. Alternatively, the subinternal voltage lines may be provided for every unit functional block such as a memory block in a semiconductor memory device, as will be shown afterwards.

During a manufacturing process, there is a possibility of short-circuit (indicated by resistance Rs) between subinternal voltage line 1002 (1002b as an example), and ground line 1015. Even when the resistance of short-circuiting resistance Rs is relatively great and the voltage on subinternal voltage line 1002b can be maintained at a level higher than a predetermined value, reference voltage generation circuit 1010 must supply a great amount of current in order to maintain subinternal voltage line 1002b at a constant voltage level.

When the resistance of short-circuiting resistance Rs is small, the voltage level on subinternal voltage line 1002b is reduced. In response, the voltage level on other internal voltage lines 1002a, 1003c, . . . are reduced. Therefore, there is a possibility that the semiconductor device will not operate properly. In this case, a link element 1004b is fused by a laser blow or the like, and subinternal voltage line 1002b is disconnected from internal voltage line 1000. As a result, subinternal voltage lines 1002a, 1003c, . . . are not influenced by short-circuiting resistance Rs, and a voltage of a constant level can be received stably from internal voltage generation circuit 1010. Furthermore, internal voltage generation circuit 1010 can generate an internal voltage of a constant voltage level stably with no increase in the consumed current due to short-circuit resistance Rs.

Voltage source node 1 may received an internal power supply voltage, in place of an external power supply voltage.

First Modification

Figure 127:
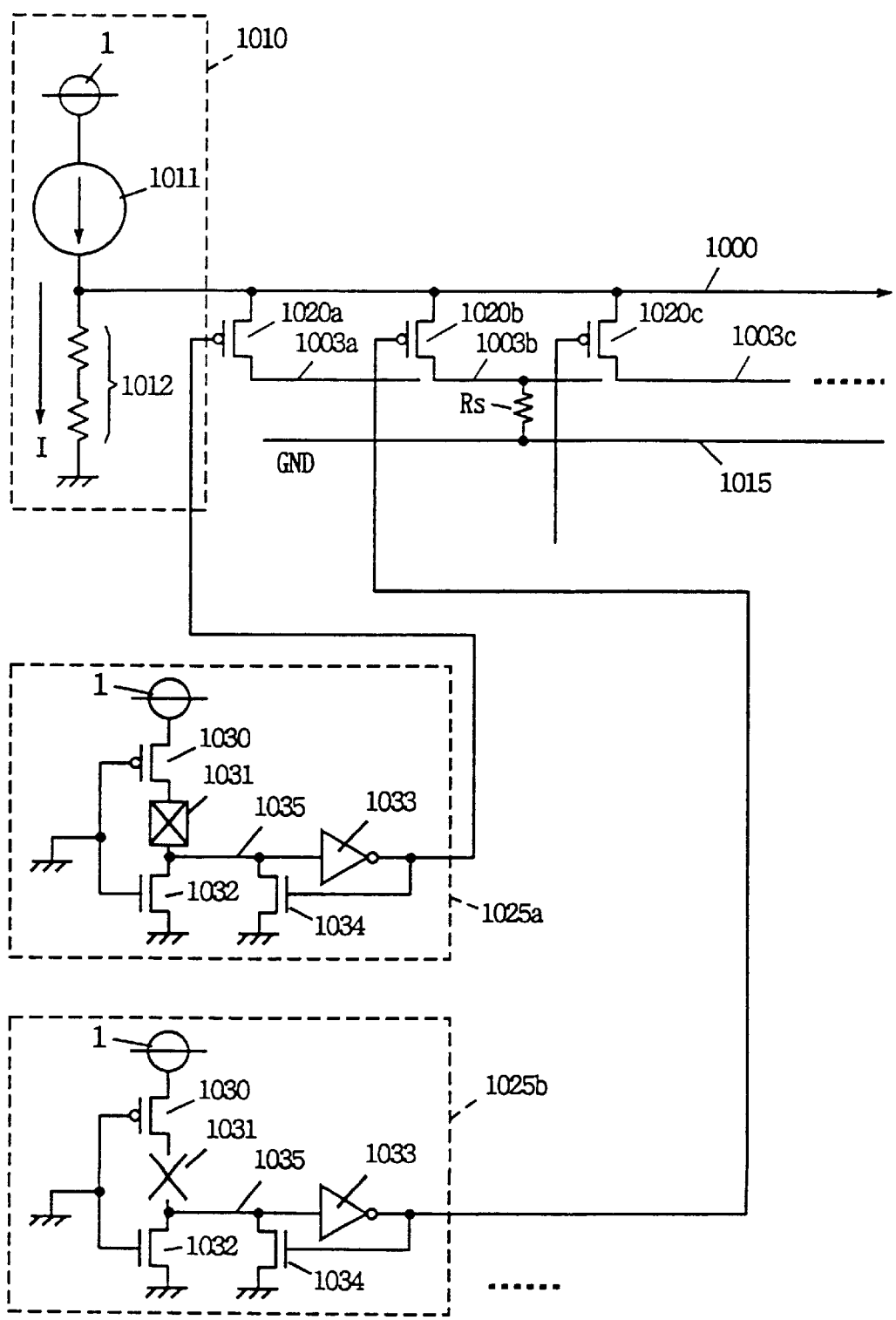
FIGS. 127 and 128 show a structure of first and second modifications, respectively, of the twenty eighth embodiment of the present invention.

FIG. 127 shows a modification of the twenty-eighth embodiment. According to the structure of FIG. 127, switching elements 1020a, 1020b, 1020c, . . . each formed of a P channel MOS transistor connecting a corresponding subinternal voltage line to an internal voltage line 1000 are provided corresponding to subinternal voltage lines 1003a–1003c, . . . , respectively.

Program circuits 1025a, 1025b, . . . for generating a signal to control the conduction/non-conduction of switching elements 1020a–1020c, . . . are provided corresponding to switching elements 1020a–1020c, . . . , respectively. Two program circuits 1025a and 1025b are typically shown in FIG. 127. Program circuits 1025a and 1025b have the same structure. Each program circuit includes a p channel MOS transistor 1030 having one conduction node connected to voltage source node 1, a gate electrode connected to the ground node and the other conduction node connected to a signal line 1035 via a link element 1031, a p channel MOS transistor 1032 having one conduction node connected to signal line 1035 and, the other conduction node connected to the ground node, and a gate electrode connected to the ground potential, an inverter 1033 for inverting the potential on signal line 1035, and an n channel MOS transistor 1034 for selectively connecting a signal line 1035 to the ground node according to-an output signal of inverter 1033.

When there is no short-circuit resistance Rs, link element 1031 is rendered conductive (non-fused state) in program circuits 1025a and 1025b. In this state, the potential on signal line 1035 is charged to a high level by an MOS transistor 1030, which in turn drives the output signal of inverter 1033 to a low level. Here, MOS transistor 1034 is rendered non-conductive. Therefore, a signal of a low level is provided from program circuits 1025a, 1025b, . . . , and switching elements 1020a–1020c all attain a conductive state. Subinternal voltage lines 1003a–1003c, . . . are connected to internal voltage line 1000 to receive an internal voltage from internal voltage generation circuit 1010.

When short-circuit resistance Rs is present in subinternal voltage line 1003b, link element 1031 is fused in program circuit 1025b corresponding to subinternal voltage line 1003b. MOS transistor 1030 is cut off from signal line 1035 which in turn is in a floating state. MOS transistor 1032 has a gate potential of the low level of the ground voltage. At the initial state when power is turned on, signal line 1035 attains a low level, and MOS transistor 1034 conducts in response to the rise of the output signal of inverter 1033 to high level as power is turned on. The output signal from program circuit 1025b is fixed at a high level.

In program circuit 1025a, link element 1031 attains a conductive state, whereby a signal of a low level is provided from program circuit 1025a as in the state of a normal state. Therefore, only switching element 1020b provided corresponding to subinternal voltage line 1003b is rendered non-conductive, and subvoltage line 1003b exhibiting short-circuit is disconnected from internal voltage line 1000. Thus, the influence of short-circuit resistance Rs can be eliminated, so that internal voltage of a constant voltage level can be supplied stably to the remaining proper subinternal voltage lines 1003a and 1003c, . . . .

The provision of a switching element between subinternal voltage lines 1003a–1003c, . . . provides the advantage that generation of short-circuit between an internal voltage line and a proper subinternal voltage line, or a short-circuit between a short-circuited subinternal voltage line and an internal voltage line caused by fragments that is scattered when a link element is blown out can be prevented. A defective subinternal voltage line can reliably be disconnected from an internal voltage line.

Second Modification

Figure 128:
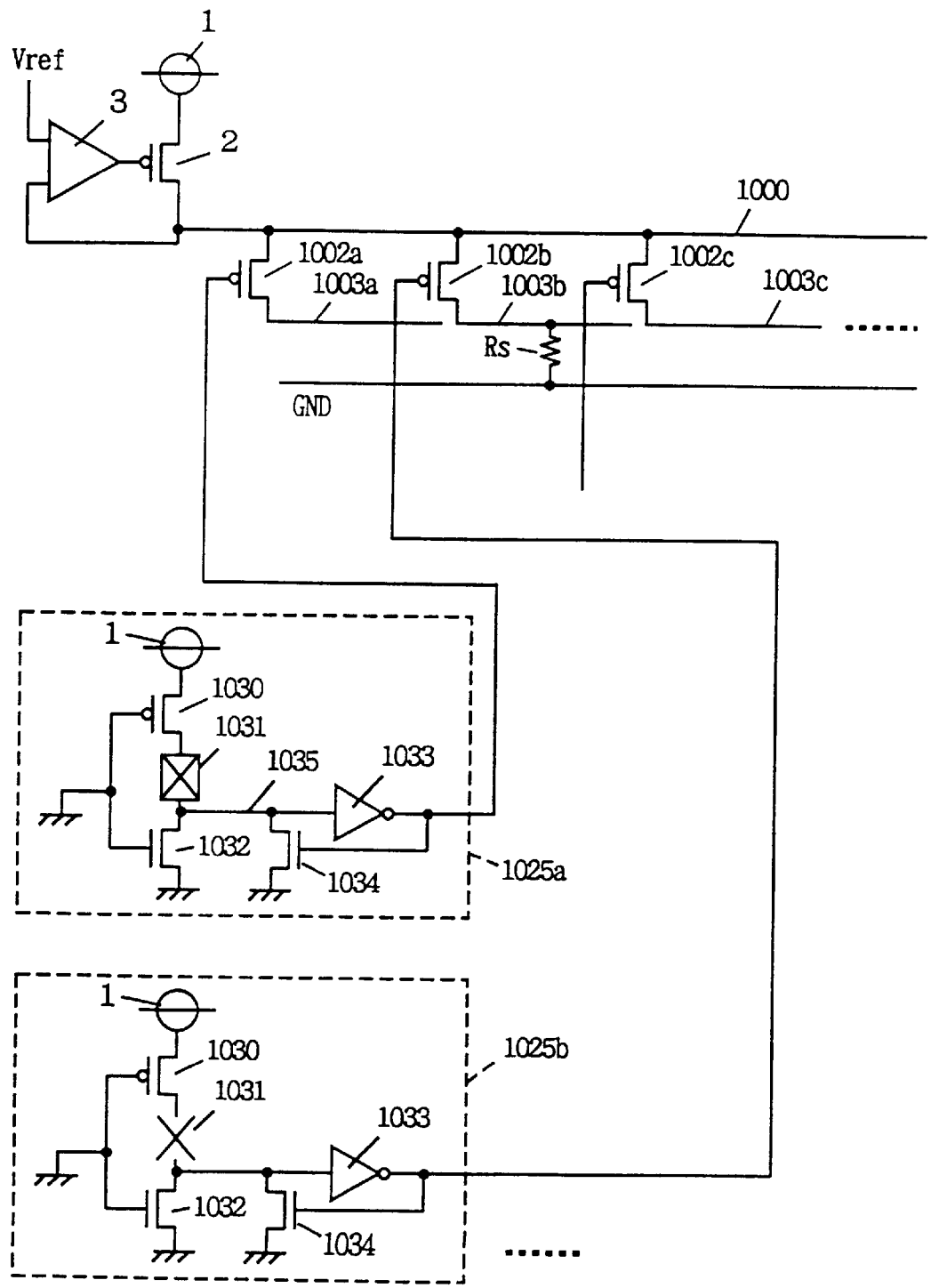

FIG. 128 shows a second modification of the twenty-eighth embodiment. The structure of FIG. 128 is similar to that of FIG. 127, except that an internal power supply voltage generation circuit formed of a drive element 2 and a comparator 3 is used instead of internal voltage generation circuit 1010. The components in the structure of FIG. 128 corresponding to those of FIG. 127 have the same reference characters denoted, and their detailed description will not be repeated.

The internal power supply voltage generation circuit of the structure of FIG. 128 compares the voltage on internal voltage line 1000 with a reference voltage Vref by a comparator 3. A current is supplied from voltage source node 1 to internal voltage line 1000 via drive element 2 according to the comparison result. Therefore, internal voltage line 1000 and subinternal voltage lines 1003a–1003c, . . . function as power supply line voltage lines. By cutting off a defective subinternal voltage line 1003b (short-circuit resistance Rs) from internal voltage line 1000, an internal power supply voltage of a constant voltage level can be supplied stably to each circuit. Thus, the semiconductor device can be operated stably. Furthermore, current consumption of this internal power supply voltage generation circuit can be reduced by cutting off a defective internal voltage line from the internal power supply voltage generation circuit (since there is no leakage current through a defect (short-circuit resistance)).

A circuit generating a high voltage VPP may be used instead of the structure of an internal power supply voltage generation circuit formed of comparator 3 and drive element 2.

Since a defective subinternal voltage line can be cut away from an internal voltage line according to the structure of the twenty eighth embodiment, an internal voltage of a constant voltage level can be supplied stably to a proper subinternal voltage line. Therefore, an internal circuit that uses the voltage on the subinternal voltage line can be operated stably. Current consumption of the internal voltage generation circuit is reduced since there is no leakage current.

Embodiment 29

Figure 129:
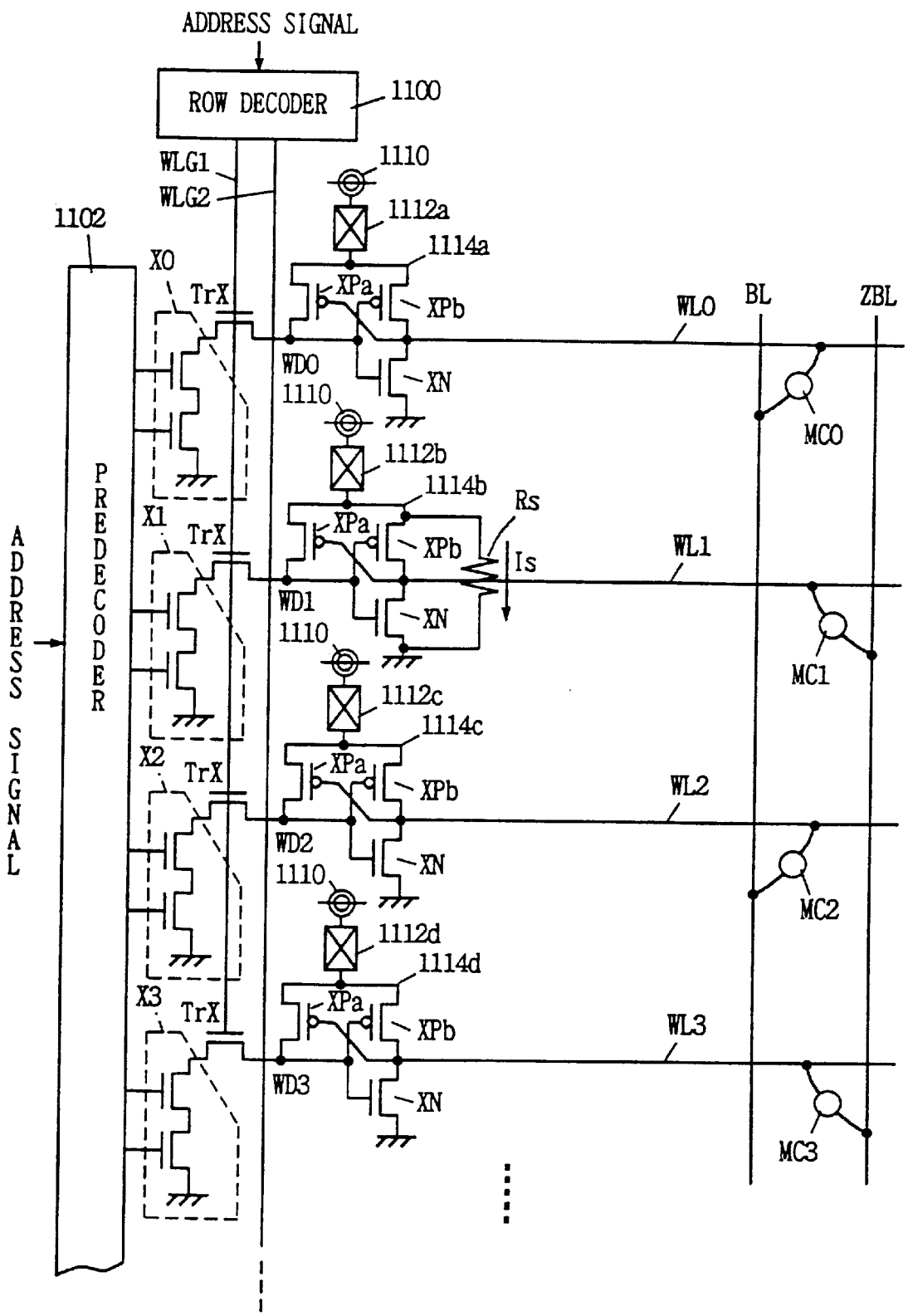
FIG. 129 shows a structure of the main portion of a semiconductor device according to a twenty ninth embodiment of the present invention.

FIG. 129 shows a structure of the main part of a semiconductor device according to a twenty ninth embodiment of the present invention. An example of a structure of a memory cell array portion of a semiconductor memory device is shown in FIG. 129.

Referring to FIG. 129, a semiconductor device includes a plurality of memory cells arranged in a matrix of rows and columns. Memory cells MC0–MC3 arranged in 4 rows and 1 column are typically shown in FIG. 129. The semiconductor device further includes word lines WL0–WL3 disposed corresponding to respective rows of the memory cell array to which corresponding rows of memory cells are connected, and a bit line pair BL and ZBL disposed corresponding to each column of memory cells to which a corresponding column of the memory cells are connected. The pair of bit lines BL and ZBL transmit data signals complementary to each other. Here, word lines WL0–WL3 form one group.

The semiconductor device further includes a row decoder 1100 for decoding an internal address signal from an address buffer not shown to output a word line group signal specifying a group of word lines WL0–WL3, a predecoder 1102 for predecoding an internal address signal from an address buffer not shown, and X decoders X0–X3 arranged corresponding to word lines WL0–WL3, respectively, for transmitting a word line select signal onto a corresponding word line according to an output signal of a predecoder 1102. Predecoder 1102 predecodes an address signal of, for example, 2 bits, to provide a signal that selects any of X decoders X0–X3. Each of X decoders X0–X3 includes an NAND type decoder structure formed of n channel MOS transistors connected in series.

A select gate TrX is provided corresponding to respective X decoders X0–X3, conducting in response to a word line group specify signal from row decoder 1100 and, functioning as a decoder for transmitting an output signal from a corresponding X decoder X0–X3.

Word drivers WD0–WD3 are arranged corresponding to word lines WL0–WL3, respectively, for converting the level of the signal provided from select gate TrX to transmit a voltage of the high voltage VPP level onto a selected word line. Each of word drivers WD0–WD3 transmits a high voltage applied to high voltage apply nodes 1114a–1114d to a corresponding WL0–WL3 when selected. Each of word drivers WD0–WD3 has the same structure, and includes a p channel MOS transistor XPb and an n channel MOS transistor XN forming an inverter connected between a high voltage apply node 1114 (1114a–1114d) and the ground node for inverting a signal applied via a corresponding selected gate TrX, and a p channel MOS transistor XPa for transmitting the high voltage applied to high voltage apply node 1114 (1114a–1114d) to MOS transistors XPb and XN when the potential on a corresponding word line WL (WL0–WL3) attains a low level. More specifically, word drivers WD0–WD3 include a structure of a level converter of a "half latch".

Fusible link elements 1112a–1112d are provided between respective high voltage apply nodes 1114a–1114d of word drivers WD0–WD3 and a high voltage node 1100 to which the high voltage of a high voltage generation circuit (may be any high voltage generation circuit of the previous embodiments) is transmitted. The operation will now be described.

In a normal state, all link elements 1112a–1112d are conductive. One of X decoders X0–X3 is selected according to an output signal of predecoder 1102. A signal of a low level is provided from the selected X decoder. When a group specify signal WLG1 from row decoder 1100 is pulled up to a selected state of a high level, select gate TrX is rendered conductive. A word line group specify signal WLG2 specifying another word line group attains a low level.

It is assumed that X decoder X0 is selected. In this case, the gate potential of P channel MOS transistor XPb of word driver WD0 attains a low level, and high voltage VPP applied to high voltage node 1100 on word line WL0 is provided to high voltage apply node 1114a via link element 1112a, whereby the potential on word line WL0 rises to the level of high voltage VPP. Here, MOS transistor XPa and XN are non-conductive in word driver WD0. MOS transistors XN in the remaining word drivers WD1–WD3 conduct, and word lines WL1–WL3 are fixed to the low level of the ground voltage. MOS transistor XPa in word drivers WD1–WD3 conduct, so that MOS transistor XPb reliably maintains a non-conductive state.

The data of memory cell MC0 connected to selected word line WL0 is read out on bit line BL to be detected and amplified via a sense amplifier not shown. Then, data read out/writing is carried out.

A case is considered where there is a fault in word driver WD1. More specifically, the case where high voltage apply node 1114b and the ground node are short-circuited by short-circuit resistance Rs in word driver WD1 is considered. Leakage current Is flows from high voltage node 1100 through link element 1112b and high voltage apply node 1114b into the ground voltage supply node via short-circuit resistance Rs. The consumed current of the high voltage generation circuit is increased even when the word line can properly be driven to a selected state. Word line WL1 is regarded as a defective word line, and substituted by a redundant word line that will be described afterwards. In this case, link element 1112b is blown out by a laser blow method or the like. By fusing out link element 1112b, high voltage node 1100 is isolated from high voltage apply node 1114b. The current path from high voltage node 1100 to high voltage apply node 1114b is cut off, so that leakage current Is due to short circuit resistance Rs is not generated. Therefore, current consumption of the high voltage generation circuit can be reduced.

By disconnecting a high voltage apply node corresponding to a defective word driver (a defective word driver) from the high voltage generation circuit, current consumption of the high voltage generation circuit is reduced. High voltage VPP of a constant voltage level can be supplied stably to each word driver.

First Modification

Figure 130:
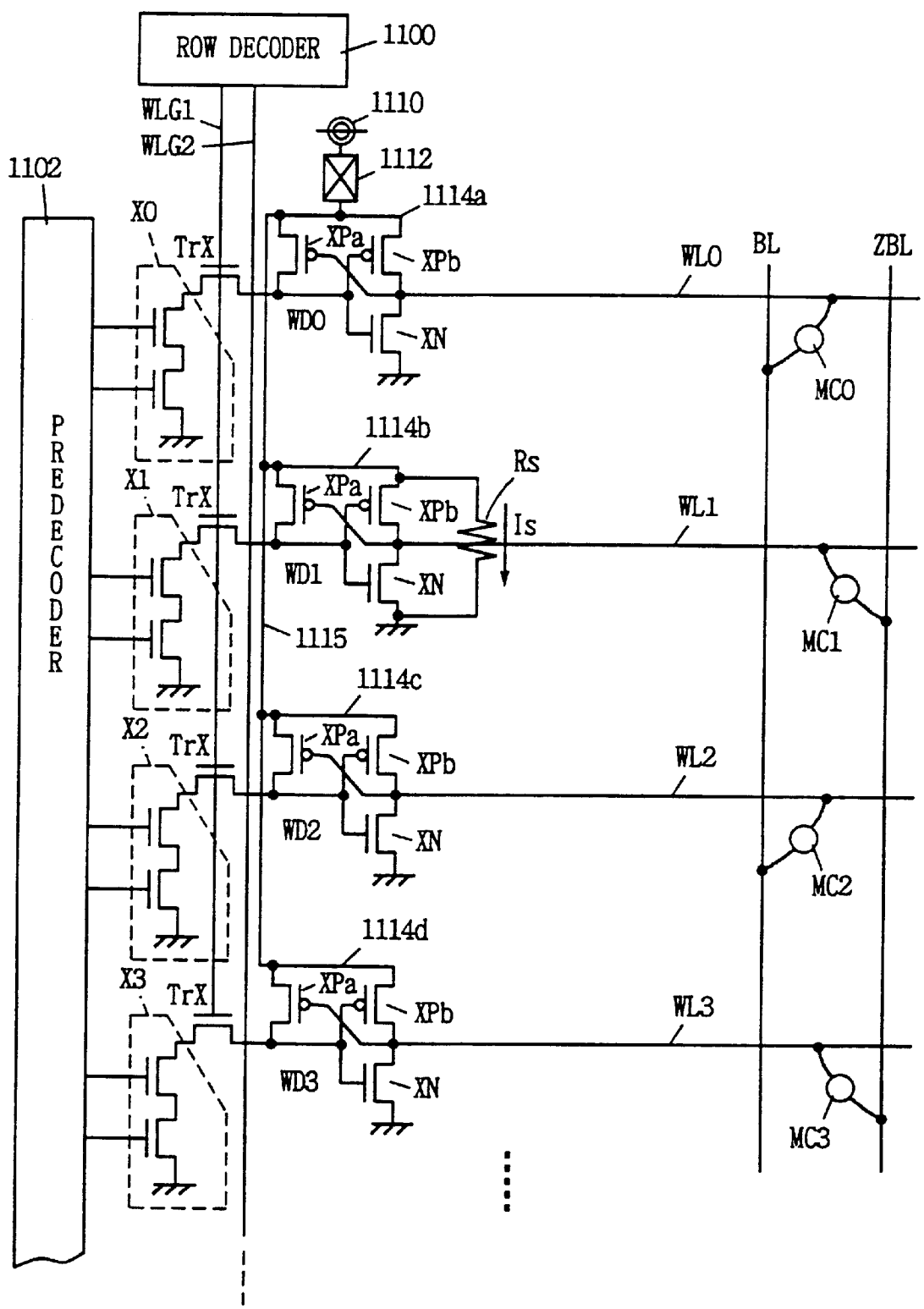
FIG. 130 shows a structure of a modification of the semiconductor device of the twenty ninth embodiment of the present invention.

FIG. 130 shows a structure of a first modification of the twenty ninth embodiment. Four word lines WL0–WL3 are selected as one group by an output signal of row decoder 1100. The components in FIG. 130 corresponding to those of FIG. 129 have the same reference characters allotted, and their details will not be repeated. According to the structure of FIG. 130, high voltage apply nodes 1114a–1114d of word drivers WD0–WD3 forming one group are interconnected by low resistance line 1115. High voltage apply node 1114a of one word driver WD0 is connected to high voltage node 1110 via link element 1112. Link element 1112 is blow fused when there is a defective word driver in one of the word line groups. Thus, high voltage apply nodes 1114a–1114d of four word drivers WD0–WD3 are disconnected from high voltage node 1110 to inhibit supply of high voltage to word drivers WD0–WD3. Although repair is allowed for every one word line (word driver) according to the structure of FIG. 129, repair (exchange) is carried out with one group of word lines as a unit in the structure shown in FIG. 130. Leakage current of a defective word driver can be suppressed reliably.

In the case of a defective word line (defective word driver), not only repairing of a defective word line, but also suppression of supplying high voltage to a word driver are effected to reduce the load of the high voltage generation circuit. Therefore, high voltage can be applied stably to each proper circuit. Furthermore, current consumption of the high voltage generation circuit is reduced to realize a semiconductor device (semiconductor memory device) of low current consumption.

Structure of Redundant Unit

Figure 131:
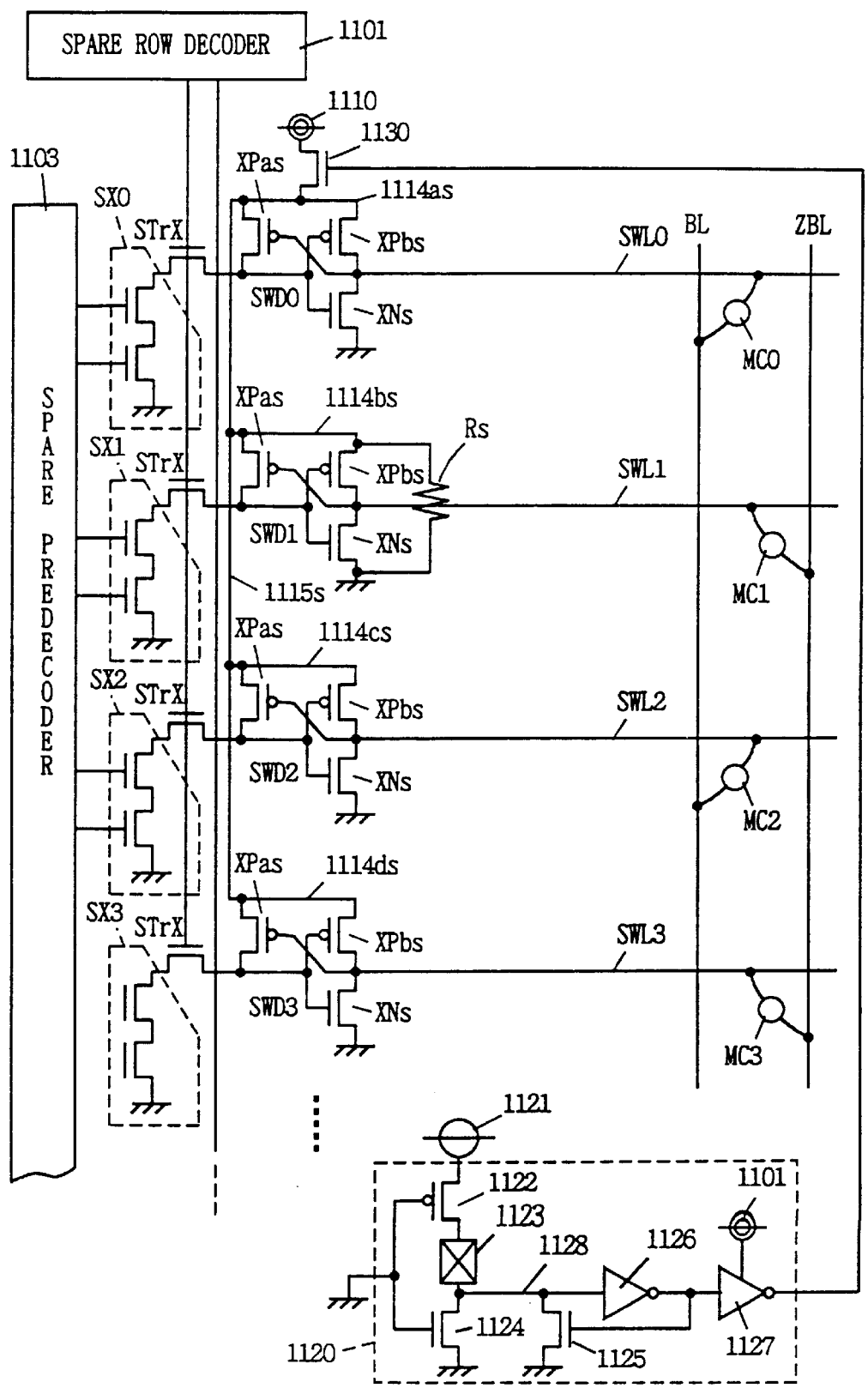
FIG. 131 shows a structure of the redundancy unit of the twenty ninth embodiment of the present invention.

FIG. 131 shows the portion of the redundant circuit which is to be substituted with a defective word driver shown in FIG. 130. Referring to FIG. 131, spare word lines SWL0–SWL3 are provided to be substituted for the group of word lines WL0–WL3. Spare word drivers SWD0–SWD3 are provided corresponding to spare word lines SWL0–SWL3, respectively. The structure of spare word drivers SWD0–SWD3 is similar to the structure of word drivers WD0–WD3 shown in FIG. 130. Corresponding components have the letter "s" attached as the last letter in a corresponding reference character. The details will not be repeated. Each of high voltage apply nodes 1114as–1114ds of spare word drivers SWD0–SWD3 are interconnected via a signal line (low resistance interconnection) 1115s. High voltage apply node 1114a s of spare word driver SWD0 is connected to high voltage node 1110 via a switching transistor 1125 formed of a p channel MOS transistor conducting in response to an output signal of program circuit 1120.

Program circuit 1120 includes a p channel MOS transistor 1122 having one conduction node connected to a voltage supply node (may be either an external or internal power supply voltage) 1121, a gate electrode connected to the ground node, and the other conduction node connected to link element 1123, an n channel MOS transistor 1124 having one conduction node connected to a link element, a gate electrode connected to the ground potential and the other conduction node connected to the ground potential, an inverter 1126 for inverting the potential on signal line 1128 connected to the connection node of link element 1123 and MOS transistor 1120, a switching element 1125 responsive to an output signal of inverter 1126 for selectively connecting signal line 1128 to the ground potential, and an inverter 1127 for inverting an output signal of inverter 1126. Similar to word drivers WD0–WD3 and spare word drivers SWD0–SWD3, inverter 1127 has a level conversion function, and provides the signal of a high level at high voltage VPP.

Program circuit 1120 includes a spare row decoder 1101 activated when a defective word line (defective word driver) is selected to select a group of spare word drivers SWD0–SWD3 for providing a group specify signal, a spare predecoder 1103 activated when a defected word line (defective word driver) is selected for providing a signal specifying one of spare word lines SWL0–SWL3, spare X decoders SW0–SW3 provided corresponding to spare word lines SWL0–SWL3 respectively, for decoding an output signal of spare predecoder 1103, and a select gate STrX for transmitting an output signal of spare X decoders X0–X3 to a corresponding spare word driver SWD0–SWD3 according to an output signal of spare row decoder 1101.

In program circuit 1120, link element 1123 is rendered conductive when spare word lines SWL0–SWL3 are not used (when no defective word line or no defective word driver is present). In this state, the potential on signal line 1128 attains a high level, and the output signal of inverter 1126 attains a low level of the ground potential. In this case, a signal of a high voltage VPP level is provided from inverter 1127, and switching element 1130 is rendered non-conductive, so that high voltage is not supplied to spare word drivers SWD0–SWD3.

Link element 1123 is fused out when there is a defective word line (or a defective word driver), and the potential on signal line 1128 attains the level of the ground potential. (Although MOS transistor 1124 is rendered non-conductive, the potential on signal line 1128 attains a low level when power is turned on, and fixed to the level of the ground potential by inverter 1126 and. switching element 1125). Therefore, the output signal of inverter 1127 attains a low level of the ground potential, whereby switching transistor 1130 conducts. A high voltage from high voltage node 1110 to spare word drivers SWD0–SWD3 is transmitted to each of high voltage apply nodes 1114as–1114ds. When a defective word driver is selected, spare row decoder 1101 and spare predecoder 1103 are activated. The spare word line substituted for the defective word line is selected.

According to the above structure, high voltage is applied to the redundant circuit portion only when there is a defective word line (or defective word driver). The usage of an unnecessary high voltage can be suppressed to reduce the load of the high voltage generation circuit.

In the above-described semiconductor device, the repair (substitution) of a defective word line can be carried out with four word lines as a group (unit). The present embodiment can be applied even in a structure where the defect repairing is carried out by the unit of one memory block (for example, 64 word lines).

Embodiment 30

Figure 132:
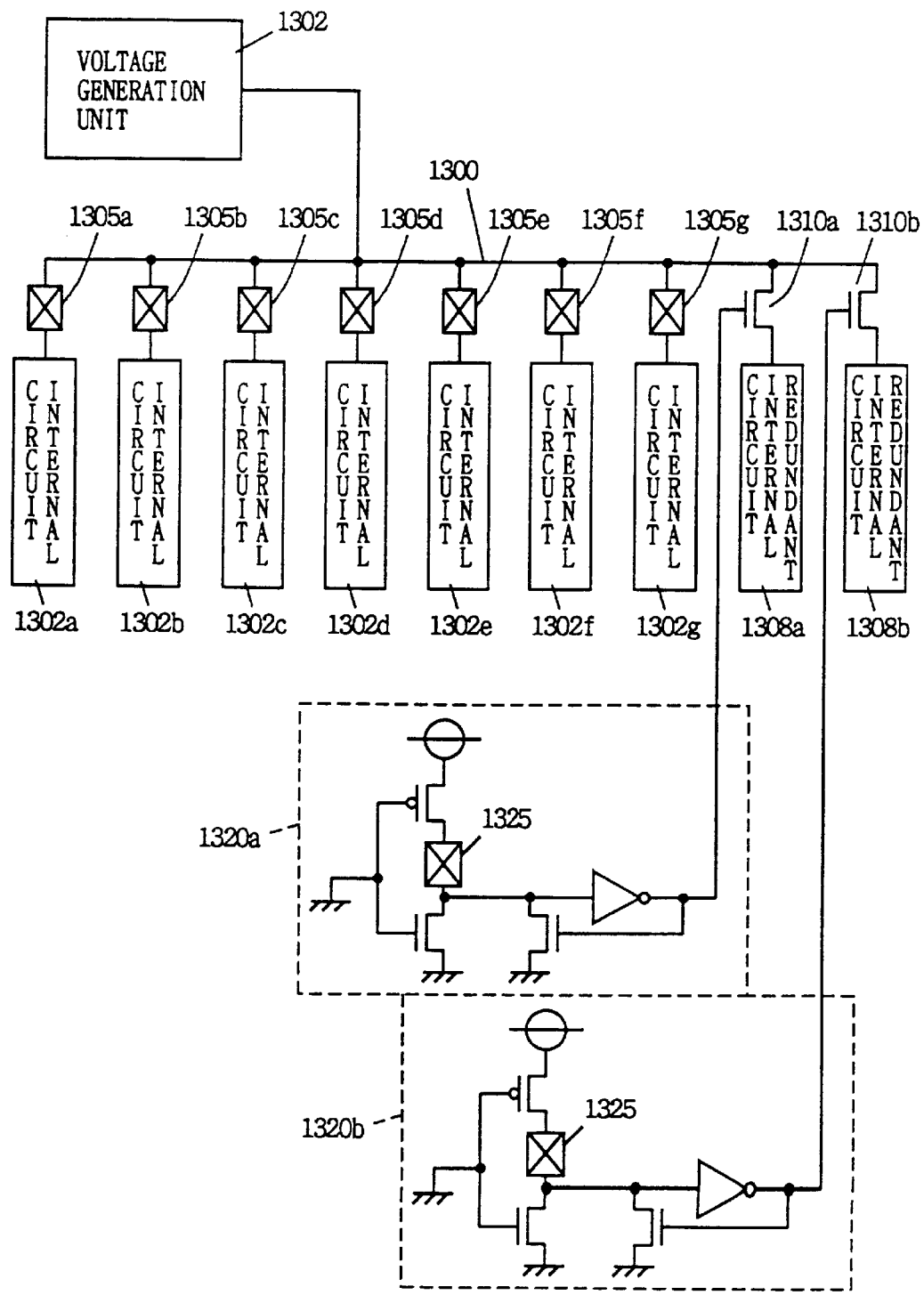
FIG. 132 schematically shows a structure of a semiconductor device according to a thirtieth embodiment of the present invention.
Figure 133:
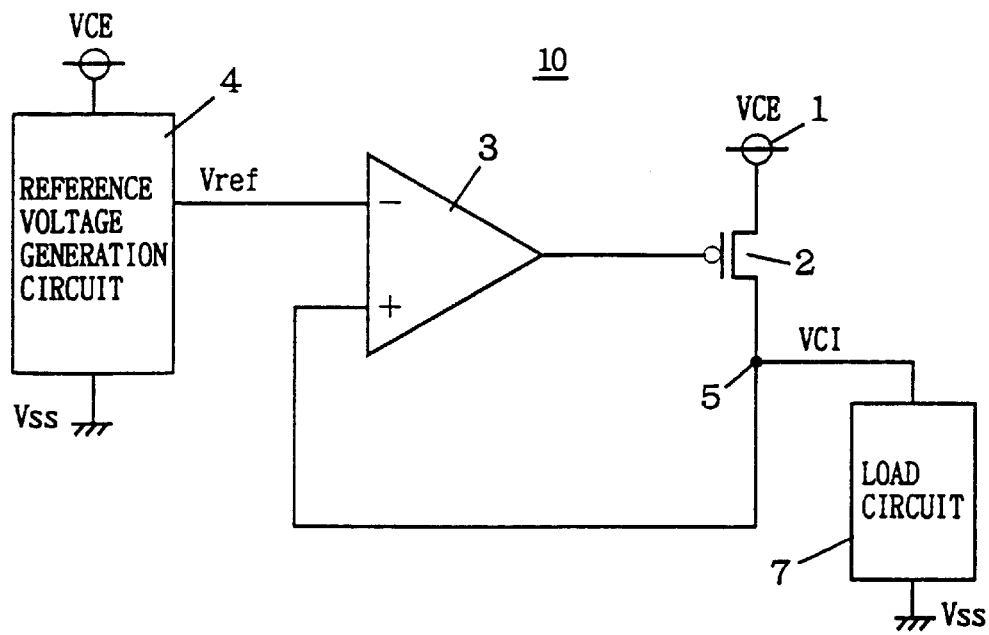
FIG. 133 shows a structure of a conventional internal voltage down converter.
Figure 134:
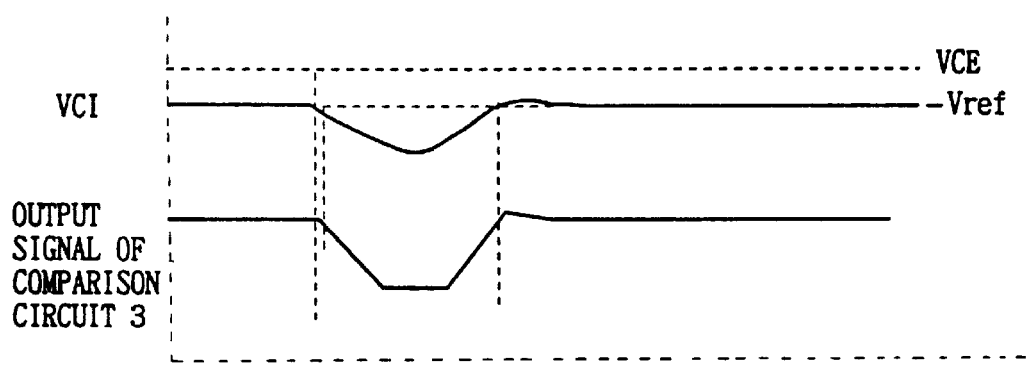
FIG. 134 is a diagram for schematically representing an operation of the circuit of FIG. 133.

FIG. 132 shows a structure of the main part of a semiconductor device according to a thirtieth embodiment of the present invention. An internal voltage from voltage generation unit 1302 is transmitted to an internal voltage line 1300. Voltage generation unit 1302 may provide an external power supply voltage to voltage line 1300, or generate a high voltage VPP, or generate an internal down-converted power supply voltage. A plurality of internal circuits 1302a–1302g each realizing the same function are interconnected via link elements 1305a–1305g, respectively, in parallel to internal voltage line 1300. Internal circuits 1302a–1302e each may be a circuit that realizes the same function. For example, it may be one memory block or memory array in a semiconductor memory device, sense amplifiers or word drivers in one memory block.

Redundant internal circuits 1302h–1302i realizing a function identical to that of internal circuits 1302a–1302g are connected to internal voltage line 1300 via switching elements 1310a–1310b, respectively. Switching elements 1310a and 1310b have the conduction/non-conduction controlled by an output signal of program circuits 1320a and 1320b, respectively.

In a proper state of internal circuits 1302a–1302g, link elements 1305a–1305g conduct. Similarly, link element 1325 conducts in program circuits 1320a and 1320b. Similar to the previous embodiment, a signal of a low level from the inverter is provided from program circuit 1320a, whereby switching transistors 1310a and 1310b are rendered non-conductive. Redundant internal circuits 1308a–1308b are cut away from internal voltage transmission line 1300.

When an error or malfunction occurs in any of internal circuits 1302a–1302g, a link element 1305 corresponding to the defective internal circuit is fused out. The defective internal circuit is cut away from internal voltage transmission line 1300. Similarly, link element 1325 is fused out in one or both of program circuits 1320a and 1320b, whereby the signal from program circuit 1320a and/or 1320b is pulled up to a high level. Switching transistor 1310a and/or 1310b conduct, whereby redundant internal circuit 1308a and/or 1308b is connected to internal voltage line 1300. Therefore, a defective internal circuit is substituted with a redundant internal circuit. Since voltage generation unit 1302 is disconnected from the defective internal circuit, unrequited current consumption is eliminated. A voltage of a constant level can be supplied stably to each internal circuit and/or redundant internal circuit. Thus, an internal voltage generation system that transmits an internal voltage stably can be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a plurality of internal power supply lines;

a plurality of active internal voltage down means provided corresponding to the respective internal power supply lines, each of said plurality of internal voltage down means being activated in response to a related activation signal for lowering a level of an externally applied power supply voltage to generate and supply to a corresponding internal power supply line an internal power supply voltage; and constant internal voltage down means constantly maintaining an active state regardless of activation and inactivation of said related activation signal for generating and supplying to said plurality of internal power supply voltage lines said internal voltage from said externally applied power supply voltage.

2. A semiconductor device comprising:

a plurality of internal power supply voltage generation means connected in parallel to each other to an external power supply potential supply node supplying an external power supply potential, each for generating an internal power potential differing in level from said external power supply potential on a common internal power supply line; and active control means responsive to an operation timing signal for activating said plurality of internal power supply voltage generation means in a time-divisional manner.

3. A power supply voltage generation circuit comprising:

first and second drive elements each connected between a first power supply node supplying a first power supply potential and a second power supply node supplying a second power supply potential, and each having a control electrode;

first control means responsive to a potential of said second power supply node for controlling a potential of the control electrode of said first drive element with a first amplification rate; and second control means responsive to the potential of said second power supply node for controlling a potential of the control electrode of said second drive element with a second amplification rate different from the first amplification rate.

4. The power supply voltage generation circuit according to claim 3, wherein said first control means includes a circuit for generating a signal applied to the control electrode of the first drive transistor with the first amplification rate in accordance with a difference between the second power supply potential and a reference potential, and said second control means includes a circuit for generating a signal applied to the control electrode of the second drive element with the second amplification rate in accordance with the difference between the second power supply potential and the reference potential.

5. The power supply voltage generation circuit according to claim 3, wherein at least one of the first and second control means changes the potential of the control electrode of a corresponding drive element analoguely in accordance with the potential at said second power supply node.

6. The semiconductor memory device according to claim 3, wherein said first control means shares a part of components thereof with said second control means.

7. The semiconductor memory device according to claim 6, wherein the part of components thereof comprises a comparator for comparing the potential at said second power supply node with a reference potential.

8. The power supply voltage generation circuit according to claim 3, wherein at least one of the first and second control means changes the potential of the control electrode of a corresponding drive element between two states digitally in accordance with the potential at said second power supply node.

9. The power supply voltage generation circuit according to claim 8, wherein said at least one of the first and second control means comprises an amplitude limiter for restricting an amplitude of the potential of the control electrode of the corresponding drive element to a range smaller than a range between the potential at the first power supply node and a ground potential.

10. A power supply voltage generation circuit comprising:
   a plurality of drive elements each connected between a first power supply node supplying a first power supply potential and a second power supply node supplying a second power supply potential in parallel to others, and each including a control electrode; and
   means responsive to a potential on said second power supply node for setting potentials of the control electrodes of said plurality of drive elements individually and independently with different amplification rates for the respective potentials of the control electrodes of said plurality of drive elements.

11. The power supply voltage generation circuit according to claim 10, wherein said means includes control means provided corresponding to the respective drive elements and for setting the respective potentials of the control electrodes in accordance with the voltage on said second power supply node with the different amplification rates for the respective control electrodes.

12. The power supply voltage generation circuit according to claim 10, wherein said means for setting potentials includes circuitry for generating signals applied to the respective control electrodes of the plurality of drive elements with the different amplification rates for the respective drive elements in accordance with a difference between the second power supply voltage and a common reference voltage.

13. A semiconductor device comprising:
   a reference voltage generation circuit connected to a first voltage source for generating and providing a first reference voltage from a voltage supplied by said first voltage source;
   load circuits divided into a plurality of groups; and
   a plurality of voltage generation elements arranged corresponding to said plurality of groups, each voltage generation element generating an internal voltage of same voltage level according to said first reference voltage on a load circuit of a corresponding group to be used.

14. The semiconductor device according to claim 13, further comprising:
   a second reference voltage generation circuit coupled to said first voltage source for generating a second reference voltage having an absolute value greater than that of said first reference voltage,
   a plurality of second voltage generation elements, each generating a second internal voltage according to said second reference voltage, and
   a plurality of control elements provided corresponding to said plurality of second voltage generation elements for transmitting to said plurality of load circuits the second internal voltage generated by corresponding second voltage generation elements in response to an operation timing signal.

15. The semiconductor device according to claim 13, wherein each of said plurality of voltage generation elements comprises an insulation gate type field effect transistor including one active region coupled to a voltage supply node to which a voltage is transmitted having an absolute value no less than the first reference voltage, another active region coupled to an internal voltage transmission line disposed over a corresponding load circuit, and a control electrode coupled to receive said first reference voltage, wherein a channel width of the insulation gate type field effect transistor of each of the voltage generation elements is substantially equal to the width of said internal voltage transmission line, and greater than the channel width of an insulation gate type field effect transistor of a component of the corresponding load circuit.

16. The semiconductor device according to claim 13, wherein each of said plurality of voltage generation elements comprises
   a voltage transmission line arranged parallel to a formation region forming a corresponding load circuit for transmitting a voltage having an absolute value greater than that of said first reference voltage,
   an internal voltage transmission interconnection arranged over the corresponding load circuit parallel to said voltage transmission line,
   a reference voltage interconnection arranged between and in parallel to said voltage transmission line and said internal voltage transmission interconnection for transmitting said first reference voltage, and
   a transistor including one conduction region extending beneath said voltage transmission line along an extending direction of said voltage transmission line and coupled to said voltage transmission line, another conduction region formed extending beneath said internal voltage transmission interconnection along an extending direction of said internal voltage transmission interconnection and coupled to said internal voltage transmission interconnection, and a gate electrode arranged in parallel to and between said one and said another conductive regions, and coupled to receive said reference voltage.

17. The semiconductor device according to claim 13, wherein each of said plurality of voltage generation elements comprises
   a voltage interconnection arranged over a corresponding load circuit for transmitting a voltage of an absolute value greater than that of said first reference voltage,
   an insulation gate type field effect transistor including one active region of a predetermined width formed beneath said voltage interconnection in parallel to said voltage interconnection and coupled to said voltage interconnection, another active region of said predetermined width formed apart from said one active region and beneath said voltage interconnection, a gate electrode layer above a region between said one and another active regions and formed beneath said voltage interconnection and coupled to receive said first reference voltage, and
   an internal voltage interconnection coupled to said another active region, formed at a layer lower than said voltage interconnection for transmitting said internal voltage to a transistor element in a corresponding load circuit.

18. The semiconductor device according to claim 13, wherein said first voltage source boosts a voltage at power node receiving a power supply voltage to generate the voltage for application to the reference voltage generation circuit, and each of the voltage generation elements is an insulated gate type field effect transistor coupled between the internal voltage line coupled to a corresponding load circuit and said power node and receiving said first reference voltage at a gate thereof and operating in a source follower mode to generate the internal voltage.

19. The semiconductor device according to claim 13, wherein each of the voltage generation elements is an insulated gate type field effect transistor receiving the first reference voltage at a gate thereof and operating in a source follower mode to generate said internal voltage.

20. The semiconductor device according to claim 19, wherein said first voltage source receives a voltage at power node receiving a power supply voltage for application to the reference voltage generation circuit, and each of the voltage generation elements is an insulated gate type field effect transistor coupled between the internal voltage line coupled to a corresponding load circuit and said power node and receiving said first reference voltage at a gate thereof and operating in a source follower mode to generate the internal voltage.

21. A semiconductor device comprising:
   internal voltage generation means coupled to a power supply node for generating and transmitting to a main internal power supply line a reference voltage from a voltage applied to said power supply node,
   a plurality of subinternal power supply lines coupled in parallel to each other to said main internal power supply line, and
   a plurality of separating means arranged each between said main internal power supply line and each said subinternal power supply line for fixedly isolating said main power supply line from a corresponding sub internal power supply line.

22. The semiconductor device according to claim 21, wherein each of said plurality of separating means comprises a fusible link element.

23. The semiconductor device according to claim 21, wherein each of said plurality of separating means comprises
   a switching element arranged between said main internal power supply line and a corresponding subinternal power supply line, and
   signal generation means including a fusible link element for generating and providing to said switching element a signal determining a non-conduction/conduction state of said switching element according to a fuse/non-fuse state of said fusible link element.

24. The semiconductor device according to claim 21, wherein said internal voltage generation means comprises an internal voltage down circuit for down-converting an external power supply voltage applied to said power supply node to generate an internal voltage and transmitting the same to said main internal power supply line.

25. A power supply voltage generation circuit comprising:
   a comparison circuit for comparing a reference potential and an internal potential on an internal potential line for generating a control signal changing between two levels digitally and having an amplitude thereof limited in accordance with a result of comparison;
   a drive element coupled between a power supply node and said internal potential line for supplying a current flow from said power supply node to said internal potential line in accordance with said control signal.

26. The power supply voltage generation circuit according to claim 25, wherein the control signal has an amplitude of an amplitude limited CMOS level.

27. The power supply voltage generation circuit according to claim 26, wherein said comparison circuit an amplitude limiter for limiting an amplitude of the control signal at a source side of CMOS level different from a side of a potential of the first power supply node.

28. The power supply voltage generation circuit according to claim 27, wherein said amplitude limiter includes an insulated gate field effect transistor receiving a reference voltage at a control gate thereof at the source side.

29. The power supply voltage generation circuit according to claim 25 further comprising an amplitude limiter for amplitude-limiting the control signal from the comparator for application to a control electrode of said drive element.

30. The power supply voltage generation circuit according to claim 29, wherein said amplitude limiter changes a source side potential of CMOS level determining an amplitude of an amplitude-limited signal in accordance with the potential at the internal potential.

31. The power supply voltage generation circuit according to claim 30, wherein said amplitude limiter raises the source side potential in accordance with increase of the internal potential.

32. A power supply voltage generation circuit comprising:
   a first drive element coupled between a first power supply node and a second power supply node and having a conductance changing in accordance with a potential at a control electrode thereof;
   a second drive element connected between said first power supply node and said second power supply node and having a control electrode;
   first control circuit for controlling the potential of the control electrode of said first drive element in accordance with a potential of said second power supply node in a first control manner; and
   a second control circuit, operating an offset to an operation of said first control circuit, for controlling the potential of said second drive element in accordance with the potential at said second power supply node in a second control manner different from said first control manner.

33. A power supply voltage generation circuit comprising:
   a current drive element for supplying a current from a first power supply node to a second power supply node in accordance with a potential of a control electrode thereof;
   a control circuit for pulse controlling the potential of the control electrode of the current drive element in accordance with a potential at said second power supply node, a pulse width of an output signal of the control circuit changing in accordance with the potential at the second power supply node.

34. A power supply voltage generation circuit comprising:
   a current drive transistor for causing a current flow between a first power supply node receiving a first power supply potential and a second power supply node receiving a second power supply potential in accordance with a potential at a control electrode thereof; and
   a comparator for comparing a reference potential and the second potential for controlling the potential of said current drive transistor in accordance with a result of comparison, said comparison circuit having a differential stage receiving the reference potential and the second potential and having different current flowing power for the reference potential and the second potential.

35. The power supply voltage generation circuit according to claim 34, wherein said differential stage has a first stage for driving said current drive transistor and a second stage coupled to said first stage and having a smaller current drive power than a current drive power of said first stage.

36. The power supply voltage generation circuit according to claim 34, wherein said comparator includes a differential stage for comparing the reference potential and said second potential and a current supply stage for supplying a current to said differential stage, and in the current supply stage and the differential stage, a first path for the reference potential and a second path for the second potential each include a first transistor element for supplying a current and a second transistor element receiving the current from the first transistor, and a ratio of a current drive power of the first transistor element and a current drive power of the second transistor element is the same between the first path and the second path.

37. A power supply voltage generation circuit comprising:
a first drive element for causing a current flow between a first power supply node and a second power supply node in accordance with a potential at a control electrode thereof;
a second drive element for causing a current flow between said first power supply node and said second power supply node in accordance with a potential at a control electrode thereof, and
a control circuit for controlling the potential of the control electrodes of the first and second drive elements differently from each other in accordance with a potential at said second power supply node, said control circuit including a comparator having separate outputs provided corresponding to the first and second drive elements for outputting output signals for the first and second drive elements respectively in accordance with the potential at the second power supply node.

38. A power supply voltage generation circuit comprising:
an internal voltage line.
an active internal voltage generator for supplying a current onto said internal voltage line in accordance with a voltage on said internal voltage line to generate the internal voltage on the internal voltage line when made active;
a normally active internal voltage generation circuit supplying a current to an output node thereof in accordance with a voltage at said output node; and
switch circuit for selectively connecting said output node and said internal voltage line in response to an operation mode designation signal.

39. The power supply voltage generation circuit according to claim 38, wherein said switch circuit connects the output node with the internal voltage line when said operation mode designation signal indicates a standby state of an internal circuit consuming a current on said internal voltage line.

40. The power supply voltage generation circuit according to claim 38, wherein said internal voltage line includes a plurality of internal power supply lines, and said internal voltages generator includes a plurality of internal power voltage generation circuits provided corresponding to the plurality of internal power supply lines, and said switch circuit includes a plurality of switch gates each provided between said output node and each of the plurality of internal power supply lines.

41. A power supply voltage generation circuit comprising:
an internal voltage line for supplying an internal power supply voltage to an internal circuit; and
internal power voltage generation circuitry for generating the internal power supply voltage onto said internal voltage line, said internal power voltage generation circuitry overdriving a voltage on said internal voltage line above a predetermined level before activation of said internal circuit in response to an operation mode designation signal instructing an operation mode of said internal circuit.

42. The power supply voltage generation circuit according to claim 41, wherein said internal voltage generation circuitry comprises a first power supply voltage generator, activated in response to said operation mode designation signal, for generating a first power supply voltage higher than said predetermined level.

43. The power supply voltage generation circuit according to claim 41, wherein said internal power voltage generation circuit overdrives said internal voltage line when said operation mode designation signal designates a standby state of said internal circuit.

44. The power supply voltage generation circuit according to claim 41, wherein said internal power voltage generation circuit comprises an internal power supply voltage generator, activated in response to said operation mode designation signal, for generating the internal power supply voltage onto said internal voltage line in accordance with a reference between the voltage on said internal voltage line and a reference voltage corresponding to a voltage level above said predetermined level.

45. The power supply voltage generation circuit according to claim 41, wherein circuit for overdriving in said internal power supply voltage generation circuit is activated for a predetermined period for overdriving said internal voltage line in response to said operation mode designation signal.

46. The power supply voltage generation circuit according to claim 41, wherein said internal power voltage generation circuit includes an internal power supply voltage generator, activated after overdriving of the internal voltage line, for generating a voltage at said predetermined level in accordance with the voltage level on the internal voltage line when said internal circuit is activated.

47. The power supply voltage generation circuit according to claim 46, wherein a circuit for over-driving in said internal power supply voltage generator is disabled when said internal power supply voltage generator is activated.

48. A power supply voltage generation circuit comprising:
an internal voltage generating circuitry for generating the internal voltage on said said internal circuit consuming said internal voltage for operation; and
internal voltage generating circuitry for generating the internal voltage on said internal power line, said internal voltage generation circuitry including an overdriving voltage generator, activated in a period within a period from start of an active cycle to activation of said internal circuit, for overdriving the internal voltage beyond a predetermined level, said internal circuit being activated in response to an operation mode designation signal generated in said active cycle.

49. A semiconductor device comprising:
an internal voltage line for transmitting an internal voltage;

a plurality of source follower transistors, coupled to said internal voltage line, each receiving a reference voltage at a gate thereof an operating in a source follower mode to generate the internal voltage, each of the source follower transistors receiving the reference voltage different in level from others.

50. The semiconductor device according to claim 49, further comprising a control circuit provided for at least one of the plurality of source follower transistor for rendering conductive for a predetermined period in accordance with an operation mode designation signal.

51. The semiconductor device according to claim 49, wherein said internal voltage line is provided in plurality corresponding to a plurality of load circuits; and a set of said plurality of source follower transistors is provided corresponding to each of the interal voltage lines.

52. A semiconductor device comprising:

an internal power line for transmitting an internal voltage to an internal circuit, said internal circuit consuming said internal voltage for operation; and internal voltage generating circuitry for generating the internal voltage on said internal power line, said internal voltage generation circuitry including an overdriving voltage generator, activated upon start of an active cycle for allowing operation of said internal circuit, for overdriving the internal voltage beyond a predetermined level, said internal circuit being activated in response to an operation mode designation signal generated in said active cycle.

53. The semiconductor device according to claim 52, further comprising:

a plurality of memory cells arranged in rows and columns, wherein said internal circuit comprises a plurality of sense amplifiers provided corresponding to the columns of memory cells, for sensing and amplifying data of memory cells on corresponding columns using said internal voltage as operation source voltage when activated.

54. The semiconductor device according to claim 53, wherein said internal circuit further comprises sense activation circuit for transmitting said internal voltage to said plurality of sense amplifiers in response to a sense amplifier activation signal.

55. The semiconductor device according to claim 53, wherein each of said plurality of sense amplifiers includes an N sense amplifier formed of cross coupled N channel insulated gate field effect transistors and a P sense amplifier formed of cross coupled P channel insulated gate field effect transistors, and said internal voltage is applied to said P sense amplifier upon activation of the sense amplifiers.

56. The semiconductor device according to claim 52, wherein said overdriving voltage generator is responsive to an overdrive instructing signal for boosting said internal voltage, said overdrive instructing signal being activated in response to activation of an activation signal instructing said start of said active cycle.

57. The semiconductor device according to claim 56, wherein said internal circuit is activated to perform a pre-allotted operation in response to activation of an internal circuit enabling signal, said internal circuit enabling signal being activated in response to activation of said activation signal.

* * * * *